US012183287B2

(12) United States Patent
Yakubo et al.

(10) Patent No.: US 12,183,287 B2
(45) Date of Patent: Dec. 31, 2024

(54) SEMICONDUCTOR DEVICE, DISPLAY APPARATUS, AND ELECTRONIC DEVICE

(71) Applicant: Semiconductor Energy Laboratory Co., Ltd., Atsugi (JP)

(72) Inventors: Yuto Yakubo, Atsugi (JP); Kouhei Toyotaka, Isehara (JP); Seiko Inoue, Atsugi (JP); Yoshiyuki Kurokawa, Sagamihara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/560,718

(22) PCT Filed: May 17, 2022

(86) PCT No.: PCT/IB2022/054557
§ 371 (c)(1),
(2) Date: Nov. 14, 2023

(87) PCT Pub. No.: WO2022/248972
PCT Pub. Date: Dec. 1, 2022

(65) Prior Publication Data
US 2024/0257751 A1 Aug. 1, 2024

(30) Foreign Application Priority Data

May 27, 2021 (JP) ................. 2021-089483
Jun. 17, 2021 (JP) ................. 2021-100794

(51) Int. Cl.
*G09G 3/3233* (2016.01)
(52) U.S. Cl.
CPC ....... *G09G 3/3233* (2013.01); *G09G 2310/08* (2013.01); *G09G 2330/021* (2013.01); *G09G 2360/14* (2013.01)

(58) Field of Classification Search
CPC ............ G09G 5/00; G09G 2300/0426; G09G 2300/0452; G09G 2300/0456
See application file for complete search history.

(56) References Cited

U.S. PATENT DOCUMENTS 8,664,581 B2    3/2014   Kurokawa et al.
10,140,928 B2 * 11/2018  Wang .................. G09G 3/3283
(Continued)

FOREIGN PATENT DOCUMENTS

CN      108649059 A     10/2018
JP      2012-118519 A    6/2012
(Continued)

OTHER PUBLICATIONS

International Search Report (Application No. PCT/IB2022/054557) Dated Aug. 2, 2022.
(Continued)

*Primary Examiner* — Van N Chow
(74) *Attorney, Agent, or Firm* — Eric J. Robinson; Robinson Intellectual Property Law Office, P.C.

(57) ABSTRACT

A semiconductor device including a display pixel circuit and an imaging pixel circuit is provided. The semiconductor device includes first and second circuits; the first circuit includes a light-emitting device; and the second circuit includes a light-receiving device, first to fifth transistors, and a first capacitor. The light-receiving device includes first and second terminals, and the light-emitting device includes third and fourth terminals. A first terminal of the first transistor is electrically connected to a first terminal of the second transistor, and a gate of the second transistor is electrically connected to a first terminal of the third transistor and a first terminal of the first capacitor. A second terminal of the first capacitor is electrically connected to a first terminal of the fourth transistor and a first terminal of the fifth transistor. A second terminal of the fifth transistor is
(Continued)

electrically connected to the first terminal of the light-receiving device, the second terminal of the light-receiving device is electrically connected to the third terminal of the light-emitting device, and the fourth terminal of the light-emitting device is electrically connected to a wiring.

17 Claims, 44 Drawing Sheets

(56) References Cited

U.S. PATENT DOCUMENTS

| | | | |
|---|---|---|---|
| 10,593,172 B2 | 3/2020 | Kurokawa | |
| 11,250,786 B2* | 2/2022 | Cheng | G09G 3/3275 |
| 11,430,311 B2 | 8/2022 | Kurokawa | |
| 2012/0119073 A1 | 5/2012 | Kurokawa et al. | |
| 2015/0332568 A1 | 11/2015 | Kurokawa | |
| 2017/0221418 A1* | 8/2017 | Xiang | G09G 3/3233 |
| 2017/0301293 A1* | 10/2017 | Zhu | G09G 3/3258 |
| 2019/0164501 A1* | 5/2019 | Chai | G09G 3/3233 |
| 2020/0212137 A1 | 7/2020 | Wang et al. | |
| 2021/0279449 A1* | 9/2021 | Yamazaki | G06V 40/176 |
| 2021/0384906 A1 | 12/2021 | Takahashi et al. | |
| 2022/0180159 A1* | 6/2022 | Kimura | G06F 30/39 |
| 2022/0320064 A1 | 10/2022 | Takahashi et al. | |
| 2023/0075180 A1 | 3/2023 | Inoue et al. | |
| 2023/0206735 A1 | 6/2023 | Kurokawa | |
| 2024/0185780 A1* | 6/2024 | Qing | G09G 3/3233 |

FOREIGN PATENT DOCUMENTS

| | | |
|---|---|---|
| JP | 2016-027694 A | 2/2016 |
| KR | 2015-0131999 A | 11/2015 |
| TW | 201547280 | 12/2015 |
| WO | WO-2019/218831 | 11/2019 |
| WO | WO-2019/243955 | 12/2019 |

OTHER PUBLICATIONS

Written Opinion (Application No. PCT/IB2022/054557) Dated Aug. 2, 2022.

Theuwissen.A, "There's More to the Picture Than Meets the Eye, and in the future it will only become more so", ISSCC 2021 (Digest of Technical Papers. IEEE International Solid-State Circuits Conference), Feb. 13, 2021, pp. 30-35.

Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.

* cited by examiner

400A

400B

400C

400D

SEMICONDUCTOR DEVICE, DISPLAY APPARATUS, AND ELECTRONIC DEVICE

TECHNICAL FIELD

One embodiment of the present invention relates to a semiconductor device, a display apparatus, and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting apparatus, a power storage device, an imaging device, a memory device, a signal processing device, a processor, an electronic device, a system, a driving method thereof, a manufacturing method thereof, and a testing method thereof.

BACKGROUND ART

Display apparatuses included in electronic devices for XR (Extended Reality or Cross Reality) such as VR (Virtual Reality) or AR (Augmented Reality), mobile phones such as smartphones, tablet information terminals, laptop PCs (personal computers), and the like have undergone various improvements in recent years. For example, display apparatuses have been developed aiming for a higher pixel density, higher color reproducibility (NTSC ratio), a smaller driver circuit, lower power consumption, and the like.

Such display apparatuses may include organic EL devices. Non-Patent Document 1 discloses a method for manufacturing an organic optoelectronic device, as one of organic EL devices, using standard UV (Ultraviolet) photolithography.

Development has also been conducted on display apparatuses having novel functions by providing circuits other than display pixel circuits in display regions of the display apparatuses. For example, Patent Document 1 discloses a method for detecting an eye or the periphery of the eye as an image by using a display apparatus including an imaging pixel circuit in addition to a display pixel circuit in its display region.

REFERENCES

Patent Document

[Patent Document 1] PCT International Publication No. 2019/243955

Non-Patent Document

[Non-Patent Document 1] B. Lamprecht et al., "Organic optoelectronic device fabrication using standard UV photolithography", phys. stat. sol. (RRL) 2, No. 1, pp. 16-18 (2008).

SUMMARY OF THE INVENTION

Problems to be Solved by the Invention

In the case where a display region of a display apparatus includes an imaging pixel circuit for detecting an object that is close to or in contact with the display region as an image in addition to a display pixel circuit for outputting an image, the size of the display region (e.g., a diagonal size of a rectangular display region) is likely to increase and accordingly the pixel density (sometimes referred to as resolution) of the display region is likely to decrease.

An example of a means of preventing an increase in the size of the display region is a method in which a common wiring is used as power supply wirings electrically connected to the display pixel circuit and the imaging pixel circuit. Specifically, in order to use the common wiring as the power supply wirings, input voltages required for the display pixel circuit and the imaging pixel circuit need to be equalized. However, the range of the input voltage for normal driving is sometimes different between the display pixel circuit and the imaging pixel circuit. In that case, the range of the input voltage of one of the display pixel circuit and the imaging pixel circuit needs to be adjusted in accordance with that of the other.

An example of a means of reducing the size of the display region is a method in which the areas of the display pixel circuit and the imaging pixel circuit are reduced. However, an area reduction of a light-receiving device included in the imaging pixel circuit decreases an S/N ratio (signal-to-noise ratio), so that noise is easily generated in imaging data. Thus, the imaging pixel circuit included in the display region is required to have a structure in which an S/N ratio does not decrease even when the area of the imaging pixel circuit (light-receiving device) is reduced.

In addition, the area reduction of the light-receiving device included in the imaging pixel circuit reduces the amount of current generated when the light-receiving device receives light, resulting in longer time for obtaining imaging data. Thus, the driving speed (shutter speed) of the imaging pixel circuit at the time of image capturing needs to be low. Accordingly, in the case where high-speed image capturing is performed with the imaging pixel circuit including the light-receiving device with a small area, the imaging pixel circuit is required to have a structure in which the time for obtaining imaging data is shortened.

An object of one embodiment of the present invention is to provide a semiconductor device including a display pixel circuit and an imaging pixel circuit that are driven at a common input voltage. Another object of one embodiment of the present invention is to provide a semiconductor device in which an S/N ratio does not decrease even when the area of an imaging pixel circuit is reduced. Another object of one embodiment of the present invention is to provide a semiconductor device capable of high-speed image capturing even when the area of an imaging pixel circuit is reduced. Another object of one embodiment of the present invention is to provide a novel semiconductor device. Another object of one embodiment of the present invention is to provide a display apparatus including the semiconductor device. Another object of one embodiment of the present invention is to provide a display apparatus with a high pixel density.

Another object of one embodiment of the present invention is to provide an electronic device including the display apparatus.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a semiconductor device including a first circuit and a second circuit. The first circuit includes a light-emitting device, and the second circuit includes a light-receiving device, a first transistor, a second transistor, a third transistor, a fourth transistor, a fifth transistor, and a first capacitor. The light-receiving device includes a first terminal and a second terminal, and the light-emitting device includes a third terminal and a fourth terminal. One of a source and a drain of the first transistor is electrically connected to one of a source and a drain of the second transistor, and a gate of the second transistor is electrically connected to one of a source and a drain of the third transistor and one of a pair of terminals of the first capacitor. The other of the pair of terminals of the first capacitor is electrically connected to one of a source and a drain of the fourth transistor and one of a source and a drain of the fifth transistor, and the other of the source and the drain of the fifth transistor is electrically connected to the first terminal of the light-receiving device. The second terminal of the light-receiving device is electrically connected to the third terminal of the light-emitting device, and the fourth terminal of the light-emitting device is electrically connected to a first wiring. Note that the first wiring serves as a wiring supplying a potential to the fourth terminal of the light-emitting device.

(2)

Another embodiment of the present invention may be a structure of the above (1), in which a gate of the third transistor is electrically connected to a gate of the fourth transistor.

(3)

Another embodiment of the present invention may be a structure of the above (1) or (2), in which the first circuit includes a sixth transistor and a seventh transistor. It is particularly preferable that one of a source and a drain of the seventh transistor be directly electrically connected to the fourth terminal of the light-emitting device, the other of the source and the drain of the seventh transistor be directly electrically connected to the first wiring, and one of a source and a drain of the sixth transistor be electrically connected to a gate of the seventh transistor.

(4)

Another embodiment of the present invention is a display apparatus including the semiconductor device of the above (3), a first driver circuit, a second driver circuit, a second wiring, and a third wiring. The first driver circuit is electrically connected to a gate of the sixth transistor through the second wiring, and the second driver circuit is electrically connected to the other of the source and the drain of the seventh transistor through the third wiring. The first driver circuit has a function of transmitting a selection signal to the second wiring, and the second driver circuit has a function of transmitting an image data signal to the third wiring.

(5)

Another embodiment of the present invention is an electronic device including the display apparatus of the above (4) and a housing.

(6)

Another embodiment of the present invention is a semiconductor device including a second circuit and a third circuit. The second circuit includes a first light-receiving device, a first transistor, a second transistor, a third transistor, a fourth transistor, a fifth transistor, an eighth transistor, and a first capacitor, and the third circuit includes a second light-receiving device, a ninth transistor, a tenth transistor, an eleventh transistor, a twelfth transistor, a thirteenth transistor, a fourteenth transistor, and a second capacitor. The first light-receiving device includes a first terminal and a second terminal, and the second light-receiving device includes a fifth terminal and a sixth terminal. One of a source and a drain of the first transistor is electrically connected to one of a source and a drain of the second transistor, and a gate of the second transistor is electrically connected to one of a source and a drain of the third transistor and one of a pair of terminals of the first capacitor. The other of the pair of terminals of the first capacitor is electrically connected to one of a source and a drain of the fourth transistor, one of a source and a drain of the fifth transistor, one of a source and a drain of the eighth transistor, and one of a source and a drain of the fourteenth transistor, and the other of the source and the drain of the fifth transistor is electrically connected to the other of the source and the drain of the eighth transistor and the first terminal of the first light-receiving device. One of a source and a drain of the ninth transistor is electrically connected to one of a source and a drain of the tenth transistor, and a gate of the tenth transistor is electrically connected to one of a source and a drain of the eleventh transistor and one of a pair of terminals of the second capacitor. The other of the pair of terminals of the second capacitor is electrically connected to one of a source and a drain of the twelfth transistor and one of a source and a drain of the thirteenth transistor, and the other of the source and the drain of the thirteenth transistor is electrically connected to the other of the source and the drain of the fourteenth transistor and the fifth terminal of the second light-receiving device. The second terminal of the first light-receiving device is electrically connected to the sixth terminal of the second light-receiving device.

(7)

Another embodiment of the present invention may be a structure of the above (6), in which a gate of the third transistor is electrically connected to a gate of the eleventh transistor, a gate of the fourth transistor is electrically connected to a gate of the twelfth transistor, a gate of the fifth transistor is electrically connected to a gate of the thirteenth transistor, and a gate of the eighth transistor is electrically connected to a gate of the fourteenth transistor.

(8)

Another embodiment of the present invention may be a structure of the above (7), in which the other of the source and the drain of the first transistor is electrically connected to the other of the source and the drain of the ninth transistor.

(9)

Another embodiment of the present invention may be a structure of the above (8), in which a first circuit is included. It is particularly preferable that the first circuit include a light-emitting device. The light-emitting device preferably includes a third terminal and a fourth terminal. It is preferable that the third terminal of the light-emitting device be electrically connected to the second terminal of the first light-receiving device and the sixth terminal of the second light-receiving device, and the fourth terminal of the light-emitting device be electrically connected to a first wiring.

The first wiring preferably serves as a wiring supplying a potential to the fourth terminal of the light-emitting device.

(10)

Another embodiment of the present invention may be a structure of the above (8), in which a first circuit including a light-emitting device, a sixth transistor, and a seventh transistor is included. The light-emitting device preferably includes a third terminal and a fourth terminal. It is preferable that the third terminal of the light-emitting device be electrically connected to the second terminal of the first light-receiving device and the sixth terminal of the second light-receiving device, one of a source and a drain of the seventh transistor be electrically connected to the fourth terminal of the light-emitting device, the other of the source and the drain of the seventh transistor be electrically connected to a first wiring, and one of a source and a drain of the sixth transistor be electrically connected to a gate of the seventh transistor. The first wiring preferably serves as a wiring supplying a potential to the other of the source and the drain of the seventh transistor.

(11)

Another embodiment of the present invention is a semiconductor device that includes a second circuit and a third circuit and has a structure different from the structure of the above (6). The second circuit includes a first light-receiving device, a first transistor, a second transistor, a third transistor, a fourth transistor, a fifth transistor, an eighth transistor, a fifteenth transistor, and a first capacitor, and the third circuit includes a second light-receiving device, a ninth transistor, a tenth transistor, an eleventh transistor, a twelfth transistor, a thirteenth transistor, a fourteenth transistor, and a second capacitor. The first light-receiving device includes a first terminal and a second terminal, and the second light-receiving device includes a fifth terminal and a sixth terminal. One of a source and a drain of the first transistor is electrically connected to one of a source and a drain of the second transistor, and a gate of the second transistor is electrically connected to one of a source and a drain of the third transistor and one of a pair of terminals of the first capacitor. The other of the pair of terminals of the first capacitor is electrically connected to one of a source and a drain of the fourth transistor, one of a source and a drain of the fifth transistor, one of a source and a drain of the eighth transistor, and one of a source and a drain of the fifteenth transistor. The other of the source and the drain of the fifteenth transistor is electrically connected to one of a source and a drain of the fourteenth transistor, and a gate of the fifteenth transistor is electrically connected to a gate of the eighth transistor. The other of the source and the drain of the fifth transistor is electrically connected to the other of the source and the drain of the eighth transistor and the first terminal of the first light-receiving device, and one of a source and a drain of the ninth transistor is electrically connected to one of a source and a drain of the tenth transistor. A gate of the tenth transistor is electrically connected to one of a source and a drain of the eleventh transistor and one of a pair of terminals of the second capacitor. The other of the pair of terminals of the second capacitor is electrically connected to one of a source and a drain of the twelfth transistor and one of a source and a drain of the thirteenth transistor, and the other of the source and the drain of the thirteenth transistor is electrically connected to the other of the source and the drain of the fourteenth transistor and the fifth terminal of the second light-receiving device. The second terminal of the first light-receiving device is electrically connected to the sixth terminal of the second light-receiving device.

(12)

Another embodiment of the present invention may be a structure of the above (11), in which a gate of the third transistor is electrically connected to a gate of the eleventh transistor, a gate of the fourth transistor is electrically connected to a gate of the twelfth transistor, a gate of the fifth transistor is electrically connected to a gate of the thirteenth transistor, and the gate of the eighth transistor is electrically connected to a gate of the fourteenth transistor.

(13)

Another embodiment of the present invention may be a structure of the above (12), in which the other of the source and the drain of the first transistor is electrically connected to the other of the source and the drain of the ninth transistor.

(14)

Another embodiment of the present invention may be a structure of the above (13), in which a first circuit is included. The first circuit preferably includes a light-emitting device. The light-emitting device preferably includes a third terminal and a fourth terminal. It is preferable that the third terminal of the light-emitting device be electrically connected to the second terminal of the first light-receiving device and the sixth terminal of the second light-receiving device, and the sixth terminal of the light-emitting device be electrically connected to a first wiring. The first wiring preferably serves as a wiring supplying a potential to the fourth terminal of the light-emitting device.

(15)

Another embodiment of the present invention may be a structure of the above (13), in which a first circuit including a light-emitting device, a sixth transistor, and a seventh transistor is included. The light-emitting device preferably includes a third terminal and a fourth terminal. It is preferable that the third terminal of the light-emitting device be electrically connected to the second terminal of the first light-receiving device and the sixth terminal of the second light-receiving device, one of a source and a drain of the seventh transistor be electrically connected to the fourth terminal of the light-emitting device, the other of the source and the drain of the seventh transistor be electrically connected to a first wiring, and one of a source and a drain of the sixth transistor be electrically connected to a gate of the seventh transistor. The first wiring preferably serves as a wiring supplying a potential to the other of the source and the drain of the seventh transistor.

(16)

Another embodiment of the present invention is a display apparatus including the semiconductor device of the above (10) or (15), a first driver circuit, a second driver circuit, a second wiring, and a third wiring. The first driver circuit is electrically connected to a gate of the sixth transistor through the second wiring, and the second driver circuit is electrically connected to the other of the source and the drain of the sixth transistor through the third wiring. The first driver circuit has a function of transmitting a selection signal to the second wiring, and the second driver circuit has a function of transmitting an image data signal to the third wiring.

(17)

Another embodiment of the present invention is an electronic device including the display apparatus of the above (16) and a housing.

Note that in this specification and the like, a semiconductor device refers to a device that utilizes semiconductor characteristics, and means a circuit including a semiconductor element (e.g., a transistor, a diode, and a photodiode), or a device including the circuit. The semiconductor device also means all devices that can function by utilizing semiconductor characteristics. For example, an integrated circuit, a chip including an integrated circuit, and an electronic component including a chip in a package are each an example of the semiconductor device. Moreover, a memory device, a display apparatus, a light-emitting apparatus, a lighting device, an electronic device, and the like themselves are semiconductor devices or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y Note that a switch has a function of being controlled to be turned on or off. That is, the switch has a function of being in a conducting state (on state) or a non-conducting state (off state) to control whether current flows or not.

For example, in the case where X and Y are functionally connected, one or more circuits that allow functional connection between X and Y (e.g., a logic circuit (e.g., an inverter, a NAND circuit, or a NOR circuit); a signal converter circuit (e.g., a digital-analog converter circuit, an analog-digital converter circuit, or a gamma correction circuit); a potential level converter circuit (e.g., a power supply circuit such as a step-up circuit or a step-down circuit, or a level shifter circuit for changing the potential level of a signal); a voltage source; a current source; a switching circuit; an amplifier circuit (e.g., a circuit that can increase signal amplitude, the amount of current, or the like, an operational amplifier, a differential amplifier circuit, a source follower circuit, or a buffer circuit); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

This specification describes a circuit structure in which a plurality of elements are electrically connected to a wiring (a wiring for supplying a constant potential or a wiring for transmitting a signal). For example, in the case where X is directly connected to a wiring and Y is directly connected to the wiring, this specification may describe that X and Y are directly electrically connected to each other.

It can be expressed as, for example, "X, Y, a source (sometimes called one of a first terminal and a second terminal) of a transistor, and a drain (sometimes called the other of the first terminal and the second terminal) of the transistor are electrically connected to each other, and X, the source of the transistor, the drain of the transistor, and Y are electrically connected to each other in this order". Alternatively, it can be expressed as "a source of a transistor is electrically connected to X; a drain of the transistor is electrically connected to Y; and X, the source of the transistor, the drain of the transistor, and Y are electrically connected to each other in this order". Alternatively, it can be expressed as "X is electrically connected to Y through a source and a drain of a transistor, and X, the source of the transistor, the drain of the transistor, and Y are provided in this connection order". When the connection order in a circuit structure is defined by an expression similar to the above examples, a source and a drain of a transistor can be distinguished from each other to specify the technical scope. Note that these expressions are examples and the expression is not limited to these expressions. Here, each of X and Y denotes an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has both functions of a wiring and an electrode. Thus, electrical connection in this specification includes, in its category, such a case where one conductive film has functions of a plurality of components.

In this specification and the like, a "resistor" can be, for example, a circuit element having a resistance value higher than 0Ω or a wiring having a resistance value higher than 0Ω. Therefore, in this specification and the like, a "resistor" includes a wiring having a resistance value, a transistor in which current flows between a source and a drain, a diode, and a coil. Thus, the term "resistor" can sometimes be replaced with the terms "resistance", "load", or "region having a resistance value". Conversely, the terms "resistance", "load", or "region having a resistance value" can sometimes be replaced with the term "resistor". The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. For another example, the resistance value may be higher than or equal to 1Ω and lower than or equal to $1 \times 10^9 \Omega$.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. The term "capacitor", "parasitic capacitance", or "gate capacitance" can be replaced with the term "capacitance" in some cases. Conversely, the term "capacitance" can be replaced with the term "capacitor", "parasitic capacitance", or "gate capacitance" in some cases. In addition, a "capacitor" (including a "capacitor" with three or more terminals) includes an insulator and a pair of conductors between which the insulator is interposed. Thus, the term "pair of conductors" of "capacitor" can be replaced with "pair of electrodes", "pair of conductive regions", "pair of regions", or "pair of terminals". In addition, the terms "one of a pair of terminals" and "the other of the pair of terminals" are referred to as a first terminal and a second terminal, respectively, in some cases. Note that the electrostatic capacitance value can be higher than or equal to 0.05 fF and lower than or equal to 10 pF, for example. For another example, the electrostatic capacitance value may be higher than or equal to 1 pF and lower than or equal to 10 μF.

In this specification and the like, a transistor includes three terminals called a gate, a source, and a drain. The gate is a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can sometimes be replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of off-state current can be reduced, and the withstand voltage of the transistor can be increased (the reliability can be improved). Alternatively, with the multi-gate structure, drain-source current does not change very much even if drain-source voltage changes at the time of an operation in a saturation region, so that a flat slope of voltage-current characteristics can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

In this specification and the like, circuit elements such as a "light-emitting device" and a "light-receiving device" sometimes have polarities called an "anode" and a "cathode". In the case of a "light-emitting device", the "light-emitting device" can sometimes emit light when a forward bias is applied (a positive potential with respect to a "cathode" is applied to an "anode"). In the case of a "light-receiving device", current is sometimes generated between an "anode" and a "cathode" when a zero bias or a reverse bias is applied (a negative potential with respect to a "cathode" is applied to an "anode") and the "light-receiving device" is irradiated with light. As described above, an "anode" and a "cathode" are sometimes regarded as input/output terminals of the circuit elements such as a "light-emitting device" and a "light-receiving device". In this specification and the like, an "anode" and a "cathode" of the circuit element such as a "light-emitting device" or a "light-receiving device" are sometimes called terminals (a first terminal, a second terminal, and the like). For example, one of an "anode" and a "cathode" is called a first terminal and the other of the "anode" and the "cathode" is called a second terminal in some cases.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. For another example, the case where a single capacitor is illustrated in a circuit diagram may indicate a case where two or more capacitors are electrically connected to each other in parallel. For another example, the case where a single transistor is illustrated in a circuit diagram may indicate a case where two or more transistors are electrically connected to each other in series and their gates are electrically connected to each other. Similarly, for another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, or an impurity region depending on the circuit structure and the device structure. Furthermore, a terminal or a wiring can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit or the like, and a potential output from a circuit or the like, for example, change with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer phenomenon (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer phenomenon (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A". The description "current is input to element A" can be rephrased as "current is output from element A".

Ordinal numbers such as "first", "second", and "third" in this specification and the like are used to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or the scope of claims. For another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) the top surface of a conductor" can be replaced with the expression "an insulator positioned under (on) a bottom surface of a conductor" when the direction of a drawing showing these components is rotated by 180°.

Furthermore, the terms "over" and "under" do not necessarily mean that a component is placed directly over or directly under and in direct contact with another component. For example, the expression "electrode B over insulating layer A" does not necessarily mean that the electrode B is formed over and in direct contact with the insulating layer A, and does not exclude the case where another component is provided between the insulating layer A and the electrode B.

Similarly, for example, the expression "electrode B above insulating layer A" does not necessarily mean that the electrode B is formed over and in direct contact with the insulating layer A, and does not exclude the case where another component is provided between the insulating layer A and the electrode B. Similarly, for example, the expression "electrode B under insulating layer A" does not necessarily mean that the electrode B is formed under and in direct contact with the insulating layer A, and does not exclude the case where another component is provided between the insulating layer A and the electrode B.

In this specification and the like, components arranged in a matrix and their positional relation are sometimes described using terms such as "row" and "column". The positional relation between components is changed as appropriate in accordance with the direction in which the components are described. Thus, the positional relation is not limited to the terms described in the specification and the like, and can be described with another term as appropriate depending on the situation. For example, the term "row direction" can be replaced with the term "column direction" when the direction of the diagram is rotated by 90°.

In this specification and the like, the terms "film" and "layer" can be interchanged with each other depending on the situation. For example, the term "conductive layer" can be changed into the term "conductive film" in some cases. For another example, the term "insulating film" can be changed into the term "insulating layer" in some cases.

Alternatively, the terms "film" and "layer" are not used and can be interchanged with another term depending on the case or the situation. For example, the term "conductive layer" or "conductive film" can be changed into the term "conductor" in some cases. For another example, the term "insulating layer" or "insulating film" can be changed into the term "insulator" in some cases.

In this specification and the like, the terms "electrode", "wiring", and "terminal" do not limit the functions of such components. For example, an "electrode" is used as part of a "wiring" in some cases, and vice versa. Furthermore, the term "electrode" or "wiring" also includes, for example, the case where a plurality of "electrodes" or "wirings" are formed in an integrated manner. For example, a "terminal" is used as part of a "wiring" or an "electrode" in some cases, and vice versa. Furthermore, the term "terminal" also includes, for example, the case where one or more selected from "electrodes", "wirings", and "terminals" are formed in an integrated manner. Therefore, for example, an "electrode" can be part of a "wiring" or a "terminal", and a "terminal" can be part of a "wiring" or an "electrode". Moreover, the term "electrode", "wiring", or "terminal" is sometimes replaced with the term "region" depending on the case.

In this specification and the like, the terms "wiring", "signal line", and "power supply line" can be interchanged with each other depending on the case or the situation. For example, the term "wiring" can be changed into the term "signal line" in some cases. For another example, the term "wiring" can be changed into the term "power supply line" or the like in some cases. Conversely, the term "signal line" or "power supply line" can be changed into the term "wiring" in some cases. The term "power supply line" can be changed into the term "signal line" in some cases. Conversely, the term "signal line" can be changed into the term "power supply line" in some cases. The term "potential" that is applied to a wiring can be changed into the term "signal" depending on the case or the situation. Conversely, the term "signal" can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, one or more selected from an increase in the density of defect states in a semiconductor, a decrease in carrier mobility, and a decrease in crystallinity may occur. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conducting state (on state) or a non-conducting state (off state) to determine whether current flows or not. Alternatively, a switch has a function of selecting and changing a current path. Thus, a switch may have two or more terminals through which current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conducting state" of the transistor refers to a state where a source electrode and a drain electrode of the transistor can be regarded as being electrically short-circuited or a state where current can be made to flow between the source electrode and the drain electrode. Furthermore, a "non-conducting state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification and the like, a device formed using a metal mask or an FMM (fine metal mask, high-resolution metal mask) may be referred to as a device having an MM (metal mask) structure. In this specification and the like, a device formed without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-emitting devices can be classified roughly into a single structure and a tandem structure. A device with a single structure includes one light-emitting unit between a pair of electrodes, and the light-emitting unit preferably includes one or more light-emitting layers. When white light emission is obtained using two light-emitting layers, the two light-emitting layers are selected such that emission colors of the light-emitting layers are complementary colors. For example, when an emission color of a first light-emitting layer and an emission color of a second light-emitting layer are complementary colors, a light-emitting device can be configured to emit white light as a whole. When white light emission is obtained using three or more light-emitting layers, a light-emitting device is configured to emit white light as a whole by combining emission colors of the three or more light-emitting layers.

A device with a tandem structure includes two or more light-emitting units between a pair of electrodes, and each light-emitting unit preferably includes one or more light-emitting layers. To obtain white light emission, the structure is made such that light from light-emitting layers of the plurality of light-emitting units can be combined to be white light. Note that a structure for obtaining white light emission is similar to that in the case of a single structure. In the device with a tandem structure, an intermediate layer such as a charge-generation layer is suitably provided between the plurality of light-emitting units.

When the above white-light-emitting device (having a single structure or a tandem structure) and the above light-emitting device having an SBS structure are compared to each other, the light-emitting device having an SBS structure can have lower power consumption than the white-light-emitting device. The light-emitting device having an SBS structure is suitably used in the case where the power consumption is required to be low. Meanwhile, the white-light-emitting device is suitable in terms of lower manufacturing cost or higher manufacturing yield because the manufacturing process of the white-light-emitting device is simpler than that of the light-emitting device having an SBS structure.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 800 and less than or equal to 100°. Thus, the case where the angle is greater than or equal to 85° and less than or equal to 950 is also included. Furthermore, "approximately perpendicular" or "substantially perpendicular" indicates a state where two straight lines are placed at an angle greater than or equal to 60° and less than or equal to 120°.

Effect of the Invention

According to one embodiment of the present invention, a semiconductor device including a display pixel circuit and an imaging pixel circuit that are driven at a common input voltage can be provided. According to another embodiment of the present invention, a semiconductor device in which an S/N ratio does not decrease even when the area of an imaging pixel circuit is reduced can be provided. According to another embodiment of the present invention, a semiconductor device capable of high-speed image capturing even when the area of an imaging pixel circuit is reduced can be provided. According to another embodiment of the present invention, a novel semiconductor device can be provided. According to another embodiment of the present invention, a display apparatus including the semiconductor device can be provided. According to another embodiment of the present invention, a display apparatus with a high pixel density can be provided. According to another embodiment of the present invention, an electronic device including the display apparatus can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted as appropriate from the description by those skilled in the art. Note that one embodiment of the present invention has at least one of the effects listed above and the other effects. Accordingly, depending on the case, one embodiment of the present invention does not have the effects listed above in some cases.

MODE FOR CARRYING OUT THE INVENTION

Figure 1A:
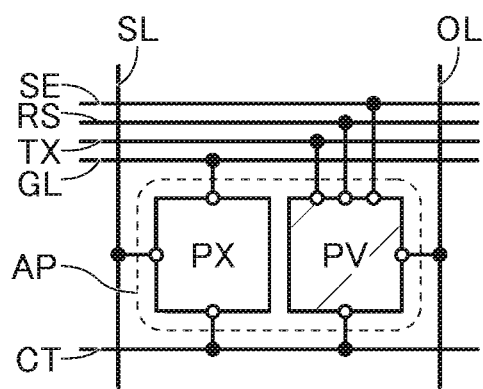
FIG. 1A and FIG. 1B are block diagrams illustrating structure examples of a semiconductor device.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described using a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification, a plan view is sometimes used to explain a structure in each embodiment. A plan view is a diagram illustrating the appearance of a plane (section) of a structure cut in the horizontal direction, for example. Hidden lines (e.g., dashed lines) in a plan view can indicate the positional relation between a plurality of components included in a structure or the overlapping relation between the plurality of components. In this specification and the like, the term "plan view" can be replaced with the term "projection view", "top view", or "bottom view". A plane (section) of a structure cut in a direction other than the horizontal direction may be referred to as a plan view depending on circumstances.

In this specification, a cross-sectional view is sometimes used to explain a structure in each embodiment. A cross-sectional view is a diagram illustrating the appearance of a plane (section) of a structure cut in the vertical direction, for example. In this specification and the like, the term "cross-sectional view" can be replaced with the term "front view" or "side view". A plane (section) of a structure cut in a direction other than the vertical direction may be referred to as a cross-sectional view depending on circumstances.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other. In the drawings in this specification, the size, the layer thickness, or the region is exaggerated for clarity in some cases. Therefore, they are not limited to the illustrated scale.

The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a semiconductor device of one embodiment of the present invention will be described.

Structure Example 1

FIG. 1A is a block diagram illustrating a display pixel circuit and an imaging pixel circuit that can be included in a display region of a display apparatus, and a circuit AP illustrated in FIG. 1A is an example of the semiconductor device of one embodiment of the present invention. The circuit AP includes a circuit PX and a circuit PV.

The circuit PX has a function of a display pixel circuit, for example. The display pixel circuit can be, for example, a pixel including at least one of a liquid crystal display device and a light-emitting device. Examples of the light-emitting device include a light-emitting device containing an organic EL material and an LED (including a micro LED). Note that in the description in this embodiment, the circuit PX includes a light-emitting device containing an organic EL material. In particular, the luminance of light emitted from a light-emitting device capable of emitting light with high luminance can be, for example, higher than or equal to 500 $cd/m^2$, preferably higher than or equal to 1000 $cd/m^2$ and lower than or equal to 10000 $cd/m^2$, further preferably higher than or equal to 2000 $cd/m^2$ and lower than or equal to 5000 $cd/m^2$. Note that a pixel circuit applicable to the circuit PX or the like will be described in detail in Embodiment 4.

The circuit PV has a function of an imaging pixel circuit, for example. The imaging pixel circuit includes a light-receiving device functioning as an imaging device, for example.

The circuit PX is electrically connected to a wiring SL, a wiring GL, and a wiring CT, for example.

The wiring SL functions as a wiring transmitting an image data signal to the circuit PX, for example. Alternatively, the wiring SL may be, for example, a wiring supplying a constant voltage or a variable potential (sometimes referred to as a pulse voltage).

The wiring GL functions as a wiring transmitting a selection signal for selecting the circuit PX to be a supply destination of an image data signal, for example. Alternatively, the wiring GL may be, for example, a wiring supplying a constant potential.

The wiring CT functions as a wiring supplying a constant potential to the circuit PX, for example. The wiring CT is electrically connected to a terminal of the light-emitting device included in the circuit PX, for example. In that case, the constant potential is preferably a ground potential or a negative potential, for example. Alternatively, the wiring CT may be, for example, a wiring supplying a variable potential.

The circuit PV is electrically connected to a wiring TX, a wiring RS, a wiring SE, a wiring OL, and the wiring CT, for example.

The wiring TX functions as a wiring transmitting a trigger signal for enabling the light-receiving device included in the circuit PV to perform image capturing, for example. Alternatively, the wiring TX may be, for example, a wiring supplying a constant voltage.

The wiring RS functions as a wiring transmitting a trigger signal for erasing imaging data captured by the light-receiving device included in the circuit PV, for example. Note that an operation of erasing imaging data can be rephrased as, for example, an initialization operation of a potential corresponding to imaging data retained in the circuit PV that is performed to allow the circuit PV to perform another image capturing. Alternatively, the wiring RS may be, for example, a wiring supplying a constant voltage.

The wiring SE functions as a wiring transmitting a trigger signal for reading imaging data captured by the light-receiving device included in the circuit PV, for example. Alternatively, the wiring SE may be, for example, a wiring supplying a constant potential.

The wiring OL functions as a wiring transmitting imaging data captured by the light-receiving device included in the circuit PV as a signal, for example. Alternatively, the wiring OL may be, for example, a wiring supplying a constant potential, a variable potential, or the like.

The wiring CT functions as a wiring supplying a constant potential also to the circuit PV. The wiring CT is electrically connected to a terminal of the light-receiving device included in the circuit PV, for example.

Although the various wirings are illustrated in FIG. 1A, a wiring other than the wiring SL, the wiring GL, the wiring TX, the wiring RS, the wiring SE, the wiring OL, and the wiring CT may be electrically connected to one or both of the circuit PX and the circuit PV. For example, although not illustrated in FIG. 1A, a wiring supplying a power supply voltage for driving one or both of the circuit PX and the circuit PV may be electrically connected to the circuit AP.

The number of at least one of the wirings illustrated in FIG. 1A may be two or more. For example, the number of wirings GL illustrated in FIG. 1A may be two or more. For another example, the number of wirings RS illustrated in FIG. 1A may be two or more.

Although FIG. 1A illustrates the structure in which the circuit AP includes one circuit PX as the display pixel circuit, the circuit AP may include a plurality of the display pixel circuits. In particular, the plurality of display pixel circuits can exhibit, for example, three colors of red (R), green (G), and blue (B). Alternatively, for example, the plurality of display pixel circuits may exhibit four or more colors; one or more colors selected from cyan, magenta, yellow, and white may be exhibited in addition to the three colors of red (R), green (G), and blue (B). Note that in the case where pixels expressing different colors are each called a subpixel and white is expressed by a plurality of subpixels expressing different colors, the plurality of subpixels are sometimes collectively called a pixel in this specification and the like.

Figure 1B:
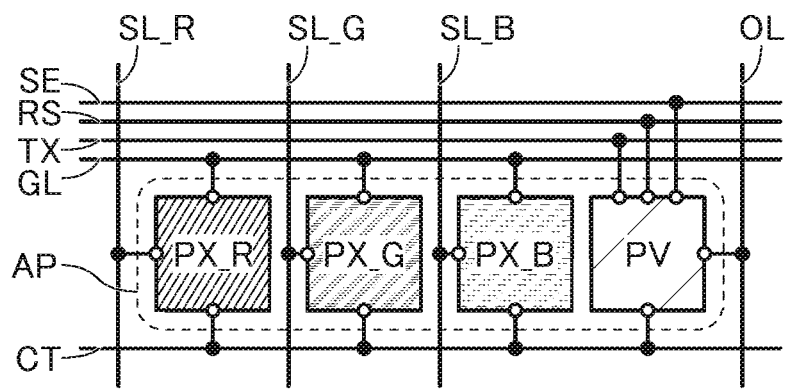

FIG. 1B illustrates the structure of the circuit AP including three display pixel circuits of a circuit PX_R serving as a red (R) display pixel circuit, a circuit PX_G serving as a green (G) display pixel circuit, and a circuit PX_B serving as a blue (B) display pixel circuit, for example. In FIG. 1B, a wiring SL_R, a wiring SL_G, and a wiring SL_B that correspond to the wiring SL in FIG. 1A are illustrated, the wiring SLR is electrically connected to the circuit PX_R, the wiring SL_G is electrically connected to the circuit PX_G, and the wiring SL_B is electrically connected to the circuit PX_B, for example.

Note that the arrangement order of the display pixel circuits and the imaging pixel circuit is not limited to the order illustrated in FIG. 1B, and the arrangement order may be changed depending on circumstances.

Specific Example 1

Figure 2A:
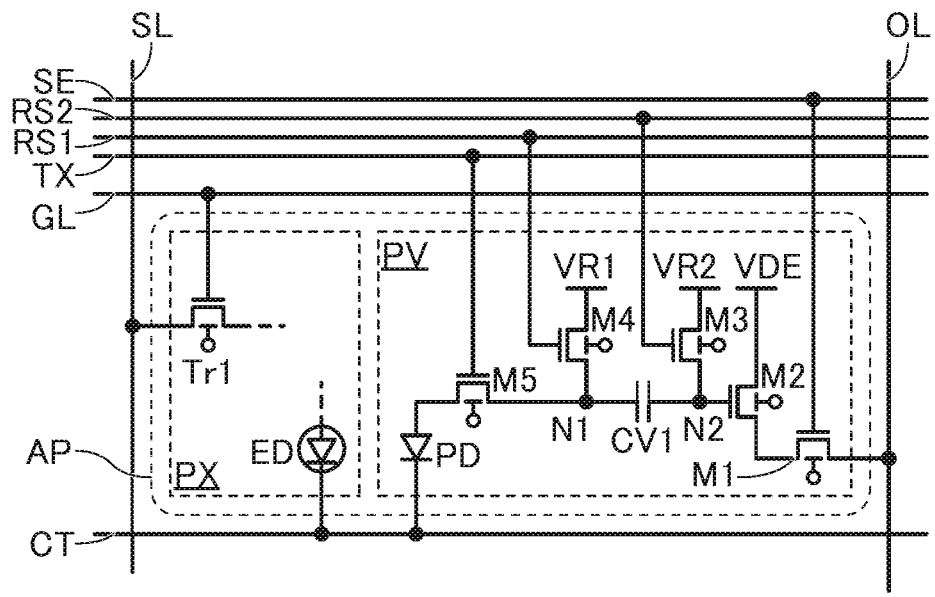
FIG. 2A is a circuit diagram illustrating a structure example of a semiconductor device.

FIG. 2A illustrates a structure example of a circuit applicable to the circuit AP in FIG. 1A.

The circuit PX illustrated in FIG. 2A includes a transistor Tr1 and a light-emitting device ED. Although only the transistor Tr1 and the light-emitting device ED are illustrated in the circuit PX in FIG. 2A, the circuit PX may include a circuit element other than the transistor Tr1 and the light-emitting device ED depending on the structure of the circuit PX.

The circuit PV includes a transistor M1 to a transistor M5, a capacitor CV1, and a light-receiving device PD.

Note that in FIG. 2A, both of the light-emitting device ED and the light-receiving device PD are illustrated as circuit elements each including an anode and a cathode, for example.

It is preferable to use an OS transistor as each of the transistor Tr1 and the transistor M1 to the transistor M5, for example. In particular, a metal oxide contained in a channel formation region of an OS transistor is preferably an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like), for example. Alternatively, as each of the transistors, a transistor containing silicon in a channel formation region (hereinafter, referred to as a Si transistor) may be used. As the silicon, single crystal silicon, amorphous silicon (sometimes referred to as hydrogenated amorphous silicon), microcrystalline silicon, or polycrystalline silicon (including low-temperature polycrystalline silicon (LTPS)) can be used, for example. As a transistor other than an OS transistor and a Si transistor, for example, a transistor containing germanium or the like in a channel formation region, a transistor containing a compound semiconductor such as zinc selenide, cadmium sulfide, gallium arsenide, indium phosphide, gallium nitride, or silicon germanium in a channel formation region, a transistor containing a carbon nanotube in a channel formation region, or a transistor containing an organic semiconductor in a channel formation region can be used.

The semiconductor device of one embodiment of the present invention may include both an OS transistor and a Si transistor, for example. In particular, with the use of both an LTPS transistor, which is a Si transistor, and an OS transistor, the semiconductor device can have low power consumption and high drive capability. A structure in which an LTPS transistor and an OS transistor are combined is referred to as LTPO in some cases. As a favorable example, it is preferable to use an OS transistor as a transistor functioning as a switch for controlling electrical continuity between wirings and an LTPS transistor as a transistor for controlling current.

Each of the transistor Tr1 and the transistor M1 to the transistor M5 illustrated in FIG. 2A is an n-channel transistor having gates over and under a channel, and each of the transistor Tr1 and the transistor M1 to the transistor M5 has a first gate and a second gate. Note that in this specification and the like, for convenience, the first gate is referred to as a gate (sometimes referred to as a front gate) and the second gate is referred to as a back gate in some cases so that they are distinguished from each other, for example. In this specification and the like, the first gate and the second gate can be interchanged with each other; thus, the term "gate" can be replaced with the term "back gate". Similarly, the term "back gate" can be replaced with the term "gate". As a specific example, a connection structure in which "a gate is electrically connected to a first wiring and a back gate is electrically connected to a second wiring" can be replaced with a connection structure in which "a back gate is electrically connected to a first wiring and a gate is electrically connected to a second wiring".

For each of the transistor Tr1 and the transistor M1 to the transistor M5 in FIG. 2A, the back gate is illustrated but the connection structure of the back gate is not illustrated; an electrical connection destination of the back gate can be determined at the design stage. For example, in a transistor having a back gate, a gate and the back gate may be electrically connected to each other to increase the on-state current of the transistor. That is, for example, the gate and the back gate of the transistor Tr1 may be electrically connected to each other, and the gate and the back gate of the transistor M1 may be electrically connected to each other. For another example, in a transistor having a back gate, a wiring electrically connecting the back gate of the transistor to an external circuit may be provided and a potential may be supplied to the back gate of the transistor with the external circuit to change the threshold voltage of the transistor or to reduce the off-state current of the transistor.

The transistor Tr1 and the transistor M1 to the transistor M5 illustrated in FIG. 2A have back gates; however, the semiconductor device of one embodiment of the present invention is not limited thereto. For example, the transistor Tr1 and the transistor M1 to the transistor M5 illustrated in FIG. 2A may each be a transistor having a structure not including a back gate, i.e., a single-gate structure. It is also possible that some transistors have a structure including a back gate and the other transistors have a structure not including a back gate.

The transistor Tr1 and the transistor M1 to the transistor M5 illustrated in FIG. 2A are n-channel transistors; however, the semiconductor device of one embodiment of the present invention is not limited thereto. For example, some or all of the transistor Tr1 and the transistor M1 to the transistor M5 may be replaced with p-channel transistors.

The above-described examples of changes in the structure and polarity of the transistor are not limited to the transistor Tr1 and the transistor M1 to the transistor M5. For example, the structure and polarity of a transistor described in other parts of the specification or a transistor illustrated in other drawings may also be changed in a similar manner.

In the circuit PX, a first terminal of the transistor Tr1 is electrically connected to the wiring SL, and the gate of the transistor Tr1 is electrically connected to the wiring GL, for example. A cathode of the light-emitting device ED is electrically connected to the wiring CT.

Note that the circuit PX sometimes includes a circuit element other than the transistor Tr1 and the light-emitting device ED. For example, the circuit structure of the circuit PX in FIG. 2A may be changed depending on the function that the circuit PX can have, and there is no particular limitation on the electrical connection destination of an anode of the light-emitting device ED and the electrical connection destination of a second terminal of the transistor Tr1 in the circuit PX in FIG. 2A. Thus, the electrical connection destination of the anode of the light-emitting device ED and the electrical connection destination of the second terminal of the transistor Tr1 in the circuit PX are not illustrated in FIG. 2A. A structure example of a display pixel circuit applicable to the circuit PX in FIG. 2A will be described later.

In the circuit PV, for example, a first terminal of the transistor M1 is electrically connected to the wiring OL, the gate of the transistor M1 is electrically connected to the wiring SE, and a second terminal of the transistor M1 is electrically connected to a first terminal of the transistor M2. A second terminal of the transistor M2 is electrically connected to a wiring VDE, and the gate of the transistor M2 is electrically connected to a first terminal of the transistor M3 and a first terminal of the capacitor CV1. A second terminal of the transistor M3 is electrically connected to a wiring VR2, and the gate of the transistor M3 is electrically connected to a wiring RS2. A second terminal of the capacitor CV1 is electrically connected to a first terminal of the transistor M4 and a first terminal of the transistor M5. A second terminal of the transistor M4 is electrically connected to a wiring VR1, and the gate of the transistor M4 is electrically connected to a wiring RS1. A second terminal of the transistor M5 is electrically connected to an anode of the light-receiving device PD, and the gate of the transistor M5 is electrically connected to the wiring TX. A cathode of the light-receiving device PD is electrically connected to the wiring CT.

In this specification and the like, an electrical connection point of the gate of the transistor M2, the first terminal of the transistor M3, and the first terminal of the capacitor CV1 is referred to as a node N2. Similarly, an electrical connection point of the second terminal of the capacitor CV1, the first terminal of the transistor M4, and the first terminal of the transistor M5 is referred to as a node N1.

The wiring VR1, the wiring VR2, and the wiring VDE each function as a wiring supplying a constant potential, for example. It is particularly preferable that the constant potential supplied from the wiring VR1 be a potential equal to the constant potential supplied from the wiring CT, for example. It is also preferable that the constant potential supplied from the wiring VR2 be a potential higher than the constant potential supplied from the wiring VR1, for example. Furthermore, it is preferable that the constant potential supplied from the wiring VDE be, for example, a high-level potential, a potential equal to the constant potential supplied from the wiring VR2, a potential higher than the constant potential supplied from the wiring VR2, or the like.

Operation Example 1

Next, an operation example of the circuit PV included in the circuit AP in FIG. 2A will be described.

Figure 2B:
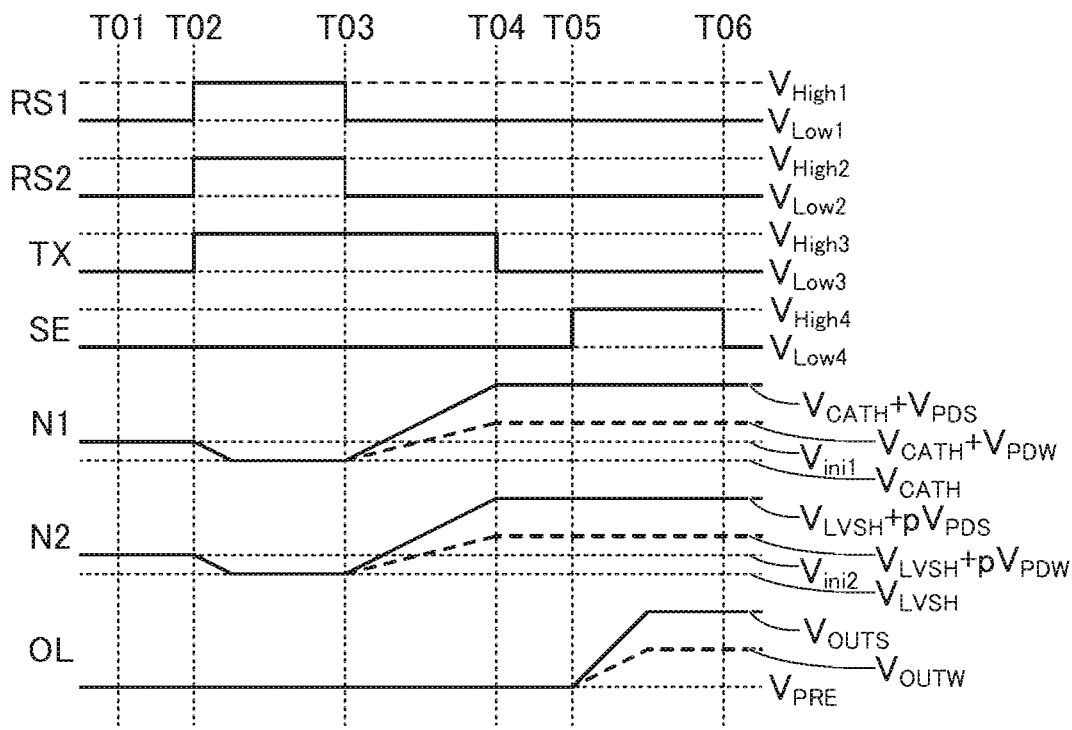
FIG. 2B is a timing chart showing an operation example of the semiconductor device.

FIG. 2B is a timing chart showing an operation example of the circuit AP in FIG. 2A. The timing chart in FIG. 2B shows, for example, changes in the potentials of the wiring RS1, the wiring RS2, the wiring TX, the wiring SE, the node N1, the node N2, and the wiring OL in a period from Time T01 to Time T06 and around the period.

In this operation example, a high-level potential supplied from the wiring RS1 is referred to as $V_{High1}$ and a low-level potential supplied from the wiring RS1 is referred to as $V_{Low1}$. A high-level potential supplied from the wiring RS2 is referred to as $V_{High2}$ and a low-level potential supplied from the wiring RS2 is referred to as $V_{Low2}$. A high-level potential supplied from the wiring TX is referred to as $V_{High3}$ and a low-level potential supplied from the wiring TX is referred to as $V_{Low3}$. A high-level potential supplied from the wiring SE is referred to as $V_{High4}$ and a low-level potential supplied from the wiring SE is referred to as $V_{Low4}$.

In this operation example, a constant voltage supplied from the wiring VR1 is referred to as $V_{CATH}$ and a constant voltage supplied from the wiring VR2 is referred to as $V_{LVSH}$. A constant voltage supplied from the wiring VDE is referred to as $V_{DD}$. A constant voltage supplied from the wiring CT is referred to as $V_{CATH}$, which is the same as the constant voltage supplied from the wiring VR1.

Before Time T01, the wiring OL is precharged with $V_{PRE}$, for example. Note that the timing at which the wiring OL is precharged with $V_{PRE}$ is not necessarily before Time T01 and may be any timing between Time T01 and Time T05. After the wiring OL is precharged with the potential $V_{PRE}$, the wiring OL is brought into a floating state.

Note that in this operation example, $V_{LVSH}$ is a potential higher than $V_{CATH}$. Furthermore, $V_{LVSH}$ and $V_{PRE}$ may be potentials equal to each other. Moreover, $V_{DD}$ is a potential higher than $V_{CATH}$, $V_{LVSH}$, and $V_{PRE}$.

Note that $V_{High4}$ and $V_{PRE}$ re potentials set such that a difference between $V_{High4}$ and $V_{PRE}$ is higher than the threshold voltage of the transistor M4, and $V_{Low4}$ and $V_{PRE}$ are potentials set such that a difference between $V_{Low4}$ and $V_{PRE}$ is lower than or equal to the threshold voltage of the transistor M4.

Furthermore, $V_{High1}$ and $V_{CATH}$ are potentials set such that a difference between $V_{High1}$ and $V_{CATH}$ is higher than the threshold voltage of the transistor M4, and $V_{Low1}$ and $V_{CATH}$ are potentials set such that a difference between $V_{Low1}$ and $V_{CATH}$ is lower than or equal to the threshold voltage of the transistor M4. In addition, $V_{High2}$ and $V_{LVSH}$ are potentials set such that a difference between $V_{High2}$ and $V_{LVSH}$ is higher than the threshold voltage of the transistor M3, and $V_{Low2}$ and $V_{LVSH}$ are potentials set such that a difference between $V_{Low2}$ and $V_{LVSH}$ is lower than or equal to the threshold voltage of the transistor M3. Moreover, $V_{High3}$ and $V_{CATH}$ are potentials set such that a difference between $V_{High3}$ and $V_{CATH}$ is higher than the threshold voltage of the transistor M5, and $V_{Low3}$ and $V_{CATH}$ are potentials set such that a difference between $V_{Low3}$ and $V_{CATH}$ is lower than or equal to the threshold voltage of the transistor M5.

Accordingly, in the case where the threshold voltages of the transistor M4 and the transistor M5 are equal to each other, $V_{High1}$ and $V_{High3}$ may be potentials equal to each other and $V_{Low1}$ and $V_{Low3}$ may be potentials equal to each other.

[From Time T01 to Time T02]

In a period from Time T01 to Time T02, the low-level potential ($V_{Low3}$) is input to the wiring TX, the low-level potential ($V_{Low1}$) is input to the wiring RS1, the low-level potential ($V_{Low2}$) is input to the wiring RS2, and the low-level potential ($V_{Low4}$) is input to the wiring SE.

The potentials of the node N1 and the node N2 in the period from Time T01 to Time T02 are $V_{ini1}$ and $V_{ini2}$, respectively. Note that each of $V_{ini1}$ and $V_{ini2}$ is a potential higher than or equal to $V_{CATH}$, for example. Each of $V_{ini1}$ and $V_{ini2}$ can be a potential corresponding to imaging data captured by the circuit PV before Time T01, for example.

The low-level potential ($V_{Low1}$) from the wiring RS1 is applied to the gate of the transistor M4, and the gate-source voltage of the transistor M4 becomes $V_{Low1} - V_{CATH}$. Since $V_{Low1} - V_{CATH}$ is lower than or equal to the threshold voltage of the transistor M4, the transistor M4 is in the off state.

The low-level potential ($V_{Low3}$) from the wiring TX is applied to the gate of the transistor M5. At this time, the gate-source voltage of the transistor M5 is lower than or equal to the threshold voltage of the transistor M5, and the transistor M5 is in the off state.

The low-level potential ($V_{Low2}$) from the wiring RS2 is applied to the gate of the transistor M3, and the gate-source voltage of the transistor M3 becomes $V_{Low2} - V_{LVSH}$. Since $V_{Low2} - V_{LVSH}$ is lower than or equal to the threshold voltage of the transistor M3, the transistor M3 is in the off state.

The low-level potential ($V_{Low4}$) from the wiring SE is applied to the gate of the transistor M1. At this time, the gate-source voltage of the transistor M1 is lower than or equal to the threshold voltage of the transistor M1, and the transistor M1 is in the off state.

In the period from Time T01 to Time T02, $V_{ini2}$ is applied to the gate of the transistor M2 and the potential $V_{DD}$ from the wiring VDE is applied to the second terminal of the transistor M2. Here, the potential of the first terminal of the transistor M2 is lower than $V_{DD}$ and the first terminal of the transistor M2 functions as a source. Note that the transistor M2 is turned on depending on the gate-source voltage of the transistor M2 but the transistor M1 is in the off state as described above; thus, current does not flow from the wiring VDE to the wiring OL through the transistor M2 and the transistor M1.

[From Time T02 to Time T03]

In a period from Time T02 to Time T03, the high-level potential ($V_{High1}$) is input to the wiring RS1, and the high-level potential ($V_{High2}$) is input to the wiring RS2. The high-level potential ($V_{High3}$) is input to the wiring TX.

At this time, the high-level potential ($V_{High1}$) from the wiring RS1 is applied to the gate of the transistor M4, and the gate-source voltage of the transistor M4 becomes $V_{High1} - V_{CATH}$. Since $V_{High1} - V_{CATH}$ is higher than the threshold voltage of the transistor M4, the transistor M4 is turned on. Thus, electrical continuity is established between the wiring VR1 and the first terminal of the transistor M5 (the second terminal of the capacitor CV1 or the node N1), and the potential of the first terminal of the transistor M5 (the second terminal of the capacitor CV1 or the node N1) becomes $V_{CATH}$.

In addition, the high-level potential ($V_{High3}$) from the wiring TX is applied to the gate of the transistor M5, and the gate-source voltage of the transistor M5 becomes $V_{High3} - V_{CATH}$. Since $V_{High3} - V_{CATH}$ is higher than the threshold voltage of the transistor M5, the transistor M5 is turned on. Thus, electrical continuity is established between the wiring VR1 and the anode of the light-receiving device PD, and the potential of the anode of the light-receiving device PD becomes $V_{CATH}$.

At this time, the anode-cathode voltage of the light-receiving device PD becomes 0 V; thus, current does not flow between the anode and the cathode of the light-receiving device PD. The high-level potential ($V_{High2}$) from the wiring RS2 is applied to the gate of the transistor M3, and the gate-source voltage of the transistor M3 becomes $V_{High2} - V_{LVSH}$. Since $V_{High2} - V_{LVSH}$ is higher than the threshold voltage of the transistor M3, the transistor M3 is turned on. Thus, electrical continuity is established between the wiring VR2 and the gate of the transistor M2 (the first terminal of the capacitor CV1 or the node N2), and the potential of the gate of the transistor M2 (the first terminal of the capacitor CV1 or the node N2) becomes $V_{LVSH}$.

Accordingly, in the period from Time T02 to Time T03, the potential $V_{LVSH}$ is applied to the gate of the transistor M2 and the potential $V_{DD}$ from the wiring VDE is applied to the second terminal of the transistor M2. Here, as in the period from Time T01 to Time T02, the potential of the first terminal of the transistor M2 is lower than $V_{DD}$ and the first terminal of the transistor M2 functions as the source. Although the transistor M2 is turned on depending on the gate-source voltage of the transistor M2, the transistor M2 is preferably in the off state in the period from Time T02 to Time T03. Since the transistor M1 is in the off state as in the period from Time T01 to Time T02, current does not flow from the wiring VDE to the wiring OL through the transistor M2 and the transistor M1.

[From Time T03 to Time T04]

In a period from Time T03 to Time T04, the low-level potential ($V_{Low1}$) is input to the wiring RS1, and the low-level potential ($V_{Low2}$) is input to the wiring RS2.

The low-level potential ($V_{Low1}$) from the wiring RS1 is applied to the gate of the transistor M4, and the gate-source voltage of the transistor M4 becomes $V_{Low1}-V_{CATH}$. Since $V_{Low1}-V_{CATH}$ is lower than or equal to the threshold voltage of the transistor M4, the transistor M4 is turned off.

The low-level potential ($V_{Low2}$) from the wiring RS2 is applied to the gate of the transistor M3, and the gate-source voltage of the transistor M3 becomes $V_{Low2}-V_{LVSH}$. Since $V_{Low2}-V_{LVSH}$ is lower than or equal to the threshold voltage of the transistor M3, the transistor M3 is turned off. Thus, the first terminal of the capacitor CV1 (the node N2) is brought into a floating state.

Note that the transistor M5 remains in the on state since before Time T03.

Here, when the light-receiving device PD is irradiated with light, current flows in the direction from the cathode to the anode of the light-receiving device PD. Since the transistor M4 is in the off state and the transistor M5 is in the on state, positive charge due to the current flows to the node N1 only for a period during which the transistor M5 is on and is accumulated in the second terminal of the capacitor CV1. Assuming that the transistor M5 is turned off at Time T04, the potential of the second terminal of the capacitor CV1 (the node N1) continuously increases in the period from Time T03 to Time T04.

In the period from Time T03 to Time T04, the amount of positive charge accumulated in the second terminal of the capacitor CV1 (the node N1) depends on the amount of current flowing through the light-receiving device PD; thus, the amount of potential change per unit time in the second terminal of the capacitor CV1 (the node N1) is determined. The amount of current flowing through the light-receiving device PD depends on the intensity of light incident on the light-receiving device PD. Here, the case where the intensity of light incident on the light-receiving device PD is first intensity and the case where the intensity of light incident on the light-receiving device PD is second intensity are considered, for example. Assuming that light with the first intensity is more intense than light with the second intensity, the amount of potential change per unit time in the second terminal of the capacitor CV1 (the node N1) is larger in the case where the light with the first intensity is incident on the light-receiving device than in the case where the light with the second intensity is incident on the light-receiving device.

In this operation example, for example, in the case where the light with the first intensity is incident on the light-receiving device PD, the potential of the node N1 changes from $V_{CATH}$ to $V_{CATH}+V_{PDS}$ (this potential change of the node N1 is denoted by a solid line in FIG. 2B); and in the case where the light with the second intensity is incident on the light-receiving device PD, the potential of the node N1 changes from $V_{CATH}$ to $V_{CATH}+V_{PDW}$ (this potential change of the node N1 is denoted by a thick dashed line in FIG. 2B). Note that $V_{PDS}$ and $V_{PDW}$ satisfy a relational expression of $0<V_{PDS}<V_{PDW}$, and are voltages determined by the intensity of light incident on the light-receiving device PD.

The potential changes of the node N1 shown in FIG. 2B are examples, and the potential of the node N1 at Time T04 sometimes becomes a value other than $V_{CATH}+V_{PDS}$ and $V_{CATH}+V_{PDW}$ depending on the intensity of light incident on the light-receiving device PD.

Since the first terminal of the capacitor CV1 (the node N2) is in a floating state in the period from Time T03 to Time T04, the potential of the first terminal of the capacitor CV1 (the node N2) increases with increasing potential of the second terminal of the capacitor CV1 (the node N1) owing to the capacitive coupling of the capacitor CV1. The amount of potential change of the first terminal of the capacitor CV1 (the node N2) is obtained by multiplying the amount of potential change of the second terminal of the capacitor CV1 (the node N1) by a capacitive coupling coefficient determined by the peripheral components of the first terminal of the capacitor CV1 (the node N2). The capacitive coupling coefficient is calculated using the capacitance value of the capacitor CV1, the gate capacitance of the transistor M2, and the parasitic capacitance, for example. Here, assuming that the capacitive coupling coefficient due to the capacitor CV1 is p, the potential of the first terminal of the capacitor CV1 (the node N2) changes from $V_{LVSH}$ to $V_{LVSH}+pV_{PDS}$ (this potential change of the node N2 is denoted by a solid line in FIG. 2B) in the case where the light with the first intensity is incident on the light-receiving device PD; the potential of the first terminal of the capacitor CV1 (the node N2) changes from $V_{LVSH}$ to $V_{LVSH}+pV_{PDW}$ (this potential change of the node N2 is denoted by a thick dashed line in FIG. 2B) in the case where the light with the second intensity is incident on the light-receiving device PD.

[From Time T04 to Time T05]

At Time T04, the low-level potential ($V_{Low3}$) is input to the wiring TX.

At this time, the low-level potential ($V_{Low3}$) from the wiring TX is applied to the gate of the transistor M5. At this time, the gate-source voltage of the transistor M5 is lower than or equal to the threshold voltage of the transistor M5, and the transistor M5 is turned off.

Accordingly, accumulation of positive charge (a potential increase) in the first terminal of the capacitor CV1 (the node N2) due to the anode-cathode current of the light-receiving device PD, which is performed by the operation from Time T03 to Time T04, is completed.

[From Time T05 to Time T06]

In a period from Time T05 to Time T06, the high-level potential ($V_{High4}$) is input to the wiring SE.

The high-level potential ($V_{High4}$) from the wiring SE is applied to the gate of the transistor M1. At this time, the gate-source voltage of the transistor M1 becomes $V_{High4}-V_{PRE}$. Since $V_{High4}-V_{PRE}$ is higher than the threshold voltage of the transistor M1, the transistor M1 is turned on.

In the case where the light with the first intensity is incident on the light-receiving device PD in the period from Time T03 to Time T04, $V_{LVSH}+pV_{PDS}$ is applied to the gate of the transistor M2 and the potential $V_{DD}$ from the wiring VDE is applied to the second terminal of the transistor M2 in the period from Time T05 to Time T06. Moreover, since the transistor M1 is in the on state, $V_{PRE}$ with which the wiring OL is precharged is applied to the first terminal of the transistor M2.

At this time, the gate-source voltage of the transistor M2 becomes $V_{LVSH}+pV_{PDS}-V_{PRE}$, and current corresponding to the gate-source voltage $V_{LVSH}+pV_{PDS}-V_{PRE}$ flows between the source and the drain of the transistor M2. Here, the wiring OL is in a floating state; thus, the potential of the wiring OL increases over time. Hence, when current flows between the source and the drain of the transistor M2, the gate-source voltage of the transistor M2 becomes lower; ideally, the transistor M2 is turned off when the gate-source voltage of the transistor M2 becomes equal to the threshold voltage of the transistor M2. The potential of the wiring OL at this time is $V_{OUTS}$ (this potential change of the wiring OL is denoted by a solid line in FIG. 2B).

In the case where the light with the second intensity is incident on the light-receiving device PD in the period from Time T03 to Time T04, $V_{LVSH}+pV_{PDW}$ is applied to the gate of the transistor M2 and the potential $V_{DD}$ from the wiring VDE is applied to the second terminal of the transistor M2 in the period from Time T05 to Time T06. Moreover, since the transistor M1 is in the on state, $V_{PRE}$ with which the wiring OL is precharged is applied to the first terminal of the transistor M2.

At this time, the gate-source voltage of the transistor M2 becomes $V_{LVSH}+pV_{PDW}-V_{PRE}$, and current corresponding to the gate-source voltage $V_{LVSH}+pV_{PDW}-V_{PRE}$ flows between the source and the drain of the transistor M2. Here, the wiring OL is in a floating state; thus, the potential of the wiring OL increases over time. Hence, when current flows between the source and the drain of the transistor M2, the gate-source voltage of the transistor M2 becomes lower; ideally, the transistor M2 is turned off when the gate-source voltage of the transistor M2 becomes equal to the threshold voltage of the transistor M2. The potential of the wiring OL at this time is $V_{OUTW}$ (this potential change of the wiring OL is denoted by a thick dashed line in FIG. 2B).

Note that as for the gate-source voltage of the transistor M2, $V_{LVSH}+pV_{PDS}-V_{PRE}$ is higher than $V_{LVSH}+pV_{PDW}-V_{PRE}$; thus, $V_{OUTS}$ becomes a voltage higher than $V_{OUTW}$.

[After Time T06]

After Time T06, the low-level potential ($V_{Low4}$) is input to the wiring SE.

The low-level potential ($V_{Low4}$) from the wiring SE is applied to the gate of the transistor M1. At this time, the gate-source voltage of the transistor M1 is lower than or equal to the threshold voltage of the transistor M1, and the transistor M1 is turned off.

The potential of the wiring OL is read at this time, whereby imaging data captured by the light-receiving device PD in the period from Time T03 to Time T04 can be obtained from the circuit PV.

Note that the operation of the semiconductor device of one embodiment of the present invention is not limited to the operation example in the timing chart of FIG. 2B and may be changed as appropriate as long as an object is achieved.

For example, the high-level potentials are input to the wiring RS1, the wiring RS2, and the wiring TX at the same time in the period from Time T02 to Time T03 in the timing chart of FIG. 2B; however, the operation of the semiconductor device of one embodiment of the present invention may be an operation in which the high-level potentials are input to the wiring RS1, the wiring RS2, and the wiring TX in a given order in the period from Time T02 to Time T03. Specifically, for example, the high-level potentials may be input to the wirings in the following order: the wiring RS1, the wiring RS2, and the wiring TX. Alternatively, for example, the high-level potentials may be input to the wirings in the following order: the wiring RS1, the wiring TX, and the wiring RS2. Alternatively, for example, the high-level potentials may be input to the wirings in the following order: the wiring TX, the wiring RS1, and the wiring RS2. Alternatively, for example, the high-level potentials may be input to the wirings in the following order: the wiring TX, the wiring RS2, and the wiring RS1.

Alternatively, for example, in the operation of the semiconductor device of one embodiment of the present invention in the period from Time T02 to Time T03, the high-level potentials may be input to two wirings selected from the wiring RS1, the wiring RS2, and the wiring TX at the same time before or after the high-level potential is input to the other one wiring. Specifically, for example, after the high-level potential is input to the wiring TX, the high-level potentials may be input to the wiring RS1 and the wiring RS2.

Note that the modification example of the operation in the period from Time T02 to Time T03 in the timing chart of FIG. 2B is described above, and the operation in the period other than the period from Time T02 to Time T03 in the timing chart of FIG. 2B may be changed.

As described above, with the use of the circuit AP in FIG. 2A as the pixel circuit included in the display apparatus or the like, the wiring CT supplying a common constant voltage can be electrically connected to the cathode of the light-emitting device included in the circuit PX serving as the display pixel circuit and the cathode of the light-receiving device included in the circuit PV serving as the imaging pixel circuit.

Specific Example 2

Figure 3A:
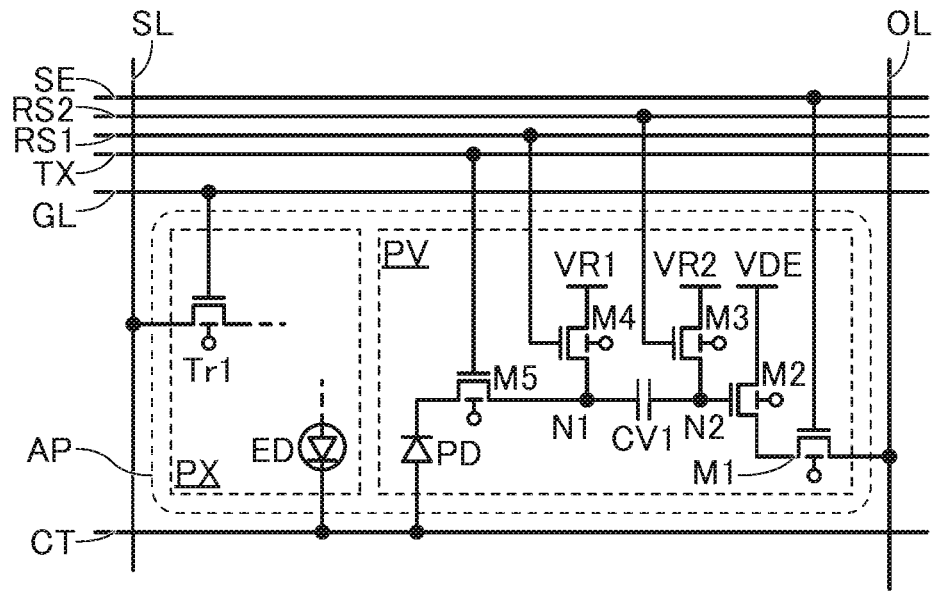
FIG. 3A is a circuit diagram illustrating a structure example of a semiconductor device.

Not only the circuit structure of the circuit AP in FIG. 2A but also that of the circuit AP illustrated in FIG. 3A may be employed as the circuit structure applicable to the circuit AP in FIG. 1A or FIG. 1B.

The circuit AP in FIG. 3A is a modification example of the circuit AP in FIG. 2A and differs from the circuit AP in FIG. 2A in that the electrical connection destinations of the anode and the cathode of the light-receiving device PD are interchanged with each other. Specifically, for example, in the circuit AP in FIG. 3A, the anode of the light-receiving device PD is electrically connected to the wiring CT and the cathode of the light-receiving device PD is electrically connected to the second terminal of the transistor M5.

Operation Example 2

Next, an operation example of the circuit PV included in the circuit AP in FIG. 3A will be described.

Figure 3B:
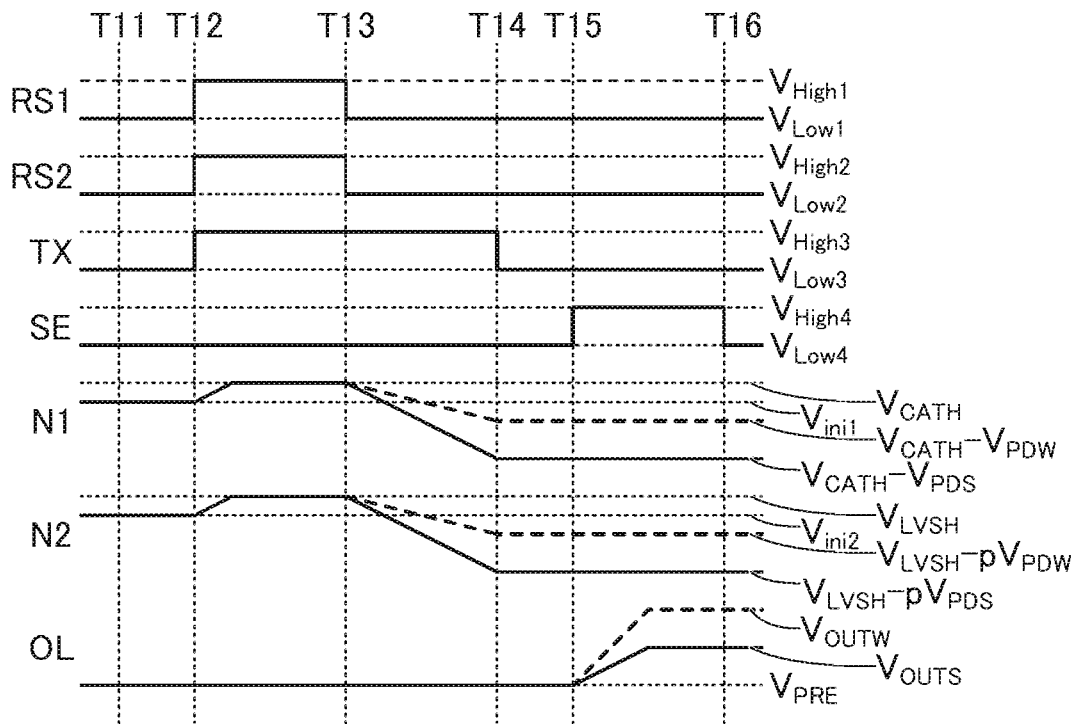
FIG. 3B is a timing chart showing an operation example of the semiconductor device.

FIG. 3B is a timing chart showing an operation example of the circuit AP in FIG. 3A. The timing chart in FIG. 3B shows, for example, changes in the potentials of the wiring RS1, the wiring RS2, the wiring TX, the wiring SE, the node N1, the node N2, and the wiring OL in a period from Time T11 to Time T16 and around the period.

Note that the description of the contents already described with reference to the timing chart in FIG. 2B is sometimes omitted in the description of the operation example of the circuit AP in FIG. 3A.

[From Time T11 to Time T12]

In a period from Time T11 to Time T12, as in the period from Time T01 to Time T02 in the timing chart of FIG. 2B, the low-level potential ($V_{Low3}$) is input to the wiring TX, the low-level potential ($V_{Low1}$) is input to the wiring RS1, the low-level potential ($V_{Low2}$) is input to the wiring RS2, and the low-level potential ($V_{Low4}$) is input to the wiring SE. Since the potentials supplied to the wiring TX, the wiring RS1, the wiring RS2, and the wiring SE are the same as the above-described potentials supplied to the wirings in the period from Time T01 to Time T02 in the timing chart of FIG. 2B, refer to the operation example in the period from Time T01 to Time T02 in the timing chart of FIG. 2B for the switching operations of the transistor M1 to the transistor M5 included in the circuit PV.

The potentials of the node N1 and the node N2 in the period from Time T11 to Time T12 are $V_{ini1}$ and $V_{ini2}$, respectively. Note that $V_{ini1}$ and $V_{ini2}$ here are different from those in the timing chart of FIG. 2B and are each a potential lower than or equal to $V_{CATH}$, for example. Each of $V_{ini1}$ and $V_{ini2}$ can be a potential corresponding to imaging data captured by the circuit PV before Time T11, for example.

[From Time T12 to Time T13]

In a period from Time T12 to Time T13, the high-level potential ($V_{High1}$) is input to the wiring RS1 and the high-level potential ($V_{High2}$) is input to the wiring RS2, as in the period from Time T02 to Time T03 in the timing chart of FIG. 2B. The high-level potential ($V_{High3}$) is input to the wiring TX.

At this time, the high-level potential ($V_{High1}$) from the wiring RS1 is applied to the gate of the transistor M4. The potential $V_{ini1}$ of the first terminal of the transistor M4 is lower than the potential $V_{CATH}$ of the second terminal of the transistor M4; thus, the gate-source voltage of the transistor M4 becomes $V_{High1}-V_{ini1}$. Since $V_{High1}-V_{ini1}$ is higher than the threshold voltage of the transistor M4, the transistor M4 is turned on. Thus, electrical continuity is established between the wiring VR1 and the first terminal of the transistor M5 (the second terminal of the capacitor CV1 or the node N1), and the potential of the first terminal of the transistor M5 (the second terminal of the capacitor CV1 or the node N1) becomes $V_{CATH}$.

For the switching operation of the transistor M5, refer to the operation example in the period from Time T02 to Time T03 in the timing chart of FIG. 2B.

Specifically, the transistor M5 is turned on, so that the potential $V_{CATH}$ from the wiring VR1 is supplied to the cathode of the light-receiving device. At this time, the anode-cathode voltage of the light-receiving device PD becomes 0 V; thus, current does not flow between the anode and the cathode of the light-receiving device PD.

The high-level potential ($V_{High2}$) from the wiring RS2 is applied to the gate of the transistor M3. The potential $V_{ini2}$ of the first terminal of the transistor M3 is lower than the potential $V_{LVSH}$ of the second terminal of the transistor M3; thus, the gate-source voltage of the transistor M3 becomes $V_{High2}-V_{ini2}$. Since $V_{High2}-V_{ini2}$ is higher than the threshold voltage of the transistor M3, the transistor M3 is turned on. Thus, electrical continuity is established between the wiring VR2 and the gate of the transistor M2 (the first terminal of the capacitor CV1 or the node N2), and the potential of the gate of the transistor M2 (the first terminal of the capacitor CV1 or the node N2) becomes $V_{LVSH}$.

Accordingly, in the period from Time T12 to Time T13, $V_{LVSH}$ is applied to the gate of the transistor M2 and the potential $V_{DD}$ from the wiring VDE is applied to the second terminal of the transistor M2. Here, as in the period from Time T01 to Time T02, the potential of the first terminal of the transistor M2 is lower than $V_{DD}$ and the first terminal of the transistor M2 functions as the source. Although the transistor M2 is turned on depending on the gate-source voltage of the transistor M2, the transistor M1 is in the off state and thus current does not flow from the wiring VDE to the wiring OL through the transistor M2 and the transistor M1.

[From Time T13 to Time T14]

In a period from Time T13 to Time T14, the low-level potential ($V_{Low1}$) is input to the wiring RS1 and the low-level potential ($V_{Low2}$) is input to the wiring RS2, as in the period from Time T03 to Time T04 in the timing chart of FIG. 2B.

For the switching operations of the transistor M3 to the transistor M5, refer to the operation example in the period from Time T03 to Time T04 in the timing chart of FIG. 2B. Specifically, in the period from Time T13 to Time T14, the transistor M3 and the transistor M4 are turned off. In particular, the first terminal of the capacitor CV1 (the node N2) is brought into a floating state at this time. The transistor M5 remains in the on state since before Time T13.

Here, when the light-receiving device PD is irradiated with light, current flows in the direction from the cathode to the anode of the light-receiving device PD. Since the transistor M4 is in the off state and the transistor M5 is in the on state, positive charge due to the current flows to the wiring CT only for a period during which the transistor M5 is on. In other words, negative charge is accumulated in the second terminal of the capacitor CV1 (the node N1). Assuming that the transistor M5 is turned off at Time T14, the potential of the second terminal of the capacitor CV1 (the node N1) continuously decreases in the period from Time T13 to Time T14.

In the period from Time T13 to Time T14, the amount of negative charge accumulated in the second terminal of the capacitor CV1 (the node N1) depends on the amount of current flowing through the light-receiving device PD; thus, the amount of potential change per unit time in the second terminal of the capacitor CV1 (the node N1) is determined. The amount of current flowing through the light-receiving device PD depends on the intensity of light incident on the light-receiving device PD. Here, the case where the intensity of light incident on the light-receiving device PD is first intensity and the case where the intensity of light incident on the light-receiving device PD is second intensity are considered, for example, as in the timing chart of FIG. 2B. Assuming that light with the first intensity is more intense than light with the second intensity, the amount of potential change per unit time in the second terminal of the capacitor CV1 (the node N1) is larger in the case where the light with the first intensity is incident on the light-receiving device than in the case where the light with the second intensity is incident on the light-receiving device.

In this operation example, for example, in the case where the light with the first intensity is incident on the light-receiving device PD, the potential of the node N1 changes from $V_{CATH}$ to $V_{CATH}-V_{PDS}$ (this potential change of the node N1 is denoted by a solid line in FIG. 3B); and in the case where the light with the second intensity is incident on the light-receiving device PD, the potential of the node N1 changes from $V_{CATH}$ to $V_{CATH}-V_{PDW}$ (this potential change of the node N1 is denoted by a thick dashed line in FIG. 3B). Note that $V_{PDS}$ and $V_{PDW}$ satisfy a relational expression of $V_{PDS}<V_{PDW}<0$, and are voltages determined by the intensity of light incident on the light-receiving device PD.

The potential changes of the node N1 shown in FIG. 3B are examples, and the potential of the node N1 at Time T14 sometimes becomes a value other than $V_{CATH}-V_{PDS}$ and $V_{CATH}-V_{PDW}$ depending on the intensity of light incident on the light-receiving device PD.

Since the first terminal of the capacitor CV1 (the node N2) is in a floating state in the period from Time T13 to Time T14, the potential of the first terminal of the capacitor CV1 (the node N2) increases with increasing potential of the second terminal of the capacitor CV1 (the node N1) owing to the capacitive coupling of the capacitor CV1. The amount of potential change of the first terminal of the capacitor CV1 (the node N2) is obtained by multiplying the amount of potential change of the second terminal of the capacitor CV1 (the node N1) by a capacitive coupling coefficient determined by the peripheral components of the first terminal of the capacitor CV1 (the node N2). The capacitive coupling coefficient is calculated using the capacitance value of the capacitor CV1, the gate capacitance of the transistor M2, the parasitic capacitance, and the like, for example. Here, assuming that the capacitive coupling coefficient due to the capacitor CV1 is p, as in the timing chart of FIG. 2B, the potential of the first terminal of the capacitor CV1 (the node N2) changes from $V_{LVSH}$ to $V_{LVSH}-pV_{PDS}$ (this potential change of the node N2 is denoted by a solid line in FIG. 3B) in the case where the light with the first intensity is incident on the light-receiving device PD; the potential of the first terminal of the capacitor CV1 (the node N2) changes from $V_{LVSH}$ to $V_{LVSH}-pV_{PDW}$ (this potential change of the node N2 is denoted by a thick dashed line in FIG. 3B) in the case where the light with the second intensity is incident on the light-receiving device PD.

[From Time T14 to Time T15]

At Time T14, the low-level potential ($V_{Low3}$) is input to the wiring TX as in Time T04 in the timing chart of FIG. 2B.

For the switching operation of the transistor M5, refer to the operation example in the period from Time T04 to Time T05 in the timing chart of FIG. 2B. Specifically, the transistor M5 is turned off at Time T14.

Accordingly, accumulation of negative charge (a potential decrease) in the second terminal of the capacitor CV1 (the node N1) due to the anode-cathode current of the light-receiving device PD, which is performed by the operation from Time T13 to Time T14, is completed.

[From Time T15 to Time T16]

In a period from Time T15 to Time T16, the high-level potential ($V_{High4}$) is input to the wiring SE as in the period from Time T05 to Time T06 in the timing chart of FIG. 2B.

For the switching operation of the transistor M1, refer to the operation example in the period from Time T05 to Time T06 in the timing chart of FIG. 2B. Specifically, the transistor M1 is in the on state in the period from Time T15 to Time T16.

In the case where the light with the first intensity is incident on the light-receiving device PD in the period from Time T13 to Time T14, $V_{LVSH}+pV_{PDS}$ is applied to the gate of the transistor M2 and the potential $V_{DD}$ from the wiring VDE is applied to the second terminal of the transistor M2 in the period from Time T15 to Time T16. Moreover, since the transistor M1 is in the on state, $V_{PRE}$ with which the wiring OL is precharged is applied to the first terminal of the transistor M2.

At this time, the gate-source voltage of the transistor M2 becomes $V_{LVSH}+pV_{PDS}-V_{PRE}$, and current corresponding to the gate-source voltage $V_{LVSH}+pV_{PDS}-V_{PRE}$ flows between the source and the drain of the transistor M2. Here, the wiring OL is in a floating state; thus, the potential of the wiring OL increases over time. Hence, when current flows between the source and the drain of the transistor M2, the gate-source voltage of the transistor M2 becomes lower; ideally, the transistor M2 is turned off when the gate-source voltage of the transistor M2 becomes equal to the threshold voltage of the transistor M2. The potential of the wiring OL at this time is $V_{OUTS}$ (this potential change of the wiring OL is denoted by a solid line in FIG. 3B).

In the case where the light with the second intensity is incident on the light-receiving device PD in the period from Time T13 to Time T14, $V_{LVSH}+pV_{PDW}$ is applied to the gate of the transistor M2 and the potential $V_{DD}$ from the wiring VDE is applied to the second terminal of the transistor M2 in the period from Time T15 to Time T16. Moreover, since the transistor M1 is in the on state, $V_{PRE}$ with which the wiring OL is precharged is applied to the first terminal of the transistor M2.

At this time, the gate-source voltage of the transistor M2 becomes $V_{LVSH}+pV_{PDW}-V_{PRE}$, and current corresponding to the gate-source voltage $V_{LVSH}+pV_{PDW}-V_{PRE}$ flows between the source and the drain of the transistor M2. Here, the wiring OL is in a floating state; thus, the potential of the wiring OL increases over time. Hence, when current flows between the source and the drain of the transistor M2, the gate-source voltage of the transistor M2 becomes lower; ideally, the transistor M2 is turned off when the gate-source voltage of the transistor M2 becomes equal to the threshold voltage of the transistor M2. The potential of the wiring OL at this time is $V_{OUTW}$ (this potential change of the wiring OL is denoted by a thick dashed line in FIG. 3B).

Note that as for the gate-source voltage of the transistor M2, $V_{LVSH}+pV_{PDS}-V_{PRE}$ is lower than $V_{LVSH}+pV_{PDW}-V_{PRE}$; thus, $V_{OUTS}$ becomes a voltage lower than $V_{OUTW}$.

[After Time T16]

After Time T16, the low-level potential ($V_{Low4}$) is input to the wiring SE as in the period after Time T06 in the timing chart of FIG. 2B.

For the switching operation of the transistor M1, refer to the operation example in the period after Time T06 in the timing chart of FIG. 2B. Specifically, the transistor M1 is in the off state after Time T16.

The potential of the wiring OL is read at this time, whereby imaging data captured by the light-receiving device PD in the period from Time T13 to Time T14 can be obtained from the circuit PV.

The semiconductor device of one embodiment of the present invention can be suitably used for a display apparatus. As described above, with the use of the circuit AP in FIG. 3A as the pixel circuit included in the display apparatus or the like, a wiring supplying a common constant potential can be electrically connected to the cathode of the light-emitting device included in the circuit PX serving as the display pixel circuit and the cathode or the anode of the light-receiving device included in the circuit PV serving as the imaging pixel circuit.

Note that the operation of the semiconductor device of one embodiment of the present invention is not limited to the operation example in the timing chart of FIG. 3B and may be changed as appropriate as long as an object is achieved.

For example, the high-level potentials are input to the wiring RS1, the wiring RS2, and the wiring TX at the same time in the period from Time T12 to Time T13 in the timing chart of FIG. 3B; however, the operation of the semiconductor device of one embodiment of the present invention may be an operation in which the high-level potentials are input to the wiring RS1, the wiring RS2, and the wiring TX in a given order in the period from Time T12 to Time T13. Specifically, for example, the high-level potentials may be input to the wirings in the following order: the wiring RS1, the wiring RS2, and the wiring TX. Alternatively, for example, the high-level potentials may be input to the wirings in the following order: the wiring RS1, the wiring TX, and the wiring RS2. Alternatively, for example, the high-level potentials may be input to the wirings in the following order: the wiring TX, the wiring RS1, and the wiring RS2. Alternatively, for example, the high-level potentials may be input to the wirings in the following order: the wiring TX, the wiring RS2, and the wiring RS1.

Alternatively, for example, in the operation of the semiconductor device of one embodiment of the present invention in the period from Time T12 to Time T13, the high-level potentials may be input to two wirings selected from the wiring RS1, the wiring RS2, and the wiring TX at the same time before or after the high-level potential is input to the other one wiring. Specifically, for example, after the high-level potential is input to the wiring TX, the high-level potentials may be input to the wiring RS1 and the wiring RS2.

Note that the modification example of the operation in the period from Time T12 to Time T13 in the timing chart of FIG. 3B is described above, and the operation in the period other than the period from Time T12 to Time T13 in the timing chart of FIG. 3B may be changed.

Specific Example 3

The semiconductor device of one embodiment of the present invention is not limited to having the circuit structure illustrated in FIG. 2A, FIG. 3A, or the like. The structure of the semiconductor device of one embodiment of the present invention may be changed as appropriate as long as an object is achieved.

Figure 4A:
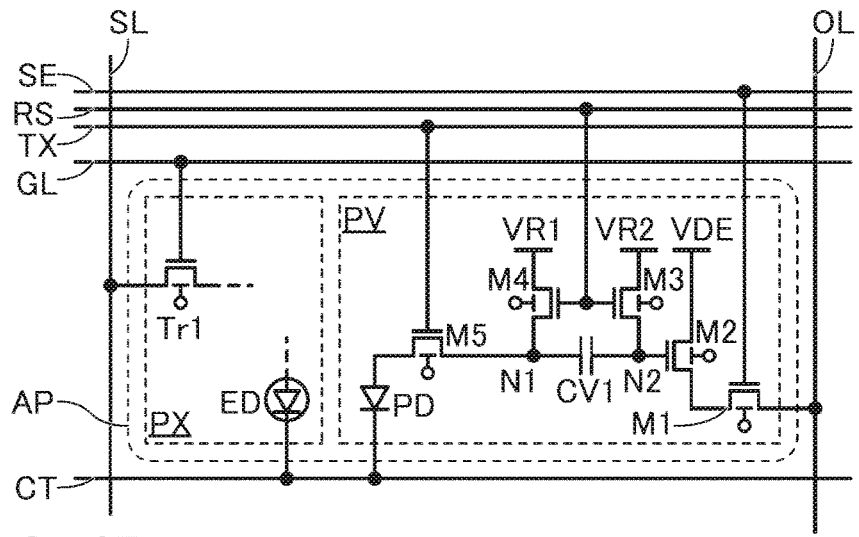
FIG. 4A to FIG. 4C are circuit diagrams illustrating structure examples of a semiconductor device.

The circuit AP illustrated in FIG. 4A is a modification example of the circuit AP in FIG. 2A and differs from the circuit AP in FIG. 2A in that the gate of the transistor M3 and the gate of the transistor M4 are electrically connected to each other. The circuit AP in FIG. 4A differs from the circuit AP in FIG. 2A also in that the gates of the transistor M3 and the transistor M4 are electrically connected to the wiring RS.

Like the wiring RS1 or the wiring RS2 described for the circuit AP in FIG. 1A, the wiring RS illustrated in FIG. 4A for the circuit AP functions as a wiring transmitting a trigger signal for resetting imaging data captured by the light-receiving device, for example. The trigger signal can be the high-level potential ($V_{High2}$) supplied from the wiring RS2 or the low-level potential ($V_{LOW1}$) supplied from the wiring RS1, which is described for the circuit AP in FIG. 2A, for example.

The ranges of voltages applied to the source, the drain, and the gate are different between the transistor M3 and the transistor M4 in each of the circuit PV in FIG. 2A and the circuit PV in FIG. 3A. Thus, in the case where the circuit PV is driven with the structure in which the gate of the transistor M3 and the gate of the transistor M4 are electrically connected to each other in FIG. 4A, the gate-source voltages and the gate-drain voltages of the transistor M3 and the transistor M4 are sometimes higher than those in the circuit PV in FIG. 2A and the circuit PV in FIG. 3A. Hence, in the case where the circuit PV is stably driven with the circuit structure of the circuit AP in FIG. 4A, each of the transistor M3 and the transistor M4 is preferably a transistor capable of being driven even when the gate-source voltage and the gate-drain voltage are high. That is, each of the transistor M3 and the transistor M4 preferably has a high withstand voltage.

Since the number of wirings in the circuit AP in FIG. 4A is smaller than those in the circuit AP in FIG. 2A and the circuit AP in FIG. 3A by one, the area of the circuit AP in FIG. 4A can be smaller than those of the circuit AP in FIG. 2A and the circuit AP in FIG. 3A. With the use of the circuit AP in FIG. 4A as the pixel circuit included in the display region of the display apparatus, the number of wirings led to the display region can be smaller than that in the case where the circuit AP in FIG. 2A or the circuit AP in FIG. 3A is used. There is a surplus area, which is the area occupied by the omitted wiring, in the display region and the circuit AP in FIG. 4A is provided also in the surplus area, so that the pixel density of the display region can be increased. The circuit AP in FIG. 4A has a smaller number of wirings than the circuit AP in FIG. 2A and the circuit AP in FIG. 3A and thus can be less affected by parasitic capacitance in some cases.

Figure 4B:
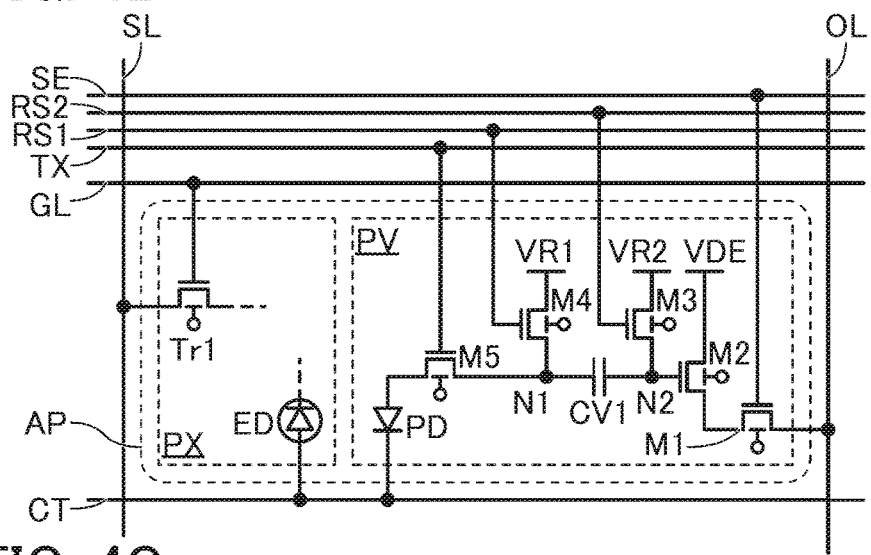

The circuit AP illustrated in FIG. 4B is a modification example of the circuit AP in FIG. 2A and differs from the circuit AP in FIG. 2A in that the anode of the light-emitting device ED is electrically connected to the wiring CT and the cathode of the light-emitting device ED is electrically connected to the circuit element included in the circuit PX.

In that case, a high-level potential is preferably input to the wiring CT to make the light-emitting device ED emit light. Also in that case, the constant potential supplied from the wiring VR1 is preferably equal to the high-level potential supplied from the wiring CT. The constant potential supplied from the wiring VR2 is preferably a potential equal to the constant potential supplied from the wiring VDE, a potential lower than the constant potential supplied from the wiring VDE, or the like.

For the operation of the case where the circuit PV included in the circuit AP in FIG. 4B performs image capturing, refer to the operation in the timing chart of FIG. 2B, for example.

In the circuit AP in FIG. 4B, the electrical connection destinations of the anode and the cathode of the light-receiving device PD included in the circuit PV may be interchanged with each other (not illustrated). In that case, refer to the operation in the timing chart of FIG. 3B for the operation of the case where the circuit PV performs image capturing, for example.

Figure 4C:
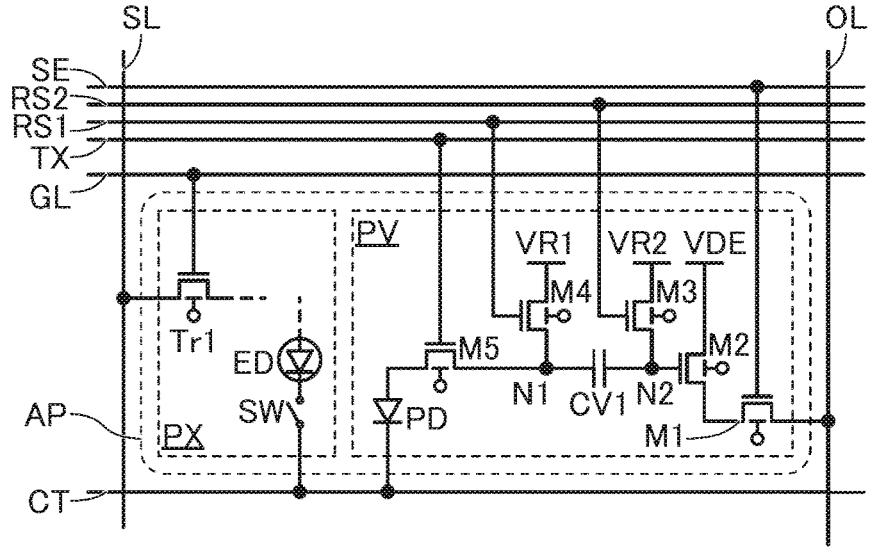

The circuit AP illustrated in FIG. 4C is a modification example of the circuit AP in FIG. 2A and differs from the circuit AP in FIG. 2A in that the cathode of the light-emitting device ED is electrically connected to the wiring CT through a switch SW. Specifically, the cathode of the light-emitting device ED is electrically connected to a first terminal of the switch SW, and a second terminal of the switch SW is electrically connected to the wiring CT.

Alternatively, the electrical connection between the cathode of the light-emitting device ED and the first terminal of the switch SW may be direct connection. In addition, the electrical connection between the second terminal of the switch SW and the wiring CT may be direct connection.

As the switch SW, an electrical switch such as an analog switch or a transistor can be used, for example. When a transistor is used as the switch SW, for example, the transistor can be a transistor having a structure similar to that of the transistor Tr1 or the transistor M1 to the transistor M5. Other than the electrical switch, a mechanical switch may be used.

The switch SW provided between the cathode of the light-emitting device ED and the wiring CT as illustrated in FIG. 4C can establish or break electrical continuity between the cathode of the light-emitting device ED and the wiring CT. In the case where the light-emitting device ED emits light, for example, the switch SW is turned on to make current flow between the cathode of the light-emitting device ED and the wiring CT. In the case where the light-emitting device ED does not emit light, for example, the switch SW is turned off so that current flowing between the cathode of the light-emitting device ED and the wiring CT can be stopped. The switch SW is turned off in the case where the light-emitting device ED does not emit light in this manner, whereby unintentional light emission from the light-emitting device ED due to current flowing from the cathode of the light-emitting device ED to the wiring CT can be prevented.

In the circuit AP in FIG. 4C, the electrical connection destinations of the anode and the cathode of the light-emitting device included in the circuit PX may be interchanged with each other (not illustrated). In addition, the electrical connection destinations of the anode and the cathode of the light-receiving device included in the circuit PV may be interchanged with each other (not illustrated).

Specific Example 4

Figure 5A:
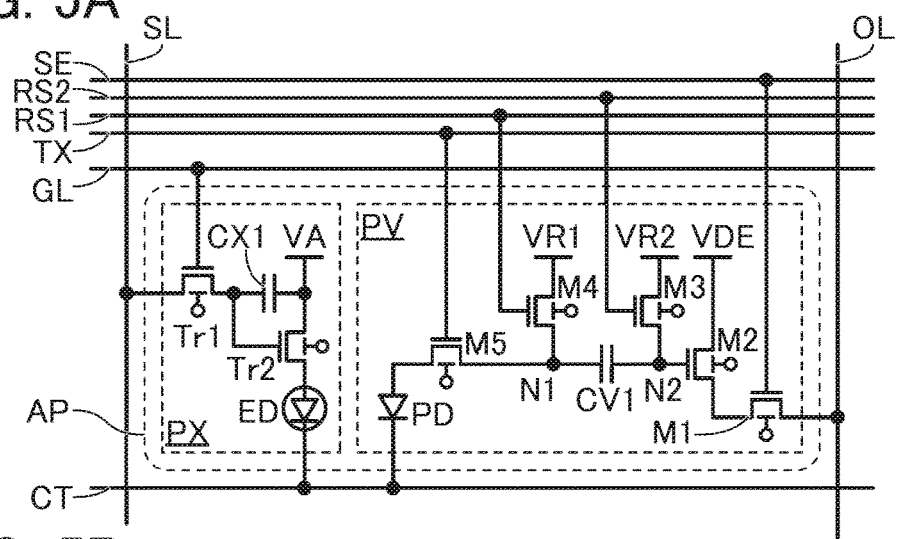
FIG. 5A to FIG. 5C are circuit diagrams illustrating structure examples of a semiconductor device.

FIG. 5A is a circuit diagram illustrating an example of a specific circuit structure of the circuit PX serving as the display pixel circuit in the circuit AP in FIG. 2A. The circuit PX included in the circuit AP in FIG. 5A includes, for example, the transistor Tr1, a transistor Tr2, the capacitor CX1, and the light-emitting device ED.

As the transistor Tr1 and the transistor Tr2, for example, a transistor that can be used as the transistor M1 to the transistor M5 can be used.

The first terminal of the transistor Tr1 is electrically connected to the wiring SL, the second terminal of the transistor Tr1 is electrically connected to the first terminal of the capacitor CX1 and a gate of the transistor Tr2, and the gate of the transistor Tr1 is electrically connected to the wiring GL.

A first terminal of the transistor Tr2 is electrically connected to the second terminal of the capacitor CX1 and a wiring VA, and a second terminal of the transistor Tr2 is electrically connected to the anode of the light-emitting device ED.

The wiring VA functions as a wiring supplying a constant potential, for example. The constant potential is preferably a potential higher than $V_{CATH}$ supplied to the wiring CT, for example.

In the circuit PX, a potential corresponding to image data is written to the first terminal of the capacitor CX1, and light is emitted from the light-emitting device ED. Specifically, for example, the potential corresponding to the image data is written to the first terminal of the capacitor CX1, so that the amount of current flowing between a source and a drain of the transistor Tr2 is determined and the current flows between the anode and the cathode of the light-emitting device ED. The luminance of light emitted from the light-emitting device ED is proportional to the amount of current. That is, the luminance of light emitted from the light-emitting device ED depends on the potential corresponding to the image data written to the first terminal of the capacitor CX1.

The image data is written to the first terminal of the capacitor CX1 in the circuit PX in the following manner, for example: a high-level potential is supplied to the wiring GL to turn on the transistor Tr1 and then a desired image data signal is transmitted (the potential corresponding to the image data is supplied) to the first terminal of the capacitor CX1 from the wiring SL through the transistor Tr1. After the image data is written to the first terminal of the capacitor CX1 in the circuit PX, a low-level potential is supplied to the wiring GL to turn off the transistor Tr1.

Figure 5B:
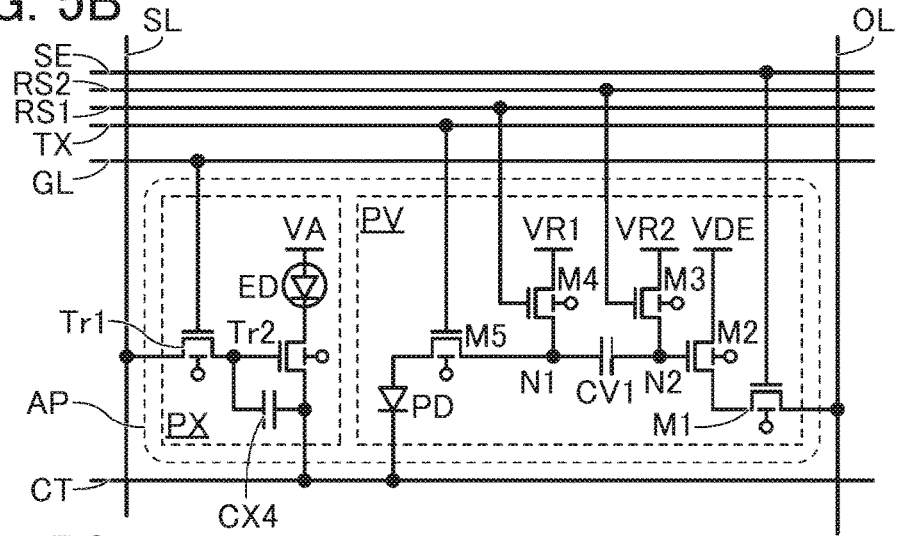

The circuit PX illustrated in FIG. 5B may be used as the circuit PX serving as the display pixel circuit in the circuit AP in FIG. 2A. The circuit PX illustrated in FIG. 5B is a modification example of the circuit PX in FIG. 5A and differs from the circuit PX illustrated in FIG. 5A in that the cathode of the light-emitting device ED is electrically connected to the wiring CT through the source and the drain of the transistor Tr2.

The circuit PX in FIG. 5B includes the transistor Tr1 and the transistor Tr2. The circuit PX in FIG. 5B includes a capacitor CX4 instead of the capacitor CX1.

The first terminal of the transistor Tr1 is electrically connected to the wiring SL, the second terminal of the transistor Tr1 is electrically connected to a first terminal of the capacitor CX4 and the gate of the transistor Tr2, and the gate of the transistor Tr1 is electrically connected to the wiring GL. The anode of the light-emitting device ED is electrically connected to the wiring VA, and the cathode of the light-emitting device ED is electrically connected to the first terminal of the transistor Tr2. The second terminal of the transistor Tr2 is electrically connected to a second terminal of the capacitor CX4 and the wiring CT.

For the operation of the circuit PX in FIG. 5B, refer to the description of the operation of the circuit PX in FIG. 5A.

Figure 5C:
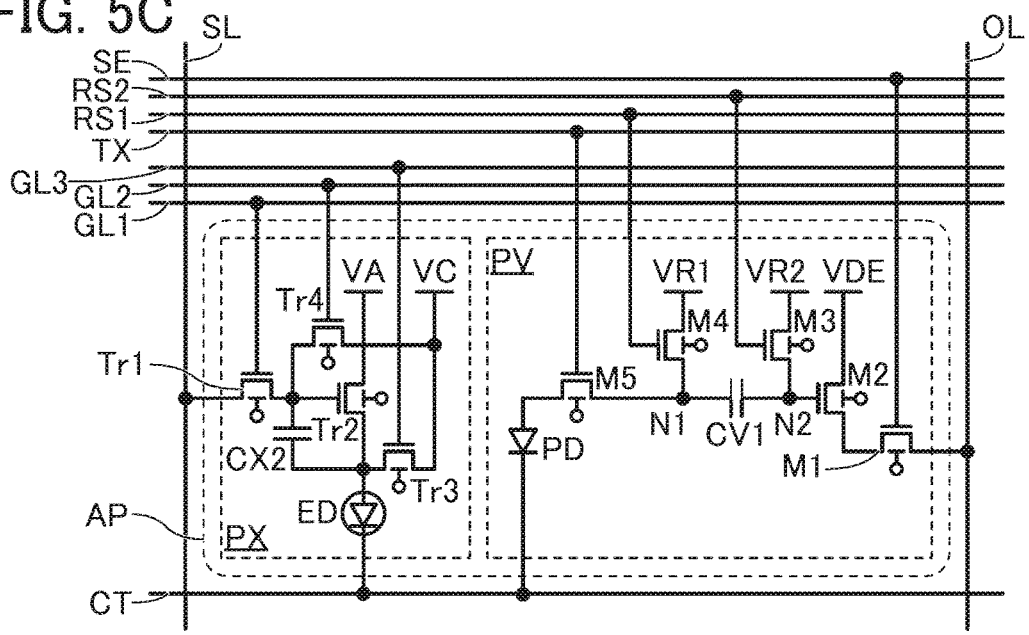

Moreover, the circuit PX illustrated in FIG. 5C may be used as the circuit PX serving as the display pixel circuit in the circuit AP in FIG. 2A. The circuit PX illustrated in FIG. 5C is a structure example of a display pixel circuit capable of Duty driving, for example. The circuit PX in FIG. 5C is a modification example of the circuit PX illustrated in FIG. 5A and differs from the circuit PX illustrated in FIG. 5A in that a transistor Tr3, a transistor Tr4, and a capacitor CX2 are provided and the capacitor CX1 is not provided.

As the transistor Tr3 and the transistor Tr4, for example, a transistor that can be used as the transistor M1 to the transistor M5 can be used.

A first terminal of the capacitor CX2 is electrically connected to the second terminal of the transistor Tr1, the gate of the transistor Tr2, and a first terminal of the transistor Tr4. A second terminal of the capacitor CX2 is electrically connected to the second terminal of the transistor Tr2, a first terminal of the transistor Tr3, and the anode of the light-emitting device ED. A second terminal of the transistor Tr3 is electrically connected to a second terminal of the transistor Tr4 and a wiring VC.

In FIG. 5C, the gate of the transistor Tr1 is electrically connected not to the wiring GL but to a wiring GL1. A gate of the transistor Tr4 is electrically connected to a wiring GL2. A gate of the transistor Tr3 is electrically connected to a wiring GL3.

The wiring VC functions as a wiring supplying a constant potential, for example. The constant voltage can be a ground potential, for example.

In the case where image data is written to the circuit PX in the circuit AP in FIG. 5C, for example, high-level potentials are supplied to the wiring GL1 and the wiring GL3 and a low-level potential is supplied to the wiring GL2. Accordingly, the transistor Tr1 and the transistor Tr3 are turned on and the transistor Tr4 is turned off. After that, a desired image data signal is transmitted (a potential corresponding to the image data is supplied) to the first terminal of the capacitor CX2 from the wiring SL. At this time, for example, a ground potential is supplied to the second terminal of the capacitor CX2 from the wiring VC. After the image data is written to the first terminal of the capacitor CX2 in the circuit PX, low-level potentials are supplied to the wiring GL1 and the wiring GL3 to turn off the transistor Tr1 and the transistor Tr3.

In the case where image data for black display is written to the circuit PX in the circuit AP in FIG. 5C, for example, high-level potentials are supplied to the wiring GL2 and the wiring GL3 and a low-level potential is supplied to the wiring GL1. Accordingly, the transistor Tr3 and the transistor Tr4 are turned on and the transistor Tr1 is turned off. Thus, a ground potential is supplied to the first terminal of the capacitor CX2 and the second terminal of the capacitor CX2 from the wiring VC. That is, the gate-source voltage of the transistor Tr2 is 0 V; hence, current does not flow through the light-emitting device ED and the circuit PX performs black display when the threshold voltage of the transistor Tr2 is appropriate. After the ground potential is written to the first terminal of the capacitor CX2 in the circuit PX, low-level potentials are supplied to the wiring GL2 and the wiring GL3 to turn off the transistor Tr3 and the transistor Tr4.

Figure 6:
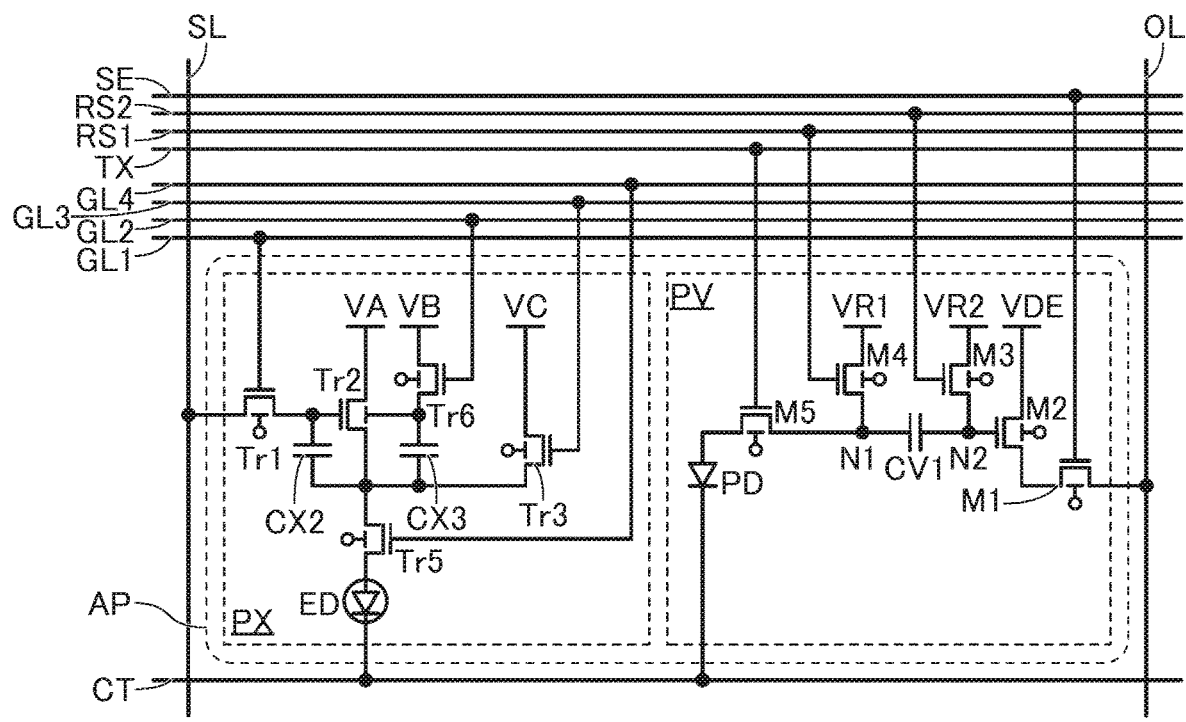
FIG. 6 is a circuit diagram illustrating a structure example of a semiconductor device.

Furthermore, the circuit PX illustrated in FIG. 6 may be used as the circuit PX serving as the display pixel circuit in the circuit AP in FIG. 2A. The circuit PX illustrated in FIG. 6 is a structure example of a display pixel circuit capable of correcting the threshold voltage of the transistor Tr2, for example. The circuit PX in FIG. 6 is a modification example of the circuit PX illustrated in FIG. 5A and differs from the circuit PX illustrated in FIG. 5A in that the transistor Tr3, a transistor Tr5, a transistor Tr6, the capacitor CX2, and a capacitor CX3 are provided and the capacitor CX1 is not provided.

As the transistor Tr5 and the transistor Tr6, for example, a transistor that can be used as the transistor M1 to the transistor M5 can be used.

The first terminal of the capacitor CX2 is electrically connected to the second terminal of the transistor Tr1 and the gate of the transistor Tr2. The second terminal of the capacitor CX2 is electrically connected to the second terminal of the transistor Tr2, the first terminal of the transistor Tr3, a first terminal of the transistor Tr5, and a first terminal of the capacitor CX3. The second terminal of the transistor Tr3 is electrically connected to the wiring VC. A second terminal of the capacitor CX3 is electrically connected to the back gate of the transistor Tr2 and a first terminal of the transistor Tr6, and a second terminal of the transistor Tr6 is electrically connected to a wiring VB. A second terminal of the transistor Tr5 is electrically connected to the anode of the light-emitting device ED In FIG. 6, the gate of the transistor Tr1 is electrically connected not to the wiring GL but to the wiring GL1. A gate of the transistor Tr6 is electrically connected to the wiring GL2. The gate of the transistor Tr3 is electrically connected to the wiring GL3. A gate of the transistor Tr5 is electrically connected to a wiring GL4.

The wiring VB functions as a wiring supplying a constant voltage, for example. In particular, the constant voltage supplied from the wiring VB in FIG. 6 is $V_{BG}$.

The wiring VC functions as a wiring supplying a constant voltage, for example. In particular, the constant voltage supplied from the wiring VC in FIG. 6 is $V_{CST}$. Note that $V_{CST}$ is a voltage lower than $V_{BG}$.

In the case where the threshold voltage of the transistor Tr2 in the circuit PX in the circuit AP in FIG. 6 is corrected, for example, high-level potentials are supplied to the wiring GL1, the wiring GL2, the wiring GL3, and the wiring GL4 first. Accordingly, the transistor Tr1, the transistor Tr3, the transistor Tr5, and the transistor Tr6 are turned on. At this time, $V_{CST}$, which is equal to the constant voltage supplied from the wiring VC, is supplied to the first terminal of the capacitor CX2 from the wiring SL. In addition, $V_{BG}$ is supplied to the potential of the second terminal of the capacitor CX3 from the wiring VB. Note that the potential $V_{CST}$ from the wiring VC is supplied to the second terminal of the capacitor CX2 and the first terminal of the capacitor CX3; however, the potential of the second terminal of the capacitor CX2 and the first terminal of the capacitor CX3 is lower than the potential $V_{CST}$ because the transistor Tr5 is in the on state.

Next, a low-level potential is supplied to the wiring GL4. Accordingly, the transistor Tr5 is turned off. Since the transistor Tr3 is in the on state and the transistor Tr5 is in the off state, the potential of the second terminal of the capacitor CX2 and the first terminal of the capacitor CX3 increases to $V_{CST}$. Strictly, the transistor Tr3 is positioned between the wiring VC and each of the second terminal of the capacitor CX2 and the first terminal of the capacitor CX3; thus, the potential of the second terminal of the capacitor CX2 and the first terminal of the capacitor CX3 is lower than $V_{CST}$ but is close to $V_{CST}$. At this time, both the potential of the first terminal of the capacitor CX2 (the gate of the transistor Tr2) and the potential of the second terminal of the capacitor CX2 and the first terminal of the capacitor CX3 (the second terminal of the transistor Tr2) are approximately $V_{CST}$; hence, the potential between the pair of terminals of the capacitor CX2 is approximately 0 V.

Next, low-level potentials are supplied to the wiring GL1 and the wiring GL3. Accordingly, the transistor Tr1 and the transistor Tr3 are turned off. When the transistor Tr1 is turned off, the potential $V_{CST}$ is retained at the first terminal of the capacitor CX2 (the gate of the transistor Tr2).

Here, a high bias is applied between the first terminal and the second terminal of the transistor Tr2 by the potential $V_{CST}$ of the second terminal of the capacitor CX2 and the first terminal of the capacitor CX3 and the potential of the wiring VA. At this time, the transistor Tr2 is turned on and current flows in the direction from the first terminal to the second terminal of the transistor Tr2. Since the transistor Tr3 and the transistor Tr5 are in the off state, the potential of the second terminal of the capacitor CX2 and the first terminal of the capacitor CX3 (the second terminal of the transistor Tr2) is increased by the current. Note that the voltage between the pair of terminals of the capacitor CX2 is approximately 0 V and the transistor Tr1 is in the off state (the first terminal of the capacitor CX2 is in a floating state); thus, the gate-source voltage of the transistor Tr2 remains at approximately 0 V owing to the potential increase of the second terminal of the capacitor CX2 and the first terminal of the capacitor CX3 (the second terminal of the transistor Tr2).

The potential of the second terminal of the capacitor CX2 and the first terminal of the capacitor CX3 increases until the transistor Tr2 is turned off. Since the gate-source voltage of the transistor Tr2 is approximately 0 V, the transistor Tr2 is turned off when the threshold voltage of the transistor Tr2 becomes 0 V or higher or exceeds 0 V. That is, the transistor Tr2 is turned off when the back gate-source voltage of the transistor Tr2 becomes a voltage at which the threshold voltage of the transistor Tr2 is 0 V. Assuming that the back gate-source voltage of the transistor Tr2 at which the threshold voltage of the transistor Tr2 is 0 V is $V_{CRC}$, the potential of the second terminal of the capacitor CX2 and the first terminal of the capacitor CX3 becomes $V_{BG}-V_{CRC}$.

Since the first terminal of the capacitor CX2 is in a floating state, the potential of the first terminal of the capacitor CX2 increases concurrently with increasing potential of the second terminal of the capacitor CX2 and the first terminal of the capacitor CX3 from $V_{CST}$ to $V_{BG}-V_{CRC}$. The increased voltage of the first terminal of the capacitor CX2 depends on the capacitive coupling coefficient between the pair of terminals of the capacitor CX2.

Next, high-level potentials are supplied to the wiring GL1 and the wiring GL3, and a low-level potential is supplied to the wiring GL2. Accordingly, the transistor Tr1 is turned on and the transistor Tr6 is turned off. Thus, the second terminal of the capacitor CX3 is brought into a floating state, and the potential of the back gate of the transistor Tr2 is retained at the second terminal of the capacitor CX3. In this manner, correction of the threshold voltage of the transistor Tr2 is completed.

The correction of the threshold voltage of the transistor Tr2 can reduce the variation in current flowing between the source and the drain of the transistor Tr2 due to the deviation of the threshold voltage of the transistor Tr2. This can reduce the variation in luminance of light emitted from the light-emitting device ED through which the current flows.

After the correction of the threshold voltage of the transistor Tr2 in the circuit PX is completed, for example, high-level potentials are supplied to the wiring GL1 and the wiring GL4 and low-level potentials are supplied to the wiring GL2 and the wiring GL3. Accordingly, the transistor Tr1 and the transistor Tr5 are turned on and the transistor Tr3 and the transistor Tr6 are turned off. After that, a desired image data signal is transmitted (a potential corresponding to image data is supplied) to the first terminal of the capacitor CX2 from the wiring SL. After the image data is written to the first terminal of the capacitor CX2 in the circuit PX, a low-level potential is supplied to the wiring GL1 to turn off the transistor Tr1.

As described above, the circuit PX included in the circuit AP in any one of FIG. 5A to FIG. 5C and FIG. 6 can be used as the circuit PX included in the circuit AP illustrated in each of FIG. 2A and FIG. 3A. Alternatively, a circuit structure other than the structure of the circuit PX illustrated in each of FIG. 5A to FIG. 5C and FIG. 6 may be employed for the circuit PX included in the circuit AP illustrated in each of FIG. 2A and FIG. 3A.

Note that the circuit structures described in this embodiment can be combined with each other as appropriate.

This embodiment can be combined with any of the other embodiments in this specification as appropriate.

Embodiment 2

In this embodiment, a semiconductor device of one embodiment of the present invention that is different from the semiconductor device described in Embodiment 1 will be described.

Structure Example 1

Figure 7:
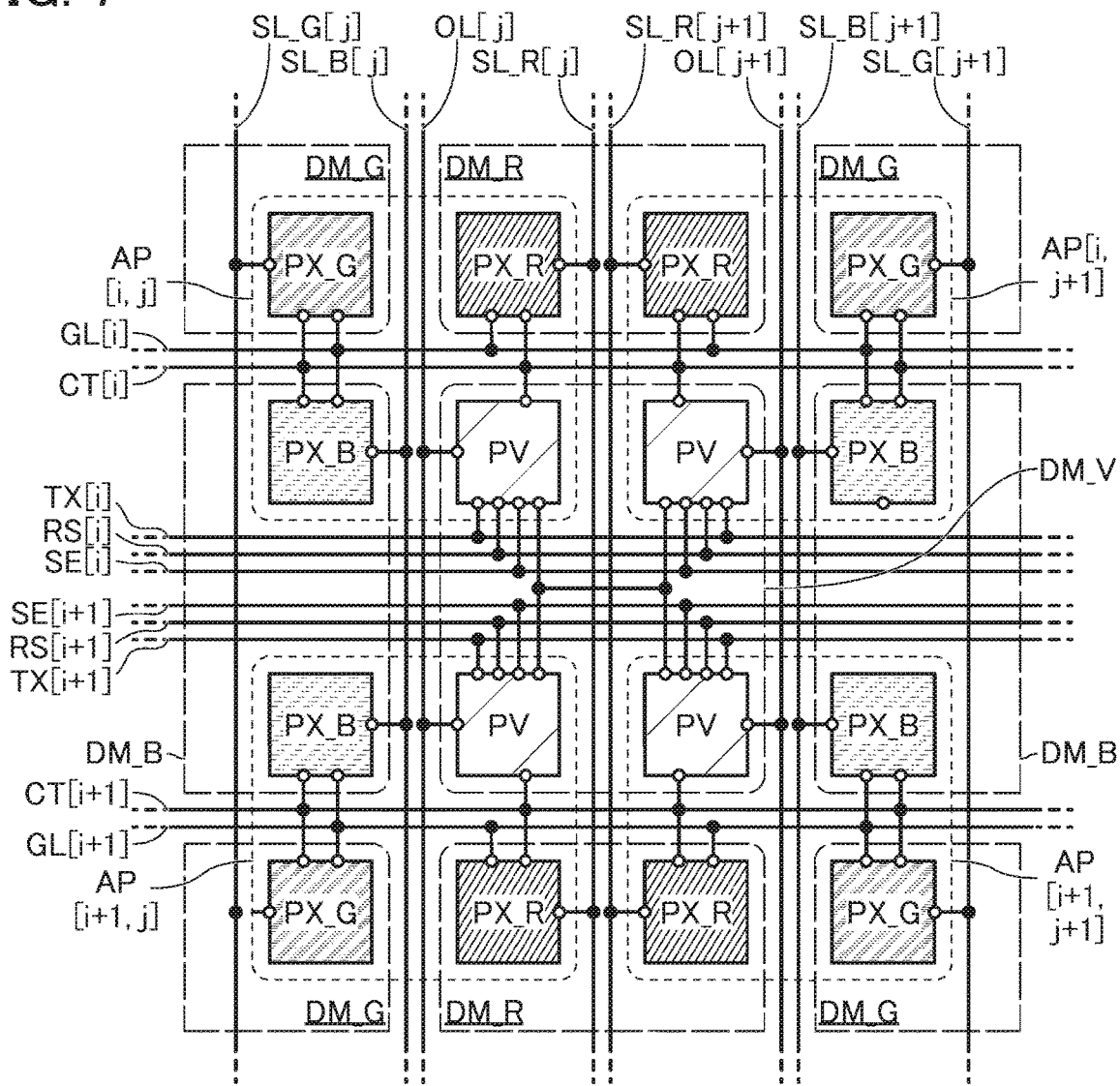
FIG. 7 is a block diagram illustrating a structure example of a semiconductor device.

FIG. 7 is a block diagram illustrating part of a display region of a display apparatus including a display pixel circuit and an imaging pixel circuit, and illustrates an example of the semiconductor device of one embodiment of the present invention. FIG. 7 illustrates a circuit AP[i,j] (here, i is an integer of 2 or more and j is an integer of 2 or more), a circuit AP[i+1,j], a circuit AP[i,j+1], and a circuit AP[i+1,j+1]. In FIG. 7, the circuit AP[i,j], the circuit AP[i+1,j], the circuit AP[i,j+1], and the circuit AP[i+1,j+1] are denoted by short dashed lines.

The circuit AP[i,j], the circuit AP[i+1,j], the circuit AP[i, j+1], and the circuit AP[i+1,j+1] each include a circuit PX_R, a circuit PX_G, a circuit PX_B, and the circuit PV, for example. The circuit PX_R, the circuit PX_G, and the circuit PX_B each have a function of a display pixel circuit, and the circuit PV has a function of an imaging pixel circuit.

For the circuit PX_R, the circuit PX_G, and the circuit PX_B, refer to the description of the circuit PX in Embodiment 1. For the circuit PV, refer to the description of the circuit PV in Embodiment 1.

The circuit PX_R, the circuit PX_G, and the circuit PX_B serving as the display pixel circuits may include light-emitting devices emitting light of different colors, for example. In particular, colors of light emitted from the light-emitting devices included in the circuit PX_R, the circuit PX_G, and the circuit PX_B may be three colors of red (R), green (G), and blue (B). Alternatively, the colors of light emitted from the light-emitting devices included in the circuit PX_R, the circuit PX_G, and the circuit PX_B may be three colors selected from red, green, blue, cyan, magenta, yellow, and white. Alternatively, the colors of light emitted from the light-emitting devices included in two circuits among the circuit PX_R, the circuit PX_G, and the circuit PX_B may be the same color and the color of light emitted from the light-emitting device included in the other one circuit may be different from the color of light emitted from the light-emitting devices of the two circuits. Alternatively, the colors of light emitted from the light-emitting devices included in the circuit PX_R, the circuit PX_G, and the circuit PX_B may be the same color.

As illustrated in FIG. 7, the circuits PV in the circuit AP[i,j], the circuit AP[i+1,j], the circuit AP[i,j+1], and the circuit AP[i+1,j+1] are arranged to be included in one region DM_V. Specifically, four circuits PV are arranged in a matrix of two rows and two columns in the one region DM_V.

Figure 8:
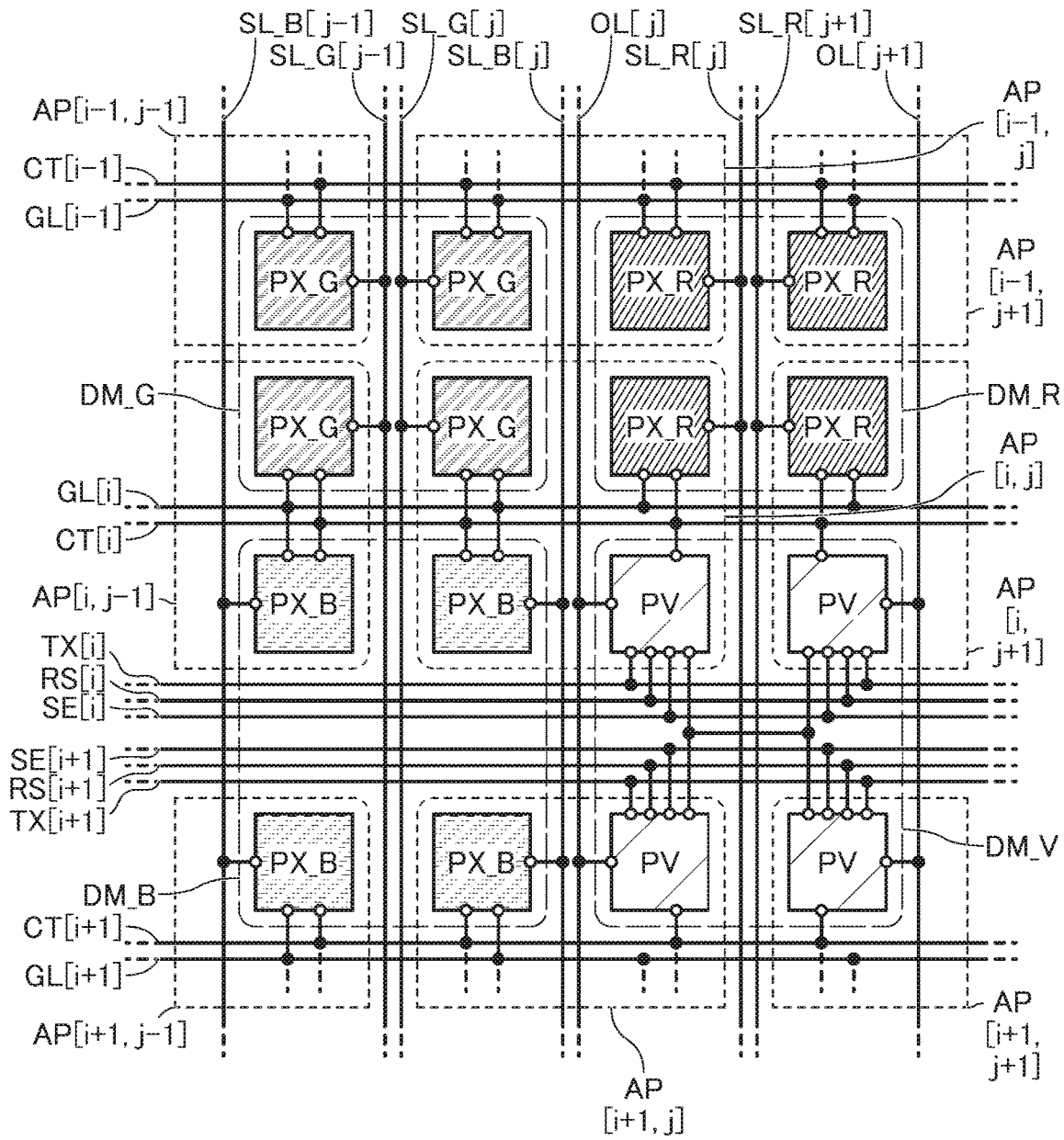
FIG. 8 is a block diagram illustrating a structure example of a semiconductor device.

In FIG. 7, four circuits PX_R are arranged to be included in one region DM_R, four circuits PX_G are arranged to be included in one region DM_G, and four circuits PX_B are arranged to be included in one region DM_B. Specifically, as illustrated in FIG. 8, the four circuits PX_R are arranged in a matrix of two rows and two columns in the one region DM_R, the four circuits PX_G are arranged in a matrix of two rows and two columns in the one region DM_G, and the four circuits PX_B are arranged in a matrix of two rows and two columns in the one region DM_B. Note that FIG. 8 illustrates a circuit structure example in which the circuit PV of the circuit AP[i+1,j+1] is illustrated in the lower right portion and the circuit PX_G of a circuit AP[i−1, j−1] is illustrated in the upper left portion in the arrangement of the circuit AP[i,j], the circuit AP[i+1,j], the circuit AP[i,j+1], and the circuit AP[i+1,j+1] illustrated in FIG. 7. Thus, FIG. 8 illustrates the entire circuit AP[i,j] and part of each of the circuit AP[i−1,j−1], a circuit AP[i−1,j], a circuit AP[i−1,j+ 1], a circuit AP[i,j−1], the circuit AP[i,j+1], a circuit AP[i+ 1,j−1], the circuit AP[i+1,j], and the circuit AP[i+1,j+1].

In FIG. 7, the region DM_V, the region DM_R, the region DM_G, and the region DM_B are denoted by long dashed lines.

By arranging the four circuits PX_R, the four circuits PX_G, the four circuits PX_B, and the four circuits PV as illustrated in FIG. 8, the circuit PX_R, the circuit PX_G, the circuit PX_B, and the circuit PV can be provided in one circuit AP.

The light-emitting devices included in the circuits PX_R arranged in a matrix of two rows and two columns in the region DM_R in FIG. 8 can be formed by a photolithography method or the like, for example. Specifically, for example, materials for forming the light-emitting devices are sequentially stacked in the entire region of the region DM_R. As a method for stacking the materials, for example, a deposition method such as a CVD (Chemical Vapor Deposition) method, a sputtering method, a vacuum evaporation method, a spin coating method, a spray coating method, or a screen printing method can be employed. After that, the stacked materials are divided into two rows and two columns by a photolithography method, whereby four light-emitting devices can be formed. By such a formation method, the light-emitting devices can be formed in the four circuits PX_R included in the region DM_R.

Four light-emitting devices can be formed in each of the region DM_G and the region DM_B in FIG. 8 in a manner similar to that of the region DM_R; a stack including materials for forming the light-emitting devices is divided into a matrix of two rows and two columns by a photolithography method or the like. Accordingly, the light-emitting devices can be formed in the four display pixel circuits included in each of the regions.

Four light-receiving devices can be formed in the region DM_V in FIG. 7 and FIG. 8 in a manner similar to that of the region DM_R; a stack including materials for forming the light-receiving devices is divided into a matrix of two rows and two columns by a photolithography method or the like. Accordingly, the light-receiving devices can be formed in the four circuits PV serving as the imaging pixel circuits included in the region DM_V.

Although FIG. 7 and FIG. 8 illustrate the example in which, with the use of a photolithography method or the like, the display pixel circuits in two rows and two columns are formed in each of the region DM_R, the region DM_G, and the region DM_B and the imaging pixel circuits in two rows and two columns are formed in the region DM_V, the display pixel circuits and the imaging pixel circuits may be formed in a matrix other than a matrix of two rows and two columns. For example, the display pixel circuits may be formed in a matrix of one or more rows and one or more columns in each of the region DM_R, the region DM_G, and the region DM_B. Similarly, the imaging pixel circuits may be formed in a matrix of one or more rows and one or more columns in the region DM_V.

The circuit AP[i,j], the circuit AP[i+1,j], the circuit AP[i,j+1], and the circuit AP[i+1,j+1] illustrated in FIG. 7 can perform image capturing in a manner similar to that of the semiconductor device described in Embodiment 1 (hereinafter, this operation is referred to as a first operation). When the four circuits PV are electrically connected to one another in the region DM_V, imaging data captured by the four circuits PV can be added up and the data added up can be output as one imaging data (hereinafter, this operation is referred to as a second operation). Since the imaging data captured by the four circuits PV can be output as one imaging data through the second operation, the time required for reading the imaging data can be reduced, and the time from image capturing to reading of imaging data can be shortened. The amount of imaging data is increased by the second operation and thus voltages used in the circuits PV become higher; accordingly, the second operation can increase the operation speed of the circuits PV as compared with the first operation in some cases. Furthermore, the imaging data obtained through the second operation has relatively fewer noise components than that obtained through the first operation. Hence, the circuit structure illustrated in FIG. 7 can increase the S/N ratios of the circuits in FIG. 7. The second operation is suitable for image capturing in an environment where the amount of current generated in a light-receiving device is small, e.g., a dark place, because the imaging data captured by the four circuits PV are added up in the second operation, for example.

Although the structure in which the region DM_V includes the four circuits PV is described above as an example, the number of circuits PV included in the region DM_V in the semiconductor device of one embodiment of the present invention may be two, three, or five or more.

In the circuit AP[i,j] in FIG. 7, the circuit PX_R is electrically connected to a wiring SL_R[j], a wiring GL[i], and a wiring CT[i], the circuit PX_G is electrically connected to a wiring SL_G[j], the wiring GL[i], and the wiring CT[i], and the circuit PX_B is electrically connected to a wiring SL_B[j], the wiring GL[i], and the wiring CT[i]. The circuit PV is electrically connected to a wiring OL[j], a wiring TX[i], a wiring RS[i], a wiring SE[i], and the wiring CT[i].

Similarly, in the circuit AP[i+1,j] in FIG. 7, the circuit PX_R is electrically connected to the wiring SL_R[j], a wiring GL[i+1], and a wiring CT[i+1], the circuit PX_G is electrically connected to the wiring SL_G[j], the wiring GL[i+1], and the wiring CT[i+1], and the circuit PX_B is electrically connected to the wiring SL_B[j], the wiring GL[i+1], and the wiring CT[i+1]. The circuit PV is electrically connected to the wiring OL[j], a wiring TX[i+1], a wiring RS[i+1], a wiring SE[i+1], and the wiring CT[i+1].

Similarly, in the circuit AP[i,j+1] in FIG. 7, the circuit PX_R is electrically connected to a wiring SL_R[j+1], the wiring GL[i], and the wiring CT[i], the circuit PX_G is electrically connected to a wiring SL_G[j+1], the wiring GL[i], and the wiring CT[i], and the circuit PX_B is electrically connected to a wiring SL_B[j+1], the wiring GL[i], and the wiring CT[i]. The circuit PV is electrically connected to a wiring OL[j+1], the wiring TX[i], the wiring RS[i], the wiring SE[i], and the wiring CT[i].

Similarly, in the circuit AP[i+1,j+1] in FIG. 7, the circuit PX_R is electrically connected to the wiring SL_R[j+1], the wiring GL[i+1], and the wiring CT[i+1], the circuit PX_G is electrically connected to the wiring SL_G[j+1], the wiring GL[i+1], and the wiring CT[i+1], and the circuit PX_B is electrically connected to the wiring SL_B[j+1], the wiring GL[i+1], and the wiring CT[i+1]. The circuit PV is electrically connected to the wiring OL[j+1], the wiring TX[i+1], the wiring RS[i+1], the wiring SE[i+1], and the wiring CT[i+1].

In the region DM_V in FIG. 7 and FIG. 8, the four circuits PV are electrically connected to one another.

In FIG. 8, a wiring SL_G[j−1] is electrically connected to the circuit PX_G in the circuit AP[i−1,j−1] and the circuit PX_G in the circuit AP[i,j−1]. A wiring SL_B[j−1] is electrically connected to the circuit PX_B in the circuit AP[i,j−1] and the circuit PX_B in the circuit AP[i+1,j−1]. A wiring CT[i−1] is electrically connected to the circuit PX_G in the circuit AP[i−1,j−1], the circuit PX_G and the circuit PX_R in the circuit AP[i−1,j], and the circuit PX_R in the circuit AP[i−1,j+1]. A wiring GL[i−1] is electrically connected to the circuit PX_G in the circuit AP[i−1,j−1], the circuit PX_G and the circuit PX_R in the circuit AP[i−1,j], and the circuit PX_R in the circuit AP[i−1,j+1].

The wirings SL_R illustrated in FIG. 7 and FIG. 8 function as wirings transmitting image data signals to the circuits PX_R serving as the display pixel circuits, for example. The wirings SL_G illustrated in FIG. 7 and FIG. 8 function as wirings transmitting image data signals to the circuits PX_G serving as the display pixel circuits, for example. The wirings SL_B illustrated in FIG. 7 and FIG. 8 function as wirings transmitting image data signals to the circuits PX_B serving as the display pixel circuits, for example. Note that the wirings SL_R, the wirings SL_G, and the wirings SL_B may each be a wiring supplying a constant potential or a variable potential (sometimes referred to as a pulse voltage), for example.

The wirings GL illustrated in FIG. 7 and FIG. 8 each function as a wiring transmitting a selection signal for selecting a row including the circuit PX_R, the circuit PX_G, and the circuit PX_B to which image data signals are supplied, for example. Alternatively, the wirings GL may each be a wiring supplying a constant voltage, for example.

The wirings TX illustrated in FIG. 7 and FIG. 8 function as wirings transmitting trigger signals for enabling the light-receiving devices included in the circuits PV to perform image capturing, for example. Alternatively, the wirings TX may each be, for example, a wiring supplying a constant voltage.

The wirings RS illustrated in FIG. 7 and FIG. 8 function as wirings transmitting trigger signals for erasing imaging data captured by the light-receiving devices included in the circuits PV, for example. Note that an operation of erasing imaging data can be rephrased as, for example, an initialization operation of potentials corresponding to imaging data retained in the circuits PV that is performed to allow the circuits PV to perform another image capturing. Alternatively, the wirings RS may each be, for example, a wiring supplying a constant voltage.

Although FIG. 7 and FIG. 8 illustrate an example in which the wiring TX extends in each of the rows including the circuits PV, the wirings TX in the rows may be combined into one wiring in the case where the trigger signals are supplied at the same timing from the wirings TX in the rows. Specifically, for example, the wiring TX[i] and the wiring TX[i+1] may be combined into one wiring in FIG. 7 or FIG. 8.

In particular, when the wirings TX extending in all the rows including the circuits PV are combined into one wiring and the wirings RS extending in all the rows including the circuits PV are combined into one wiring in the display region, all the circuits PV included in the display region can concurrently erase imaging data or obtain imaging data. That is, the above-described structure enables image capturing with a global shutter system. Moreover, when the trigger signals are sequentially transmitted to one or the other of the plurality of wirings TX and the plurality of wirings RS extending in all the rows including the circuits PV in the display region illustrated in each of FIG. 7 and FIG. 8, image capturing with a rolling shutter system can be performed.

Although FIG. 7 and FIG. 8 illustrate an example in which the wiring RS extends in each of the rows including the circuits PV, the wirings RS in the rows may be combined into one wiring in the case where the trigger signals are supplied at the same timing from the wirings RS in the rows. Specifically, for example, the wiring RS[i] and the wiring RS[i+1] may be combined into one wiring in FIG. 7 or FIG. 8.

The wirings SE illustrated in FIG. 7 and FIG. 8 function as wirings transmitting trigger signals for reading imaging data captured by the light-receiving devices included in the circuits PV, for example. Alternatively, the wirings SE may each be, for example, a wiring supplying a constant potential.

The wirings OL illustrated in FIG. 7 and FIG. 8 function as wirings transmitting imaging data captured by the light-receiving devices included in the circuits PV as signals, for example. Alternatively, the wirings OL may each be, for example, a wiring supplying a constant potential or a variable potential (sometimes referred to as a pulse voltage).

The wirings CT illustrated in FIG. 7 and FIG. 8 function as wirings supplying constant potentials to the circuits PX_R, the circuits PX_G, the circuits PX_B, and the circuits PV, for example. The wirings CT are electrically connected to the terminals of the light-emitting devices included in the circuits PX and the terminals of the light-receiving devices included in the circuits PV, for example. In that case, each of the constant potentials is preferably a ground potential or a negative potential, for example. Alternatively, the wirings CT may each be a wiring supplying a variable potential (sometimes referred to as a pulse voltage), for example.

Although FIG. 7 and FIG. 8 illustrate an example in which the wiring CT extends in each of the rows, the wirings CT in the rows may be combined into one wiring in the case where the constant potentials supplied from the wirings CT in the rows are equal to each other. Specifically, for example, the wiring CT[i] and the wiring CT[i+1] may be combined into one wiring in FIG. 7. For another example, the wiring CT[i−1], the wiring CT[i], and the wiring CT[i+1] may be combined into one wiring in FIG. 8.

Although FIG. 7 and FIG. 8 illustrate the various wirings, a wiring other than the wirings SL_R, the wirings SL_G, the wirings SL_B, the wirings GL, the wirings TX, the wirings RS, the wirings SE, the wirings OL, and the wirings CT may be electrically connected to at least one of the circuits PX_R, the circuits PX_G, the circuits PX_B, and the circuits PV. For example, although not illustrated in FIG. 7, a wiring supplying a power supply voltage for driving one or more selected from the circuits PX_R, the circuits PX_G, the circuits PX_B, and the circuits PV may be electrically connected to the circuits AP.

The number of at least one of the wirings illustrated in FIG. 7 and FIG. 8 may be two or more. For example, the number of wirings GL illustrated in FIG. 7 and FIG. 8 may be two or more. For another example, the number of wirings RS illustrated in FIG. 7 and FIG. 8 may be two or more. For another example, the number of wirings TX illustrated in FIG. 7 and FIG. 8 may be two or more.

Specific Example 1

Figure 9:
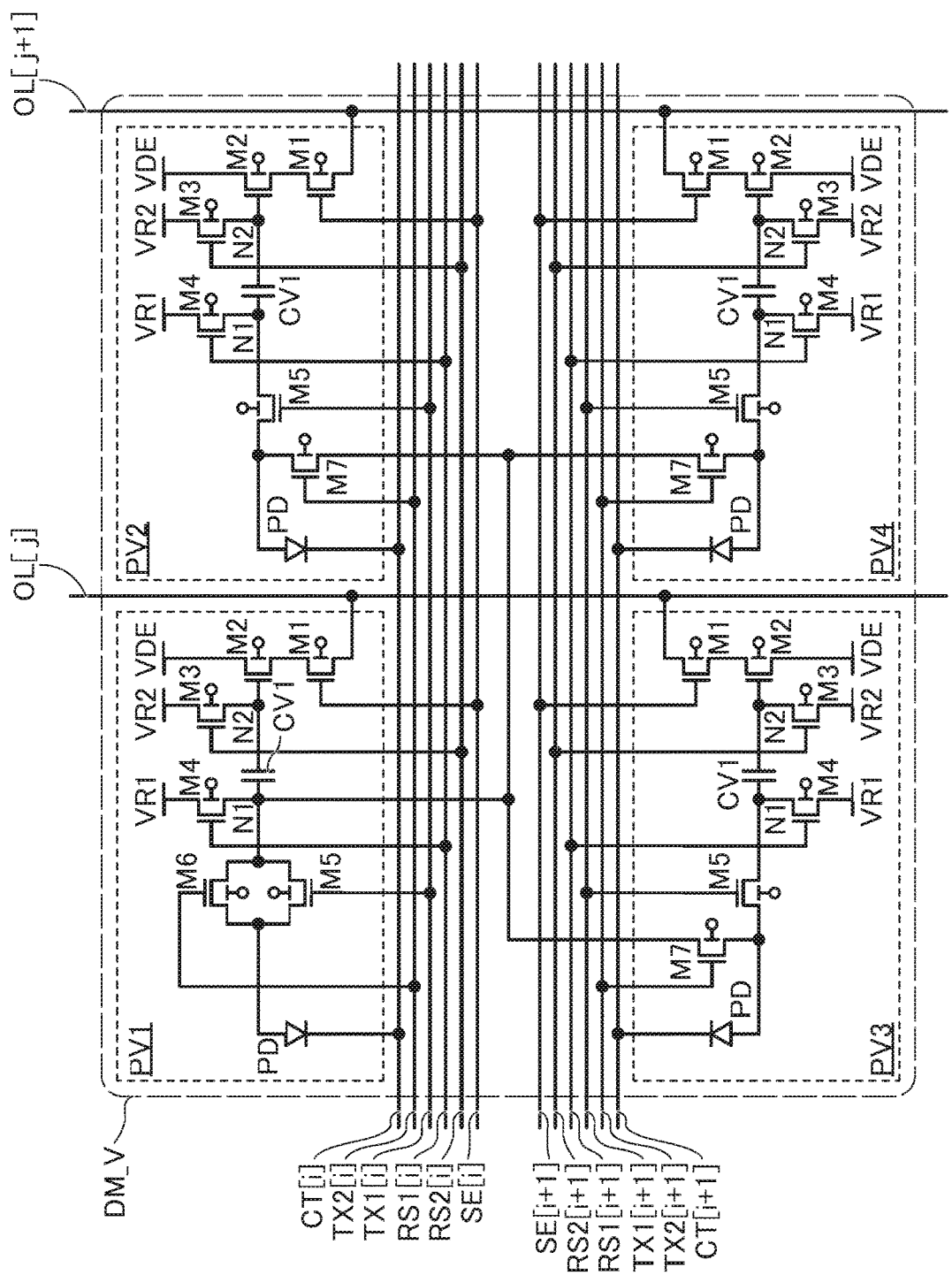
FIG. 9 is a circuit diagram illustrating a structure example of a semiconductor device.

FIG. 9 illustrates a circuit structure example applicable to the four circuits PV included in the region DM_V in FIG. 7 and FIG. 8. Note that in the region DM_V in FIG. 9, the circuits PV included in the circuit AP[i,j], the circuit AP[i+1,j], the circuit AP[i,j+1], and the circuit AP[i+1,j+1] are illustrated.

The four circuits PV included in the region DM_V in FIG. 7 and FIG. 8 are illustrated as a circuit PV1, a circuit PV2, a circuit PV3, and a circuit PV4 in the region DM_V illustrated in FIG. 9. For example, the circuit PV1 corresponds to the circuit PV included in the circuit AP[i,j], the circuit PV2 corresponds to the circuit PV included in the circuit AP[i,j+1], the circuit PV3 corresponds to the circuit PV included in the circuit AP[i+1,j], and the circuit PV4 corresponds to the circuit PV included in the circuit AP[i+1,j+1].

The circuit PV1 includes the transistor M1 to a transistor M6, the capacitor CV1, and the light-receiving device PD.

Each of the circuit PV2 to the circuit PV4 includes the transistor M1 to the transistor M5, a transistor M7, the capacitor CV1, and the light-receiving device PD.

As the transistor M1 to the transistor M7, for example, a transistor that can be used as any of the transistor Tr1, the transistor Tr2, the transistor Tr5, the transistor Tr6, and the transistor M1 to the transistor M5 described in Embodiment 1 can be used.

In the circuit PV1, for example, the first terminal of the transistor M1 is electrically connected to the wiring OL[j], the gate of the transistor M1 is electrically connected to the wiring SE[i], and the second terminal of the transistor M1 is electrically connected to the first terminal of the transistor M2. The second terminal of the transistor M2 is electrically connected to the wiring VDE, and the gate of the transistor M2 is electrically connected to the first terminal of the transistor M3 and the first terminal of the capacitor CV1.

The second terminal of the transistor M3 is electrically connected to the wiring VR2, and the gate of the transistor M3 is electrically connected to a wiring RS2[$i$]. The second terminal of the capacitor CV1 is electrically connected to the first terminal of the transistor M4, the first terminal of the transistor M5, and a first terminal of the transistor M6. The second terminal of the transistor M4 is electrically connected to the wiring VR1, and the gate of the transistor M4 is electrically connected to a wiring RS1[$i$]. The second terminal of the transistor M5 is electrically connected to a second terminal of the transistor M6 and the anode of the light-receiving device PD, the gate of the transistor M5 is electrically connected to a wiring TX1[$i$], and a gate of the transistor M6 is electrically connected to a wiring TX2[$i$]. The cathode of the light-receiving device PD is electrically connected to the wiring CT[i].

In the circuit PV2, for example, the first terminal of the transistor M1 is electrically connected to the wiring OL[j+1], the gate of the transistor M1 is electrically connected to the wiring SE[i], and the second terminal of the transistor M1 is electrically connected to the first terminal of the transistor M2. The second terminal of the transistor M2 is electrically connected to the wiring VDE, and the gate of the transistor M2 is electrically connected to the first terminal of the transistor M3 and the first terminal of the capacitor CV1. The second terminal of the transistor M3 is electrically connected to the wiring VR2, and the gate of the transistor M3 is electrically connected to the wiring RS2[$i$]. The second terminal of the capacitor CV1 is electrically connected to the first terminal of the transistor M4 and the first terminal of the transistor M5. The second terminal of the transistor M4 is electrically connected to the wiring VR1, and the gate of the transistor M4 is electrically connected to the wiring RS1[$i$]. The second terminal of the transistor M5 is electrically connected to a first terminal of the transistor M7 and the anode of the light-receiving device PD, the gate of the transistor M5 is electrically connected to the wiring TX1[$i$], and a gate of the transistor M7 is electrically connected to the wiring TX2[$i$]. The cathode of the light-receiving device PD is electrically connected to the wiring CT[i].

In the circuit PV3, for example, the first terminal of the transistor M1 is electrically connected to the wiring OL[j], the gate of the transistor M1 is electrically connected to the wiring SE[i+1], and the second terminal of the transistor M1 is electrically connected to the first terminal of the transistor M2. The second terminal of the transistor M2 is electrically connected to the wiring VDE, and the gate of the transistor M2 is electrically connected to the first terminal of the transistor M3 and the first terminal of the capacitor CV1. The second terminal of the transistor M3 is electrically connected to the wiring VR2, and the gate of the transistor M3 is electrically connected to a wiring RS2[$i$+1]. The second terminal of the capacitor CV1 is electrically connected to the first terminal of the transistor M4 and the first terminal of the transistor M5. The second terminal of the transistor M4 is electrically connected to the wiring VR1, and the gate of the transistor M4 is electrically connected to a wiring RS1[$i$+1]. The second terminal of the transistor M5 is electrically connected to the first terminal of the transistor M7 and the anode of the light-receiving device PD, the gate of the transistor M5 is electrically connected to a wiring TX1[$i$+1], and the gate of the transistor M7 is electrically connected to a wiring TX2[$i$+1]. The cathode of the light-receiving device PD is electrically connected to the wiring CT[i+1].

In the circuit PV4, for example, the first terminal of the transistor M1 is electrically connected to the wiring OL[j+1], the gate of the transistor M1 is electrically connected to the wiring SE[i+1], and the second terminal of the transistor M1 is electrically connected to the first terminal of the transistor M2. The second terminal of the transistor M2 is electrically connected to the wiring VDE, and the gate of the transistor M2 is electrically connected to the first terminal of the transistor M3 and the first terminal of the capacitor CV1. The second terminal of the transistor M3 is electrically connected to the wiring VR2, and the gate of the transistor M3 is electrically connected to the wiring RS2[$i$+1]. The second terminal of the capacitor CV1 is electrically connected to the first terminal of the transistor M4 and the first terminal of the transistor M5. The second terminal of the transistor M4 is electrically connected to the wiring VR1, and the gate of the transistor M4 is electrically connected to the wiring RS1[$i$+1]. The second terminal of the transistor M5 is electrically connected to the first terminal of the transistor M7 and the anode of the light-receiving device PD, the gate of the transistor M5 is electrically connected to the wiring TX1[$i$+1], and the gate of the transistor M7 is electrically connected to the wiring TX2[$i$+1]. The cathode of the light-receiving device PD is electrically connected to the wiring CT[i+1].

A second terminal of the transistor M7 in the circuit PV2 is electrically connected to a second terminal of the transistor M7 in the circuit PV3 and a second terminal of the transistor M7 in the circuit PV4.

In this specification and the like, an electrical connection point of the gate of the transistor M2, the gate of the transistor M3, and the first terminal of the capacitor CV1 is referred to as the node N2 in each of the circuit PV1 to the circuit PV4. An electrical connection point of the second terminal of the capacitor CV1, the first terminal of the transistor M4, the first terminal of the transistor M5, and the first terminal of the transistor M6 is referred to as the node N1 in the circuit PV1. Similarly, an electrical connection point of the second terminal of the capacitor CV1, the first terminal of the transistor M4, and the first terminal of the transistor M5 is referred to as the node N1 in each of the circuit PV2 to the circuit PV4.

For the wiring VR1, the wiring VR2, and the wiring VDE, refer to the description of the wiring VR1, the wiring VR2, and the wiring VDE in Embodiment 1.

The wiring TX1[$i$] and the wiring TX2[$i$] illustrated in FIG. 9 each correspond to the wiring TX[i] illustrated in FIG. 7 and FIG. 8. Similarly, the wiring TX1[$i$+1] and the wiring TX2[$i$+1] illustrated in FIG. 9 each correspond to the wiring TX[i+1] illustrated in FIG. 7 and FIG. 8.

The wiring RS1[$i$] and the wiring RS2[$i$] illustrated in FIG. 9 each correspond to the wiring RS[i] illustrated in FIG. 7 and FIG. 8. Similarly, the wiring RS1[$i$+1] and the wiring RS2[$i$+1] illustrated in FIG. 9 each correspond to the wiring RS[i+1] illustrated in FIG. 7 and FIG. 8.

Note that the wiring TX1[$i$] and the wiring TX1[$i$+1] illustrated in FIG. 9 may be combined into one wiring, the wiring TX2[$i$] and the wiring TX2[$i$+1] may be combined into one wiring, the wiring RS1[$i$] and the wiring RS1[$i$+1] may be combined into one wiring, the wiring RS2[$i$] and the wiring RS2[$i$+1] may be combined into one wiring, and the wiring CT[i] and the wiring CT[i+1] may be combined into one wiring.

Figure 11:
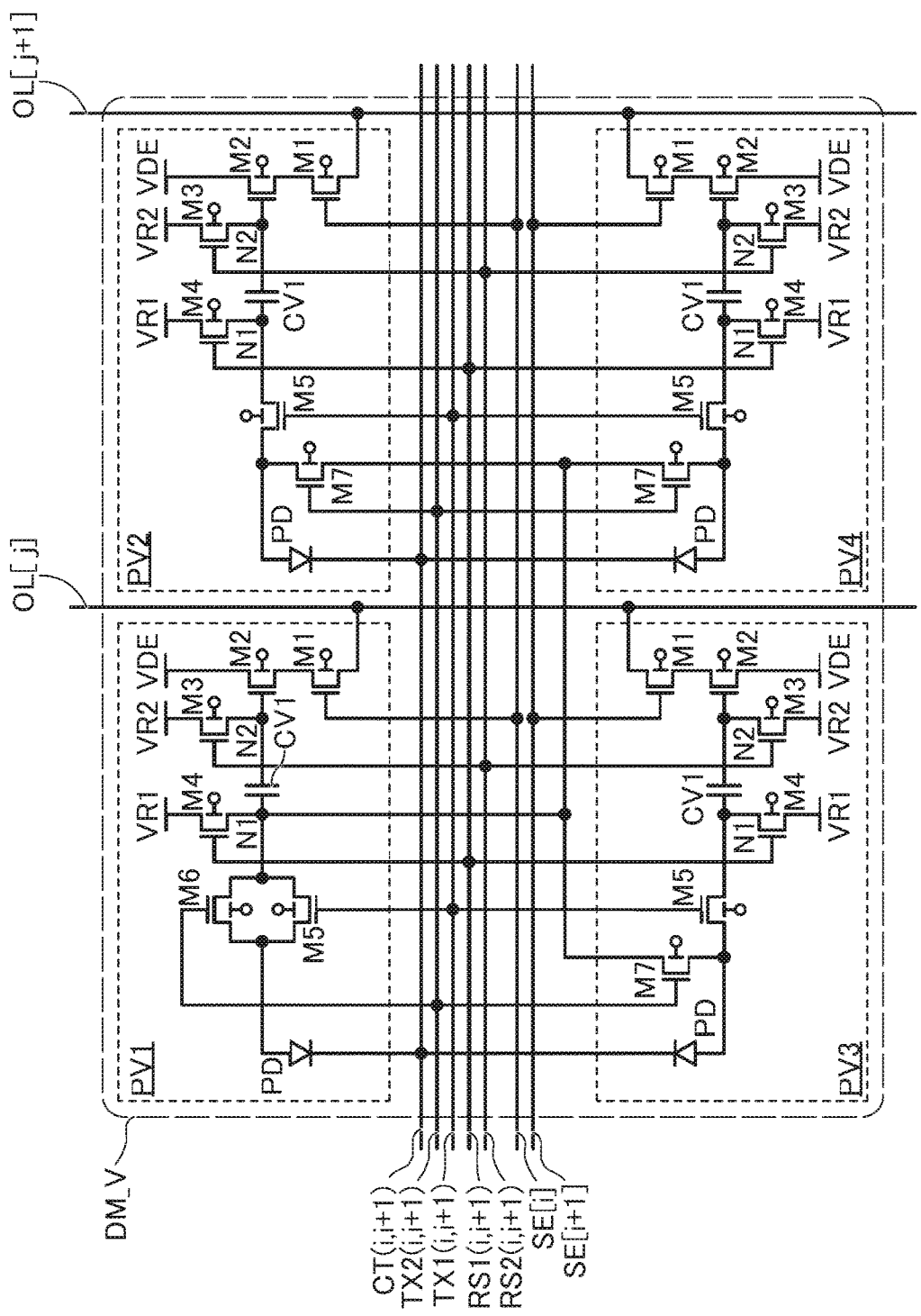
FIG. 11 is a circuit diagram illustrating a structure example of a semiconductor device.

Specifically, for example, the arrangement of the wirings extending in the region DM_V illustrated in FIG. 9 may be changed into the arrangement of the wirings extending in the region DM_V illustrated in FIG. 11. In FIG. 11, the wiring TX1[*i*] and the wiring TX1[*i*+1] in FIG. 9 are combined into a wiring TX1(*i,i*+1), the wiring TX2[*i*] and the wiring TX2[*i*+1] in FIG. 9 are combined into a wiring TX2(*i,i*+1), the wiring RS1[*i*] and the wiring RS1[*i*+1] in FIG. 9 are combined into a wiring RS1(*i,i*+1), the wiring RS2[*i*] and the wiring RS2[*i*+1] in FIG. 9 are combined into a wiring RS2(*i,i*+1), and the wiring CT[i] and the wiring CT[i+1] in FIG. 9 are combined into a wiring CT(*i,i*+1).

The four circuits PV included in the region DM_V illustrated in FIG. 7 and FIG. 8 are preferably imaging pixel circuits receiving light of the same color. For example, the color of light that can be received by the four circuits PV included in the region DM_V may be one color selected from red (R), green (G), blue (B), cyan, magenta, yellow, and white.

In the case where a plurality of the regions DM_V are included in the display region in the display apparatus, the color of light that can be received by the four circuits PV may differ between the regions DM_V. A specific example will be described below.

Figure 10:
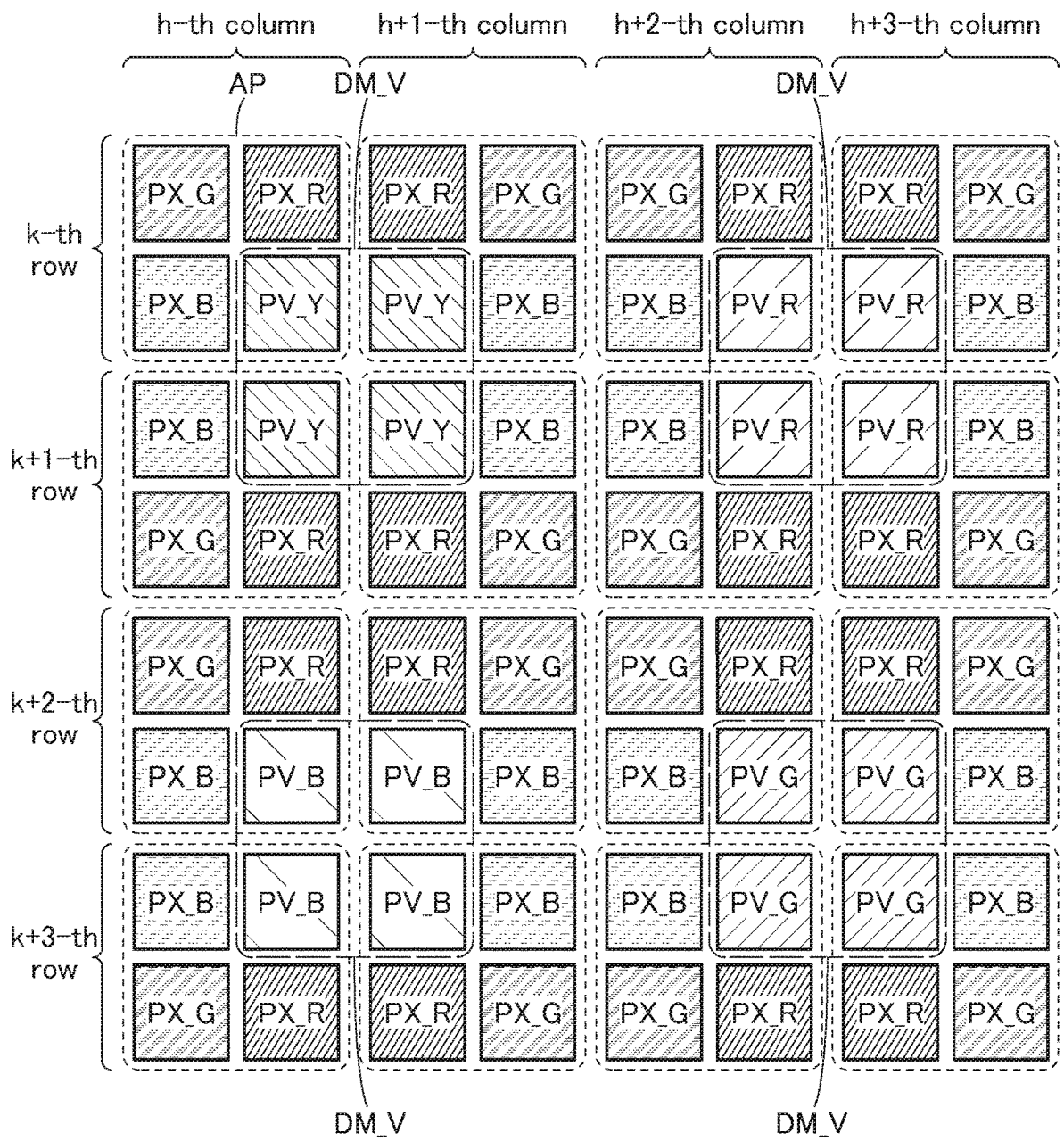
FIG. 10 is a plan view illustrating examples of pixels.

A block diagram in FIG. 10 illustrates a structure example of a display region including a circuit PV_Y, a circuit PV_R, a circuit PV_G, and a circuit PV_B, which are four imaging pixel circuits receiving light of different colors from each other. Specifically, the display region in FIG. 10 includes the region DM_V including four circuits PV_Y, the region DM_V including four circuits PV_R, the region DM_V including four circuits PV_G, and the region DM_V including four circuits PV_B. For example, the circuits PV_Y can be imaging pixel circuits receiving yellow light, the circuits PV_R can be imaging pixel circuits receiving red light, the circuits PV_G can be imaging pixel circuits receiving green light, and the circuits PV_B can be imaging pixel circuits receiving blue light.

The four imaging pixel circuits included in each of the regions DM_V illustrated in FIG. 10 correspond to the four circuits PV1 to PV4 included in the region DM_V in FIG. 9 or FIG. 11.

As for the plurality of regions DM_V positioned in the k-th row (k is an integer of 1 or more) and the k+1-th row, two circuits PV_Y and two circuits PV_R are arranged in this order from the left. As for the plurality of regions DM_V positioned in the k+2-th row and the k+3-th row, two circuits PV_B and two circuits PV_G are arranged in this order from the left. As for the circuits included in the regions DM_V positioned in the h-th column (h is an integer of 1 or more) and the h+1-th column, the two circuits PV_Y and the two circuits PV_B are arranged in this order from the top. As for the circuits included in the regions DM_V positioned in the h+2-th column and the h+3-th column, the two circuits PV_R and the two circuits PV_G are arranged in this order from the top.

Note that in the plurality of regions DM_V positioned in the k-th row and the k+1-th row in the display region in FIG. 10, the imaging pixel circuits may be arranged such that the two circuits PV_Y, the two circuits PV_R, the two circuits PV_Y, and the two circuits PV_R are arranged in this order repeatedly. In the plurality of regions DM_V positioned in the k+2-th row and the k+3-th row, the imaging pixel circuits may be arranged such that the two circuits PV_B, the two circuits PV_G, the two circuits PV_B, and the two circuits PV_G are arranged in this order repeatedly. In the plurality of regions DM_V positioned in the h-th column and the h+1-th column, the imaging pixel circuits may be arranged such that the two circuits PV_Y, the two circuits PV_B, the two circuits PV_Y, and the two circuits PV_B are arranged in this order repeatedly. In the plurality of regions DM_V positioned in the h+2-th column and the h+3-th column, the imaging pixel circuits may be arranged such that the two circuits PV_R, the two circuits PV_G, the two circuits PV_R, and the two circuits PV_G are arranged in this order repeatedly.

Although light of four colors is received in the circuit structure illustrated in FIG. 10, light of three or less colors or five or more colors may be received in the structure. In that case, light of three or less colors or five or more colors selected from red (R), green (G), blue (B), cyan, magenta, yellow, and white may be received.

Operation Example 1

Next, an example of the first operation of the circuit PV1 to the circuit PV4 included in the region DM_V in FIG. 11 will be described.

Figure 12:
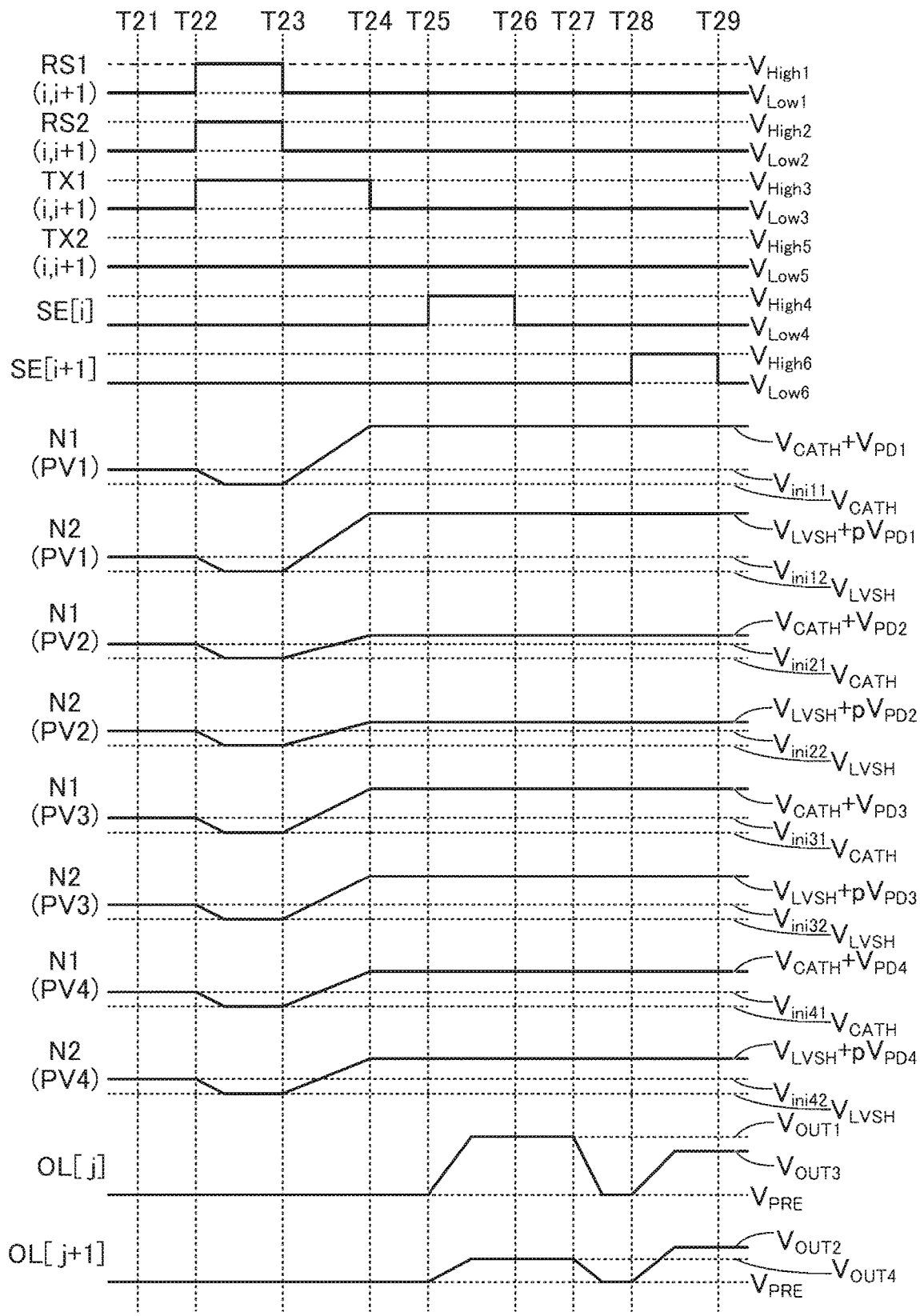
FIG. 12 is a timing chart showing an operation example of a semiconductor device.

FIG. 12 is a timing chart showing the example of the first operation of the circuit PV1 to the circuit PV4 included in the region DM_V in FIG. 11. The timing chart in FIG. 12 shows, for example, changes in the potentials of the wiring RS1(*i,i*+1), the wiring RS2(*i,i*+1), the wiring TX1(*i,i*+1), the wiring TX2(*i,i*+1), the wiring SE[i], the wiring SE[i+1], the node N1 and the node N2 in the circuit PV1 (denoted as N1 (PV1) and N2 (PV1) in FIG. 12), the node N1 and the node N2 in the circuit PV2 (denoted as N1 (PV2) and N2 (PV2) in FIG. 12), the node N1 and the node N2 in the circuit PV3 (denoted as N1 (PV3) and N2 (PV3) in FIG. 12), the node N1 and the node N2 in the circuit PV4 (denoted as N1 (PV4) and N2 (PV4) in FIG. 12), the wiring OL[j], and the wiring OL[j+I] in a period from Time T21 to Time T29 and around the period In this operation example, a high-level potential supplied from the wiring RS1(*i,i*+1) is referred to as $V_{High1}$ and a low-level potential supplied from the wiring RS1(*i,i*+1) is referred to as $V_{Low1}$. A high-level potential supplied from the wiring RS2(*i,i*+1) is referred to as $V_{High2}$ and a low-level potential supplied from the wiring RS2(*i,i*+1) is referred to as $V_{Low2}$. A high-level potential supplied from the wiring TX1(*i,i*+1) is referred to as $V_{High3}$ and a low-level potential supplied from the wiring TX1(*i,i*+1) is referred to as $V_{Low3}$. A high-level potential supplied from the wiring TX2(*i,i*+1) is referred to as $V_{High5}$ and a low-level potential supplied from the wiring TX1(*i,i*+1) is referred to as $V_{Low5}$. A high-level potential supplied from the wiring SE[i] is referred to as $V_{High4}$ and a low-level potential supplied from the wiring SE[i] is referred to as $V_{Low4}$. A high-level potential supplied from the wiring SE[i+1] is referred to as $V_{High6}$ and a low-level potential supplied from the wiring SE[i+1] is referred to as $V_{Low6}$.

In this operation example, a constant potential supplied from the wiring VR1 is referred to as $V_{CATH}$ and a constant potential supplied from the wiring VR2 is referred to as $V_{LVSH}$. A constant potential supplied from the wiring VDE is referred to as $V_{DD}$. A constant potential supplied from the wiring CT is referred to as $V_{CATH}$, which is the same as the constant potential supplied from the wiring VR1.

Before Time T21, the wiring OL[j] and the wiring OL[j+1] are precharged with $V_{PRE}$, for example. Note that the timing at which the wiring OL[j] and the wiring OL[j+1] are precharged with $V_{PRE}$ is not necessarily before Time T21 and may be any timing between Time T21 and Time T25.

Note that in this operation example, $V_{LVSH}$ is a potential higher than $V_{CATH}$. Furthermore, $V_{LVSH}$ and $V_{PRE}$ may be potentials equal to each other. Moreover, $V_{DD}$ is a potential higher than $V_{CATH}$, $V_{LVSH}$, and $V_{PRE}$.

Note that $V_{High4}$ and $V_{PRE}$ re potentials set such that a difference between $V_{High4}$ and $V_{PRE}$ is higher than the threshold voltage of the transistor M4, and $V_{Low4}$ and $V_{PRE}$ are potentials set such that a difference between $V_{Low4}$ and $V_{PRE}$ is lower than or equal to the threshold voltage of the transistor M4.

Furthermore, $V_{High6}$ may be a potential equal to $V_{High4}$. Moreover, $V_{Low6}$ may be a potential equal to $V_{Low4}$.

Furthermore, $V_{High1}$ and $V_{CATH}$ are potentials set such that a difference between $V_{High1}$ and $V_{CATH}$ is higher than the threshold voltage of the transistor M4, and $V_{Low1}$ and $V_{CATH}$ are potentials set such that a difference between $V_{Low1}$ and $V_{CATH}$ is lower than or equal to the threshold voltage of the transistor M4. In addition, $V_{High2}$ and $V_{LVSH}$ are potentials set such that a difference between $V_{High2}$ and $V_{LVSH}$ is higher than the threshold voltage of the transistor M3, and $V_{Low2}$ and $V_{LVSH}$ are potentials set such that a difference between $V_{Low2}$ and $V_{LVSH}$ is lower than or equal to the threshold voltage of the transistor M3. Moreover, $V_{High3}$ and $V_{CATH}$ are potentials set such that a difference between $V_{High3}$ and $V_{CATH}$ is higher than the threshold voltage of the transistor M5, and $V_{Low3}$ and $V_{CATH}$ are potentials set such that a difference between $V_{Low3}$ and $V_{CATH}$ is lower than or equal to the threshold voltage of the transistor M5.

Furthermore, $V_{High5}$ and $V_{CATH}$ are potentials set such that a difference between $V_{High5}$ and $V_{CATH}$ is higher than the threshold voltages of the transistor M6 and the transistor M7, and $V_{Low5}$ and $V_{CATH}$ are potentials set such that a difference between $V_{Low5}$ and $V_{CATH}$ is lower than or equal to the threshold voltages of the transistor M6 and the transistor M7.

Accordingly, in the case where the threshold voltages of the transistor M4 to the transistor M7 are approximately equal to each other, $V_{High1}$, $V_{High3}$, and $V_{High5}$ may be potentials equal to each other and $V_{Low1}$, $V_{Low3}$, and $V_{Low5}$ may be potentials equal to each other.

[From Time T21 to Time T22]

In a period from Time T21 to Time T22, the low-level potential ($V_{Low3}$) is input to the wiring TX1($i,i$+1), the low-level potential ($V_{Low5}$) is input to the wiring TX2($i,i$+1), the low-level potential ($V_{Low1}$) is input to the wiring RS1($i,i$+1), the low-level potential ($V_{Low2}$) is input to the wiring RS2($i,i$+1), the low-level potential ($V_{Low4}$) is input to the wiring SE[$i$], and the low-level potential ($V_{Low6}$) is input to the wiring SE[$i$+1].

In the period from Time T21 to Time T22, the potentials of the node N1 and the node N2 in the circuit PV1 are $V_{ini11}$ and $V_{ini12}$, respectively; the potentials of the node N1 and the node N2 in the circuit PV2 are $V_{ini21}$ and $V_{ini22}$, respectively; the potentials of the node N1 and the node N2 in the circuit PV3 are $V_{ini31}$ and $V_{ini32}$, respectively; and the potentials of the node N1 and the node N2 in the circuit PV4 are $V_{ini41}$ and $V_{ini42}$, respectively. Note that each of $V_{ini11}$, $V_{ini12}$, $V_{ini21}$, $V_{ini22}$, $V_{ini31}$, $V_{ini32}$, $V_{ini41}$, and $V_{ini42}$ is a potential higher than or equal to $V_{CATH}$, for example. Note that $V_{ini1}$, $V_{ini12}$, $V_{ini2}$, $V_{ini22}$, $V_{ini31}$, $V_{ini32}$, $V_{ini41}$, and $V_{ini42}$ can be potentials corresponding to imaging data captured by the circuit PV1 to the circuit PV4 before Time T21, for example.

The low-level potential ($V_{Low1}$) from the wiring RS1 is applied to the gate of the transistor M4 in each of the circuit PV1 to the circuit PV4, and the gate-source voltage of the transistor M4 becomes $V_{Low1}-V_{CATH}$. Since $V_{Low1}-V_{CATH}$ is lower than or equal to the threshold voltage of the transistor M4, the transistor M4 is in the off state.

The low-level potential ($V_{Low3}$) from the wiring TX1($i, i$+1) is applied to the gate of the transistor M5 in each of the circuit PV1 to the circuit PV4. At this time, the gate-source voltage of the transistor M5 is lower than or equal to the threshold voltage of the transistor M5, and the transistor M5 is in the off state.

The low-level potential ($V_{Low2}$) from the wiring RS2($i, i$+1) is applied to the gate of the transistor M3 in each of the circuit PV1 to the circuit PV4, and the gate-source voltage of the transistor M3 becomes $V_{Low2}-V_{LVSH}$. Since $V_{Low2}-V_{LVSH}$ is lower than or equal to the threshold voltage of the transistor M3, the transistor M3 is in the off state.

The low-level potential ($V_{Low4}$) from the wiring SE[$i$] is applied to the gate of the transistor M1 in each of the circuit PV1 and the circuit PV2. At this time, the gate-source voltage of the transistor M1 is lower than or equal to the threshold voltage of the transistor M1, and the transistor M1 is in the off state.

Similarly, the low-level potential ($V_{Low6}$) from the wiring SE[$i$+1] is applied to the gate of the transistor M1 in each of the circuit PV3 and the circuit PV4. At this time, the gate-source voltage of the transistor M1 is lower than or equal to the threshold voltage of the transistor M1, and the transistor M1 is in the off state.

In each of the circuit PV1 to the circuit PV4, the potential of the first terminal of the transistor M2 is lower than $V_{DD}$ and the first terminal of the transistor M2 functions as the source in the period from Time T21 to Time T22. Note that the transistor M2 is turned on depending on the gate-source voltage of the transistor M2 but the transistor M1 is in the off state as described above; thus, current does not flow from the wiring VDE to the wiring OL[$j$] through the transistor M2 and the transistor M1 in the case of the circuit PV1 and the circuit PV3, and current does not flow from the wiring VDE to the wiring OL[$j$+1] through the transistor M2 and the transistor M1 in the case of the circuit PV2 and the circuit PV4.

[From Time T22 to Time T23]

In a period from Time T22 to Time T23, the high-level potential ($V_{High1}$) is input to the wiring RS1($i,i$+1), and the high-level potential ($V_{High2}$) is input to the wiring RS2($i,i$+1). The high-level potential ($V_{High3}$) is input to the wiring TX1($i,i$+1), and the low-level potential ($V_{Low5}$) is input to the wiring TX2($i,i$+1).

At this time, in each of the circuit PV1 to the circuit PV4, the high-level potential ($V_{High1}$) from the wiring RS1($i,i$+1) is applied to the gate of the transistor M4, and the gate-source voltage of the transistor M4 becomes $V_{High1}-V_{CATH}$. Since $V_{High1}-V_{CATH}$ is higher than the threshold voltage of the transistor M4, the transistor M4 is turned on. Thus, electrical continuity is established between the wiring VR1 and the first terminal of the transistor M5 (the second terminal of the capacitor CV1 or the node N1), and the potential of the first terminal of the transistor M5 (the second terminal of the capacitor CV1 or the node N1) becomes $V_{CATH}$. In the case of the circuit PV1, the potential of the first terminal of the transistor M6 also becomes $V_{CATH}$.

In addition, the high-level potential ($V_{High3}$) from the wiring TX1($i,i$+1) is applied to the gate of the transistor M5 in each of the circuit PV1 to the circuit PV4, and the gate-source voltage of the transistor M5 becomes $V_{High3}-V_{CATH}$. Since $V_{High3}-V_{CATH}$ is higher than the threshold voltage of the transistor M5, the transistor M5 is turned on. Thus, electrical continuity is established between the wiring VR1 and the anode of the light-receiving device PD, and the potential of the anode of the light-receiving device PD becomes $V_{CATH}$.

In the circuit PV1, the low-level potential ($V_{Low5}$) from the wiring TX2($i,i$+1) is applied to the gate of the transistor M6, and the potentials of the first terminal (the node N1) and the second terminal of the transistor M6 each become $V_{CATH}$. Thus, the voltage between the gate and the first terminal (the voltage between the gate and the second terminal) of the transistor M6 becomes $V_{Low5}-V_{CATH}$, and the transistor M6 is turned off.

In each of the circuit PV2 to the circuit PV4, the low-level potential ($V_{Low5}$) from the wiring TX2($i,i$+1) is applied to the gate of the transistor M7. Since the potentials of the first terminal and the second terminal (the node N1 in the circuit PV1) of the transistor M7 are $V_{CATH}$, the voltage between the gate and the first terminal (the voltage between the gate and the second terminal) of the transistor M7 becomes $V_{Low5}-V_{CATH}$, and the transistor M7 is turned off.

At this time, the anode-cathode voltage of the light-receiving device PD becomes 0 V in each of the circuit PV1 to the circuit PV4; thus, current does not flow between the anode and the cathode of the light-receiving device PD.

The high-level potential ($V_{High2}$) from the wiring RS2 is applied to the gate of the transistor M3 in each of the circuit PV1 to the circuit PV4, and the gate-source voltage of the transistor M3 becomes $V_{High2}-V_{LVSH}$. Since $V_{High2}-V_{LVSH}$ is higher than the threshold voltage of the transistor M3, the transistor M3 is turned on. Thus, electrical continuity is established between the wiring VR2 and the gate of the transistor M2 (the first terminal of the capacitor CV1 or the node N2), and the potential of the gate of the transistor M2 (the first terminal of the capacitor CV1 or the node N2) becomes $V_{LVSH}$.

Accordingly, in the period from Time T22 to Time T23, $V_{LVSH}$ is applied to the gate of the transistor M2 and the potential $V_{DD}$ from the wiring VDE is applied to the second terminal of the transistor M2 in each of the circuit PV1 to the circuit PV4. Here, as in the period from Time T21 to Time T22, the potential of the first terminal of the transistor M2 is lower than $V_{DD}$ and the first terminal of the transistor M2 functions as the source. Although the transistor M2 is turned on depending on the gate-source voltage of the transistor M2, the transistor M2 is preferably in the off state in the period from Time T22 to Time T23. Since the transistor M1 is in the off state as in the period from Time T21 to Time T22, current does not flow from the wiring VDE to the wiring OL[j] through the transistor M2 and the transistor M1 in the case of the circuit PV1 and the circuit PV3, and current does not flow from the wiring VDE to the wiring OL[j+1] through the transistor M2 and the transistor M1 in the case of the circuit PV2 and the circuit PV4.

[From Time T23 to Time T24] In a period from Time T23 to Time T24, the low-level potential ($V_{Low1}$) is input to the wiring RS1($i,i$+1), and the low-level potential ($V_{Low2}$) is input to the wiring RS2($i,i$+1).

The low-level potential ($V_{Low1}$) from the wiring RS1($i,i$+1) is applied to the gate of the transistor M4 in each of the circuit PV1 to the circuit PV4, and the gate-source voltage of the transistor M4 becomes $V_{Low1}-V_{CATH}$. Since $V_{Low1}-V_{CATH}$ is lower than or equal to the threshold voltage of the transistor M4, the transistor M4 is turned off.

The low-level potential ($V_{Low2}$) from the wiring RS2($i,i$+1) is applied to the gate of the transistor M3 in each of the circuit PV1 to the circuit PV4, and the gate-source voltage of the transistor M3 becomes $V_{Low2}-V_{LVSH}$. Since $V_{Low2}-V_{LVSH}$ is lower than or equal to the threshold voltage of the transistor M3, the transistor M3 is turned off. Thus, the first terminal of the capacitor CV1 (the node N2) is brought into a floating state.

Note that the transistor M5 in each of the circuit PV1 to the circuit PV4 remains in the on state since before Time T23.

Here, when the light-receiving device PD is irradiated with light in each of the circuit PV1 to the circuit PV4, current flows in the direction from the cathode to the anode of the light-receiving device PD. Since the transistor M4 is in the off state and the transistor M5 is in the on state, positive charge due to the current flows to the node N1 only for a period during which the transistor M5 is on and is accumulated in the second terminal of the capacitor CV1. Assuming that the transistor M5 is turned off at Time T24, the potential of the second terminal of the capacitor CV1 (the node N1) continuously increases in the period from Time T23 to Time T24.

In the period from Time T23 to Time T24, the amount of positive charge accumulated in the second terminal of the capacitor CV1 (the node N1) depends on the amount of current flowing through the light-receiving device PD; thus, the amount of potential change per unit time in the second terminal of the capacitor CV1 (the node N1) is determined. The amount of current flowing through the light-receiving device PD depends on the intensity of light incident on the light-receiving device PD. In this operation example, for example, when light is received by the light-receiving devices PD in the circuit PV1 to the circuit PV4, the potential of the node N1 in the circuit PV1 changes from $V_{CATH}$ to $V_{CATH}+V_{PD1}$, the potential of the node N1 in the circuit PV2 changes from $V_{CATH}$ to $V_{CATH}+V_{PD2}$, the potential of the node N1 in the circuit PV3 changes from $V_{CATH}$ to $V_{CATH}+V_{PD3}$, and the potential of the node N1 in the circuit PV4 changes from $V_{CATH}$ to $V_{CATH}+V_{PD4}$.

Since the first terminal of the capacitor CV1 (the node N2) in each of the circuit PV1 to the circuit PV4 is in a floating state in the period from Time T23 to Time T24, the potential of the first terminal of the capacitor CV1 (the node N2) increases with increasing potential of the second terminal of the capacitor CV1 (the node N1) owing to the capacitive coupling of the capacitor CV1. The amount of potential change of the first terminal of the capacitor CV1 (the node N2) is obtained by multiplying the amount of potential change of the second terminal of the capacitor CV1 (the node N1) by a capacitive coupling coefficient determined by the peripheral components of the first terminal of the capacitor CV1 (the node N2). The capacitive coupling coefficient is calculated using the capacitance value of the capacitor CV1, the gate capacitance of the transistor M2, and the parasitic capacitance, for example. Here, when the capacitive coupling coefficient due to the capacitor CV1 in each of the circuit PV1 to the circuit PV4 is p and the light-receiving device PD in each of the circuit PV1 to the circuit PV4 receives light, the potential of the first terminal of the capacitor CV1 (the node N2) in the circuit PV1 changes from $V_{LVSH}$ to $V_{LVSH}+pV_{PD1}$, the potential of the first terminal of the capacitor CV1 (the node N2) in the circuit PV2 changes from $V_{LVSH}$ to $V_{LVSH}+pV_{PD2}$, the potential of the first terminal of the capacitor CV1 (the node N2) in the circuit PV3 changes from $V_{LVSH}$ to $V_{LVSH}+pV_{PD3}$, and the potential of the first terminal of the capacitor CV1 (the node N2) in the circuit PV4 changes from $V_{LVSH}$ to $V_{LVSH}+pV_{PD4}$.

[From Time T24 to Time T25]

At Time T24, the low-level potential ($V_{Low3}$) is input to the wiring TX1($i,i$+1).

At this time, the low-level potential ($V_{Low3}$) from the wiring TX1($i,i$+1) is applied to the gate of the transistor M5 in each of the circuit PV1 to the circuit PV4. At this time, the gate-source voltage of the transistor M5 is lower than or equal to the threshold voltage of the transistor M5, and the transistor M5 is turned off.

Accordingly, accumulation of positive charge (a potential increase) in the first terminal of the capacitor CV1 (the node N2) due to the anode-cathode current of the light-receiving device PD in each of the circuit PV1 to the circuit PV4, which is performed by the operation from Time T23 to Time T24, is completed.

[From Time T25 to Time T26] In a period from Time T25 to Time T26, the high-level potential ($V_{High4}$) is input to the wiring SE[i].

The high-level potential ($V_{High4}$) from the wiring SE[i] is applied to the gate of the transistor M1 in each of the circuit PV1 and the circuit PV2. At this time, the gate-source voltage of the transistor M1 becomes $V_{High4}-V_{PRE}$. Since $V_{High4}-V_{PRE}$ is higher than the threshold voltage of the transistor M1, the transistor M1 is turned on.

In the period from Time T25 to Time T26, $V_{LVSH}+pV_{PD1}$ is applied to the gate of the transistor M2 and the potential $V_{DD}$ from the wiring VDE is applied to the second terminal of the transistor M2 in the circuit PV1. Moreover, since the transistor M1 is in the on state, $V_{PRE}$ with which the wiring OL[j] is precharged is applied to the first terminal of the transistor M2.

At this time, the gate-source voltage of the transistor M2 in the circuit PV1 becomes $V_{LVSH}+pV_{PD1}-V_{PRE}$, and current corresponding to the gate-source voltage $V_{LVSH}+pV_{PD1}-V_{PRE}$ flows between the source and the drain of the transistor M2. Here, the wiring OL[j] is in a floating state; thus, the potential of the wiring OL[j] increases over time. Hence, when current flows between the source and the drain of the transistor M2, the gate-source voltage of the transistor M2 becomes lower; ideally, the transistor M2 is turned off when the gate-source voltage of the transistor M2 becomes equal to the threshold voltage of the transistor M2. The potential of the wiring OL[j] at this time is $V_{OUT1}$.

In the period from Time T25 to Time T26, $V_{LVSH}+pV_{PD2}$ is applied to the gate of the transistor M2 and the potential $V_{DD}$ from the wiring VDE is applied to the second terminal of the transistor M2 in the circuit PV2. Moreover, since the transistor M1 is in the on state, $V_{PRE}$ with which the wiring OL[j+1] is precharged is applied to the first terminal of the transistor M2.

At this time, the gate-source voltage of the transistor M2 in the circuit PV2 becomes $V_{LVSH}+pV_{PD2}-V_{PRE}$, and current corresponding to the gate-source voltage $V_{LVSH}+pV_{PD2}-V_{PRE}$ flows between the source and the drain of the transistor M2. Here, the wiring OL[j+1] is in a floating state; thus, the potential of the wiring OL[j+1] increases over time. Hence, when current flows between the source and the drain of the transistor M2, the gate-source voltage of the transistor M2 becomes lower; ideally, the transistor M2 is turned off when the gate-source voltage of the transistor M2 becomes equal to the threshold voltage of the transistor M2. The potential of the wiring OL[j+1] at this time is $V_{OUT2}$.

[From Time T26 to Time T27] In a period from Time T26 to Time T27, the low-level potential ($V_{Low4}$) is input to the wiring SE[i].

The low-level potential ($V_{Low4}$) from the wiring SE[i] is applied to the gate of the transistor M1 in each of the circuit PV1 and the circuit PV2. At this time, the gate-source voltage of the transistor M1 is lower than or equal to the threshold voltage of the transistor M1, and the transistor M1 is turned off.

The potentials of the wiring OL[j] and the wiring OL[j+1] are read at this time, whereby imaging data captured by the light-receiving devices PD in the circuit PV1 and the circuit PV2 in the period from Time T23 to Time T24 can be obtained.

[From Time T27 to Time T28]

In a period from Time T27 to Time T28, the wiring OL[j] and the wiring OL[j+1] are each precharged with the potential $V_{PRE}$. Thus, the potential of the wiring OL[j] read from the circuit PV1 and the potential of the wiring OL[j+1] read from the circuit PV2 in the period from Time T26 to Time T27 can each be reset to the initial potential ($V_{PRE}$).

[From Time T28 to Time T29]

In a period from Time T28 to Time T29, the high-level potential ($V_{High6}$) is input to the wiring SE[i+1].

The high-level potential ($V_{High6}$) from the wiring SE[i+1] is applied to the gate of the transistor M1 in each of the circuit PV3 and the circuit PV4. At this time, the gate-source voltage of the transistor M1 becomes $V_{High6}-V_{PRE}$. Since $V_{High6}-V_{PRE}$ is higher than the threshold voltage of the transistor M1, the transistor M1 is turned on.

In the period from Time T28 to Time T29, $V_{LVSH}+pV_{PD3}$ is applied to the gate of the transistor M2 and the potential $V_{DD}$ from the wiring VDE is applied to the second terminal of the transistor M2 in the circuit PV3. Moreover, since the transistor M1 is in the on state, $V_{PRE}$ with which the wiring OL[j] is precharged is applied to the first terminal of the transistor M2.

At this time, the gate-source voltage of the transistor M2 in the circuit PV3 becomes $V_{LVSH}+pV_{PD3}-V_{PRE}$, and current corresponding to the gate-source voltage $V_{LVSH}+pV_{PD3}-V_{PRE}$ flows between the source and the drain of the transistor M2. Here, the wiring OL[j] is in a floating state; thus, the potential of the wiring OL[j] increases over time. Hence, when current flows between the source and the drain of the transistor M2, the gate-source voltage of the transistor M2 becomes lower; ideally, the transistor M2 is turned off when the gate-source voltage of the transistor M2 becomes equal to the threshold voltage of the transistor M2. The potential of the wiring OL[j] at this time is $V_{OUT3}$.

In the period from Time T28 to Time T29, $V_{LVSH}+pV_{PD4}$ is applied to the gate of the transistor M2 and the potential $V_{DD}$ from the wiring VDE is applied to the second terminal of the transistor M2 in the circuit PV4. Moreover, since the transistor M1 is in the on state, $V_{PRE}$ with which the wiring OL[j+1] is precharged is applied to the first terminal of the transistor M2.

At this time, the gate-source voltage of the transistor M2 in the circuit PV4 becomes $V_{LVSH}+pV_{PD4}-V_{PRE}$, and current corresponding to the gate-source voltage $V_{LVSH}+pV_{PD4}-V_{PRE}$ flows between the source and the drain of the transistor M2. Here, the wiring OL[j+1] is in a floating state; thus, the potential of the wiring OL[j+1] increases over time. Hence, when current flows between the source and the drain of the transistor M2, the gate-source voltage of the transistor M2 becomes lower; ideally, the transistor M2 is turned off when the gate-source voltage of the transistor M2 becomes equal to the threshold voltage of the transistor M2. The potential of the wiring OL[j+1] at this time is $V_{OUT4}$.

[After Time T29]

After Time T29, the low-level potential ($V_{Low6}$) is input to the wiring SE[i+1].

The low-level potential ($V_{Low6}$) from the wiring SE[i+1] is applied to the gate of the transistor M1 in each of the circuit PV3 and the circuit PV4. At this time, the gate-source voltage of the transistor M1 is lower than or equal to the threshold voltage of the transistor M1, and the transistor M1 is turned off.

The potentials of the wiring OL[j] and the wiring OL[j+1] are read at this time, whereby imaging data captured by the light-receiving devices PD in the circuit PV3 and the circuit PV4 in the period from Time T23 to Time T24 can be obtained.

Note that the operation of the semiconductor device of one embodiment of the present invention is not limited to the operation example in the timing chart of FIG. 12 and may be changed as appropriate as long as an object is achieved.

For example, the high-level potentials are input to the wiring RS1($i,i$+1), the wiring RS2($i,i$+1), and the wiring TX1($i,i$+1) at the same time in the period from Time T22 to Time T23 in the timing chart of FIG. 12; however, the operation of the semiconductor device of one embodiment of the present invention may be an operation in which the high-level potentials are input to the wiring RS1($i,i$+1), the wiring RS2($i,i$+1), and the wiring TX1($i,i$+1) in a given order in the period from Time T22 to Time T23. Specifically, for example, the high-level potentials may be input to the wirings in the following order: the wiring RS1($i,i$+1), the wiring RS2($i,i$+1), and the wiring TX1($i,i$+1). Alternatively, for example, the high-level potentials may be input to the wirings in the following order: the wiring RS1($i,i$+1), the wiring TX1($i,i$+1), and the wiring RS2($i,i$+1). Alternatively, for example, the high-level potentials may be input to the wirings in the following order: the wiring TX1($i,i$+1), the wiring RS1($i,i$+1), and the wiring RS2($i,i$+1). Alternatively, for example, the high-level potentials may be input to the wirings in the following order: the wiring TX1($i,i$+1), the wiring RS2($i,i$+1), and the wiring RS1($i,i$+1).

Operation Example 2

Next, an example of the second operation of the circuit PV1 to the circuit PV4 included in the region DM_V in FIG. 11 will be described.

Figure 13:
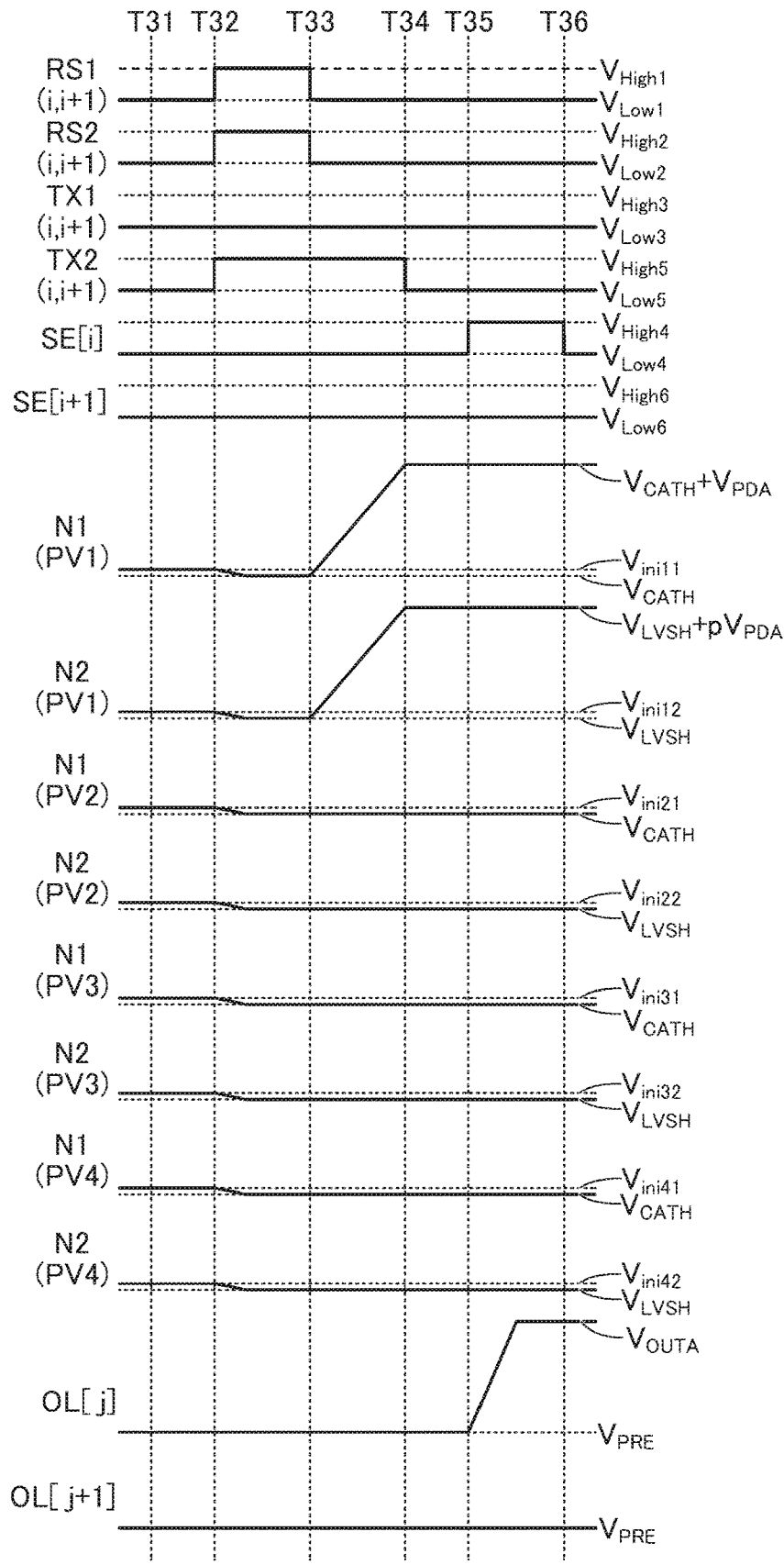
FIG. 13 is a timing chart showing an operation example of a semiconductor device.

FIG. 13 is a timing chart showing the example of the second operation of the circuit PV1 to the circuit PV4 included in the region DM_V in FIG. 11. The timing chart in FIG. 13 shows, for example, changes in the potentials of the wiring RS1($i,i$+1), the wiring RS2($i,i$+1), the wiring TX1($i,i$+1), the wiring TX2($i,i$+1), the wiring SE[i], the wiring SE[i+1], the node N1 and the node N2 in the circuit PV1 (denoted as N1 (PV1) and N2 (PV1) in FIG. 13), the node N1 and the node N2 in the circuit PV2 (denoted as N1 (PV2) and N2 (PV2) in FIG. 13), the node N1 and the node N2 in the circuit PV3 (denoted as N1 (PV3) and N2 (PV3) in FIG. 13), the node N1 and the node N2 in the circuit PV4 (denoted as N1 (PV4) and N2 (PV4) in FIG. 13), the wiring OL[j], and the wiring OL[j+1] in a period from Time T31 to Time T36 and around the period Note that the description of the contents already described with reference to the timing chart in FIG. 12 is sometimes omitted in the description of the operation example of the circuit AP in FIG. 11.

[From Time T31 to Time T32] In a period from Time T31 to Time T32, the low-level potential ($V_{Low3}$) is input to the wiring TX1($i,i$+1), the low-level potential ($V_{Low1}$) is input to the wiring RS1($i,i$+1), the low-level potential ($V_{Low2}$) is input to the wiring RS2($i,i$+1), the low-level potential ($V_{Low4}$) is input to the wiring SE[i], and the low-level potential ($V_{Low6}$) is input to the wiring SE[i+1], as in the period from Time T21 to Time T22 in the timing chart of FIG. 12. Since the potentials supplied to the wiring TX1($i,i$+1), the wiring TX2($i,i$+1), the wiring RS1($i,i$+1), the wiring RS2($i,i$+1), the wiring SE[i], and the wiring SE[i+1] are the same as the above-described potentials supplied to the wirings in the period from Time T21 to Time T22 in the timing chart of FIG. 12, refer to the operation example in the period from Time T21 to Time T22 in the timing chart of FIG. 12 for the switching operations of the transistor M1 to the transistor M7 included in the region DM_V.

[From Time T32 to Time T33]

In a period from Time T32 to Time T33, the high-level potential ($V_{High1}$) is input to the wiring RS1($i,i$+1) and the high-level potential ($V_{High2}$) is input to the wiring RS2($i,i$+1), as in the period from Time T22 to Time T23 in the timing chart of FIG. 12.

In the period from Time T32 to Time T33, the low-level potential ($V_{Low3}$) is input to the wiring TX1($i,i$+1) continuously since before Time T32, and the high-level potential ($V_{High5}$) is input to the wiring TX2($i,i$+1). This operation example differs from Operation example 1 in this embodiment in this point.

For the switching operation of the transistor M4 in each of the circuit PV1 to the circuit PV4, refer to the operation example in the period from Time T22 to Time T23 in the timing chart of FIG. 12. Specifically, in each of the circuit PV1 to the circuit PV4, the high-level potential ($V_{High1}$) from the wiring RS1($i,i$+1) is applied to the gate of the transistor M4, and the transistor M4 is turned on.

The low-level potential ($V_{Low3}$) from the wiring TX1($i,i$+1) is applied to the gate of the transistor M5 in each of the circuit PV1 to the circuit PV4, and the gate-source voltage of the transistor M5 becomes $V_{Low3}-V_{CATH}$. Since $V_{Low3}-V_{CATH}$ is lower than the threshold voltage of the transistor M5, the transistor M5 is turned off.

In the circuit PV1, the high-level potential ($V_{High5}$) from the wiring TX2($i,i$+1) is applied to the gate of the transistor M6, and the potential of the first terminal of the transistor M6 (the node N1) becomes $V_{CATH}$. Thus, the gate-source voltage of the transistor M6 becomes $V_{High5}-V_{CATH}$. Since $V_{High5}-V_{CATH}$ is higher than the threshold voltage of the transistor M6, the transistor M6 is turned on. Thus, electrical continuity is established between the wiring VR1 and the anode of the light-receiving device PD, and the potential of the anode of the light-receiving device PD becomes $V_{CATH}$.

In each of the circuit PV2 to the circuit PV4, the high-level potential ($V_{High5}$) from the wiring TX2($i,i$+1) is applied to the gate of the transistor M7. Since the potential of the second terminal of the transistor M7 (the node N1 in the circuit PV1) is $V_{CATH}$, the gate-source voltage of the transistor M7 becomes $V_{High5}-V_{CATH}$, and the transistor M7 is turned on. Thus, electrical continuity is established between the wiring VR1 of the circuit PV1 and each of the anodes of the light-receiving devices PD in the circuit PV2 to the circuit PV4, so that the potentials of the anodes of the light-receiving devices PD in the circuit PV2 to the circuit PV4 become $V_{CATH}$.

At this time, the anode-cathode voltage of the light-receiving device PD becomes 0 V in each of the circuit PV1 to the circuit PV4; thus, current does not flow between the anode and the cathode of the light-receiving device PD.

For the switching operation of the transistor M3 in each of the circuit PV1 to the circuit PV4, refer to the operation example in the period from Time T22 to Time T23 in the timing chart of FIG. 12. Specifically, in each of the circuit PV1 to the circuit PV4, the high-level potential ($V_{High2}$) from the wiring RS2 is applied to the gate of the transistor M3, and the transistor M3 is turned on.

Accordingly, in the period from Time T32 to Time T33, $V_{LVSH}$ is applied to the gate of the transistor M2 and the potential $V_{DD}$ from the wiring VDE is applied to the second terminal of the transistor M2 in each of the circuit PV1 to the circuit PV4. Here, as in the period from Time T31 to Time T32, the potential of the first terminal of the transistor M2 is lower than $V_{DD}$ and the first terminal of the transistor M2 functions as the source. Although the transistor M2 is turned on depending on the gate-source voltage of the transistor M2, the transistor M2 is preferably in the off state in the period from Time T32 to Time T33. Since the transistor M1 is in the off state as in the period from Time T31 to Time T32, current does not flow from the wiring VDE to the wiring OL[j] through the transistor M2 and the transistor M1 in the case of the circuit PV1 and the circuit PV3, and current does not flow from the wiring VDE to the wiring OL[j+1] through the transistor M2 and the transistor M1 in the case of the circuit PV2 and the circuit PV4.

[From Time T33 to Time T34]

In a period from Time T33 to Time T34, the low-level potential ($V_{Low1}$) is input to the wiring RS1($i,i$+1), and the low-level potential ($V_{Low2}$) is input to the wiring RS2($i,i$+1).

For the switching operation of the transistor M4 in each of the circuit PV1 to the circuit PV4, refer to the operation example in the period from Time T23 to Time T24 in the timing chart of FIG. 12. Specifically, in each of the circuit PV1 to the circuit PV4, the low-level potential ($V_{Low1}$) from the wiring RS1($i,i$+1) is applied to the gate of the transistor M4, and the transistor M4 is turned off.

For the switching operation of the transistor M3 in each of the circuit PV1 to the circuit PV4, refer to the operation example in the period from Time T23 to Time T24 in the timing chart of FIG. 12. Specifically, in each of the circuit PV1 to the circuit PV4, the low-level potential ($V_{Low2}$) from the wiring RS2($i,i$+1) is applied to the gate of the transistor M3, and the transistor M3 is turned off. Thus, the first terminal of the capacitor CV1 (the node N2) is brought into a floating state.

Note that the transistor M6 in the circuit PV1 and the transistors M7 in the circuit PV2 to the circuit PV4 remain in the on state since before Time T33.

Here, when the light-receiving devices PD in the circuit PV1 to the circuit PV4 are irradiated with light, current flows in the direction from the cathode to the anode of each of the light-receiving devices PD. Since the transistors M5 in the circuit PV1 to the circuit PV4 are in the off state and the transistor M6 in the circuit PV1 and the transistors M7 in the circuit PV2 to the circuit PV4 are in the on state, positive charge due to the current flows to the node N1 in the circuit PV1 only for a period during which the transistor M6 and the transistors M7 are on and is accumulated in the second terminal of the capacitor CV1 in the circuit PV1. Assuming that the transistor M6 and the transistors M7 are turned off at Time T34, the potential of the second terminal of the capacitor CV1 (the node N1) in the circuit PV1 continuously increases in the period from Time T33 to Time T34.

That is, the imaging data captured by the light-receiving devices PD in the circuit PV2 to the circuit PV4 are transmitted to the node N1 in the circuit PV1. Thus, the imaging data captured by the light-receiving devices PD in the circuit PV1 to the circuit PV4 are added up and the imaging data added up are retained at the second terminal of the capacitor CV1 (the node N1) in the circuit PV1.

In the period from Time T33 to Time T34, the amount of positive charge accumulated in the second terminal of the capacitor CV1 (the node N1) in the circuit PV1 depends on the amount of current flowing through the light-receiving device PD in each of the circuit PV1 to the circuit PV4; thus, the amount of potential change per unit time in the second terminal of the capacitor CV1 (the node N1) in the circuit PV1 is determined. In this operation example, for example, when light is received by the light-receiving devices PD in the circuit PV1 to the circuit PV4, the potential of the node N1 in the circuit PV1 changes from $V_{CATH}$ to $V_{CATH}+V_{PDA}$.

Since the first terminal of the capacitor CV1 (the node N2) in the circuit PV1 is in a floating state in the period from Time T33 to Time T34, the potential of the first terminal of the capacitor CV1 (the node N2) increases with increasing potential of the second terminal of the capacitor CV1 (the node N1) owing to the capacitive coupling of the capacitor CV1. The amount of potential change of the first terminal of the capacitor CV1 (the node N2) is obtained by multiplying the amount of potential change of the second terminal of the capacitor CV1 (the node N1) by a capacitive coupling coefficient determined by the peripheral components of the first terminal of the capacitor CV1 (the node N2). The capacitive coupling coefficient is calculated using the capacitance value of the capacitor CV1, the gate capacitance of the transistor M2, and the parasitic capacitance, for example. Here, when the capacitive coupling coefficient due to the capacitor CV1 in the circuit PV1 is p and the light-receiving device PD in the circuit PV1 receives light, the potential of the first terminal of the capacitor CV1 (the node N2) in the circuit PV1 changes from $V_{LVSH}$ to $V_{LVSH}+pV_{PDA}$.

[From Time T34 to Time T35]

At Time T34, the low-level potential ($V_{Low5}$) is input to the wiring TX2($i,i$+1).

At this time, the low-level potential ($V_{Low5}$) from the wiring TX2($i,i$+1) is applied to the gates of the transistor M6 in the circuit PV1 and the transistors M7 in the circuit PV2 to the circuit PV4. In that case, the gate-source voltage of the transistor M6 in the circuit PV1 is lower than or equal to the threshold voltage of the transistor M6 and the transistor M6 is turned off. In addition, the gate-source voltages of the transistors M7 in the circuit PV2 to the circuit PV4 are lower than or equal to the threshold voltages of the transistors M7 and the transistors M7 are turned off.

Accordingly, accumulation of positive charge (a potential increase) in the first terminal of the capacitor CV1 (the node N2) in the circuit PV1 due to the anode-cathode current of the light-receiving device PD in each of the circuit PV1 to the circuit PV4, which is performed by the operation from Time T33 to Time T34, is completed.

[From Time T35 to Time T36]

In a period from Time T35 to Time T36, the high-level potential ($V_{High6}$) is input to the wiring SE[i] as in the period from Time T25 to Time T26 in the timing chart of FIG. 12.

For the switching operation of the transistor M1 in each of the circuit PV1 and the circuit PV2, refer to the operation example in the period from Time T25 to Time T26 in the timing chart of FIG. 12. Specifically, the transistor M1 in each of the circuit PV1 and the circuit PV2 is in the on state in the period from Time T35 to Time T36.

In the period from Time T35 to Time T36, $V_{LVSH}+pV_{PDA}$ is applied to the gate of the transistor M2 and the potential $V_{DD}$ from the wiring VDE is applied to the second terminal of the transistor M2 in the circuit PV1. Moreover, since the transistor M1 is in the on state, $V_{PRE}$ with which the wiring OL[j] is precharged is applied to the first terminal of the transistor M2.

At this time, the gate-source voltage of the transistor M2 in the circuit PV1 becomes $V_{LVSH}+pV_{PDA}-V_{PRE}$, and current corresponding to the gate-source voltage $V_{LVSH}+pV_{PDA}-V_{PRE}$ flows between the source and the drain of the transistor M2. Here, the wiring OL[j] is in a floating state; thus, the potential of the wiring OL[j] increases over time.

Hence, when current flows between the source and the drain of the transistor M2, the gate-source voltage of the transistor M2 becomes lower; ideally, the transistor M2 is turned off when the gate-source voltage of the transistor M2 becomes equal to the threshold voltage of the transistor M2. The potential of the wiring OL[j] at this time is $V_{OUTA}$.

In the period from Time T35 to Time T36, $V_{LVSH}$ is applied to the gate of the transistor M2 and the potential $V_{DD}$ from the wiring VDE is applied to the second terminal of the transistor M2 in the circuit PV2. Moreover, since the transistor M1 is in the on state, $V_{PRE}$ with which the wiring OL[j+1] is precharged is applied to the first terminal of the transistor M2.

At this time, the gate-source voltage of the transistor M2 in the circuit PV2 becomes $V_{LVSH}-V_{PRE}$. When $V_{LVSH}-V_{PRE}$ is lower than or equal to the threshold voltage of the transistor M2, the transistor M2 is turned off and current does not flow between the source and the drain of the transistor M2. Thus, the potential of the wiring OL[j+1] does not change from $V_{PRE}$ over time. Alternatively, when $V_{LVSH}-V_{PRE}$ is a voltage higher than the threshold voltage of the transistor M2, current corresponding to the gate-source voltage $V_{LVSH}-V_{PRE}$ flows between the source and the drain of the transistor M2. Here, the wiring OL[j+1] is in a floating state; thus, the potential of the wiring OL[j+1] increases over time. Note that FIG. 13 shows the case where the transistor M2 is turned off (the potential of the wiring OL[j+1] does not change from $V_{PRE}$).

[After Time T36]

After Time T36, the low-level potential ($V_{Low6}$) is input to the wiring SE[i].

For the switching operation of the transistor M1 in each of the circuit PV1 and the circuit PV2, refer to the operation example in the period from Time T26 to Time T27 in the timing chart of FIG. 12. Specifically, the transistor M1 in each of the circuit PV1 and the circuit PV2 is in the off state in the period from Time T26 to Time T27.

The potential of the wiring OL[j] is read at this time, whereby the imaging data captured by the light-receiving devices PD in the circuit PV1 and the circuit PV2 in the period from Time T33 to Time T34 can be obtained. Note that the potential of the wiring OL[j+1] does not need to be read in this operation example; thus, the potential of the wiring OL[j+1] may be changed from $V_{PRE}$ owing to current flowing from the first terminal of the transistor M1 in the circuit PV2, the circuit PV4, or the like.

The semiconductor device of one embodiment of the present invention can be suitably used for a display apparatus. With the use of the region DM_V in FIG. 9 for a display portion included in a display apparatus or the like as described above, the display apparatus can perform the second operation suitable for high-speed image capturing or image capturing in a dark place as well as the first operation.

Note that the operation of the semiconductor device of one embodiment of the present invention is not limited to the operation example in the timing chart of FIG. 13 and may be changed as appropriate as long as an object is achieved.

For example, the high-level potentials are input to the wiring RS1(i,i+1), the wiring RS2(i,i+1), and the wiring TX2(i,i+1) at the same time in the period from Time T32 to Time T33 in the timing chart of FIG. 13; however, the operation of the semiconductor device of one embodiment of the present invention may be an operation in which the high-level potentials are input to the wiring RS1(i,i+1), the wiring RS2(i,i+1), and the wiring TX2(i,i+1) in a given order in the period from Time T32 to Time T33. Specifically, for example, the high-level potentials may be input to the wirings in the following order: the wiring RS1(i,i+1), the wiring RS2(i,i+1), and the wiring TX2(i,i+1). Alternatively, for example, the high-level potentials may be input to the wirings in the following order: the wiring RS1(i,i+1), the wiring TX2(i,i+1), and the wiring RS2(i,i+1). Alternatively, for example, the high-level potentials may be input to the wirings in the following order: the wiring TX2(i,i+1), the wiring RS1(i,i+1), and the wiring RS2(i,i+1). Alternatively, for example, the high-level potentials may be input to the wirings in the following order: the wiring TX2(i,i+1), the wiring RS2(i,i+1), and the wiring RS1(i,i+1).

Specific Example 2

The semiconductor device of one embodiment of the present invention is not limited to having the circuit structure illustrated in each of FIG. 9 and FIG. 11. The structure of the semiconductor device of one embodiment of the present invention may be changed as appropriate as long as an object is achieved.

Figure 14:
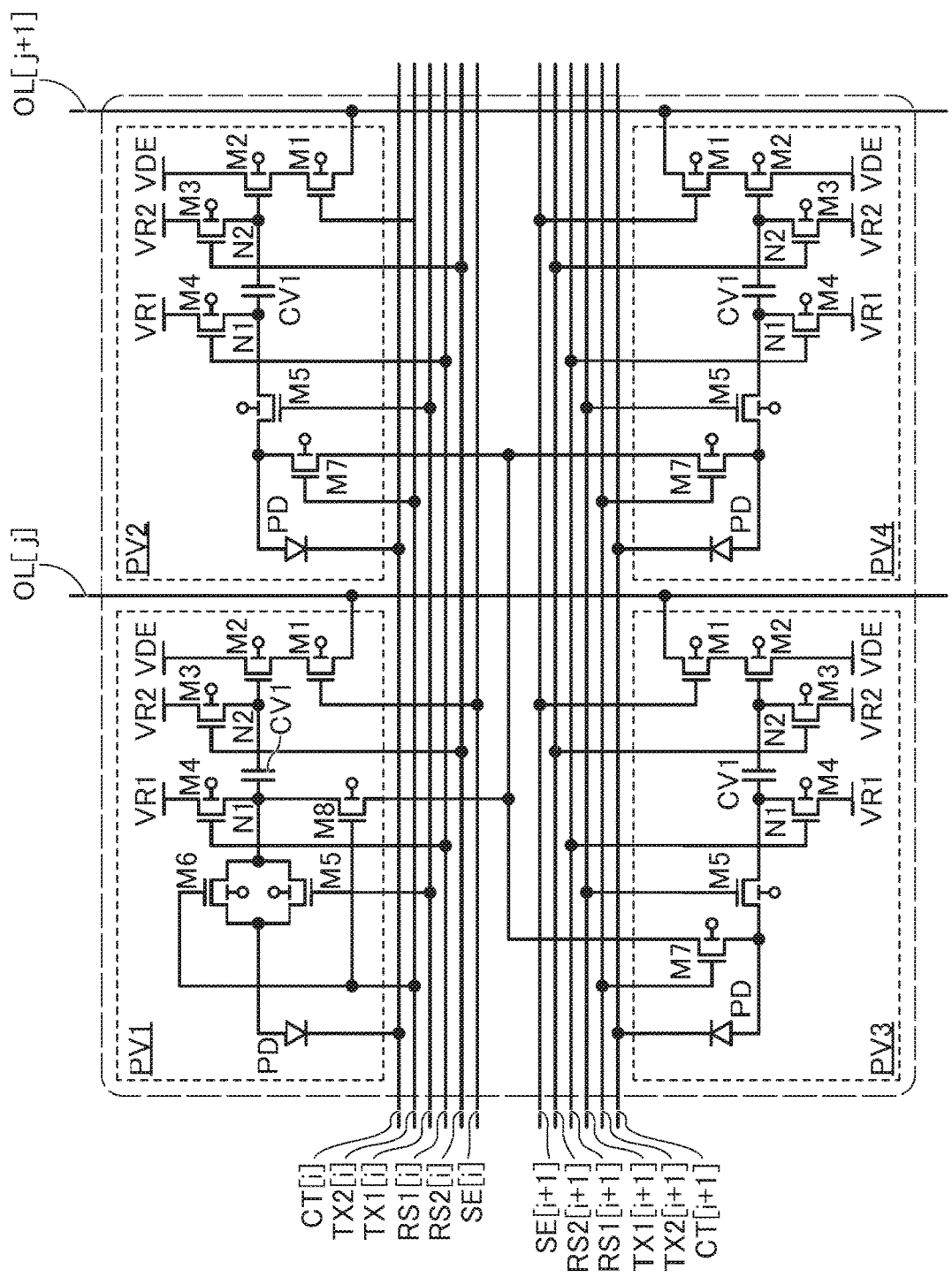
FIG. 14 is a circuit diagram illustrating a structure example of a semiconductor device.

The region DM_V illustrated in FIG. 14 is a modification example of the region DM_V in FIG. 9 and differs from the region DM_V in FIG. 9 in that a transistor M8 is included in the circuit PV1.

As the transistor M8, a transistor that can be used as the transistor M1 to the transistor M5 can be used, for example.

The circuit PV1 in the region DM_V in FIG. 14 includes the transistor M8. Specifically, the transistor M8 is positioned between the second terminal of the capacitor CV1 and the second terminals of the transistors M7 in the circuit PV2 to the circuit PV4, which are electrically connected to one another. That is, the transistor M8 has a function of switching electrical continuity and discontinuity between the second terminal of the capacitor CV1 and the second terminals of the transistors M7 in the circuit PV2 to the circuit PV4.

A first terminal of the transistor M8 is electrically connected to the second terminal of the capacitor CV1, the first terminal of the transistor M4, the first terminal of the transistor M5, and the first terminal of the transistor M6. A second terminal of the transistor M8 is electrically connected to the second terminals of the transistors M7 in the circuit PV2 to the circuit PV4. A gate of the transistor M8 is electrically connected to the gate of the transistor M6 and the wiring TX2[i].

The transistor M8 provided in the circuit PV1 as illustrated in FIG. 14 can reduce the influence of the parasitic capacitance of the wirings electrically connecting the second terminal of the capacitor CV1 in the circuit PV1 and the second terminals of the transistors M7 in the circuit PV2 to the circuit PV4.

For example, since the second terminal of the capacitor CV1 in the circuit PV1 is directly electrically connected to the second terminals of the transistors M7 in the circuit PV2 to the circuit PV4 in the region DM_V in FIG. 9, the parasitic capacitance of the wirings electrically connecting the second terminal of the capacitor CV1 in the circuit PV1 and the second terminals of the transistors M7 in the circuit PV2 to the circuit PV4 is sometimes large. Thus, in the case where the parasitic capacitance of the wirings is large, the time for obtaining imaging data in the image capturing operation in the circuit PV1 sometimes becomes longer in the second terminal of the capacitor CV1 (the node N1) in the circuit PV1.

Meanwhile, in the region DM_V illustrated in FIG. 14, when a low-level potential is supplied to the wiring TX2[i], the transistor M8 can be turned off together with the transistor M6 in the circuit PV1 and the transistor M7 in the circuit PV2. At this time, a low-level potential may be supplied to the wiring TX2[i+1] at substantially the same timing so that the transistors M7 in the circuit PV3 and the circuit PV4 can be turned off. At this time, high-level potentials are supplied to the wiring TX1[i] and the wiring TX1[i+1] so that the transistors M5 in the circuit PV1 to the circuit PV4 are in the on state.

In this manner, image capturing by the first operation described in Operation example 1 can be performed in the region DM_V. Since the transistor M8 is in the off state at this time, the influence of the parasitic capacitance of the wirings electrically connected to the second terminals of the transistors M7 in the circuit PV2 to the circuit PV4 on the second terminal of the capacitor CV1 (the node N1) can be prevented.

In the region DM_V illustrated in FIG. 14, when a high-level potential is supplied to the wiring TX2[i], the transistor M8 can be turned on together with the transistor M6 in the circuit PV1 and the transistor M7 in the circuit PV2. At this time, a high-level potential may be supplied to the wiring TX2[i+1] at substantially the same timing so that the transistors M7 in the circuit PV3 and the circuit PV4 can be turned on. At this time, low-level potentials are supplied to the wiring TX1[i] and the wiring TX1[i+1] so that the transistors M5 in the circuit PV1 to the circuit PV4 are in the off state, so that image capturing by the second operation described in Operation example 2 can be performed in the region DM_V. Even with the structure of the region DM_V including the circuit PV1 in which the transistor M8 is provided, the second operation can be performed as in the region DM_V in FIG. 9.

Specific Example 3

Figure 15:
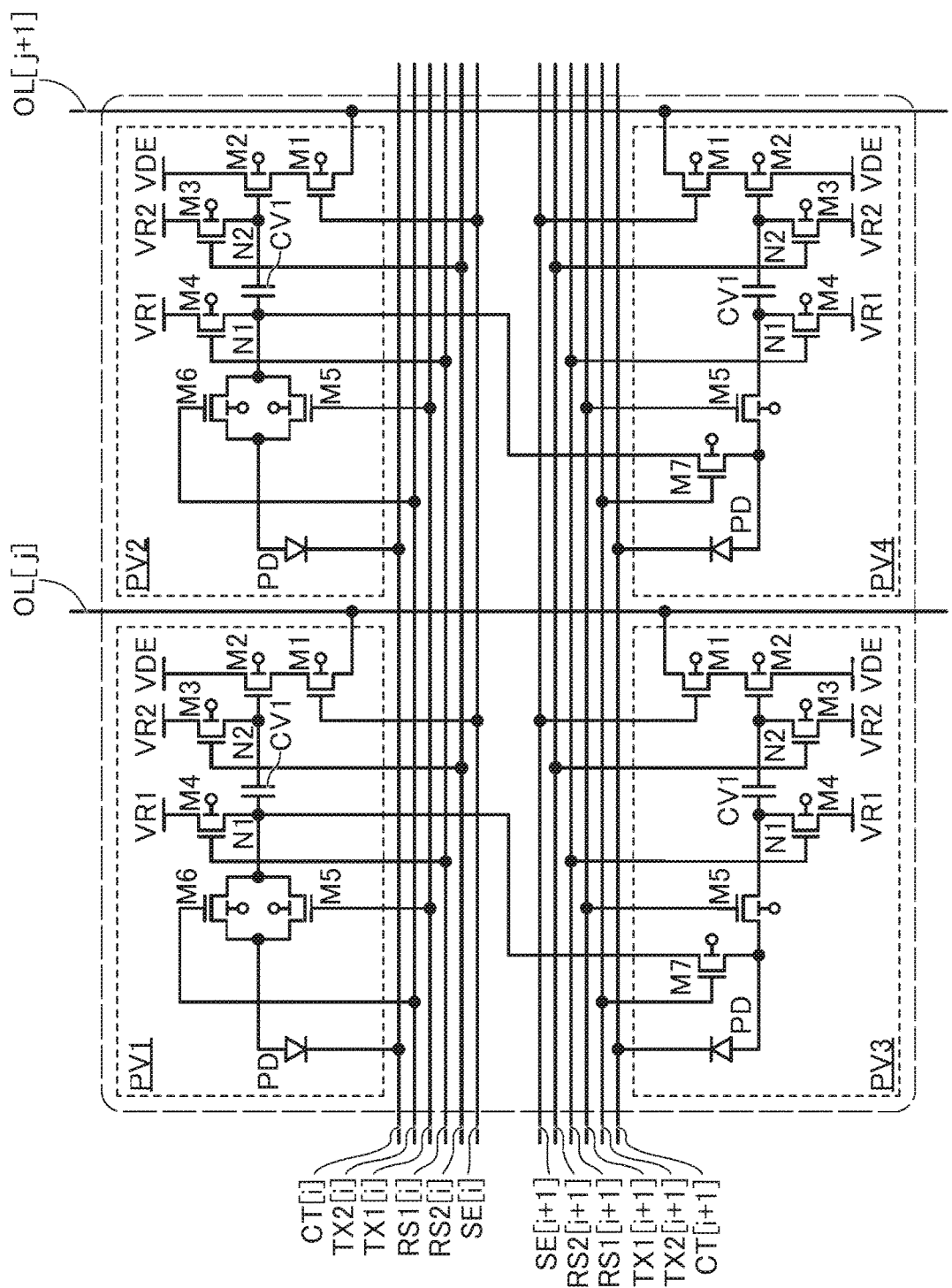
FIG. 15 is a circuit diagram illustrating a structure example of a semiconductor device.

The region DM_V illustrated in a circuit diagram of FIG. 15 is a modification example of the region DM_V in FIG. 9. Each of the circuit PV1 and the circuit PV2 in the region DM_V in FIG. 15 has the same structure as the circuit PV1 in the region DM_V in FIG. 9, and each of the circuit PV3 and the circuit PV4 in the region DM_V in FIG. 15 has the same structure as the circuit PV2, the circuit PV3, or the circuit PV4 in the region DM_V in FIG. 9.

The second terminal of the capacitor CV1 in the circuit PV1 and the first terminals of the transistor M4 to the transistor M6 in the circuit PV1 are electrically connected to the second terminal of the transistor M7 in the circuit PV3. The second terminal of the capacitor CV1 in the circuit PV2 and the first terminals of the transistor M4 to the transistor M6 in the circuit PV2 are electrically connected to the second terminal of the transistor M7 in the circuit PV4.

That is, when the second operation is performed in the region DM_V in FIG. 15, the imaging data in the circuit PV1 and the circuit PV3 are added up and the imaging data in the circuit PV2 and the circuit PV4 are added up in the circuit structure.

In the case where the imaging data in the circuit PV1 and the circuit PV3 are added up and the imaging data in the circuit PV2 and the circuit PV4 are added up in the region DM_V in FIG. 15, the pair of the circuit PV1 and the circuit PV3 and the pair of the circuit PV2 and the circuit PV4 may receive light of different colors. For example, the pair of the circuit PV1 and the circuit PV3 can be a pair of imaging pixel circuits receiving light of one color selected from three colors of red (R), green (G), and blue (B), and the pair of the circuit PV2 and the circuit PV4 can be a pair of imaging pixel circuits receiving light of one color selected from the remaining two colors. The three colors are not limited to red (R), green (G), and blue (B), and may be three colors selected from red (R), green (G), blue (B), cyan, magenta, yellow, and white.

Described here is the arrangement of colors of light received by the imaging pixel circuits in the display region in the case where the pair of the circuit PV1 and the circuit PV3 and the pair of the circuit PV2 and the circuit PV4 are pairs of imaging pixel circuits receiving light of different colors in the region DM_V in FIG. 15.

Figure 16:
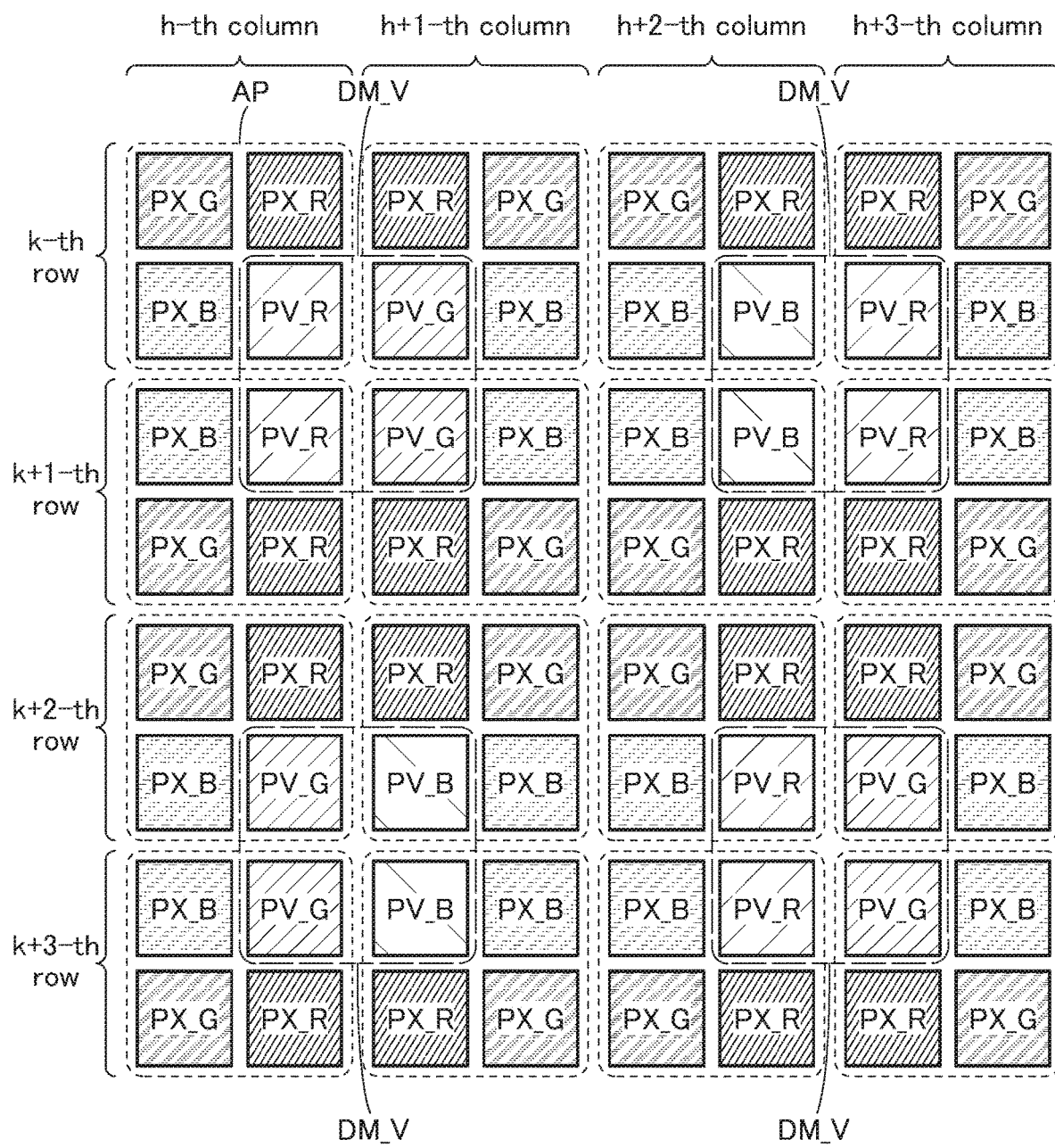
FIG. 16 is a plan view illustrating examples of pixels.

FIG. 16 is a block diagram illustrating part of a display region of a display apparatus including the region DM_V in FIG. 15. The display region in FIG. 16 includes, for example, the region DM_V including two circuits PV_R and two circuits PV_G, the region DM_V including two circuits PV_G and two circuits PV_B, and the region DM_V including two circuits PV_B and two circuits PV_R. Note that the circuit PV_R, the circuit PV_G, and the circuit PV_B are circuits including light-receiving devices that receive light of different colors. For example, the circuit PV_R can be an imaging pixel circuit that receives red light, the circuit PV_G can be an imaging pixel circuit that receives green light, and the circuit PV_B can be an imaging pixel circuit that receives blue light.

The four imaging pixel circuits included in each of the regions DM_V illustrated in FIG. 16 correspond to the four circuits PV1 to PV4 included in the region DM_V in FIG. 15. Specifically, for example, in the display region in FIG. 16, one pair of the two imaging pixel circuits receiving light of the same color in the region DM_V corresponds to the circuit PV1 and the circuit PV2 in the region DM_V in FIG. 15, and the other pair of the two imaging pixel circuits receiving light of the same color in the region DM_V corresponds to the circuit PV3 and the circuit PV4 in the region DM_V in FIG. 15.

As for the plurality of regions DM_V positioned in the k-th row (here, k is an integer of 1 or more) and the k+1-th row, the circuit PV_R, the circuit PV_G, the circuit PV_B, and the circuit PV_R are arranged in this order from the left. As for the plurality of regions DM_V positioned in the k+2-th row and the k+3-th row, the circuit PV_G, the circuit PV_B, the circuit PV_R, and the circuit PV_G are arranged in this order from the left. As for the circuits included in the regions DM_V positioned in the h-th column (here, h is an integer of 1 or more), the two circuits PV_R and the two circuits PV_G are arranged in this order from the top. As for the circuits included in the regions DM_V positioned in the h+1-th column, the two circuits PV_G and the two circuits PV_B are arranged in this order from the top. As for the circuits included in the regions DM_V positioned in the h+2-th column, the two circuits PV_B and the two circuits PV_R are arranged in this order from the top. As for the circuits included in the regions DM_V positioned in the h+3-th column, the two circuits PV_R and the two circuits PV_G are arranged in this order from the top.

That is, in the display region illustrated in FIG. 16, the imaging pixel circuits are arranged such that the circuit PV_R, the circuit PV_G, and the circuit PV_B are arranged in this order repeatedly in the row direction and the two circuits PV_R, the two circuits PV_G, and the two circuits PV_B are arranged in this order repeatedly in the column direction.

Note that the arrangement of colors of light received by the imaging pixel circuits in the semiconductor device of one embodiment of the present invention is not limited to the arrangement in FIG. 16. For example, the arrangement of colors of light received by the imaging pixel circuits in the semiconductor device of one embodiment of the present invention may be the arrangement illustrated in FIG. 17 in which the circuit PV_R, the circuit PV_G, and the circuit PV_B are arranged in this order repeatedly in the row direction and the imaging pixel circuits receiving light of the same color are arranged in one column.

Figure 17:
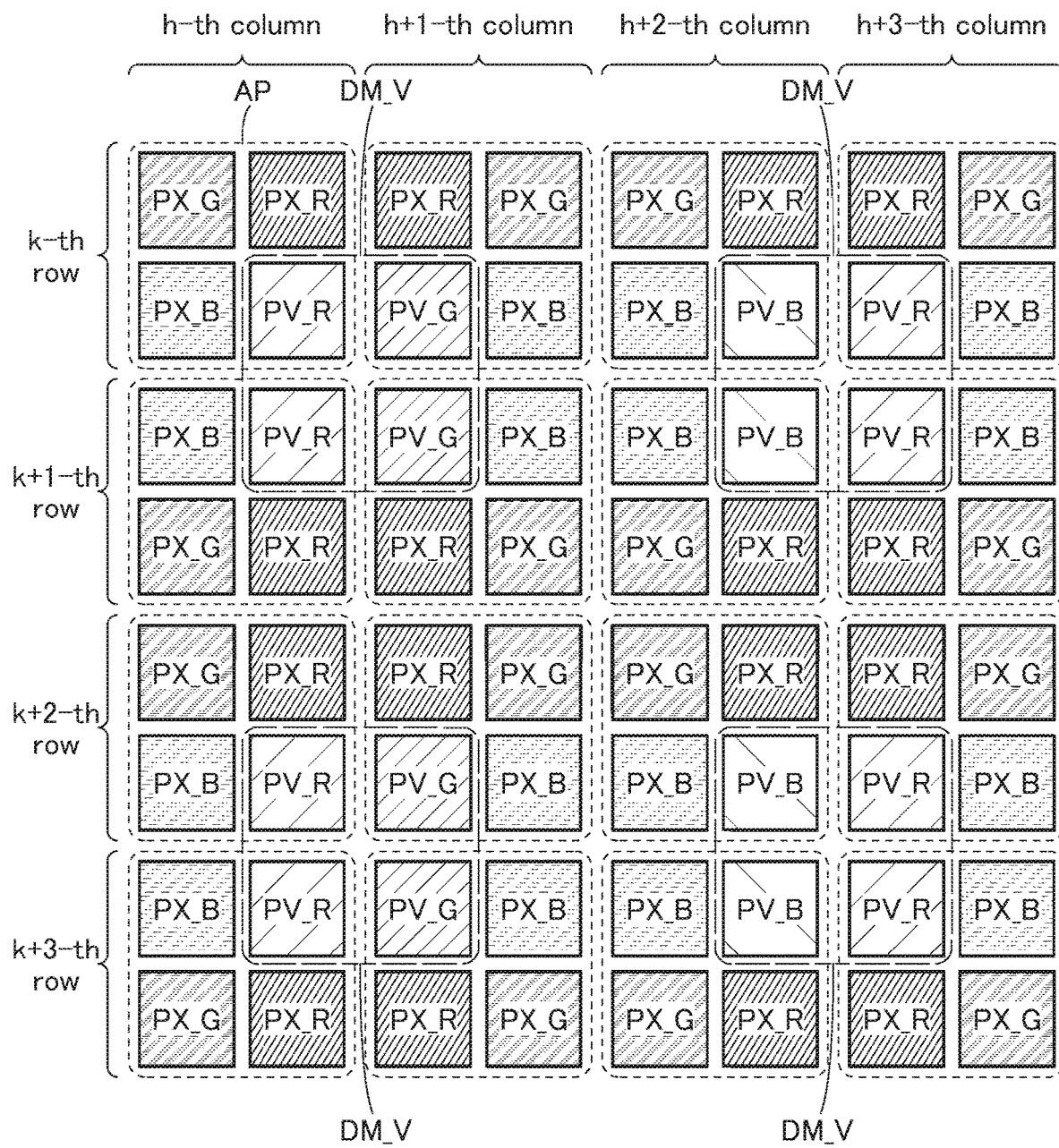
FIG. 17 is a plan view illustrating examples of pixels.

Although light of three colors is received in the circuit structures illustrated in FIG. 16 and FIG. 17, light of two colors or four or more colors may be received in the structures. In that case, light of two colors or four or more colors selected from red (R), green (G), blue (B), cyan, magenta, yellow, and white may be received.

Although the semiconductor device described in this embodiment has the structure in which the four imaging pixel circuits are provided in the region DM_V as illustrated in FIG. 7, FIG. 16, and FIG. 17, the semiconductor device of one embodiment of the present invention is not limited thereto. For example, a structure may be employed in which the four imaging pixel circuits are away from one another by extending the wirings electrically connecting the four imaging pixel circuits. Thus, the light-receiving device PD included in each of the circuit PV1 to the circuit PV4 illustrated in FIG. 9, FIG. 11, FIG. 14, and FIG. 15 may be used as a light-receiving device 160 described later with reference to FIG. 33A and FIG. 33B. The circuit PV1 to the circuit PV4 illustrated in FIG. 9, FIG. 11, FIG. 14, and FIG. 15 may be used in subpixels PS or the like in FIG. 39A to FIG. 39D.

Note that the circuit structures described in this embodiment can be combined with each other as appropriate.

This embodiment can be combined with any of the other embodiments in this specification as appropriate.

Embodiment 3

In this embodiment, structure examples of a display apparatus combining the semiconductor device of one embodiment of the present invention with a display portion will be described.

Figure 18:
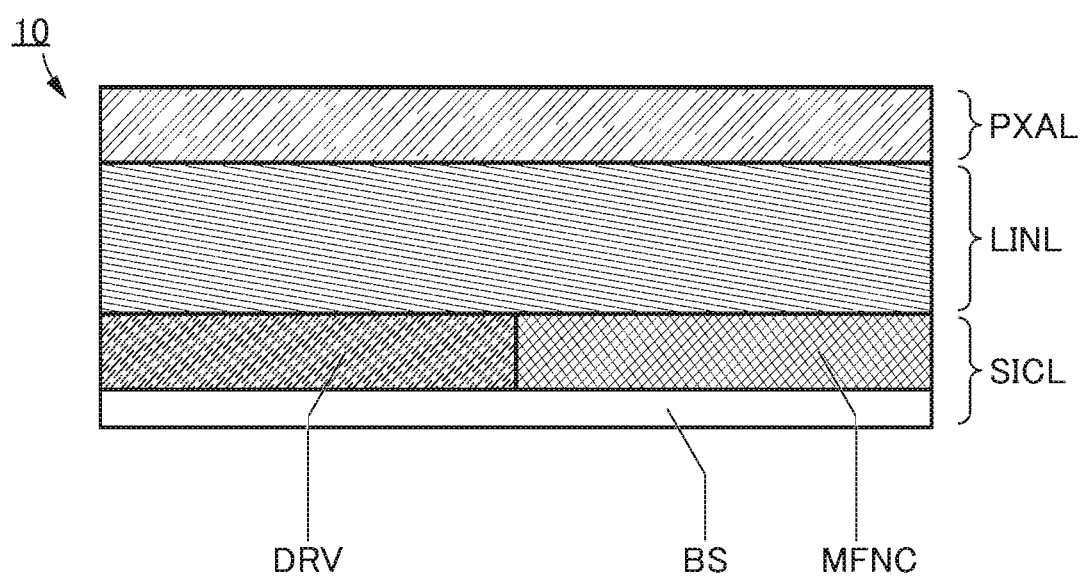
FIG. 18 is a schematic cross-sectional view illustrating a structure example of a display apparatus.

FIG. 18 is a schematic cross-sectional view of a display apparatus of one embodiment of the present invention. A display apparatus 10 includes a pixel layer PXAL, a wiring layer LINL, and a circuit layer SICL.

The wiring layer LINL is provided over the circuit layer SICL, and the pixel layer PXAL is provided over the wiring layer LINL.

The circuit layer SICL includes a substrate BS, a driver circuit region DRV, and a functional circuit region MFNC.

As the substrate BS, a single crystal substrate (e.g., a semiconductor substrate containing silicon or germanium as a material) can be used, for example. Besides the single crystal substrate, for example, an SOI (Silicon On Insulator) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, or paper or a base material film containing a fibrous material can be used as the substrate BS. Examples of the glass substrate include barium borosilicate glass, aluminoborosilicate glass, and soda lime glass. As examples of the flexible substrate, the attachment film, and the base material film, the following can be given. Examples include plastics typified by polyethylene terephthalate (PET), polyethylene naphthalate (PEN), polyether sulfone (PES), and polytetrafluoroethylene (PTFE). Another example is a synthetic resin such as an acrylic resin. Other examples include polypropylene, polyester, polyvinyl fluoride, and polyvinyl chloride. Other examples include polyamide, polyimide, aramid, an epoxy resin, an inorganic vapor deposition film, and paper. Note that in the case where the fabrication process of the display apparatus 10 includes heat treatment, a highly heat-resistant material is preferably selected for the substrate BS.

In the case where the substrate BS is a semiconductor substrate containing silicon as a material, for example, transistors included in the driver circuit region DRV and the functional circuit region MFNC can be Si transistors.

For another example, in the case where the substrate BS is a glass substrate, the transistors included in the driver circuit region DRV and the functional circuit region MFNC can be OS transistors.

The driver circuit region DRV and the functional circuit region MFNC are provided over the substrate BS.

The driver circuit region DRV includes, for example, a driver circuit for driving a display pixel circuit included in the pixel layer PXAL to be described later. Note that a specific structure example of the driver circuit region DRV will be described later.

The functional circuit region MFNC includes a GPU (Graphics Processing Unit), for example. In the case where the display apparatus 10 includes a touch panel, the functional circuit region MFNC may include a sensor controller for controlling a touch sensor included in the touch panel. In the case where a light-emitting device using an EL material is used as a display element of the display apparatus 10, an EL correction circuit may be included. In the case where a liquid crystal element is used as the display element of the display apparatus 10, a gamma correction circuit may be included.

A wiring is provided in the wiring layer LINL, for example. The wiring included in the wiring layer LINL functions as, for example, a wiring that electrically connects the driver circuit included in the driver circuit region DRV provided below the wiring layer LINL and the circuit included in the pixel layer PXAL provided above the wiring layer LINL.

The pixel layer PXAL includes, for example, a plurality of display pixel circuits. The plurality of display pixel circuits may be arranged in a matrix in the pixel layer PXAL.

Each of the plurality of display pixel circuits can express one color or a plurality of colors. In particular, the plurality of colors can be, for example, three colors of red (R), green (G), and blue (B). Alternatively, for example, the plurality of display pixel circuits may express four or more colors; one or more colors selected from cyan, magenta, yellow, and white may be expressed in addition to the three colors of red (R), green (G), and blue (B). Note that in the case where display pixel circuits expressing different colors are each called a subpixel and white is expressed by a plurality of subpixels expressing different colors, the plurality of subpixels are sometimes collectively called a pixel. In this specification and the like, a subpixel is referred to as a pixel for convenience.

Figure 19:
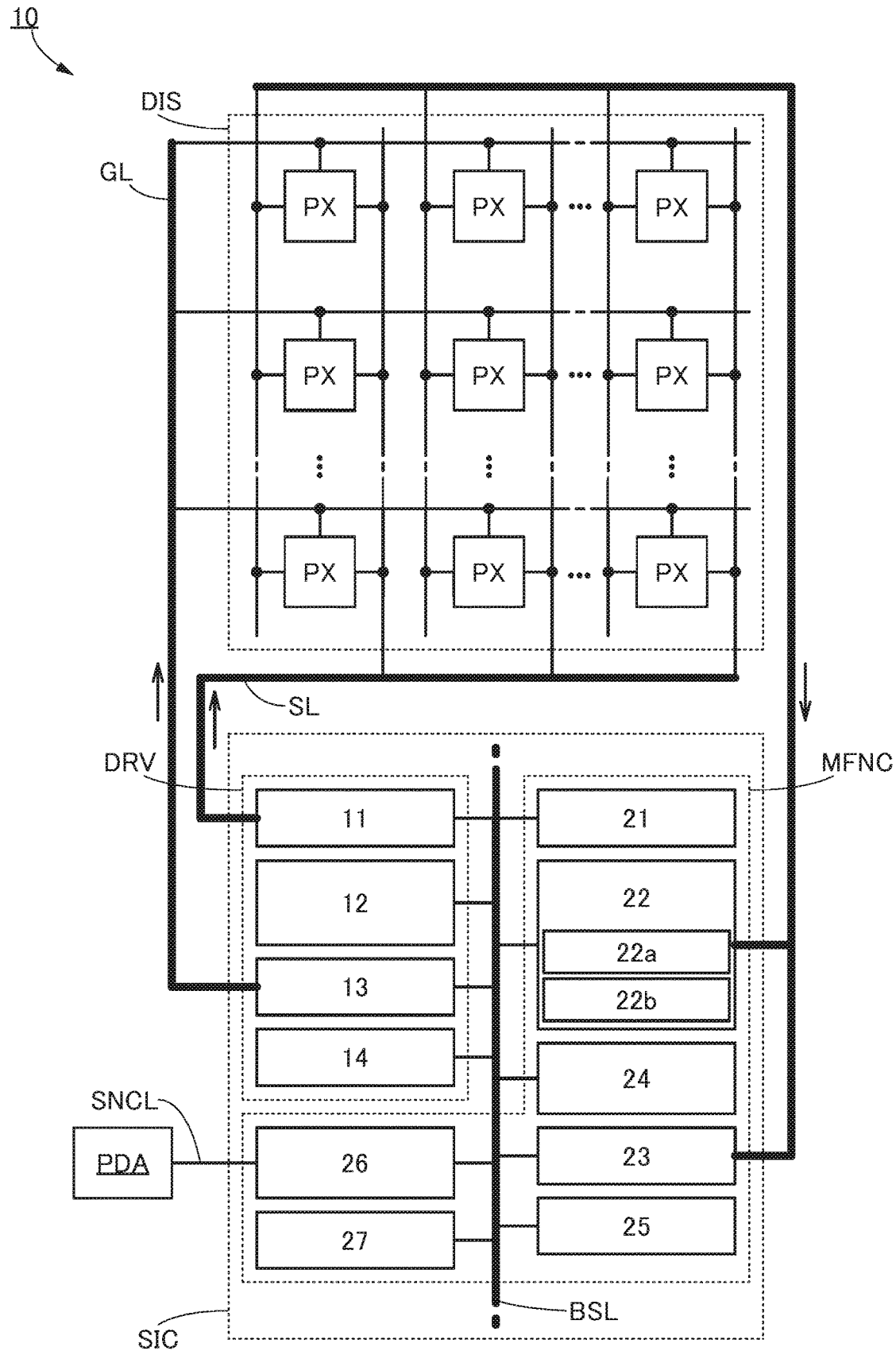
FIG. 19 is a block diagram illustrating a structure example of a display apparatus.

FIG. 19 is a block diagram illustrating a structure example of the display apparatus 10 illustrated in FIG. 18. The display apparatus 10 illustrated in FIG. 19 includes a display portion DIS and a circuit portion SIC, for example. A sensor PDA illustrated in FIG. 19 may be placed inside or outside the display apparatus 10. In the case where the sensor PDA is placed inside the display apparatus 10, the sensor PDA may be placed inside a display region or outside the display region. Note that the outside of the display region includes, for example, a frame region (a region where a driver circuit of a pixel circuit of the display region is placed and a neighboring region thereof).

Note that wirings denoted by thick solid lines in FIG. 19 are a plurality of wirings or bus wirings.

The display portion DIS illustrated in FIG. 19 is included in the pixel layer PXAL in FIG. 18, for example. In FIG. 19, a plurality of circuits PX functioning as display pixel circuits are arranged in a matrix in the display portion DIS, for example. The circuits PX can each be, for example, a pixel that includes one or more selected from a liquid crystal display device, a light-emitting device containing an organic EL material, and a light-emitting device including a light-emitting diode such as a micro LED. Note that in the description in this embodiment, the circuits PX in the display portion DIS each include a light-emitting device containing an organic EL material. The circuits PX here can each be the circuit PX included in the circuit AP described in the above embodiment. A circuit applicable to the display portion DIS, the circuits PX, and the like will be described in detail in Embodiment 4.

The pixel density (also referred to as "resolution") of the display portion DIS is preferably higher than or equal to 100 ppi and lower than or equal to 10000 ppi, further preferably higher than or equal to 1000 ppi and lower than or equal to 10000 ppi. For example, the resolution may be higher than or equal to 2000 ppi and lower than or equal to 6000 ppi, or higher than or equal to 3000 ppi and lower than or equal to 5000 ppi.

Note that there is no particular limitation on the aspect ratio of the display portion DIS. For example, the display portion DIS is compatible with a variety of aspect ratios such as 1:1 (a square), 4:3, 16:9, and 16:10.

The diagonal size of the display portion DIS is at least greater than or equal to 0.1 inches and less than or equal to 100 inches and may be greater than or equal to 100 inches.

The structure of transistors included in the display portion DIS may be selected as appropriate depending on the diagonal size of the display portion DIS. For example, single crystal Si transistors can be used in the display portion DIS with a screen diagonal size greater than or equal to 0.1 inches and less than or equal to 3 inches. In addition, LTPS transistors can be used in the display portion DIS with a screen diagonal size greater than or equal to 0.1 inches and less than or equal to 30 inches, preferably greater than or equal to 1 inch and less than or equal to 30 inches. In addition, LTPO (a structure in which an LTPS transistor and an OS transistor are combined) can be used in the display portion DIS with a screen diagonal size greater than or equal to 0.1 inches and less than or equal to 50 inches, preferably greater than or equal to 1 inch and less than or equal to 50 inches. In addition, OS transistors can be used in a display panel with a screen diagonal size greater than or equal to 0.1 inches and less than or equal to 200 inches, preferably greater than or equal to 50 inches and less than or equal to 100 inches.

Note that it is extremely difficult to make the screen size of the display portion DIS using single crystal Si transistors larger than the size of a single crystal Si substrate. Furthermore, since a laser crystallization apparatus is used in the manufacturing process, LTPS transistors are unlikely to respond to a size increase (typically to a screen diagonal size greater than 30 inches). By contrast, since the manufacturing process does not necessarily require a laser crystallization apparatus or the like or can be performed at a relatively low process temperature (typically, lower than or equal to 450° C.), OS transistors are applicable to a display panel with a relatively large area (typically, a diagonal size greater than or equal to 50 inches and less than or equal to 100 inches). In addition, LTPO is applicable to a display panel with a size midway between the case of using LTPS transistors and the case of using OS transistors (typically, a diagonal size greater than or equal to 1 inch and less than or equal to 50 inches).

The circuit portion SIC illustrated in FIG. 19 is included in the circuit layer SICL in FIG. 18, for example. In FIG. 19, the circuit portion SIC includes the driver circuit region DRV and the functional circuit region MFNC.

The driver circuit region DRV functions as a peripheral circuit for driving the display portion DIS, for example. Specifically, the driver circuit region DRV includes, for example, a source driver circuit 11, a digital-analog converter circuit 12, a gate driver circuit 13, and a level shifter 14.

The functional circuit region MFNC can be provided with, for example, a memory device storing image data to be displayed on the display portion DIS, a decoder for restoring encoded image data, a GPU for processing image data, a power supply circuit, a correction circuit, a CPU, and the like. In FIG. 19, the functional circuit region MFNC includes, for example, a memory device 21, a GPU (AI accelerator) 22, an EL correction circuit 23, a timing controller 24, a CPU 25, a sensor controller 26, and a power supply circuit 27.

In the display apparatus 10 in FIG. 19, for example, a bus wiring BSL is electrically connected to each of the circuits included in the driver circuit region DRV and each of the circuits included in the functional circuit region MFNC.

The source driver circuit 11 has a function of transmitting image data to the circuits PX included in the display portion DIS, for example. Thus, the source driver circuit 11 is electrically connected to the circuits PX through the wiring SL.

The digital-analog converter circuit 12 has a function of, for example, converting image data, which has been digitally processed by the GPU, correction circuit, or the like described later, into analog data. The image data converted into analog data is transmitted to the display portion DIS through the source driver circuit 11. Note that the digital-analog converter circuit 12 may be included in the source driver circuit 11, and the image data may be transmitted to the source driver circuit 11, the digital-analog converter circuit 12, and the display portion DIS in this order.

The gate driver circuit 13 has a function of selecting the circuit PX to which image data is to be transmitted in the display portion DIS, for example. Thus, the gate driver circuit 13 is electrically connected to the circuits PX through the wiring GL.

The level shifter 14 has a function of converting signals to be input to the source driver circuit 11, the digital-analog converter circuit 12, the gate driver circuit 13, and the like into signals having appropriate levels, for example.

The memory device 21 has a function of storing image data to be displayed on the display portion DIS, for example. Note that the memory device 21 can be configured to store the image data as digital data or analog data.

In the case where the memory device 21 stores image data, the memory device 21 is preferably a nonvolatile memory. In that case, a NAND memory or the like can be used as the nonvolatile memory, for example.

In the case where the memory device 21 stores temporary data generated in the GPU 22, the EL correction circuit 23, the CPU 25, or the like, the memory device 21 is preferably a volatile memory. In that case, an SRAM (Static Random Access Memory), a DRAM (Dynamic Random Access Memory), or the like can be used as the volatile memory, for example.

The GPU 22 has a function of performing processing for rendering image data read from the memory device 21 on the display portion DIS, for example. Specifically, the GPU 22 is configured to perform pipeline processing in parallel and can thus perform high-speed processing of image data to be displayed on the display portion DIS. The GPU 22 can also function as a decoder for restoring an encoded image.

The functional circuit region MFNC may include a plurality of circuits that can improve the display quality of the display portion DIS. Such circuits may be, for example, correction circuits (circuits performing dimming or toning) that detect color irregularity of an image displayed on the display portion DIS and correct the color irregularity to obtain an optimal image. Furthermore, in the case where a light-emitting device using an organic EL material is used in each of the pixels in the display portion DIS, the functional circuit region MFNC may be provided with an EL correction circuit. The EL correction circuit has a function of appropriately adjusting the amount of current input to the light-emitting device containing an EL material, for example. Since the emission luminance of the light-emitting device containing an EL material is proportional to current, the luminance of light emitted from the light-emitting device might be lower than a desired luminance when the characteristics of a driving transistor electrically connected to the light-emitting device are not favorable. For example, the EL correction circuit monitors the amount of current flowing through the light-emitting device and increases the amount of current flowing through the light-emitting device when the amount of current is smaller than a desired amount of current, whereby the luminance of light emitted from the light-emitting device can be increased. By contrast, when the amount of current is larger than a desired amount of current, the amount of current flowing through the light-emitting device may be adjusted to be small. Note that since the description in this embodiment is made on the assumption that a light-emitting device containing an organic EL material is used in each of the circuits PX in the display portion DIS, the functional circuit region MFNC includes the EL correction circuit 23, for example.

The above-described image correction may be performed using artificial intelligence. For example, current flowing through a display device included in a display pixel circuit (or a voltage applied to the display device) may be monitored and acquired, an image displayed on the display portion DIS may be acquired with an image sensor or the like, the current (or voltage) and the image may be used as input data in an arithmetic operation of the artificial intelligence (e.g., an artificial neural network), and the output result may be used to determine whether the image should be corrected.

Such an arithmetic operation of artificial intelligence can be applied not only to image correction but also to upconversion processing (downconversion processing) of image data. Accordingly, upconversion (downconversion) of low-definition image data can be performed in accordance with the definition of the display portion DIS, which enables a high-display-quality image to be displayed on the display portion DIS.

Note that the above-described arithmetic operation of artificial intelligence can be performed using the GPU 22 included in the functional circuit region MFNC. That is, the GPU 22 can be used to perform arithmetic operations for various kinds of correction (color irregularity correction, upconversion (downconversion), and the like).

The GPU 22 may include a correction circuit 22a for image correction and a converter 22b for performing upconversion (downconversion).

Note that in this specification and the like, a GPU performing an arithmetic operation of artificial intelligence is referred to as an AI accelerator. That is, the GPU included in the functional circuit region MFNC may be replaced with an AI accelerator in the description in this specification and the like.

The timing controller 24 has a function of, for example, changing the frame rate at which an image is displayed on the display portion DIS. For example, the display apparatus 10 can be driven at a frame rate decreased by the timing controller 24 in the case where the display portion DIS displays a still image; for another example, the display apparatus 10 can be driven at a frame rate increased by the timing controller 24 in the case where the display portion DIS displays a moving image. That is, when the display apparatus 10 is provided with the timing controller 24, a frame rate can be changed depending on which of a still image and a moving image is displayed. Specifically, since the frame rate when the display portion DIS displays a still image can be decreased, the power consumption of the display apparatus 10 can be reduced.

The CPU 25 has a function of performing general-purpose processing such as execution of an operating system, control of data, and execution of various kinds of arithmetic operations and programs, for example. In the display apparatus 10, the CPU 25 has a function of, for example, giving an instruction for a writing operation or a reading operation of image data in the memory device 21, an operation for correcting image data, or an operation for a later-described sensor. For another example, the CPU 25 may have a function of transmitting a control signal to at least one of the circuits included in the functional circuit region MFNC, such as the memory device, the GPU, the correction circuit, the timing controller, and a high frequency circuit.

The CPU 25 may include a circuit for temporarily backing up data (hereinafter, referred to as a backup circuit). The backup circuit is preferably capable of, for example, retaining the data even after supply of power supply voltage is stopped. For example, in the case where the display portion DIS displays a still image, the CPU 25 can cease to work until an image different from the currently displayed still image is displayed. Accordingly, the data under processing by the CPU 25 is temporarily backed up in the backup circuit and then supply of power supply voltage to the CPU 25 is stopped to stop the CPU 25, whereby dynamic power consumption by the CPU can be reduced. In this specification and the like, a CPU including a backup circuit is referred to as an NoffCPU (registered trademark).

The sensor controller 26 has a function of controlling the sensor PDA, for example. FIG. 19 illustrates a wiring SNCL as a wiring for electrical connection to the sensor PDA.

The sensor PDA can be, for example, a touch sensor that can be provided above or below the display portion DIS, or inside the display portion DIS.

Alternatively, the sensor PDA can be an illuminance sensor, for example. Specifically, the illuminance sensor acquiring the intensity of external light with which the display portion DIS is irradiated makes it possible to change the brightness (luminance) of an image displayed on the display portion DIS in accordance with the external light. For example, under bright external light, the luminance of an image displayed on the display portion DIS can be increased to enhance the viewability of the image. By contrast, under dark external light, the luminance of an image displayed on the display portion DIS can be lowered to reduce the power consumption.

Alternatively, the sensor PDA can be an image sensor, for example. By acquiring an image or the like with the image sensor, for example, the image can be displayed on the display portion DIS.

The power supply circuit 27 has a function of, for example, generating voltages to be supplied to the circuits included in the driver circuit region DRV, the circuits included in the functional circuit region MFNC, the display pixel circuits included in the display portion DIS, and the like. Note that the power supply circuit 27 may have a function of selecting a circuit to which voltage is to be supplied. The power supply circuit 27 can stop supply of voltage to one or both of the CPU 25 and the GPU 22 during a period in which the display portion DIS displays a still image so that the power consumption of the whole display apparatus 10 can be reduced, for example.

<Structure Example of Imaging Pixel Circuit>

Next, an image sensor that can be used as the sensor PDA of the display apparatus 10 will be described.

Figure 20:
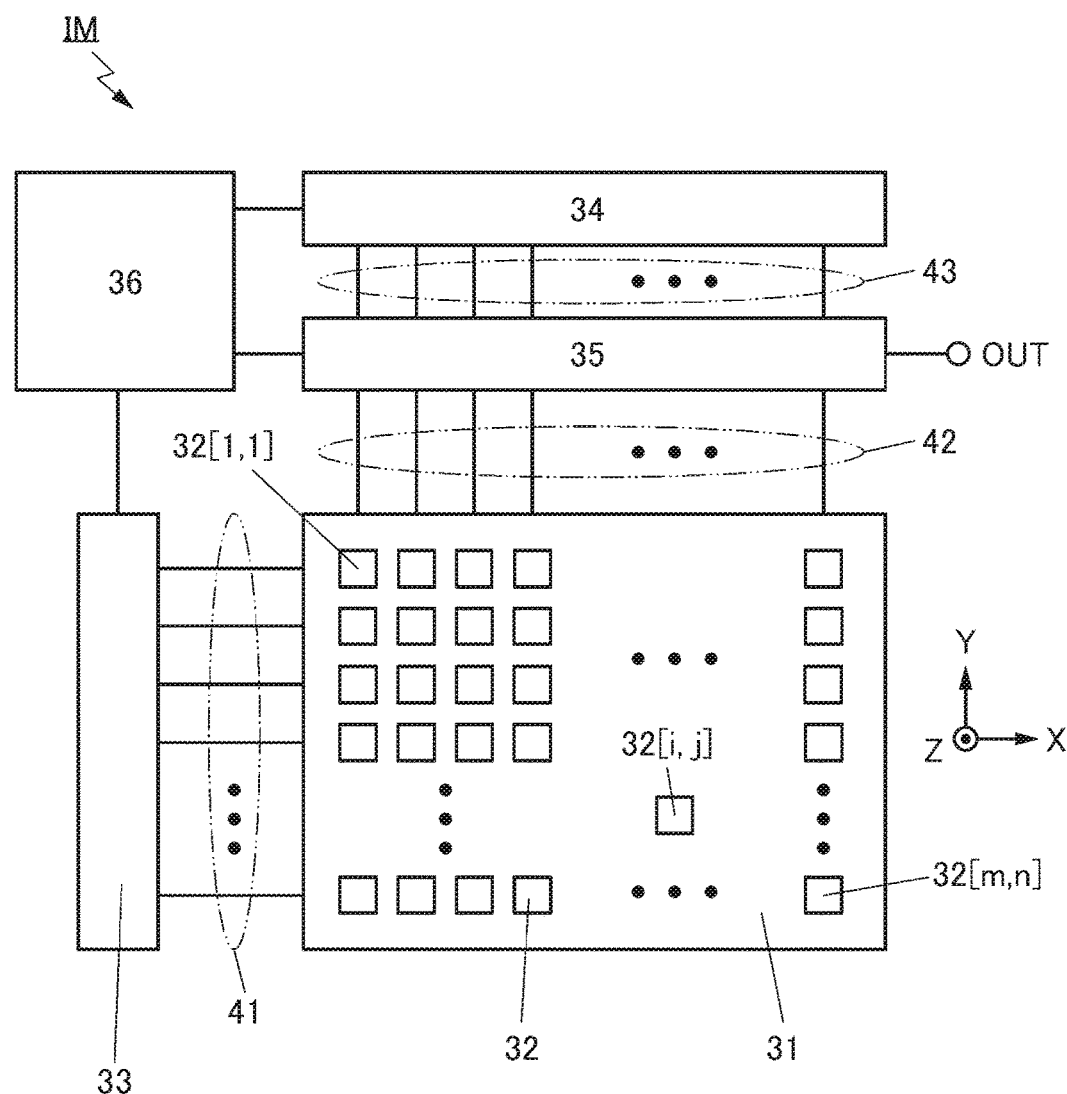
FIG. 20 is a block diagram illustrating a structure example of an imaging device.

As the image sensor that can be used as the sensor PDA, for example, an imaging device IM illustrated in FIG. 20 can be used.

FIG. 20 is a block diagram illustrating an example of a circuit structure of the imaging device IM. The imaging device IM includes an imaging portion 31, a first driver circuit portion 33, a second driver circuit portion 34, a reading circuit portion 35, and a control circuit portion 36. Note that the first driver circuit portion 33, the second driver circuit portion 34, the reading circuit portion 35, and the control circuit portion 36 are collectively called a "functional circuit" in some cases. Any of a variety of circuits such as a shift register, a level shifter, an inverter, a latch, an analog switch, and a logic circuit can be used as the functional circuit.

Transistors used in the imaging portion 31 and the functional circuit that are provided in the imaging device IM may be n-channel transistors or p-channel transistors. Both n-channel transistors and p-channel transistors may be used. A CMOS structure in which n-channel transistors and p-channel transistors are combined may be employed for the imaging portion 31 and the functional circuit.

The imaging portion 31 includes imaging pixel circuits 32 arranged in a matrix of m rows and n columns (each of m and n is an integer of 1 or more). The imaging portion 31 is electrically connected to the first driver circuit portion 33 through a plurality of wirings 41. The imaging portion 31 is electrically connected to the reading circuit portion 35 through a plurality of wirings 42. The reading circuit portion 35 is electrically connected to the second driver circuit portion 34 through a plurality of wirings 43. For example, the imaging pixel circuits 32 in the i-th row (here, i is an integer greater than or equal to 1 and less than or equal to m) are electrically connected to the first driver circuit portion 33 through the i-th wiring 41. The imaging pixel circuits 32 in the j-th column (here, j is an integer greater than or equal to 1 and less than or equal to n) are electrically connected to the reading circuit portion 35 through the j-th wiring 42.

Note that as each of the imaging pixel circuits 32, the circuit PV described in the above embodiment can be used, for example.

In FIG. 20, the imaging pixel circuit 32 placed in the first row and the first column is denoted as the imaging pixel circuit 32[1,1], and the imaging pixel circuit 32 placed in the m-th row and the n-th column is denoted as the imaging pixel circuit 32[m,n]. The imaging pixel circuit 32 placed in the i-th row and the j-th column is denoted as the imaging pixel circuit 32[i,j].

The wirings 41 can each be the wiring SE described in the above embodiment, for example. The wirings 42 can each be the wiring OL described in the above embodiment, for example.

Note that wirings connected to one imaging pixel circuit 32 are not limited to the wiring 41 and the wiring 42. A wiring other than the wiring 41 and the wiring 42 may be connected to the imaging pixel circuit 32. For example, the wiring other than the wiring 41 and the wiring 42 that is electrically connected to the imaging pixel circuit 32 can be the wiring TX, the wiring RS1, or the wiring RS2 described in the above embodiment.

For the pixel density, aspect ratio, and diagonal size of the imaging portion 31, refer to the above description of the pixel density, aspect ratio, and diagonal size of the display portion DIS.

The control circuit portion 36 has a function of controlling the operations of the circuits included in the imaging device IM. The first driver circuit portion 33 has a function of selecting the imaging pixel circuits 32 row by row. The imaging pixel circuits 32 in the row selected by the first driver circuit portion 33 output imaging data to the reading circuit portion 35 through the wirings 42.

The reading circuit portion 35 retains imaging data supplied from the imaging pixel circuits 32 in every column, and performs noise removal processing and the like. As the noise removal processing, for example, CDS (Correlated Double Sampling) processing or the like may be performed. The reading circuit portion 35 may have one or both of an amplifying function of imaging data and an AD conversion function of imaging data, for example.

The second driver circuit portion 34 has functions of sequentially selecting imaging data retained in the reading circuit portion 35 and outputting the imaging data from an output terminal OUT to the outside.

<Structure Example in which Display Apparatus and Imaging Device are Integrated>

Next, a structure of the display apparatus 10 in which the display portion DIS and the imaging device IM are integrated will be described.

Figure 21:
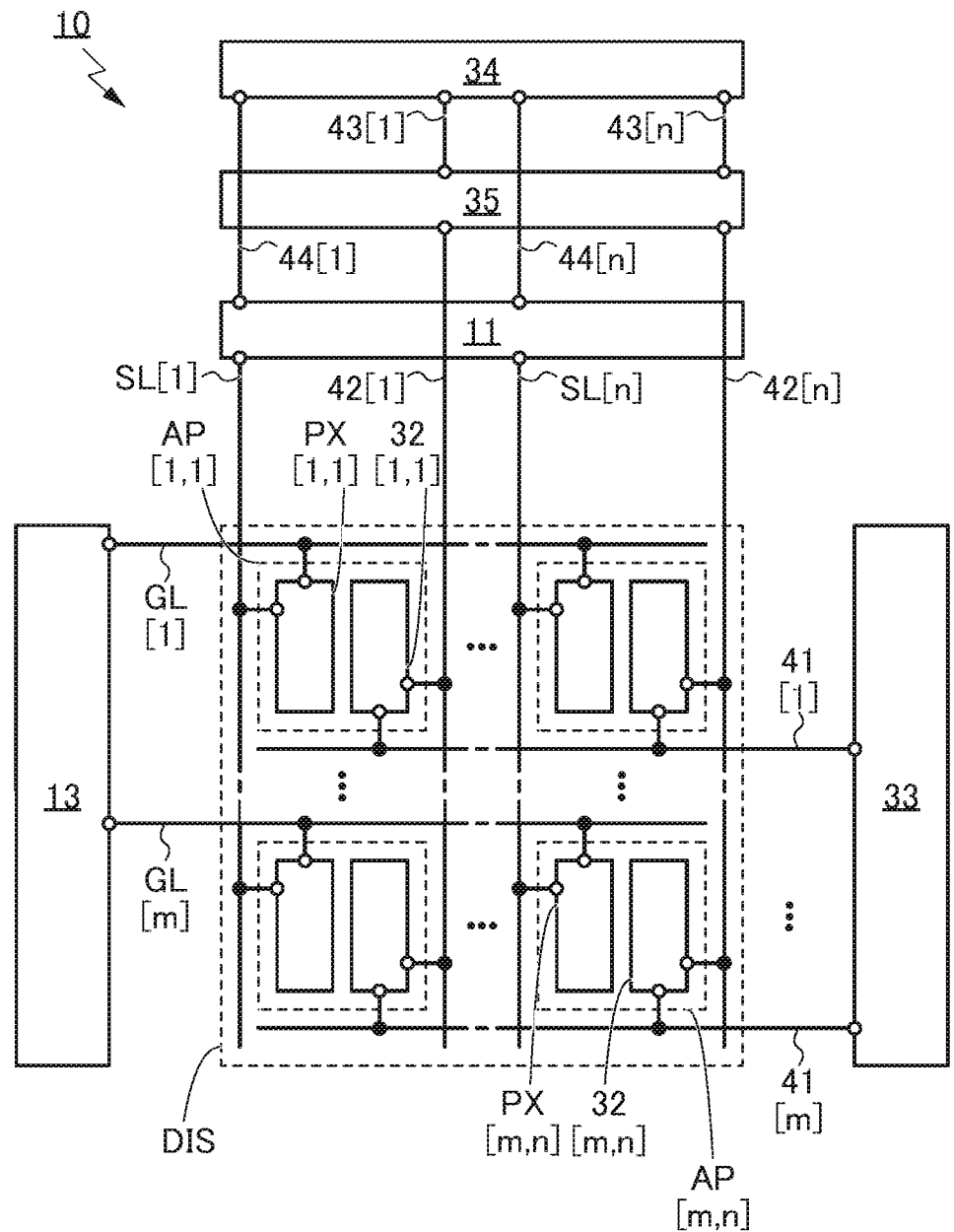
FIG. 21 is a block diagram illustrating a structure example of a display apparatus.

FIG. 21 illustrates a structure of the display apparatus 10 combining the imaging device IM illustrated in FIG. 20 and a display apparatus in FIG. 19 including the display portion DIS, the source driver circuit 11, and the gate driver circuit 13.

In the display portion DIS in the display apparatus 10 illustrated in FIG. 21, a circuit AP[1,1] to a circuit AP[m,n] are arranged in a matrix of m rows and n columns. When i is an integer greater than or equal to 1 and less than or equal to m and j is an integer greater than or equal to 1 and less than or equal to n, the circuit AP[i,j] includes a circuit PX[i,j] and the imaging pixel circuit 32[i,j], for example. Note that in the display portion DIS in FIG. 21, only the circuit AP[1,1] and the circuit AP[m,n] are illustrated with references.

Note that as the circuit AP[1,1], the circuit AP[m,n], and the like, for example, the circuit AP in FIG. 1A or the like described in the above embodiment can be used.

Note that in FIG. 21, the plurality of wirings 41 are denoted as a wiring 41[1] to a wiring 41[m], the plurality of wirings 42 are denoted as a wiring 42[1] to a wiring 42[n], and the plurality of wirings 43 are denoted as a wiring 43[1] to a wiring 43[n].

In FIG. 21, for example, the second driver circuit portion 34 and the source driver circuit 11 are electrically connected to each other through a wiring 44[1] to a wiring 44[n].

For example, imaging data read by the reading circuit portion 35 are transmitted to the source driver circuit 11 through the wiring 43[1] to the wiring 43[n], the second driver circuit portion 34, and the wiring 44[1] to the wiring 44[n].

Thus, the source driver circuit 11 may have a function of performing voltage adjustment, polarity conversion, and power amplification of imaging data supplied from the imaging device IM. That is, the source driver circuit 11 may have a function of converting imaging data into video signals. Thus, the source driver circuit 11 can output video signals converted from imaging data to the circuits PX in the display portion DIS.

With this structure, imaging data obtained by the imaging portion 31 can be converted by the source driver circuit 11 into video signals suitable for display on the display portion DIS. For example, a display apparatus that is hardly affected by noise and has excellent display quality can be obtained.

With the structure of the display apparatus 10 in which the circuits PX and the imaging pixel circuits 32 are arranged in the same display portion DIS as illustrated in FIG. 21, the entire display portion can be a sensor region. For example, by capturing an image of a user's finger with the imaging pixel circuit 32[1,1] to the imaging pixel circuit 32[m,n], the display apparatus 10 can have a fingerprint authentication function. Moreover, a function of operating the display apparatus 10 or an electronic device including the display apparatus 10 may be provided for the display apparatus 10 by continuously capturing images of a user's finger with the imaging pixel circuit 32[1,1] to the imaging pixel circuit 32[m,n].

Note that this embodiment can be combined with any of the other embodiments described in this specification as appropriate.

Embodiment 4

In this embodiment, a display apparatus that can be provided in an electronic device of one embodiment of the present invention will be described. Note that the display apparatus described in this embodiment can be used in the display portion DIS described in the above embodiment.
<Structure Example of Display Apparatus>

Figure 22:
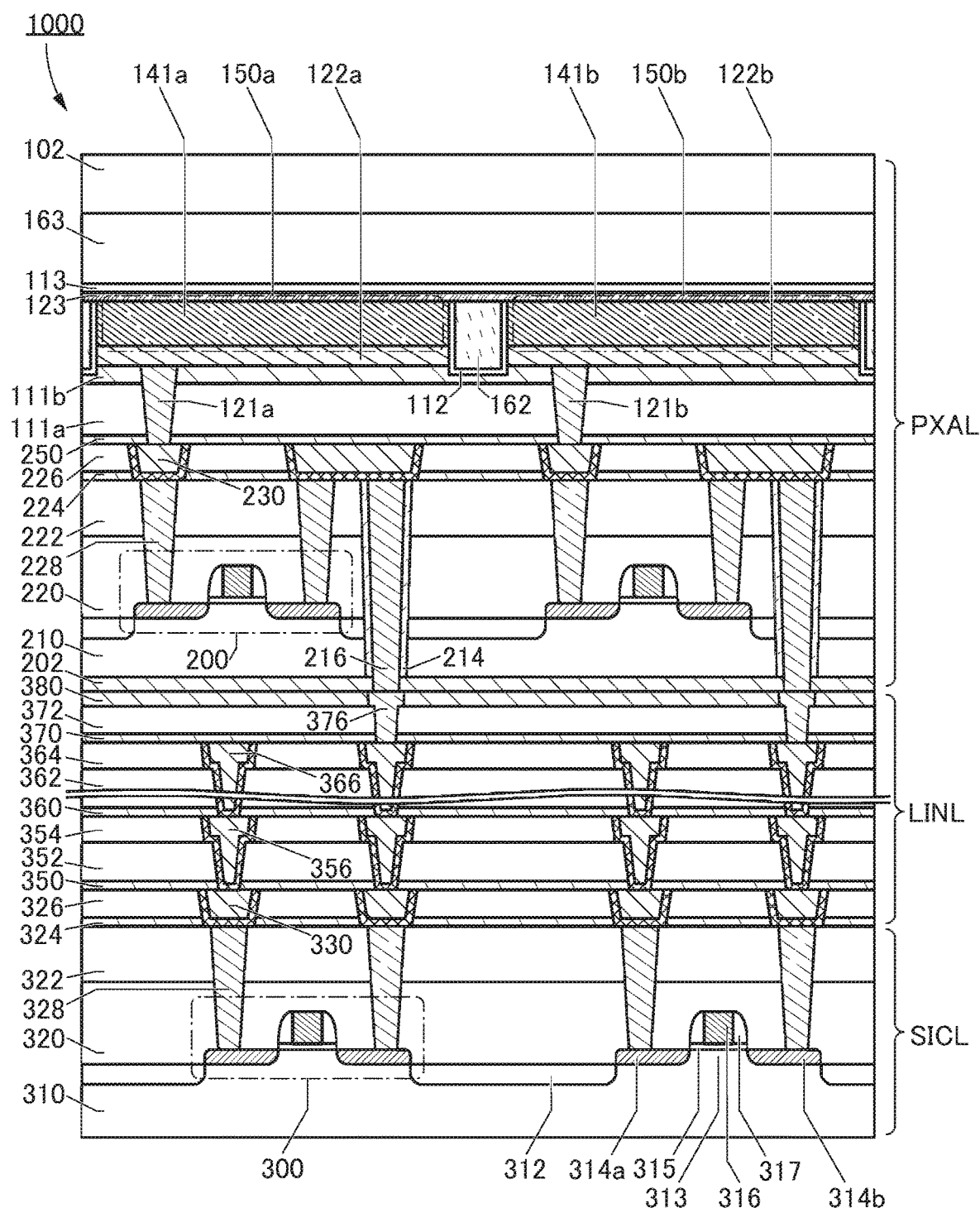
FIG. 22 is a schematic cross-sectional view illustrating a structure example of a display apparatus.

FIG. 22 is a cross-sectional view illustrating an example of a display apparatus of one embodiment of the present invention. A display apparatus 1000 illustrated in FIG. 22 has a structure in which a pixel circuit, a driver circuit, and the like are provided over a substrate 310, for example. Note that the display apparatus 10 and the like described in the above embodiment can have a structure of the display apparatus 1000 in FIG. 22. The pixel circuit described in this embodiment can be the display pixel circuit described in the above embodiment.

Specifically, for example, the circuit layer SICL, the wiring layer LINL, and the pixel layer PXAL in the display apparatus 10 can be those in the display apparatus 1000 in FIG. 22. The circuit layer SICL includes the substrate 310, for example, and a transistor 300 is formed over the substrate 310. The wiring layer LINL is provided above the transistor 300, and the wiring layer LINL includes a wiring that electrically connects the transistor 300, a transistor 200 to be described later, a light-emitting device 150a and a light-emitting device 150b to be described later, and the like. The pixel layer PXAL is provided above the wiring layer LINL, and the pixel layer PXAL includes, for example, the transistor 200 and a light-emitting device 150 (the light-emitting device 150a and the light-emitting device 150b in FIG. 22).

As the substrate 310, a single crystal substrate (e.g., a semiconductor substrate containing silicon or germanium as a material) can be used, for example. Besides the semiconductor substrate, for example, an SOI (Silicon On Insulator) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, or paper or a base material film containing a fibrous material can be used as the substrate 310. Examples of the glass substrate include barium borosilicate glass, aluminoborosilicate glass, and soda lime glass. As examples of the flexible substrate, the attachment film, and the base material film, the following can be given. Examples include plastics typified by polyethylene terephthalate (PET), polyethylene naphthalate (PEN), polyether sulfone (PES), and polytetrafluoroethylene (PTFE). Another example is a synthetic resin such as an acrylic resin. Other examples include polypropylene, polyester, polyvinyl fluoride, and polyvinyl chloride. Other examples include polyamide, polyimide, aramid, an epoxy resin, an inorganic vapor deposition film, and paper. Note that in the case where the fabrication process of the display apparatus 1000 includes heat treatment, a highly heat-resistant material is preferably selected for the substrate 310.

In the description of this embodiment, the substrate 310 is a semiconductor substrate containing silicon as a material.

The transistor 300 is provided on the substrate 310 and includes an element isolation layer 312, a conductor 316, an insulator 315, an insulator 317, a semiconductor region 313 that is part of the substrate 310, and a low-resistance region 314a and a low-resistance region 314b that function as a source region and a drain region. Thus, the transistor 300 is a Si transistor. Although FIG. 22 illustrates a structure in which one of the source and the drain of the transistor 300 is electrically connected to a conductor 330, a conductor 356, and a conductor 366, which are described later, through a conductor 328 described later, the electrical connection in the semiconductor device of one embodiment of the present invention is not limited thereto. The semiconductor device of one embodiment of the present invention may have a structure in which, for example, a gate of the transistor 300 is electrically connected to the conductor 330, the conductor 356, and the conductor 366 through the conductor 328.

The transistor 300 can be a fin type when, for example, the top surface of the semiconductor region 313 and the side surface thereof in the channel width direction are covered with the conductor 316 with the insulator 315 functioning as a gate insulating film therebetween. The effective channel width can be increased in the fin-type transistor 300, so that the on-state characteristics of the transistor 300 can be improved. In addition, contribution of the electric field of the gate electrode can be increased, so that the off-state characteristics of the transistor 300 can be improved.

Note that the transistor 300 may be either a p-channel transistor or an n-channel transistor. Alternatively, a plurality of the transistors 300 may be provided and both the p-channel transistor and the n-channel transistor may be used.

A region of the semiconductor region 313 where a channel is formed, a region in the vicinity thereof, and the low-resistance region 314a and the low-resistance region 314b that function as the source region and the drain region preferably contain a silicon-based semiconductor, specifically, preferably contain single crystal silicon. Alternatively, each of the regions may be formed using a material containing germanium (Ge), silicon germanium (SiGe), gallium arsenide (GaAs), or aluminum gallium arsenide (GaAlAs or gallium nitride (GaN)), for example. A structure using silicon whose effective mass is controlled by applying stress to the crystal lattice and changing the lattice spacing may be employed. Alternatively, the transistor 300 may be a HEMT (High Electron Mobility Transistor) using gallium arsenide and aluminum gallium arsenide.

For the conductor 316 functioning as a gate electrode, a semiconductor material such as silicon containing an element that imparts n-type conductivity, such as arsenic or phosphorus, or an element that imparts p-type conductivity, such as boron or aluminum, can be used. Alternatively, for the conductor 316, a conductive material such as a metal material, an alloy material, or a metal oxide material can be used, for example.

Note that since the work function of a conductor depends on the material of the conductor, the threshold voltage of the transistor can be adjusted by selecting the material of the conductor. Specifically, it is preferable to use one or both of titanium nitride and tantalum nitride as the material of the conductor. Moreover, in order to ensure both conductivity and embeddability, it is preferable to use stacked layers of metal materials of one or both of tungsten and aluminum for the conductor, and it is particularly preferable to use tungsten in terms of heat resistance.

The element isolation layer 312 is provided to separate a plurality of transistors formed on the substrate 310 from each other. The element isolation layer can be formed by, for example, a LOCOS (Local Oxidation of Silicon) method, an STI (Shallow Trench Isolation) method, or a mesa isolation method.

Note that the transistor 300 illustrated in FIG. 22 is an example and the structure is not limited thereto; an appropriate transistor is used in accordance with a circuit structure, a driving method, or the like. For example, the transistor 300 may have a planar structure instead of a fin-type structure.

Over the transistor 300 illustrated in FIG. 22, an insulator 320, an insulator 322, an insulator 324, and an insulator 326 are stacked in this order from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

The insulator 322 may have a function of a planarization film for eliminating a level difference caused by the transistor 300 or the like covered with the insulator 320 and the insulator 322. For example, the top surface of the insulator 322 may be planarized by planarization treatment using a chemical mechanical polishing (CMP) method to improve planarity.

For the insulator 324, it is preferable to use a barrier insulating film preventing diffusion of impurities such as water and hydrogen from the substrate 310, the transistor 300, or the like to a region above the insulator 324 (e.g., the region where the transistor 200, the light-emitting device 150a, the light-emitting device 150b, and the like are provided). Accordingly, for the insulator 324, it is preferable to use an insulating material that has a function of inhibiting diffusion of impurities such as a hydrogen atom, a hydrogen molecule, and a water molecule (through which the above impurities are less likely to pass). Furthermore, depending on the situation, for the insulator 324, it is preferable to use an insulating material that has a function of inhibiting diffusion of impurities such as a nitrogen atom, a nitrogen molecule, a nitrogen oxide molecule (e.g., $N_2O$, $NO$, and $NO_2$), and a copper atom (through which the above impurities are less likely to pass). In addition, it is preferable that the insulator 324 have a function of inhibiting diffusion of oxygen (e.g., one or both of an oxygen atom and an oxygen molecule).

For the film having a barrier property against hydrogen, silicon nitride deposited by a CVD method can be used, for example.

The amount of released hydrogen can be analyzed by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$ in TDS in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, the parasitic capacitance generated between wirings can be reduced.

In addition, the conductor 328 and the conductor 330 that are connected to the light-emitting devices and the like provided above the insulator 326 are embedded in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 22, an insulator 350, an insulator 352, and an insulator 354 are provided to be stacked in this order above the insulator 326 and the conductor 330. Furthermore, the conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

Note that like the insulator 324, for example, the insulator 350 is preferably formed using an insulator having a barrier property against hydrogen, oxygen, and water. Like the insulator 326, the insulator 352 and the insulator 354 are preferably formed using an insulator having a relatively low dielectric constant to reduce parasitic capacitance generated between wirings. An insulator 362 and an insulator 364 each have functions of an interlayer insulating film and a planarization film. Furthermore, the conductor 356 preferably includes a conductor having a barrier property against hydrogen, oxygen, and water.

For the conductor having a barrier property against hydrogen, tantalum nitride is preferably used, for example. The use of a stack including tantalum nitride and tungsten that has high conductivity can inhibit diffusion of hydrogen from the transistor 300 while the conductivity of a wiring is kept. In that case, a tantalum nitride layer having a barrier property against hydrogen is preferably in contact with the insulator 350 having a barrier property against hydrogen.

An insulator 360, the insulator 362, and the insulator 364 are stacked in this order over the insulator 354 and the conductor 356.

Like the insulator 324 or the like, the insulator 360 is preferably formed using an insulator having a barrier property against impurities such as water and hydrogen. Thus, the insulator 360 can be formed using any of the materials that can be used for the insulator 324, for example.

The insulator 362 and the insulator 364 each have functions of an interlayer insulating film and a planarization film. Like the insulator 324, the insulator 362 and the insulator 364 are preferably formed using an insulator having a barrier property against impurities such as water and hydrogen. Thus, the insulator 362 and the insulator 364 can be formed using any of the materials that can be used for the insulator 324.

An opening portion is provided in regions of the insulator 360, the insulator 362, and the insulator 364 that overlap with part of the conductor 356, and the conductor 366 is provided to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 370 and an insulator 372 are stacked in this order over the insulator 364 and the conductor 366.

Like the insulator 324 or the like, the insulator 370 is preferably formed using an insulator having a barrier property against impurities such as water and hydrogen. Thus, the insulator 370 can be formed using any of the materials that can be used for the insulator 324, for example.

The insulator 372 has functions of an interlayer insulating film and a planarization film. Like the insulator 324, the insulator 372 is preferably formed using an insulator having a barrier property against impurities such as water and hydrogen. Thus, the insulator 372 can be formed using any of the materials that can be used for the insulator 324.

An opening portion is formed in regions of the insulator 370 and the insulator 372 that overlap with part of the conductor 366, and a conductor 376 is provided to fill the opening portion.

The conductor 376 is also formed over the insulator 372. After that, the conductor 376 is patterned into a form of a wiring, a terminal, or a pad by etching treatment or the like.

For example, copper, aluminum, tin, zinc, tungsten, silver, platinum, or gold can be used for the conductor 376. The material used for the conductor 376 preferably contains the same component as the material used for a later-described conductor 216 included in the pixel layer PXAL.

Then, an insulator 380 is deposited to cover the insulator 372 and the conductor 376 and is subsequently subjected to planarization treatment by, for example, a chemical mechanical polishing (CMP) method until the conductor 376 is exposed. In this manner, the conductor 376 serving as a wiring, a terminal, or a pad can be formed over the substrate 310.

Like the insulator 324, the insulator 380 is preferably formed using a film having a barrier property that prevents diffusion of impurities such as water and hydrogen, for example. That is, the insulator 380 is preferably formed using any of the materials that can be used for the insulator 324. Like the insulator 326, the insulator 380 may be formed using an insulator having a relatively low dielectric constant to reduce parasitic capacitance generated between wirings, for example. That is, the insulator 380 may be formed using any of the materials that can be used for the insulator 326.

The pixel layer PXAL is provided with, for example, a substrate 210, the transistor 200, the light-emitting device 150 (the light-emitting device 150a and the light-emitting device 150b in FIG. 22), and a substrate 102. Moreover, the pixel layer PXAL is provided with, for example, an insulator 220, an insulator 222, an insulator 226, an insulator 250, an insulator 111a, an insulator 111b, an insulator 112, an insulator 113, an insulator 162, and a resin layer 163. Furthermore, the pixel layer PXAL is provided with, for example, the conductor 216, a conductor 228, a conductor 230, a conductor 121 (a conductor 121a and a conductor 121b in FIG. 22), a conductor 122, and a conductor 123.

An insulator 202 in FIG. 22 functions as a bonding layer together with the insulator 380, for example. The insulator 202 preferably contains, for example, the same component as the material used for the insulator 380.

The substrate 210 is provided above the insulator 202. In other words, the insulator 202 is formed on the bottom surface of the substrate 210. The substrate 210 is preferably a substrate that can be used as the substrate 310, for example. Note that in the description of the display apparatus 1000 in FIG. 22, the substrate 310 is a semiconductor substrate containing silicon as a material.

On the substrate 210, the transistor 200 is formed, for example. Being formed on the substrate 210 that is a semiconductor substrate containing silicon as a material, the transistor 200 functions as a Si transistor. Note that refer to the description of the transistor 300 for the structure of the transistor 200.

Above the transistor 200, the insulator 220 and the insulator 222 are provided. Like the insulator 320, the insulator 220 has functions of an interlayer insulating film and a planarization film, for example. Like the insulator 322, the insulator 222 has functions of an interlayer insulating film and a planarization film, for example.

A plurality of opening portions are provided in the insulator 220 and the insulator 222. The plurality of opening portions are formed in regions overlapping with a source and a drain of the transistor 200, a region overlapping with the conductor 376, and the like. The conductor 228 is formed in each of the opening portions formed in the regions overlapping with the source and the drain of the transistor 200, among the plurality of opening portions. An insulator 214 is formed on the side surface of the opening portion formed in the region overlapping with the conductor 376, among the other opening portions, and the conductor 216 is formed in the remaining space of the opening portion. The conductor 216 is sometimes particularly referred to as a TSV (Through Silicon Via).

For one or both of the conductor 216 and the conductor 228, any of the materials that can be used for the conductor 328 can be used, for example. In particular, the conductor 216 is preferably formed using the same material as the conductor 376.

The insulator 214 has a function of insulating the conductor 216 from the substrate 210, for example. Note that the insulator 214 is preferably formed using, for example, any of the materials that can be used for the insulator 320 or the insulator 324.

The insulator 380 and the conductor 376 that are formed over the substrate 310 are bonded to the insulator 202 and the conductor 216 that are formed on the substrate 210 by a bonding step, for example.

Before the bonding step, for example, planarization treatment is performed to make the surfaces of the insulator 380 and the conductor 376 level with each other on the substrate 310 side. In a similar manner, planarization treatment is performed to make the surfaces of the insulator 202 and the conductor 216 level with each other on the substrate 210 side.

In the case where bonding of the insulator 380 and the insulator 202, i.e., bonding of insulating layers, is performed in the bonding step, a hydrophilic bonding method can be employed in which, after high planarity is obtained by polishing, the surfaces subjected to hydrophilicity treatment with oxygen plasma are brought into contact to be bonded to each other temporarily, and then dehydrated by heat treatment to perform final bonding, for example. The hydrophilic bonding method can also cause bonding at an atomic level; thus, mechanically excellent bonding can be obtained.

When bonding of the conductor 376 and the conductor 216, i.e., bonding of the conductors, is performed, a surface activated bonding method can be employed in which an oxide film, a layer adsorbing impurities, and the like on the surface are removed by sputtering treatment or the like and the cleaned and activated surfaces are brought into contact to be bonded to each other. Alternatively, a diffusion bonding method in which the surfaces are bonded to each other by using temperature and pressure together can be employed, for example. Both methods cause bonding at an atomic level; thus, not only electrically but also mechanically excellent bonding can be obtained.

Through the above-described bonding step, the conductor 376 on the substrate 310 side can be electrically connected to the conductor 216 on the substrate 210 side. In addition, mechanically strong connection can be established between the insulator 380 on the substrate 310 side and the insulator 202 on the substrate 210 side.

In the case where the substrate 310 and the substrate 210 are bonded to each other, the insulating layers and the metal layers coexist on their bonding surfaces; thus, the surface activated bonding method and the hydrophilic bonding method are performed in combination, for example. For example, it is possible to employ a method in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal (e.g., gold).

Note that the substrate 310 and the substrate 210 may be bonded to each other by a bonding method other than the above-described methods. For example, as the bonding method of the substrate 310 and the substrate 210, flip-chip bonding may be employed. In the case of employing flip-chip bonding, a connection terminal such as a bump may be provided above the conductor 376 on the substrate 310 side or below the conductor 216 on the substrate 210 side. Flip-chip bonding can be performed by, for example, injecting a resin containing anisotropic conductive particles between the insulator 380 and the insulator 202 and between the conductor 376 and the conductor 216, or by using a Sn—Ag solder. Alternatively, ultrasonic wave bonding can be employed in the case where the bump and a conductor connected to the bump are each gold. To reduce physical stress such as an impact or thermal stress, the above-described flip-chip bonding may be combined with injection of an underfill agent between the insulator 380 and the insulator 202 and between the conductor 376 and the conductor 216. Furthermore, a die bonding film may be used in bonding of the substrate 310 and the substrate 210, for example.

An insulator 224 and the insulator 226 are stacked in this order over the insulator 222, the insulator 214, the conductor 216, and the conductor 228.

Like the insulator 324, the insulator 224 is preferably a barrier insulating film preventing diffusion of impurities such as water and hydrogen to the region above the insulator 224. Thus, the insulator 224 is preferably formed using any of the materials that can be used for the insulator 324, for example.

Like the insulator 326, the insulator 226 is preferably an interlayer film with a low permittivity. Thus, the insulator 226 is preferably formed using any of the materials that can be used for the insulator 326, for example.

In the insulator 224 and the insulator 226, the conductor 230 electrically connected to the transistor 200, the light-emitting device 150, and the like is embedded. Note that the conductor 230 has a function of a plug or a wiring. Note that the conductor 230 can be formed using any of the materials that can be used for the conductor 328 and the conductor 330, for example.

Over the insulator 224 and the insulator 226, the insulator 250, the insulator 111a, and the insulator 111b are stacked in this order.

Like the insulator 324, the insulator 250 is preferably formed using an insulator having a barrier property against impurities such as water and hydrogen. Thus, the insulator 250 can be formed using any of the materials that can be used for the insulator 324 or the like, for example. As each of the insulator 111a and the insulator 111b, a variety of inorganic insulating films such as an oxide insulating film, a nitride insulating film, an oxynitride insulating film, and a nitride oxide insulating film can be suitably used. As the insulator 11a, an oxide insulating film or an oxynitride insulating film, such as a silicon oxide film, a silicon oxynitride film, or an aluminum oxide film, is preferably used. As the insulator 111b, a nitride insulating film or a nitride oxide insulating film, such as a silicon nitride film or a silicon nitride oxide film, is preferably used. More specifically, it is preferable that a silicon oxide film be used as the insulator 111a and a silicon nitride film be used as the insulator 111b. The insulator 111b preferably functions as an etching protective film. Alternatively, a nitride insulating film or a nitride oxide insulating film may be used as the insulator 111a, and an oxide insulating film or an oxynitride insulating film may be used as the insulator 111b. Although this embodiment describes an example in which a depressed portion is provided in the insulator 111b, a depressed portion is not necessarily provided in the insulator 111b.

An opening portion is formed in regions of the insulator 250, the insulator 111a, and the insulator 111b that overlap with part of the conductor 230, and the conductor 121 is provided to fill the opening portion. Note that in this specification and the like, the conductor 121a and the conductor 121b illustrated in FIG. 22 are collectively referred to as the conductor 121. Note that the conductor 121 can be provided using a material similar to those for the conductor 328 and the conductor 330.

A pixel electrode described in this embodiment contains a material that reflects visible light, and a counter electrode contains a material that transmits visible light, for example.

The display apparatus 1000 has a top-emission structure. Light from the light-emitting device is emitted toward the substrate 102. For the substrate 102, a material having a high visible-light-transmitting property is preferably used.

The light-emitting device 150a and the light-emitting device 150b are provided above the conductor 121.

Here, the light-emitting device 150a and the light-emitting device 150b will be described.

The light-emitting device described in this embodiment refers to a self-luminous light-emitting device such as an organic EL element (also referred to as an OLED (Organic Light Emitting Diode)), for example. The light-emitting device electrically connected to the pixel circuit can be a self-luminous light-emitting device such as an LED (Light Emitting Diode), a micro LED, a QLED (Quantum-dot Light Emitting Diode), or a semiconductor laser.

A conductor 122a and a conductor 122b can be formed in the following manner, for example: a conductive film is formed over the insulator 111b, the conductor 121a, and the conductor 121b and the conductive film is subjected to a patterning step and an etching step. The conductor 122a and the conductor 122b function respectively as anodes of the light-emitting device 150a and the light-emitting device 150b included in the display apparatus 1000, for example.

Indium tin oxide (sometimes referred to as ITO) or the like can be used for the conductor 122a and the conductor 122b, for example.

Each of the conductor 122a and the conductor 122b may have a stacked-layer structure of two or more layers instead of a single-layer structure. For example, a conductor having a high visible-light reflectance can be used for the first-layer conductor and a conductor having a high light-transmitting property can be used for the uppermost-layer conductor. Examples of a conductor having a high visible-light reflectance include silver, aluminum, and an alloy film of silver (Ag), palladium (Pd), and copper (Cu) (Ag—Pd—Cu (APC) film). Examples of a conductor having a high light-transmitting property include indium tin oxide described above. The conductor 122a and the conductor 122b can each be, for example, a stacked-layer film in which a pair of titanium films sandwich aluminum (a film in which Ti, Al, and Ti are stacked in this order), a stacked-layer film in which a pair of indium tin oxide films sandwich silver (a film in which ITO, Ag, and ITO are stacked in this order), or the like.

An EL layer 141a is provided over the conductor 122a. An EL layer 141b is provided over the conductor 122b.

The EL layer 141a and the EL layer 141b preferably include light-emitting layers emitting light of different colors. For example, the EL layer 141a can include a light-emitting layer emitting light of any one of red (R), green (G), and blue (B), and the EL layer 141b can include a light-emitting layer emitting light of one of the other two colors. Although not illustrated in FIG. 22, in the case where an EL layer different from the EL layer 141a and the EL layer 141b is provided, the EL layer can include a light-emitting layer emitting light of the remaining one color. Thus, the display apparatus 1000 may have a structure (an SBS structure) in which light-emitting layers of different colors are formed over a plurality of pixel electrodes (the conductor 121a and the conductor 121b).

Note that the combination of colors of light emitted from the light-emitting layers included in the EL layer 141a and the EL layer 141b is not limited to the above, and a color such as cyan, magenta, or yellow may also be used, for example. The number of colors of light emitted from the light-emitting devices 150 included in the display apparatus 1000, which is three in the above example, may be two, three, or four or more.

The EL layer 141a and the EL layer 141b may each include one or more selected from an electron-injection layer, an electron-transport layer, a hole-injection layer, and a hole-transport layer in addition to the layer containing a light-emitting organic compound (the light-emitting layer).

The EL layer 141a and the EL layer 141b can be formed, for example, by an evaporation method (a vacuum evaporation method or the like), a coating method (e.g., a dip coating method, a die coating method, a bar coating method, a spin coating method, or a spray coating method), or a printing method (e.g., an inkjet method, a screen printing (stencil) method, an offset printing (planography) method, a flexography (relief printing) method, a gravure printing method, or a micro-contact printing method).

In the case where a deposition method such as the coating method or the printing method is employed, a high-molecular compound (e.g., an oligomer, a dendrimer, and a polymer), a middle-molecular compound (a compound between a low-molecular compound and a high-molecular compound with a molecular weight of 400 to 4000), or an inorganic compound (a quantum dot material or the like) can be used. As the quantum dot material, a colloidal quantum dot material, an alloyed quantum dot material, a core-shell quantum dot material, or a core quantum dot material can be used.

Figure 23A:
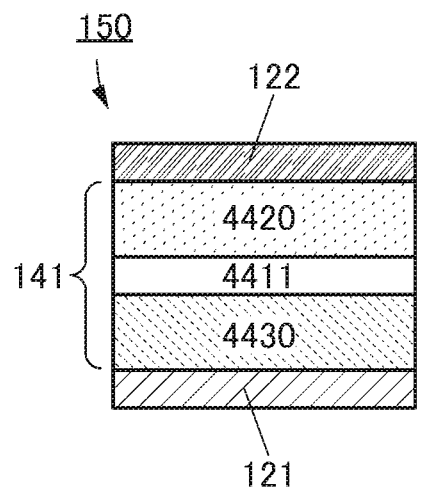
FIG. 23A to FIG. 23D are schematic views illustrating structure examples of a light-emitting device.

Like the light-emitting device 150 illustrated in FIG. 23A, for example, the light-emitting device 150a and the light-emitting device 150b in FIG. 22 can each be formed of a plurality of layers such as a light-emitting layer 4411 and a layer 4430.

A layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes (the conductor 121 and the conductor 122 described later), can function as a single light-emitting unit, and the structure in FIG. 23A is referred to as a single structure in this specification and the like.

Figure 23B:
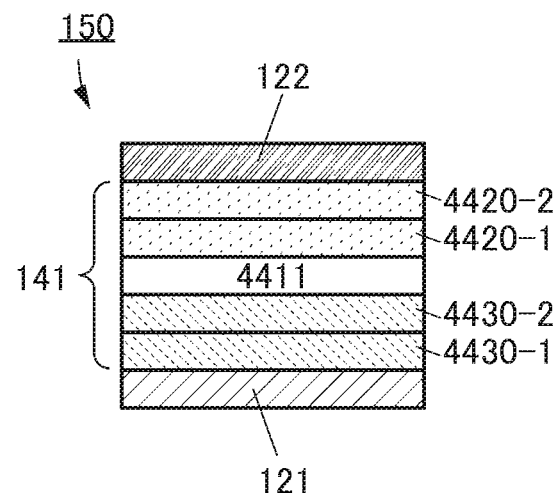

FIG. 23B is a modification example of the EL layer 141 included in the light-emitting device 150 illustrated in FIG. 23A. Specifically, the light-emitting device 150 illustrated in FIG. 23B includes a layer 4430-1 over the conductor 121, a layer 4430-2 over the layer 4430-1, the light-emitting layer 4411 over the layer 4430-2, a layer 4420-1 over the light-emitting layer 4411, a layer 4420-2 over the layer 4420-1, and the conductor 122 over the layer 4420-2. For example, when the conductor 121 functions as an anode and the conductor 122 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the conductor 121 functions as a cathode and the conductor 122 functions as an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layer structure, carriers can be efficiently injected to the light-emitting layer 4411, and the efficiency of the recombination of carriers in the light-emitting layer 4411 can be enhanced.

Figure 23C:
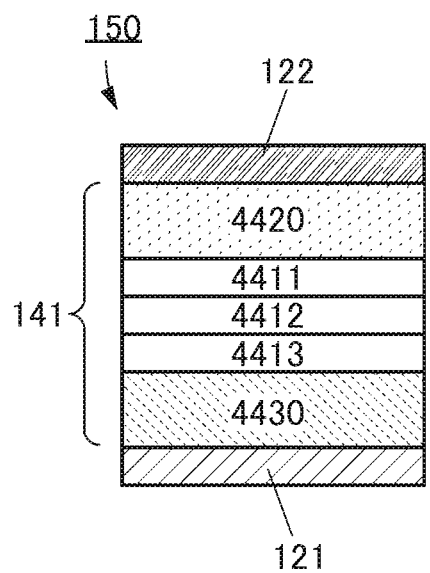

Note that the structure in which a plurality of light-emitting layers (e.g., the light-emitting layer 4411, a light-emitting layer 4412, and a light-emitting layer 4413) are provided between the layer 4420 and the layer 4430 as illustrated in FIG. 23C is also a variation of the single structure.

Figure 23D:
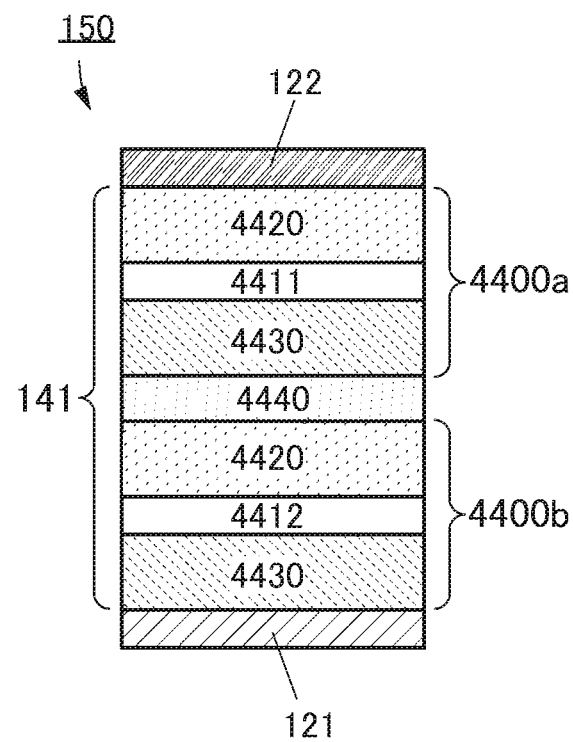

A stack including a plurality of layers such as the layer 4420, the light-emitting layer 4411, and the layer 4430 is sometimes referred to as a light-emitting unit. A plurality of light-emitting units can be connected in series with an intermediate layer (a charge-generation layer) therebetween. Specifically, a light-emitting unit 4400a and a light-emitting unit 4400b, which are a plurality of light-emitting units, can be connected in series with an intermediate layer (a charge-generation layer) 4440 therebetween as illustrated in FIG. 23D. Note that such a structure is referred to as a tandem structure in this specification. A tandem structure may be rephrased as, for example, a stack structure in this specification and the like. Note that a light-emitting device capable of high-luminance light emission can be obtained when the light-emitting device has a tandem structure. By having a tandem structure, a light-emitting device presumably has increased emission efficiency and an extended lifetime. In the case where the light-emitting device 150 of the display apparatus 1000 in FIG. 22 has a tandem structure, the EL layer 141 can include, for example, the layer 4420, the light-emitting layer 4411, and the layer 4430 that are included in the light-emitting unit 4400a, the intermediate layer 4440, and the layer 4420, the light-emitting layer 4412, and the layer 4430 that are included in the light-emitting unit 4400b.

In displaying white, the aforementioned SBS structure consumes lower power than the aforementioned single structure and tandem structure. To reduce power consumption, the SBS structure is thus suitably used. Meanwhile, the single structure and the tandem structure are suitable in terms of lower manufacturing cost or higher manufacturing yield because the manufacturing processes of the single structure and the tandem structure are simpler than that of the SBS structure.

The emission color of the light-emitting device 150 can be red, green, blue, cyan, magenta, yellow, or white depending on the material that constitutes the EL layer 141. Furthermore, the color purity can be further increased when the light-emitting device 150 has a microcavity structure.

The light-emitting device that emits white light preferably contains two or more kinds of light-emitting substances in the light-emitting layer. To obtain white light emission, two or more kinds of light-emitting substances are selected such that their emission colors are complementary.

The light-emitting layer preferably contains two or more selected from light-emitting substances that emit light of R (red), G (green), B (blue), Y (yellow), and O (orange). Alternatively, the light-emitting layer preferably contains two or more light-emitting substances that emit light containing two or more selected from spectral components of R, G, and B.

As illustrated in FIG. 22, there is a gap between two EL layers of adjacent light-emitting devices. Specifically, in FIG. 22, a depressed portion is formed between the adjacent light-emitting devices, and the insulator 112 is provided to cover the side surfaces (the side surfaces of the conductor 121a, the conductor 122a, and the EL layer 141a and the side surfaces of the conductor 121b, the conductor 122b, and the EL layer 141b) and the bottom surface (a region in the insulator 111b) of the depressed portion. The insulator 162 is formed over the insulator 112 to fill the depressed portion. In this manner, the EL layer 141a and the EL layer 141b are preferably provided so as not to be in contact with each other. This suitably prevents unintentional light emission (also referred to as crosstalk) from being caused by current flowing through two adjacent EL layers (also referred to as lateral leakage current or side leakage current). As a result, the contrast can be increased to achieve a display apparatus with high display quality. Furthermore, with the structure with an extremely low lateral leakage current between light-emitting devices, for example, the display apparatus can perform black display with as little light leakage or the like as possible (such display is also referred to as completely black display).

As an example of the formation method of the EL layer 141a and the EL layer 141b, a method with photolithography can be given. For example, the EL layer 141a and the EL layer 141b can be formed in the following manner: an EL film to be the EL layer 141a and the EL layer 141b is deposited over the conductor 122 and then subjected to patterning by a photolithography method. Accordingly, a gap can be provided between two EL layers of adjacent light-emitting devices.

In the case where the EL film is subjected to patterning by a photolithography method, damage to the light-emitting layer (e.g., processing damage) or the like might significantly degrade the reliability. In view of this, in fabrication of the semiconductor device of one embodiment of the present invention, a sacrificial layer or the like is preferably formed over a layer above the light-emitting layer (e.g., a carrier-transport layer or a carrier-injection layer, and specifically an electron-transport layer or an electron-injection layer), followed by the processing of the light-emitting layer into an island shape. Such a method provides a highly reliable semiconductor device.

The insulator 112 can be an insulating layer containing an inorganic material. As the insulator 112, an inorganic insulating film such as an oxide insulating film, a nitride insulating film, an oxynitride insulating film, or a nitride oxide insulating film can be used, for example. The insulator 112 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. An aluminum oxide film is particularly preferable because it has high selectivity with respect to the EL layer in etching and has a function of protecting the EL layer during formation of the insulator 162 described later. In particular, when an inorganic insulating film such as an aluminum oxide film, a hafnium oxide film, or a silicon oxide film formed by an ALD (Atomic Layer Deposition) method is used as the insulator 112, the insulator 112 having a small number of pinholes and an excellent function of protecting the EL layer can be formed.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The insulator 112 can be formed by a sputtering method, a CVD method, a PLD (Pulsed Laser Deposition) method, or an ALD method. The insulator 112 is preferably formed by an ALD method achieving good coverage.

The insulator 162 provided over the insulator 112 has a planarization function for the depressed portion of the insulator 112, which is formed between the adjacent light-emitting devices. In other words, the insulator 162 has an effect of improving the planarity of the formation surface of the conductor 123 to be described later. As the insulator 162, for example, an insulating layer containing an organic material can be suitably used. For example, as the insulator 162, an acrylic resin, a polyimide resin, an epoxy resin, an imide resin, a polyamide resin, a polyimide-amide resin, a silicone resin, a siloxane resin, a benzocyclobutene-based resin, a phenol resin, or precursors of these resins can be used. For the insulator 162, for example, an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin may be used. Moreover, for the insulator 162, a photosensitive resin can be used, for example. A photoresist may be used as the photosensitive resin, for example. Note that as the photosensitive resin, a positive photosensitive material or a negative photosensitive material can be used.

A difference between the top surface level of the insulator 162 and the top surface level of the EL layer 141a or the EL layer 141b is preferably less than or equal to 0.5 times, further preferably less than or equal to 0.3 times the thickness of the insulator 162, for example. The insulator 162 may be provided, for example, such that the top surface of the EL layer 141a or the EL layer 141b is at a higher level than the top surface of the insulator 162. Alternatively, the insulator 162 may be provided, for example, such that the top surface of the insulator 162 is at a higher level than the top surface of the light-emitting layer included in the EL layer 141a or the EL layer 141b.

The conductor 123 is provided over the EL layer 141a, the EL layer 141b, the insulator 112, and the insulator 162. The insulator 113 is provided over the light-emitting device 150a and the light-emitting device 150b.

The conductor 123 functions as, for example, a common electrode for the light-emitting device 150a and the light-emitting device 150b. The conductor 123 preferably contains a conductive material having a light-transmitting property so that light emitted from the light-emitting device 150 can be extracted to above the display apparatus 1000.

The conductor 123 is preferably a light-transmitting and light-reflective material having high conductivity (sometimes referred to as a semi-transmissive and semi-reflective electrode). For example, an alloy of silver and magnesium, or indium tin oxide can be used as the conductor 123.

The insulator 113 is referred to as a protective layer in some cases, and the insulator 113 provided above the light-emitting device 150a and the light-emitting device 150b can increase the reliability of the light-emitting devices. That is, the insulator 113 functions as a passivation film that protects the light-emitting device 150a and the light-emitting device 150b. Thus, the insulator 113 is preferably formed using a material that prevents entry of water, for example. Any of the materials that can be used for the insulator 111a and the insulator 111b can be used for the insulator 113, for example. Specifically, aluminum oxide, silicon nitride, or silicon nitride oxide can be used.

The resin layer 163 is provided over the insulator 113. The substrate 102 is provided over the resin layer 163.

The substrate 102 is preferably a substrate having a light-transmitting property, for example. Using a substrate having a light-transmitting property as the substrate 102 enables extraction of light emitted from the light-emitting device 150a and the light-emitting device 150b to above the substrate 102.

Note that the structure of the display apparatus of one embodiment of the present invention is not limited to that of the display apparatus 1000 illustrated in FIG. 22. The structure of the display apparatus of one embodiment of the present invention may be changed as appropriate as long as an object is achieved.

For example, the transistor 200 included in the pixel layer PXAL in the display apparatus 1000 in FIG. 22 may be a transistor including a metal oxide in a channel formation region (hereinafter, referred to as an OS transistor). The display apparatus 1000 illustrated in FIG. 24 has a structure in which the light-emitting device 150 and a transistor 500 (an OS transistor), instead of the transistor 200 in the display apparatus 1000 in FIG. 22, are provided above the circuit layer SICL and the wiring layer LINL.

Figure 24:
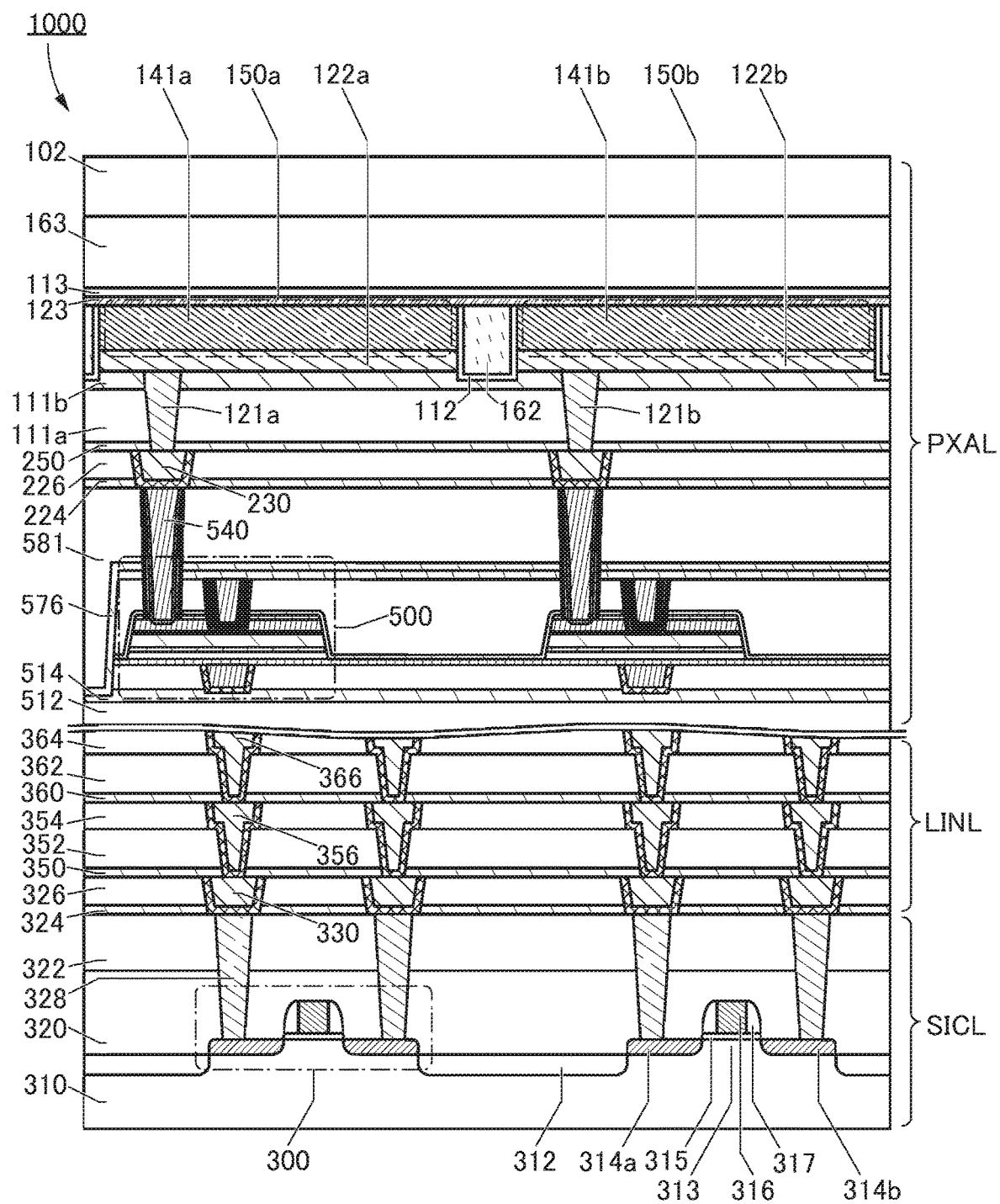
FIG. 24 is a schematic cross-sectional view illustrating a structure example of a display apparatus.

In FIG. 24, the transistor 500 is provided over an insulator 512. The insulator 512 is provided above the insulator 364 and the conductor 366, and the insulator 512 is preferably formed using a substance having a barrier property against oxygen and hydrogen. Specifically, for example, the insulator 512 is formed using silicon oxide, silicon oxynitride, silicon nitride oxide, silicon nitride, aluminum oxide, aluminum oxynitride, aluminum nitride oxide, or aluminum nitride.

For the film having a barrier property against hydrogen, silicon nitride deposited by a CVD method can be used, for example. Here, diffusion of hydrogen into a semiconductor element including an oxide semiconductor (e.g., the transistor 500) degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

A material similar to that for the insulator 320 can be used for the insulator 512, for example. When a material with a relatively low permittivity is used for these insulators, parasitic capacitance generated between wirings can be reduced. A silicon oxide film or a silicon oxynitride film can be used as the insulator 512, for example.

An insulator 514 is provided over the insulator 512, and the transistor 500 is provided over the insulator 514. An insulator 576 is formed over the insulator 512 to cover the transistor 500. An insulator 581 is formed over the insulator 576.

As the insulator 514, it is preferable to use a film having a barrier property that prevents diffusion of impurities such as hydrogen from the substrate 310, a region where the circuit element or the like below the insulator 512 is provided, or the like into a region where the transistor 500 is provided. Thus, silicon nitride deposited by a CVD method can be used for the insulator 514, for example.

The transistor 500 illustrated in FIG. 24 is an OS transistor that includes a metal oxide in a channel formation region, as described above. As the metal oxide, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium) can be used. Specifically, an oxide containing indium, gallium, and zinc (sometimes referred to as IGZO) may be used as the metal oxide, for example. Alternatively, an oxide containing indium, aluminum, and zinc (sometimes referred to as IAZO) may be used as the metal oxide, for example. Alternatively, an oxide containing indium, aluminum, gallium, and zinc (sometimes referred to as IAGZO) may be used as the metal oxide, for example. Alternatively, besides the above, an In—Ga oxide, an In—Zn oxide, or an indium oxide may be used as the metal oxide.

In particular, the metal oxide functioning as a semiconductor preferably has a band gap of 2 eV or more, preferably 2.5 eV or more. With the use of a metal oxide having such a wide band gap, the off-state current (sometimes referred to as leakage current) of the transistor can be reduced.

In particular, as a driving transistor included in a pixel circuit, a transistor having a sufficiently low off-state current even when the source-drain voltage is high, for example, an OS transistor, is preferably used. With the use of an OS transistor as the driving transistor, the amount of off-state current flowing through the light-emitting device when the driving transistor is in an off state can be reduced, whereby the luminance of light emitted from the light-emitting device through which an off-state current flows can be sufficiently reduced. Thus, in the case where a driving transistor having a high off-state current and a driving transistor having a low off-state current are compared, a pixel circuit including the driving transistor having a low off-state current can have lower emission luminance than a pixel circuit including the driving transistor having a high off-state current when black display is performed by the pixel circuits. That is, the use of an OS transistor can inhibit black blurring when black display is performed by the pixel circuit.

The off-state current value per micrometer of channel width of an OS transistor at room temperature can be lower than or equal to 1 aA ($1 \times 10^{-18}$ A), lower than or equal to 1 zA ($1 \times 10^{-21}$ A), or lower than or equal to 1 yA ($1 \times 10^{-24}$ A). Note that the off-state current value per micrometer of channel width of a Si transistor at room temperature is higher than or equal to 1 fA ($1 \times 10^{-15}$ A) and lower than or equal to 1 pA ($1 \times 10^{-12}$ A). In other words, the off-state current of an OS transistor is lower than the off-state current of a Si transistor by approximately ten orders of magnitude.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher withstand voltage between a source and a drain than a Si transistor, a high voltage can be applied between a source and a drain of an OS transistor. Accordingly, when an OS transistor is used as the driving transistor included in the pixel circuit, a high voltage can be applied between a source and a drain of the OS transistor, so that the amount of current flowing through the light-emitting device can be increased and the emission luminance of the light-emitting device can be increased.

When transistors operate in a saturation region, a change in source-drain current relative to a change in gate-source voltage can be smaller in an OS transistor than in a Si transistor. Accordingly, when an OS transistor is used as the driving transistor included in the pixel circuit, the amount of current flowing between the source and the drain can be set minutely by a change in gate-source voltage; hence, the amount of current flowing through the light-emitting device can be controlled. Therefore, the emission luminance of the light-emitting device can be controlled minutely (the number of gray levels in the pixel circuit can be increased).

Regarding saturation characteristics of current flowing when transistors operate in a saturation region, an OS transistor can feed constant current (saturation current) more stably than a Si transistor even when the source-drain voltage gradually increases. Thus, by using an OS transistor as the driving transistor, a stable constant current can be fed through a light-emitting device that contains an EL material even when the current-voltage characteristics of the light-emitting device vary, for example. In other words, when an OS transistor operates in the saturation region, the source-drain current hardly changes with an increase in the source-drain voltage; hence, the emission luminance of the light-emitting device can be stable.

As described above, with the use of an OS transistor as the driving transistor included in the pixel circuit, it is possible to achieve one or more selected from "inhibition of black blurring", "increase in emission luminance", "increase in gray levels", and "inhibition of variation in light-emitting devices". Therefore, a display apparatus including the pixel circuit can display a clear and smooth image; as a result, any one or more of the image clearness (image sharpness) and a high contrast ratio can be observed. Note that image clearness (image sharpness) sometimes refers to one or both of the state where motion blur is inhibited and the state where black blurring is inhibited. When the off-state current that can flow through the driving transistor included in the pixel circuit is extremely low, black display performed by the display apparatus can be display with as little light leakage or the like as possible (completely black display).

At least one of the insulator 576 and the insulator 581 preferably functions as a barrier insulating film that inhibits diffusion of impurities such as water and hydrogen from above the transistor 500 into the transistor 500. Thus, for at least one of the insulator 576 and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

At least one of the insulator 576 and the insulator 581 is preferably an insulator having a function of inhibiting diffusion of oxygen and impurities such as water and hydrogen; for example, aluminum oxide, magnesium oxide, hafnium oxide, gallium oxide, indium-gallium-zinc oxide, silicon nitride, or silicon nitride oxide can be used.

An opening portion for forming a plug, a wiring, or the like is provided in the insulator 581, the insulator 576, and one of the source and drain electrodes of the transistor 500.

A conductor 540 functioning as a plug, a wiring, or the like is formed in the opening portion.

The insulator 581 is preferably an insulator functioning as one or both of an interlayer film and a planarization film, for example.

The insulator 224 and the insulator 226 are formed above the insulator 581 and the conductor 540. Note that for the description of the insulator 224 and an insulator, a conductor, a circuit element, and the like that are positioned above the insulator 224, refer to the description of the display apparatus 1000 in FIG. 22.

Note that FIG. 22 illustrates a display apparatus formed by bonding the semiconductor substrate provided with the light-emitting device 150 and the pixel circuit and the semiconductor substrate provided with a driver circuit and the like; FIG. 24 illustrates a display apparatus in which the light-emitting device 150, the pixel circuit, and the like are formed over a semiconductor substrate provided with a driver circuit; however, the display apparatus for the electronic device of one embodiment of the present invention is not limited to the those in FIG. 22 and FIG. 24. The display apparatus for the electronic device of one embodiment of the present invention may have a structure in which transistors are formed in only one layer, not a layer structure in which transistors are stacked in two or more layers.

Figure 25A:
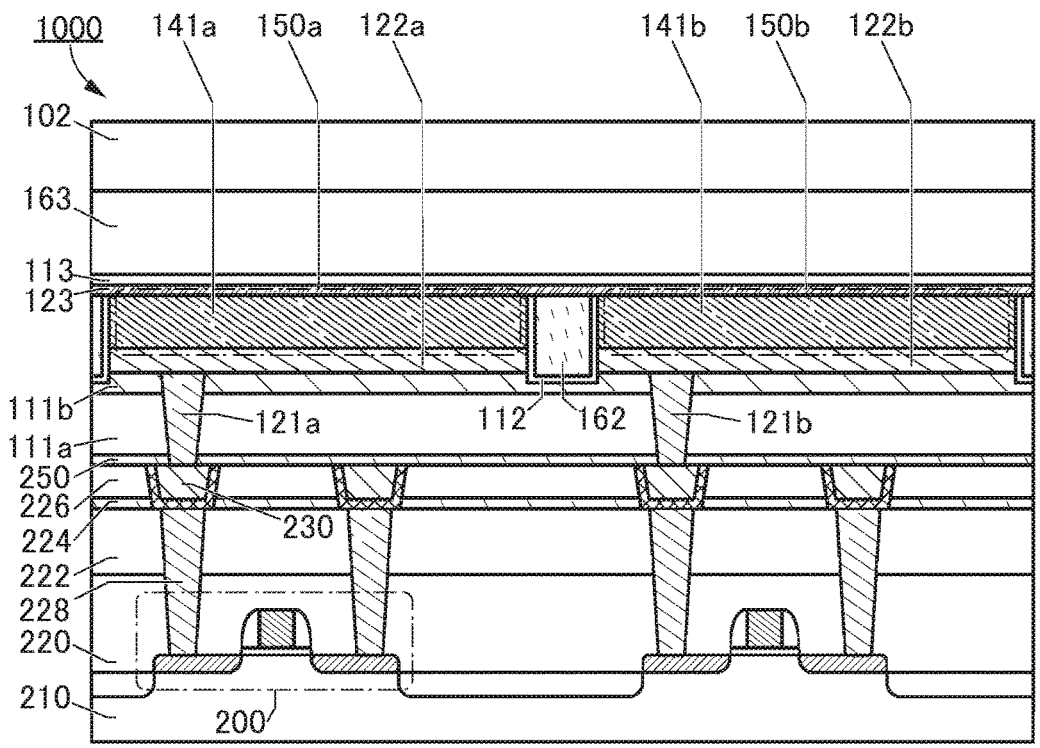
FIG. 25A and FIG. 25B are schematic cross-sectional views illustrating structure examples of a display apparatus.

Specifically, for example, the display apparatus for the electronic device of one embodiment of the present invention may include a circuit including the transistor 200 formed over the substrate 210 and the light-emitting device 150 provided above the transistor 200, like the display apparatus 1000 illustrated in FIG. 25A. For another example, a structure may be employed in which the insulator 512 is formed over a substrate 501, the transistor 500 is provided over the insulator 512, and the light-emitting device 150 is provided above the transistor 500, as in the display apparatus 1000 illustrated in FIG. 25B. Note that as the substrate 501, a substrate that can be used as the substrate 310 can be used, for example, and in particular, a glass substrate is preferably used.

Figure 25B:
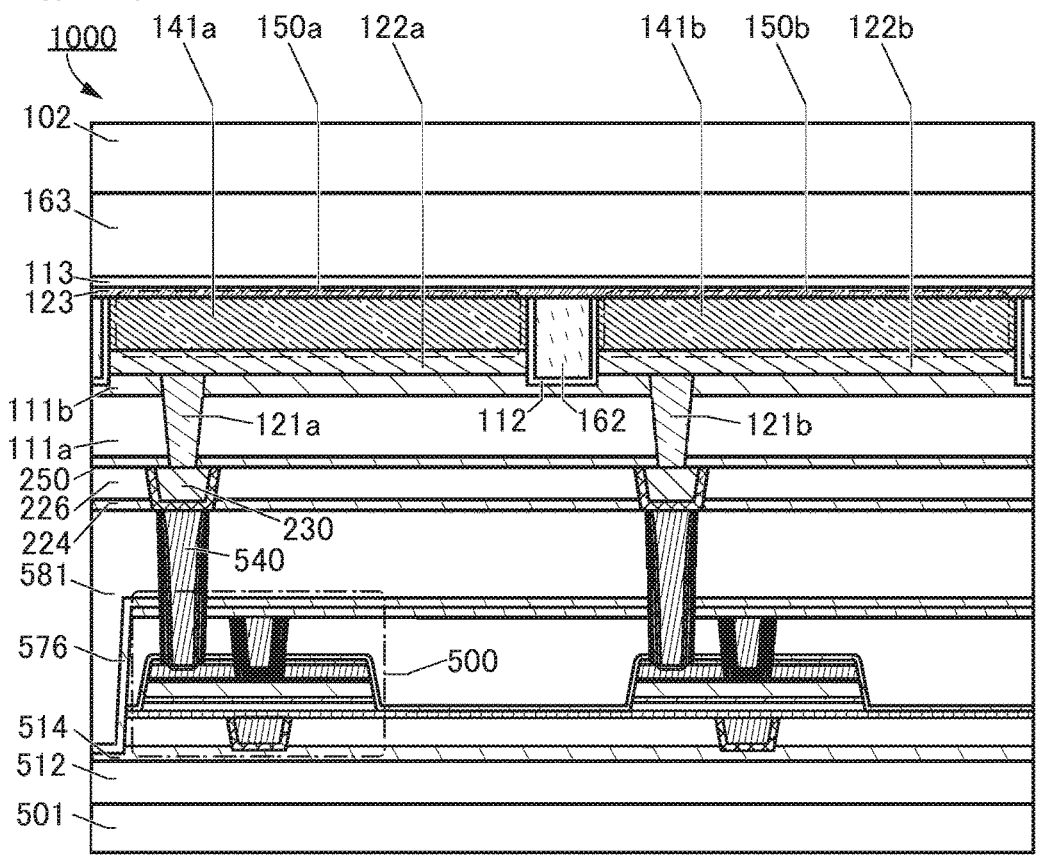

The display apparatus for the electronic device of one embodiment of the present invention may have a structure in which transistors are formed in only one layer and the light-emitting device 150 is provided above the transistors, like the display apparatus 1000 illustrated in each of FIG. 25A and FIG. 25B. Although not illustrated, the display apparatus for the electronic device of one embodiment of the present invention may have a layer structure in which transistors are formed in three or more layers.

<Sealing Structure Example of Display Apparatus>

Next, a sealing structure of the light-emitting device 150 that can be employed for the display apparatus 1000 in FIG. 22 will be described.

Figure 26A:
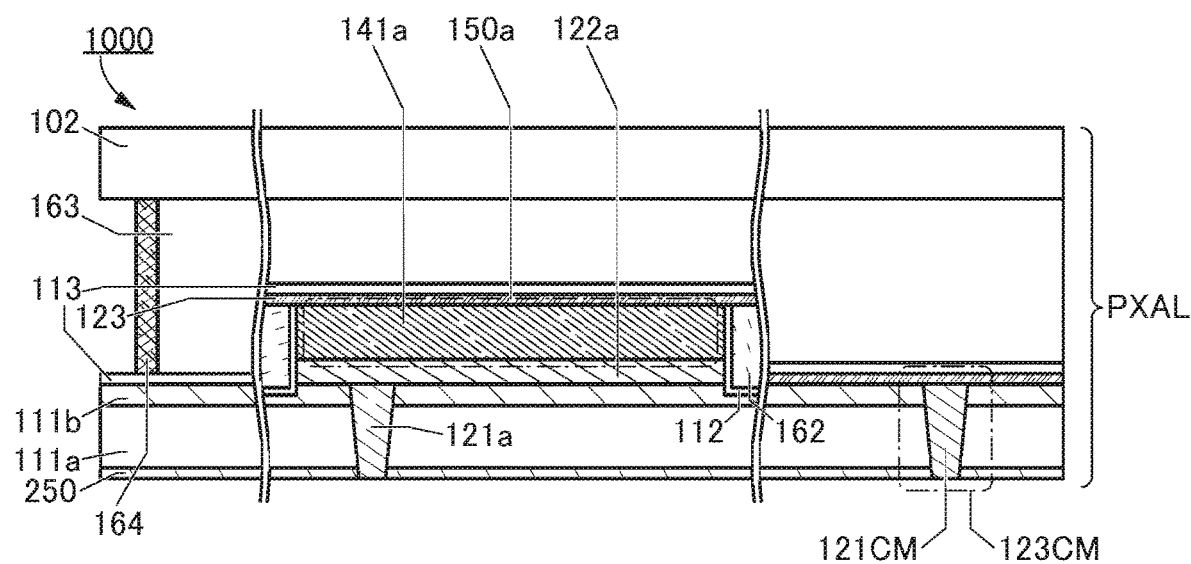
FIG. 26A and FIG. 26B are schematic cross-sectional views illustrating structure examples of a display apparatus.

FIG. 26A is a cross-sectional view illustrating an example of a sealing structure that can be employed for the display apparatus 1000 in FIG. 22. Specifically, FIG. 26A illustrates an end portion of the display apparatus 1000 in FIG. 22 and components provided around the end portion. FIG. 26A selectively illustrates only part of the pixel layer PXAL of the display apparatus 1000. Specifically, FIG. 26A illustrates the insulator 250, and insulators, conductors, and the light-emitting device 150a that are positioned above the insulator 250.

In a region 123CM illustrated in FIG. 26A, for example, an opening portion is provided. In the opening portion, a conductor 121CM is provided, for example. The conductor 123 is electrically connected to a wiring provided below the insulator 250 through the conductor 121CM. Thus, a potential (e.g., an anode potential or a cathode potential of the light-emitting device 150a or the like) can be supplied to the conductor 123 functioning as the common electrode. Note that at least one of a conductor included in the region 123CM and a conductor around the region 123CM is referred to as a connection electrode in some cases.

For the conductor 121CM, any of the materials that can be used for the conductor 121 can be used, for example.

In the display apparatus 1000 in FIG. 26A, an adhesive layer 164 is provided at or around the end portion of the resin layer 163. Specifically, the display apparatus 1000 is fabricated such that the insulator 113 and the substrate 102 are bonded to each other with the adhesive layer 164.

The adhesive layer 164 is preferably formed using, for example, a material inhibiting transmission of impurities such as moisture. Using the material for the adhesive layer 164 can increase the reliability of the display apparatus 1000.

A structure in which the insulator 113 and the substrate 102 are bonded to each other with the resin layer 163 therebetween using the adhesive layer 164 is sometimes referred to as a solid sealing structure. In the case where the resin layer 163 in the solid sealing structure has a function of bonding the insulator 113 and the substrate 102 like the adhesive layer 164, the adhesive layer 164 is not necessarily provided.

Meanwhile, a structure in which the insulator 113 and the substrate 102 are bonded to each other with an inert gas filled therebetween, instead of the resin layer 163, by using the adhesive layer 164 is sometimes referred to as a hollow sealing structure (not illustrated). Examples of an inert gas include nitrogen and argon.

Figure 26B:
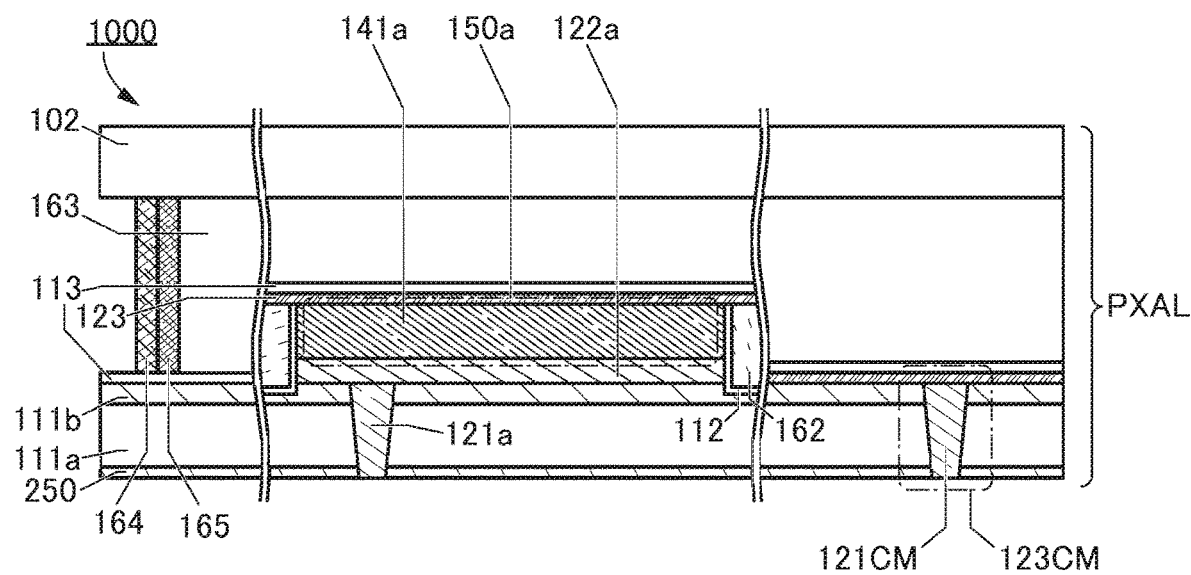

In the sealing structure of the display apparatus 1000 illustrated in FIG. 26A, two or more overlapping adhesive layers may be used. For example, as illustrated in FIG. 26B, an adhesive layer 165 may be further provided on the inner side of the adhesive layer 164 (between the adhesive layer 164 and the resin layer 163). Two or more overlapping adhesive layers can inhibit transmission of impurities such as moisture more, further increasing the reliability of the display apparatus 1000.

A desiccant may be mixed into the adhesive layer 165. In that case, the desiccant adsorbs moisture contained in the resin layer 163, insulators, conductors, and EL layers that are provided on the inner side of the adhesive layer 164 and the adhesive layer 165, increasing the reliability of the display apparatus 1000.

Although the solid sealing structure is illustrated in the display apparatus 1000 in FIG. 26B, a hollow sealing structure may be employed.

Furthermore, an inert liquid may be used instead of the resin layer 163 to fill the space in each of the sealing structures of the display apparatus 1000 in FIG. 26A and FIG. 26B. An example of an inert liquid is a fluorine-based inert liquid.

<Modification Example of Display Apparatus>

One embodiment of the present invention is not limited to the above-described structures, and the above-described structures can be changed as appropriate in accordance with circumstances. Modification examples of the display apparatus 1000 in FIG. 22 will be described below with reference to FIG. 27A to FIG. 28B. Note that FIG. 27A to FIG. 28B selectively illustrate only part of the pixel layer PXAL of the display apparatus 1000. Specifically, each of FIG. 27A to FIG. 28B illustrates, in addition to the insulator 250 and the insulator 111a, insulators, conductors, the light-emitting device 150a, and the light-emitting device 150b that are positioned above the insulator 111a. In particular, each of FIG. 27A to FIG. 28B also illustrates a light-emitting device 150c, a conductor 121c, a conductor 122c, and an EL layer 141c.

Note that, for example, the color of light emitted from the EL layer 141c may be different from the colors of light emitted from the EL layer 141a and the EL layer 141b. The display apparatus 1000 may have a structure in which the number of colors of light emitted from the light-emitting device 150a to the light-emitting device 150c is two, for example. Alternatively, for example, the display apparatus 1000 may have a structure in which the number of light-emitting devices 150 is increased so that the number of colors of light emitted from the light-emitting devices is four or more (not illustrated).

Figure 27A:
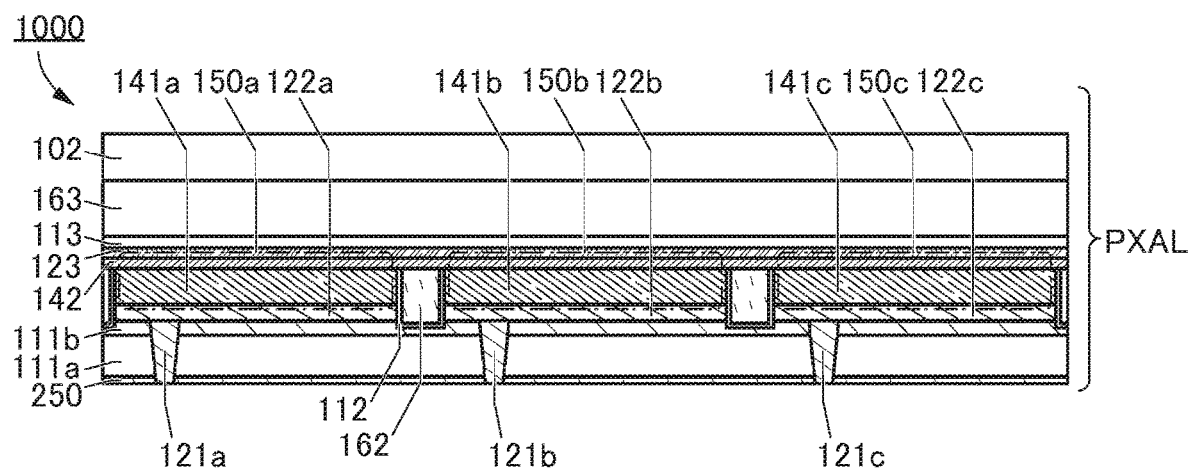
FIG. 27A and FIG. 27B are schematic cross-sectional views illustrating structure examples of a display apparatus.

The display apparatus 1000 may have a structure in which an EL layer 142 is formed over the EL layer 141a to the EL layer 141c, for example, as illustrated in FIG. 27A. Specifically, for example, in FIG. 23A, the EL layer 142 can include the layer 4420 when the EL layer 141a to the EL layer 141c each include the layer 4430 and the light-emitting layer 4411. In that case, the layer 4420 included in the EL layer 142 functions as a common layer shared by the light-emitting device 150a to the light-emitting device 150c. Similarly, for example, in FIG. 23C, the EL layer 142 can include the layer 4420 when the EL layer 141a to the EL layer 141c each include the layer 4430, the light-emitting layer 4411, the light-emitting layer 4412, and the light-emitting layer 4413, in which case the layer 4420 included in the EL layer 142 functions as a common layer shared by the light-emitting device 150a to the light-emitting device 150c. For another example, in FIG. 23D, the EL layer 142 can include the layer 4420 of the light-emitting unit 4400b when the EL layer 141a to the EL layer 141c each include the layer 4430, the light-emitting layer 4412, and the layer 4420 that are included in the light-emitting unit 4400b, the intermediate layer 4440, and the layer 4430 and the light-emitting layer 4411 that are included in the light-emitting unit 4400a, in which case the layer 4420 of the light-emitting unit 4400a included in the EL layer 142 functions as a common layer shared by the light-emitting device 150a to the light-emitting device 150c.

Figure 27B:
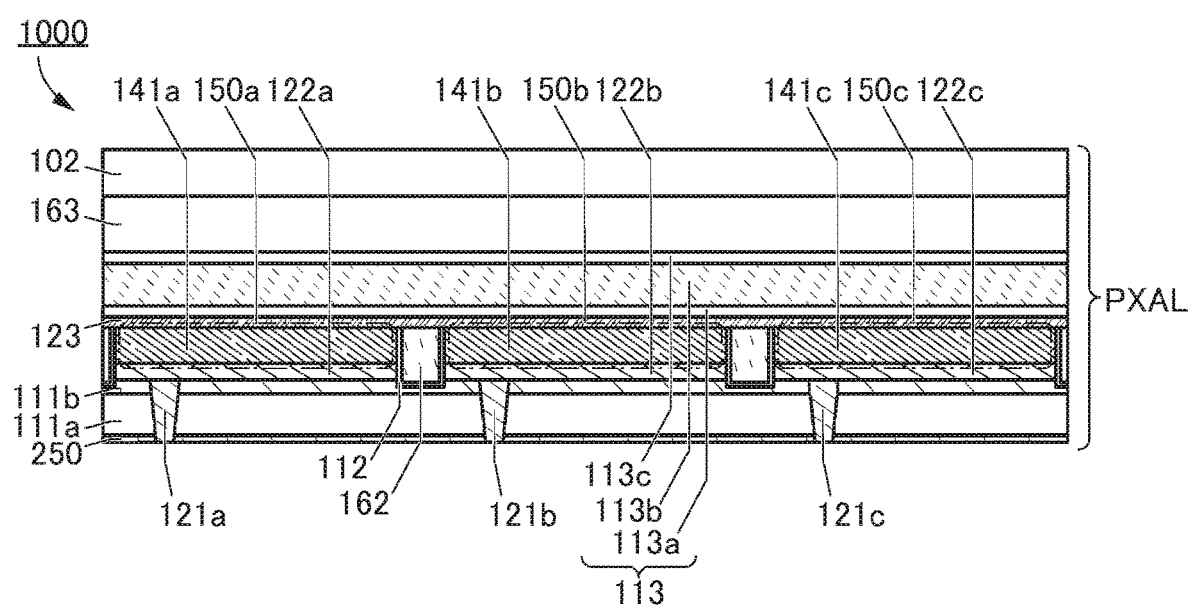

In the structure of the display apparatus 1000, for example, the insulator 113 may have a stacked-layer structure of two or more layers, instead of a single layer. The insulator 113 may have a three-layer structure that includes an insulator made of an inorganic material as the first layer, an insulator made of an organic material as the second layer, and an insulator made of an inorganic material as the third layer. FIG. 27B illustrates a cross-sectional view of part of the display apparatus 1000 in which the insulator 113 has a multilayer structure including an insulator 113a, an insulator 113b, and an insulator 113c; the insulator 113a is an insulator made of an inorganic material, the insulator 113b is an insulator made of an organic material, and the insulator 113c is an insulator made of an inorganic material.

In the structure of the display apparatus 1000, for example, the EL layer 141a to the EL layer 141c may each have a microcavity structure. In the microcavity structure, for example, the conductor 122 as an upper electrode (common electrode) is formed using a light-transmitting and light-reflective conductive material, the conductor 121 as a lower electrode (pixel electrode) is formed using a light-reflective conductive material, and the distance between the bottom surface of the light-emitting layer and the top surface of the lower electrode, i.e., the thickness of the layer 4430 in FIG. 23A, is set to the thickness corresponding to the wavelength of the color of light emitted from the light-emitting layer included in the EL layer 141.

For example, light that is reflected back from the lower electrode (reflected light) considerably interferes with light that directly enters the upper electrode from the light-emitting layer (incident light); therefore, the optical path length between the lower electrode and the light-emitting layer is preferably adjusted to $(2n-1)\lambda/4$ (n is a natural number of 1 or more and $\lambda$ is a wavelength of emitted light to be amplified). By adjusting the optical path length, the phases of the reflected light and the incident light each having the wavelength $\lambda$ can be aligned with each other, and the light emitted from the light-emitting layer can be further amplified. In the case where the reflected light and the incident light have a wavelength other than the wavelength $\lambda$, their phases are not aligned with each other, resulting in attenuation without resonation.

The EL layer included in the microcavity structure may include a plurality of light-emitting layers or a single light-emitting layer. Furthermore, for example, it is possible to combine the microcavity structure with the aforementioned tandem light-emitting device structure; specifically, a structure may be employed in which one light-emitting device includes a plurality of EL layers sandwiching a charge-generation layer and each EL layer includes one or more light-emitting layers.

With the microcavity structure, emission intensity with a specific wavelength in the front direction can be increased, whereby power consumption can be reduced. Particularly in the case of a device for XR such as VR and AR, light emitted from the light-emitting device in the front direction often enters the eyes of the user wearing the device; thus, a display apparatus of a device for XR suitably has a microcavity structure. Note that in the case of a display apparatus that displays videos with subpixels of four colors of red, yellow, green, and blue, the display apparatus can have excellent characteristics because a microcavity structure suitable for the wavelength of the corresponding color is employed in each subpixel, in addition to the effect of improving luminance owing to yellow light emission.

Figure 28A:
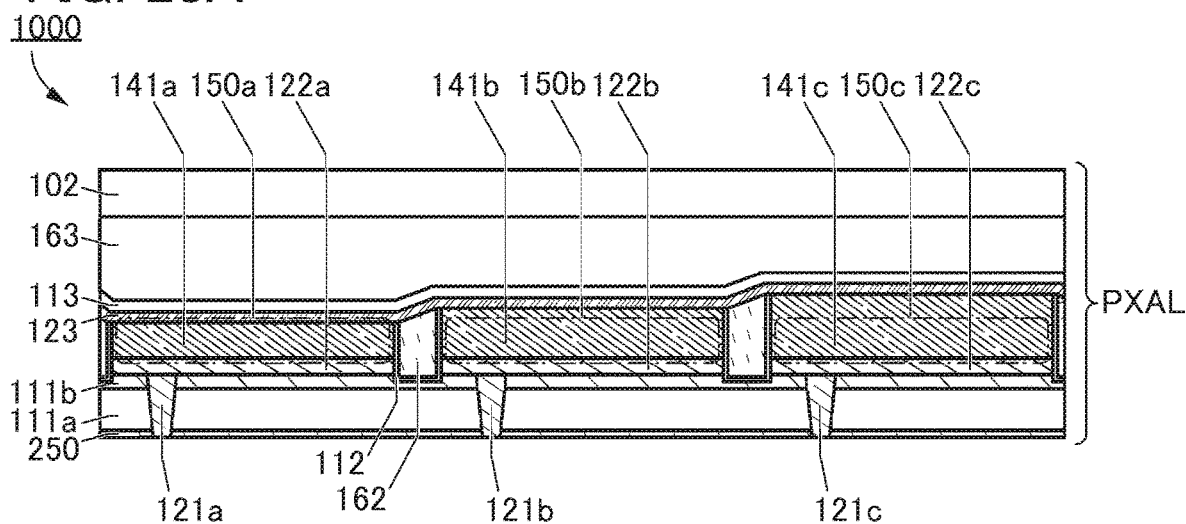
FIG. 28A and FIG. 28B are schematic cross-sectional views illustrating structure examples of a display apparatus.

FIG. 28A illustrates a cross-sectional view of part of the display apparatus 1000 having a microcavity structure, for example. In the case where the light-emitting device 150a includes a light-emitting layer emitting blue (B) light, the light-emitting device 150b includes a light-emitting layer emitting green (G) light, and the light-emitting device 150c includes a light-emitting layer emitting red (R) light, it is preferable that the EL layer 141a have the smallest thickness, the EL layer 141b have the second largest thickness, and the EL layer 141c have the largest thickness as illustrated in FIG. 28A. Specifically, the thicknesses of the layers 4430 included in the EL layer 141a, the EL layer 141b, and the EL layer 141c may be determined depending on the color of the light emitted from the corresponding light-emitting layer. In that case, the layer 4430 included in the EL layer 141a has the smallest thickness and the layer 4430 included in the EL layer 141c has the largest thickness.

Figure 28B:
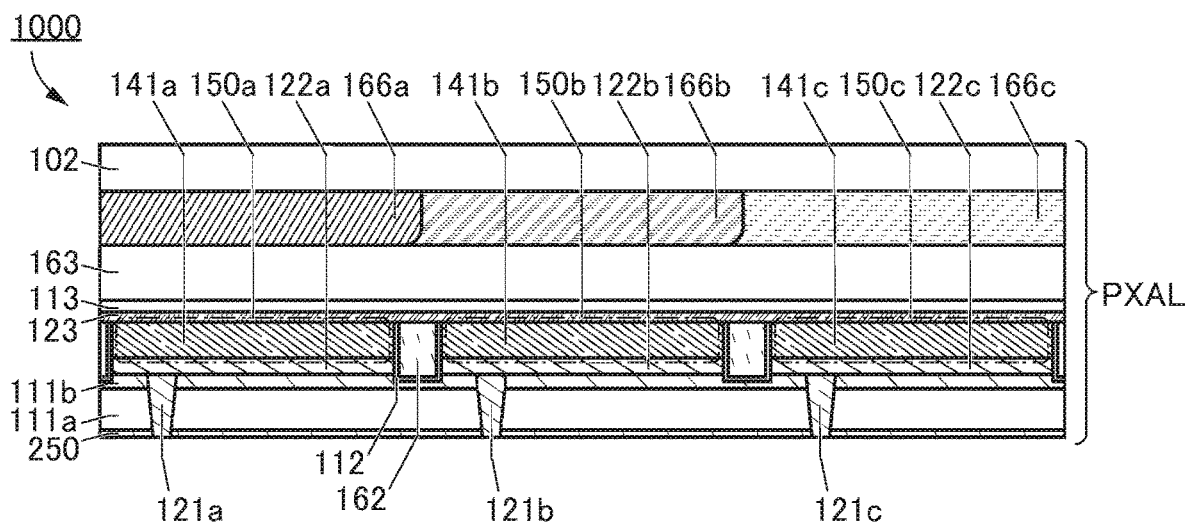

The display apparatus 1000 may include a coloring layer (color filter), for example. FIG. 28B illustrates a structure in which a coloring layer 166a, a coloring layer 166b, and a coloring layer 166c are included between the resin layer 163 and the substrate 102, for example. Note that the coloring layer 166a to the coloring layer 166c can be formed on the substrate 102, for example. In the case where the light-emitting device 150a includes a light-emitting layer emitting blue (B) light, the light-emitting device 150b includes a light-emitting layer emitting green (G) light, and the light-emitting device 150c includes a light-emitting layer emitting red (R) light, the coloring layer 166a is a blue coloring layer, the coloring layer 166b is a green coloring layer, and the coloring layer 166c is a red coloring layer.

The display apparatus 1000 illustrated in FIG. 28B can be fabricated in the following manner: the substrate 102 provided with the coloring layer 166a to the coloring layer 166c and the substrate 310 over which components up to the light-emitting device 150a to the light-emitting device 150c are formed are bonded to each other with the resin layer 163 therebetween. At this time, the bonding is preferably performed such that the light-emitting device 150a and the coloring layer 166a overlap with each other, the light-emitting device 150b and the coloring layer 166b overlap with each other, and the light-emitting device 150c and the coloring layer 166c overlap with each other. In the display apparatus 1000 provided with the coloring layer 166a to the coloring layer 166c, for example, light emitted from the light-emitting device 150b is not extracted to above the substrate 102 through the coloring layer 166a or the coloring layer 166c, but is extracted to above the substrate 102 through the coloring layer 166b. That is, light emitted from the light-emitting device 150 in an oblique direction (a direction at an elevation angle with the top surface of the substrate 102 used as a horizontal plane) can be blocked in the display apparatus 1000; thus, the viewing angle dependence of the display apparatus 1000 can be reduced, inhibiting the display quality of an image displayed on the display apparatus 1000 from decreasing when the image is viewed from an oblique direction.

The coloring layer 166a to the coloring layer 166c formed on the substrate 102 may be covered with a resin which is referred to as an overcoat layer. Specifically, the resin layer 163, the overcoat layer, the coloring layer 166a to the coloring layer 166c, and the substrate 102 may be stacked in this order in the display apparatus 1000 (not illustrated). Note that examples of the resin used for the overcoat layer include a thermosetting material having a light-transmitting property and being based on an acrylic resin or an epoxy resin.

The display apparatus 1000 may include, for example, a black matrix (not illustrated) in addition to the coloring layers. The black matrix provided between the coloring layer 166a and the coloring layer 166b, between the coloring layer 166b and the coloring layer 166c, and between the coloring layer 166c and the coloring layer 166a can block more light emitted from the light-emitting device 150 in an oblique direction (a direction at an elevation angle with the top surface of the substrate 102 used as a horizontal plane) in the display apparatus 1000; thus, the display quality of an image displayed on the display apparatus 1000 can be more prevented from decreasing when the image is viewed from an oblique direction.

In the case where the display apparatus includes coloring layers as illustrated in FIG. 28B, the light-emitting device 150a to the light-emitting device 150c of the display apparatus may each be a light-emitting device emitting white light (not illustrated). The light-emitting device can have a single structure or a tandem structure, for example.

In the above-described structure of the display apparatus 1000, the conductor 121a to the conductor 121c serve as anodes and the conductor 122 serves as a cathode; however, the display apparatus 1000 may have a structure in which the conductor 121a to the conductor 121c serve as cathodes and the conductor 122 serves as an anode. That is, in the above-described fabrication process, the stacking order of the hole-injection layer, the hole-transport layer, the light-emitting layer, the electron-transport layer, and the electron-injection layer that are included in the EL layer 141a to the EL layer 141c and the EL layer 142 may be reversed.

<Structure Example of Insulator 162>

Next, cross-sectional structures of a region including the insulator 162 and its periphery in the display apparatus 1000 will be described.

Figure 29A:
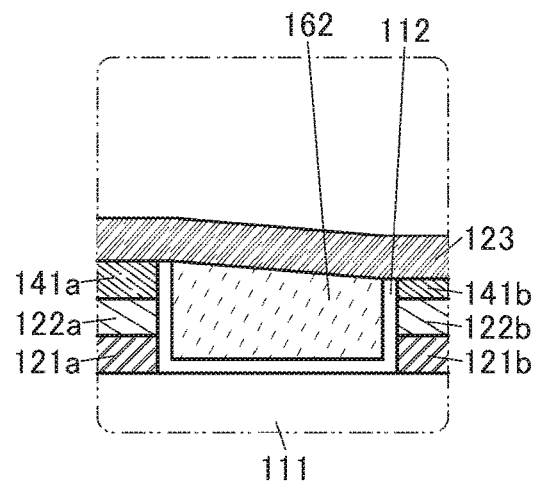
FIG. 29A to FIG. 29F are cross-sectional views illustrating an example of a method for fabricating a display apparatus.

FIG. 29A illustrates an example in which the EL layer 141a and the EL layer 141b have different thicknesses. The top surface level of the insulator 112 is equal to or substantially equal to the top surface level of the EL layer 141a on the EL layer 141a side, and equal to or substantially equal to the top surface level of the EL layer 141b on the EL layer 141b side. The top surface of the insulator 112 has a gentle slope such that the side closer to the EL layer 141a is higher and the side closer to the EL layer 141b is lower. In this manner, the top surfaces of the insulator 112 and the insulator 162 are preferably level with the top surface of an adjacent EL layer. Alternatively, the top surface levels of the insulators may be equal to the top surface level of any adjacent EL layer so that their top surfaces have a flat portion.

Figure 29D:
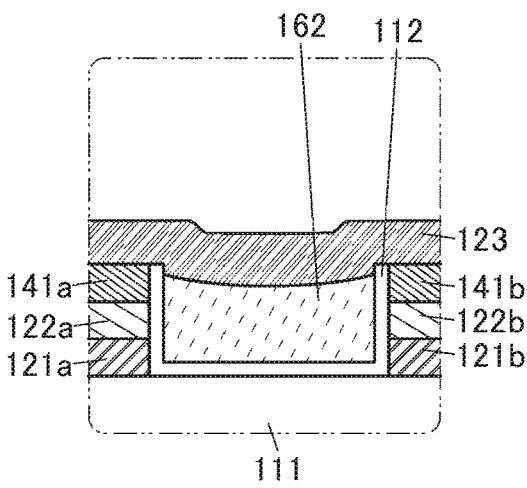
Figure 29B:
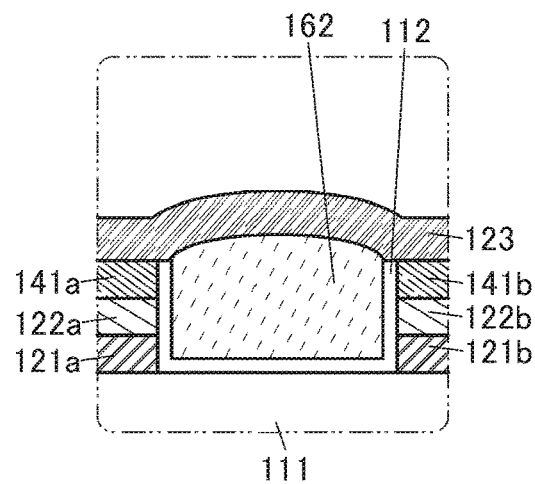

In FIG. 29B, the top surface of the insulator 162 includes a region that is at a higher level than the top surface of the EL layer 141a and the top surface of the EL layer 141b. Moreover, the top surface of the insulator 162 has a convex shape that is gently bulged toward the center.

Figure 29E:
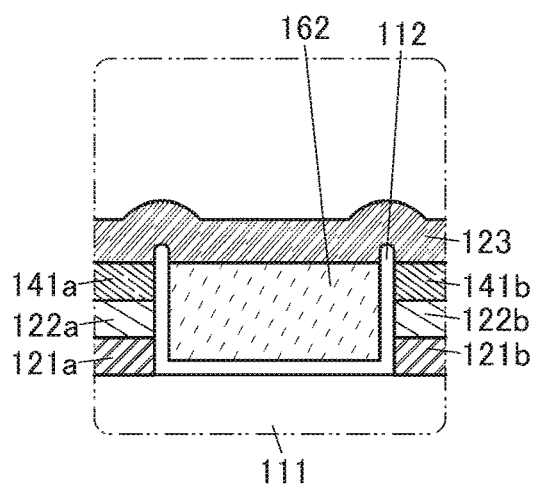
Figure 29C:
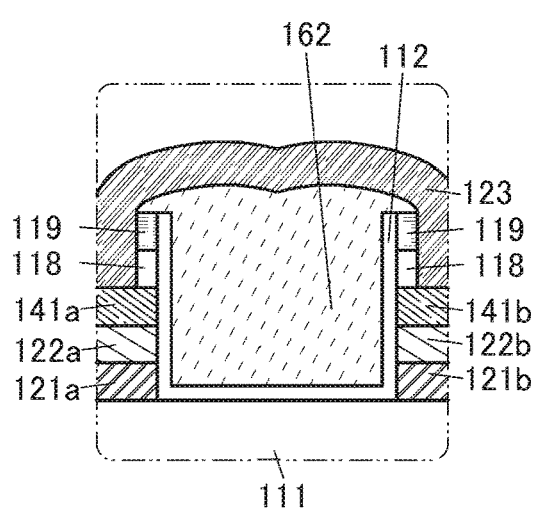

In FIG. 29C, the top surface of the insulator 112 includes a region that is at a higher level than the top surface of the EL layer 141a and the top surface of the EL layer 141b. In a region including the insulator 162 and its periphery, the display apparatus 1000 includes a first region positioned over at least one of a sacrificial layer 118 and a sacrificial layer 119. The first region is at a higher level than the top surface of the EL layer 141a and the top surface of the EL layer 141b, and part of the insulator 162 is formed in the first region. In the region including the insulator 162 and its periphery, the display apparatus 1000 includes a second region positioned over at least one of the sacrificial layer 118 and the sacrificial layer 119. The second region is at a higher level than the top surface of the EL layer 141a and the top surface of the EL layer 141b, and part of the insulator 162 is formed in the second region.

In FIG. 29D, the top surface of the insulator 162 includes a region that is at a lower level than the top surface of the EL layer 141a and the top surface of the EL layer 141b. Moreover, the top surface of the insulator 162 has a concave shape that is gently recessed toward the center.

In FIG. 29E, the top surface of the insulator 112 includes a region that is at a higher level than the top surface of the EL layer 141a and the top surface of the EL layer 141b. That is, the insulator 112 protrudes from the formation surface of the EL layer 141 and forms a projecting portion.

In formation of the insulator 112, for example, when the insulator 112 is formed to be level with or substantially level with the sacrificial layer, a shape such that the insulator 112 protrudes is sometimes formed as illustrated in FIG. 29E.

Figure 29F:
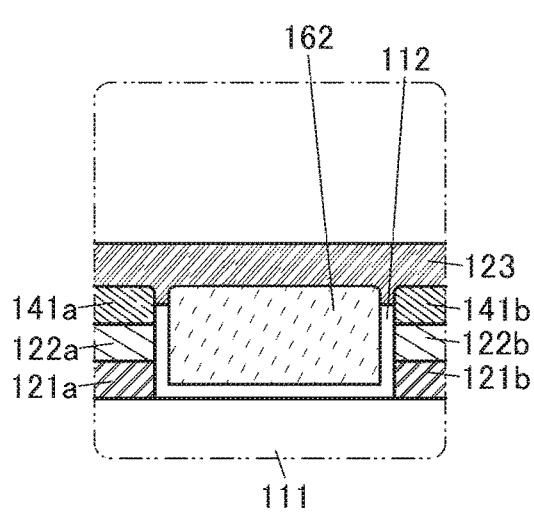

In FIG. 29F, the top surface of the insulator 112 includes a region that is at a lower level than the top surface of EL layer 141a and the top surface of the EL layer 141b. That is, the insulator 112 forms a depressed portion on the formation surface of the EL layer 141.

As described above, the insulator 112 and the insulator 162 can have a variety of shapes.

<Structure Example of Pixel Circuit>

Here, structure examples of a pixel circuit that can be included in the pixel layer PXAL will be described.

Figure 30A:
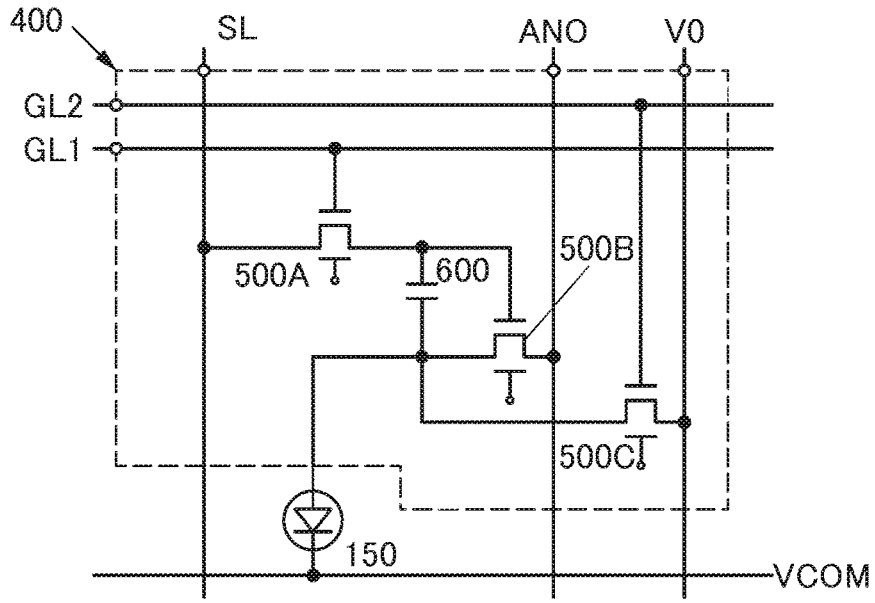
FIG. 30A is a circuit diagram illustrating a structure example of a pixel circuit included in a display apparatus.
Figure 30B:
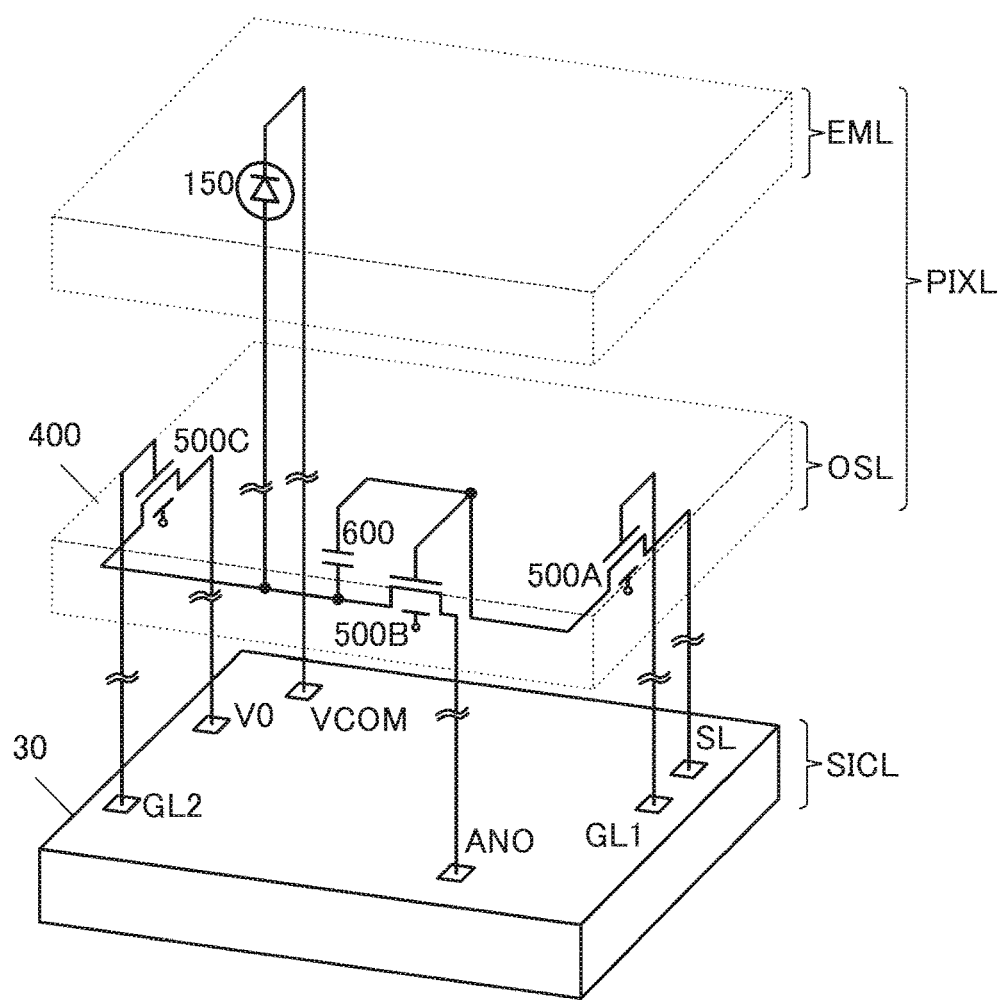
FIG. 30B is a schematic perspective view illustrating the structure example of the pixel circuit included in the display apparatus.

FIG. 30A and FIG. 30B illustrate a structure example of a pixel circuit that can be included in the pixel layer PXAL and the light-emitting device 150 connected to the pixel circuit. FIG. 30A is a diagram illustrating connection of circuit elements included in a pixel circuit 400 included in the pixel layer PXAL, and FIG. 30B is a diagram schematically illustrating the positional relation of the circuit layer SICL including a driver circuit 30, a layer OSL including a plurality of transistors of the pixel circuit, and a layer EML including the light-emitting device 150. Note that the pixel layer PXAL of the display apparatus 1000 illustrated in FIG. 30B includes the layer OSL and the layer EML, for example. A transistor 500A, a transistor 500B, or a transistor 500C included in the layer OSL illustrated in FIG. 30B corresponds to the transistor 200 in FIG. 22. The light-emitting device 150 included in the layer EML illustrated in FIG. 30B corresponds to the light-emitting device 150a or the light-emitting device 150b in FIG. 22.

The pixel circuit 400 illustrated as an example in FIG. 30A and FIG. 30B includes the transistor 500A, the transistor 500B, the transistor 500C, and a capacitor 600. The transistor 500A, the transistor 500B, and the transistor 500C can be transistors that can be used as the transistor 200 described above as an example. That is, the transistor 500A, the transistor 500B, and the transistor 500C can be Si transistors. Alternatively, the transistor 500A, the transistor 500B, and the transistor 500C can be transistors that can be used as the transistor 500 described above as example. That is, the transistor 500A, the transistor 500B, and the transistor 500C can be OS transistors. In particular, in the case where the transistor 500A, the transistor 500B, and the transistor 500C are OS transistors, each of the transistor 500A, the transistor 500B, and the transistor 500C preferably includes a back gate electrode, in which case a structure in which the back gate electrode is supplied with the same signals as the gate electrode or a structure in which the back gate electrode is supplied with signals different from those supplied to the gate electrode can be employed. Although each of the transistor 500A, the transistor 500B, and the transistor 500C illustrated in FIG. 30A and FIG. 30B includes a back gate electrode, each of the transistor 500A, the transistor 500B, and the transistor 500C does not necessarily include a back gate electrode.

The transistor 500B includes a gate electrode electrically connected to the transistor 500A, a first electrode electrically connected to the light-emitting device 150, and a second electrode electrically connected to a wiring ANO. The wiring ANO supplies a potential for supplying current to the light-emitting device 150.

The transistor 500A includes a first terminal electrically connected to the gate electrode of the transistor 500B, a second terminal electrically connected to the wiring SL functioning as a source line, and the gate electrode having a function of controlling the conducting state or the non-conducting state on the basis of the potential of the wiring GL1 functioning as a gate line.

The transistor 500C includes a first terminal electrically connected to a wiring V0, a second terminal electrically connected to the light-emitting device 150, and the gate electrode having a function of controlling the conducting state or the non-conducting state on the basis of the potential of the wiring GL2 functioning as agate line. The wiring V0 is a wiring for supplying a reference potential and a wiring for outputting current flowing through the pixel circuit 400 to the driver circuit 30.

The capacitor 600 includes a conductive film electrically connected to the gate electrode of the transistor 500B and a conductive film electrically connected to the second electrode of the transistor 500C.

The light-emitting device 150 includes a first electrode electrically connected to the first electrode of the transistor 500B and a second electrode electrically connected to a wiring VCOM. The wiring VCOM supplies a potential for supplying current to the light-emitting device 150.

Accordingly, the intensity of light emitted from the light-emitting device 150 can be controlled in accordance with an image signal supplied to the gate electrode of the transistor 500B. Furthermore, variations in the gate-source voltage of the transistor 500B can be inhibited by the reference potential of the wiring V0 supplied through the transistor 500C.

A current value that can be used for setting pixel parameters can be output from the wiring V0. Specifically, the wiring V0 can function as a monitor line for outputting current flowing through the transistor 500B or current flowing through the light-emitting device 150 to the outside. Current output to the wiring V0 is converted into voltage by a source follower circuit and output to the outside, for example. Alternatively, for example, current output to the wiring V0 can be converted into a digital signal by an A-D converter and output to the AI accelerator described in the above embodiment.

Note that in the structure illustrated as an example in FIG. 30B, the wirings electrically connecting the pixel circuit 400 and the driver circuit 30 can be shortened, so that wiring resistance of the wirings can be reduced. Thus, data writing can be performed at high speed, leading to high-speed operation of the display apparatus 1000. Therefore, even when the number of pixel circuits 400 included in the display apparatus 1000 is large, a sufficiently long frame period can be ensured and thus the pixel density of the display apparatus 1000 can be increased. In addition, the increased pixel density of the display apparatus 1000 can increase the resolution of an image displayed on the display apparatus 1000. For example, the pixel density of the display apparatus 1000 can be higher than or equal to 1000 ppi, higher than or equal to 5000 ppi, or higher than or equal to 7000 ppi. Thus, the display apparatus 1000 can be, for example, a display apparatus for AR or VR and can be suitably used in an electronic device with a short distance between a display portion and the user, such as a head-mounted display.

Although FIG. 30A and FIG. 30B illustrate, as an example, the pixel circuit 400 including three transistors in total, the pixel circuit of the electronic device of one embodiment of the present invention is not limited thereto. Structure examples of a pixel circuit that can be used as the pixel circuit 400 will be described below.

Figure 31A:
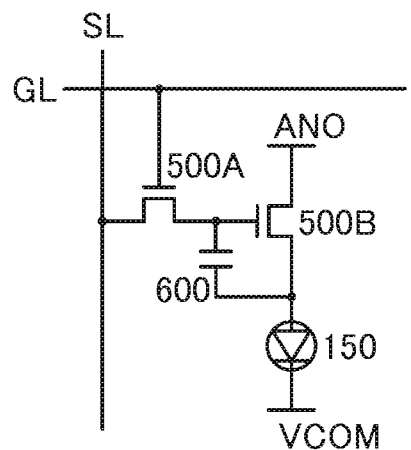
FIG. 31A to FIG. 31D are circuit diagrams illustrating structure examples of pixel circuits included in a display apparatus.

A pixel circuit 400A illustrated in FIG. 31A includes the transistor 500A, the transistor 500B, and the capacitor 600. FIG. 31A illustrates the light-emitting device 150 connected to the pixel circuit 400A. The wiring SL, the wiring GL, the wiring ANO, and the wiring VCOM are electrically connected to the pixel circuit 400A.

A gate of the transistor 500A is electrically connected to the wiring GL, one of a source and a drain of the transistor 500A is electrically connected to the wiring SL, and the other of the source and the drain of the transistor 500A is electrically connected to a gate of the transistor 500B and one electrode of the capacitor 600. One of a source and a drain of the transistor 500B is electrically connected to the wiring ANO and the other of the source and the drain of the transistor 500B is electrically connected to an anode of the light-emitting device 150. The other electrode of the capacitor 600 is electrically connected to the anode of the light-emitting device 150. A cathode of the light-emitting device 150 is electrically connected to the wiring VCOM.

Figure 31B:
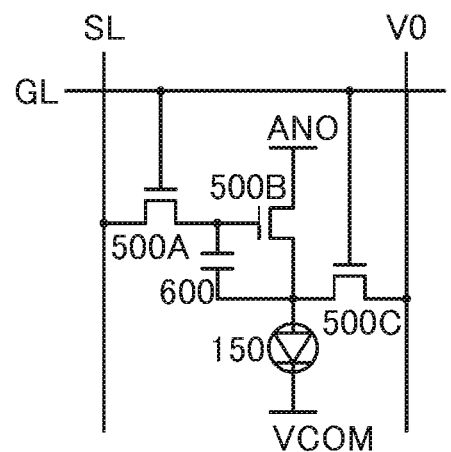

A pixel circuit 400B illustrated in FIG. 31B has a structure in which the transistor 500C is added to the pixel circuit 400A. In addition, the wiring V0 is electrically connected to the pixel circuit 400B.

Figure 31C:
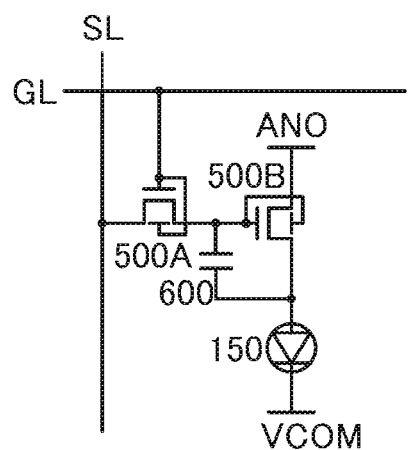
Figure 31D:
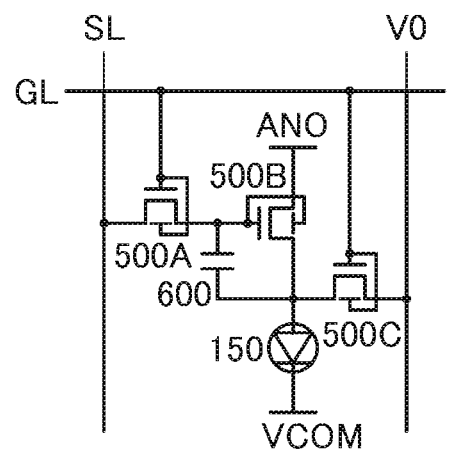

A pixel circuit 400C illustrated in FIG. 31C is an example of the case where a transistor in which a gate and a back gate are electrically connected to each other is used as each of the transistor 500A and the transistor 500B of the pixel circuit 400A. A pixel circuit 400D illustrated in FIG. 31D is an example of the case where such transistors are used in the pixel circuit 400B. Thus, current that can flow through the transistors can be increased. Note that although a transistor in which a pair of gates are electrically connected to each other is used as all the transistors here, one embodiment of the present invention is not limited thereto. A transistor that includes a pair of gates electrically connected to different wirings may be used. For example, when a transistor in which one of gates is electrically connected to a source is used, the reliability can be increased.

Figure 32A:
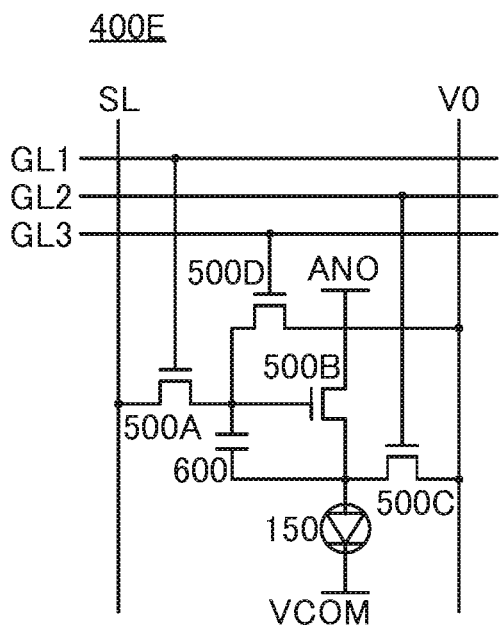
FIG. 32A to FIG. 32D are circuit diagrams illustrating structure examples of pixel circuits included in a display apparatus.

A pixel circuit 400E illustrated in FIG. 32A has a structure in which a transistor 500D is added to the pixel circuit 400B. Three wirings (the wiring GL1, the wiring GL2, and the wiring GL3) functioning as gate lines are electrically connected to the pixel circuit 400E.

A gate of the transistor 500D is electrically connected to the wiring GL3, one of a source and a drain of the transistor 500D is electrically connected to the gate of the transistor 500B, and the other of the source and the drain of the transistor 500D is electrically connected to the wiring V0. The gate of the transistor 500A is electrically connected to the wiring GL1, and the gate of the transistor 500C is electrically connected to the wiring GL2.

When the transistor 500C and the transistor 500D are turned on at the same time, the source and the gate of the transistor 500B have the same potential, so that the transistor 500B can be turned off. Thus, current flowing through the light-emitting device 150 can be blocked forcibly. Such a pixel circuit is suitable for the case of using a display method in which a display period and a non-lighting period are alternately provided.

Figure 32B:
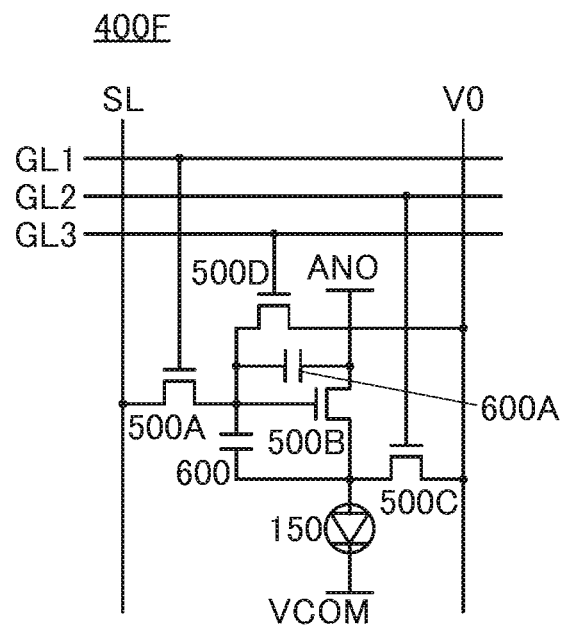

A pixel circuit 400F illustrated in FIG. 32B is an example of the case where a capacitor 600A is added to the pixel circuit 400E. The capacitor 600A functions as a storage capacitor.

Figure 32C:
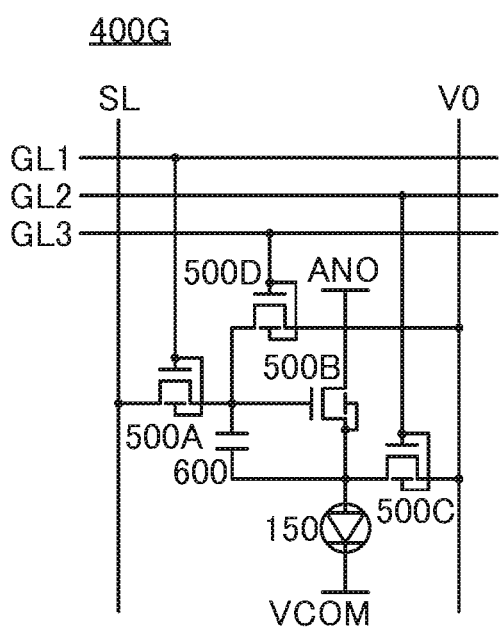
Figure 32D:
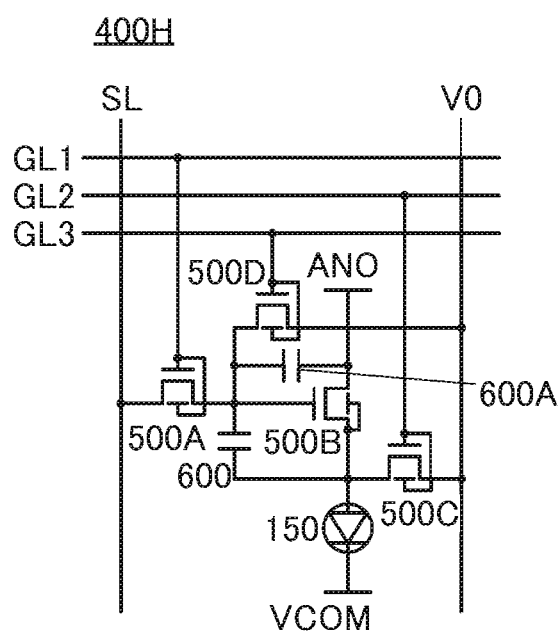

A pixel circuit 400G illustrated in FIG. 32C and a pixel circuit 400H illustrated in FIG. 32D are respectively examples of the cases where transistors each including a gate and a back gate that are electrically connected to each other are used in the pixel circuit 400E and the pixel circuit 400F. A transistor in which a gate and aback gate are electrically connected to each other is used as each of the transistor 500A, the transistor 500C, and the transistor 500D, and a transistor in which a gate is electrically connected to a source is used as the transistor 500B.

<Schematic Plan View and Schematic Cross-Sectional View of Light-Emitting Device>

Figure 33A:
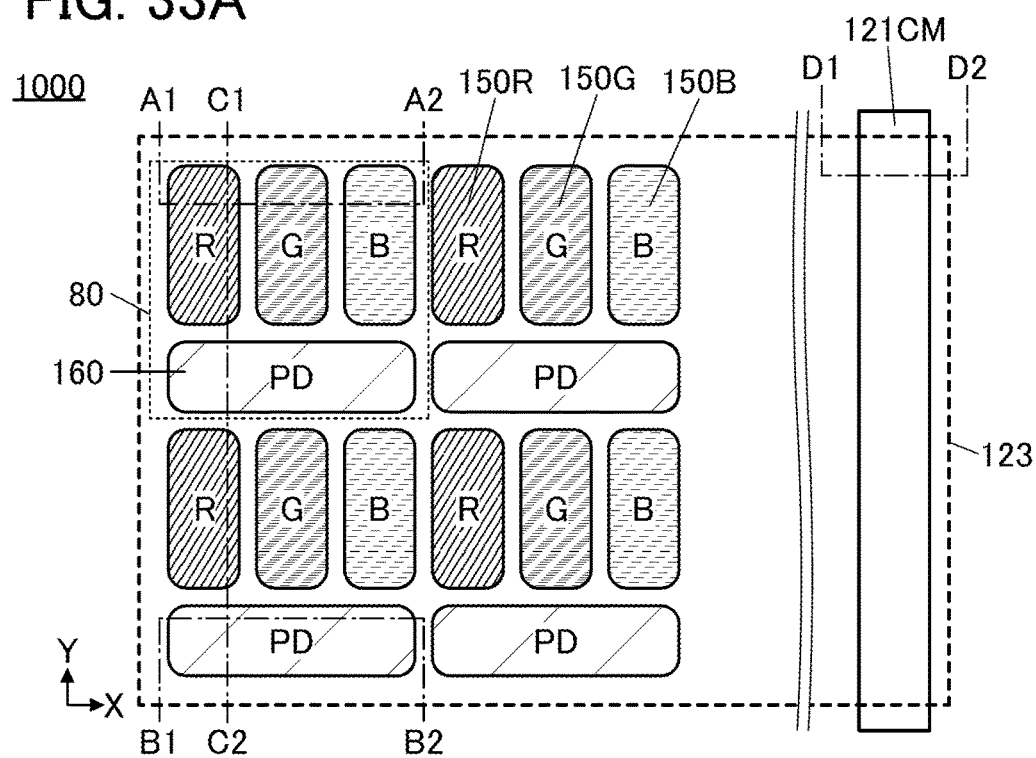
FIG. 33A and FIG. 33B are schematic plan views illustrating arrangement examples of light-emitting devices and light-receiving devices included in a display apparatus.

FIG. 33A is a schematic plan view illustrating a structure example of the case where light-emitting devices and a light-receiving device are arranged in one pixel in the display apparatus 1000 of one embodiment of the present invention. The display apparatus 1000 includes a plurality of light-emitting devices 150R that emit red light, a plurality of light-emitting devices 150G that emit green light, a plurality of light-emitting devices 150B that emit blue light, and a plurality of light-receiving devices 160. In FIG. 33A, light-emitting regions of the light-emitting devices 150 are denoted by R, G, and B to easily differentiate the light-emitting devices 150. In addition, light-receiving regions of the light-receiving devices 160 are denoted by PD.

The light-emitting devices 150R, the light-emitting devices 150G, the light-emitting devices 150B, and the light-receiving devices 160 are each arranged in a matrix. FIG. 33A illustrates an example in which the light-emitting devices 150R, the light-emitting devices 150G, and the light-emitting devices 150B are arranged in the X direction and the light-receiving devices 160 are arranged thereunder. FIG. 33A also illustrates a structure example in which the light-emitting devices 150 that emit light of the same color are arranged in the Y direction intersecting the X direction. In the display apparatus 1000 illustrated in FIG. 33A, a pixel 80 can be composed of a subpixel including the light-emitting device 150R, a subpixel including the light-emitting device 150G, and a subpixel including the light-emitting device 150B, which are arranged in the X direction, and a subpixel including the light-receiving device 160 provided under the subpixels, for example.

As each of the light-emitting device 150R, the light-emitting device 150G, and the light-emitting device 150B, an EL element such as an OLED (Organic Light Emitting Diode) or a QLED (Quantum-dot Light Emitting Diode) is preferably used. Examples of a light-emitting substance contained in the EL element include a substance that emits fluorescent light (a fluorescent material), a substance that emits phosphorescent light (a phosphorescent material), an inorganic compound (e.g., a quantum dot material), and a substance exhibiting thermally activated delayed fluorescence (a thermally activated delayed fluorescent (TADF) material). Note that as a TADF material, a material in which a singlet excited state and a triplet excited state are in a thermal equilibrium state may be used. Since such a TADF material enables a short emission lifetime (excitation lifetime), an efficiency decrease of a light-emitting device in a high-luminance region can be inhibited.

For example, a pn-type or pin-type light-receiving device can be used as the light-receiving device 160. The light-receiving device 160 functions as a photoelectric conversion element that detects light incident on the light-receiving device 160 and generates charge. The amount of generated charge depends on the amount of incident light.

It is particularly preferable to use an organic photodiode including a layer containing an organic compound, as the light-receiving device 160. An organic photodiode, which is easily made thin, lightweight, and large in area and has a high degree of freedom for shape and design, can be used in a variety of display apparatuses.

In an electronic device of one embodiment of the present invention, an organic EL element is used as the light-emitting device 150, and an organic light-receiving device is used as the light-receiving device 160. The organic EL elements and the organic light-receiving devices can be formed over one substrate. Thus, the organic light-receiving devices can be incorporated in a display apparatus including the organic EL elements. A photolithography method is preferably employed to separate the organic EL elements from each other, the organic light-receiving devices from each other, and the organic EL element and the organic light-receiving device from each other. This can reduce the interval between the light-emitting devices, between the organic light-receiving devices, and between the light-emitting device and the organic light-receiving device, achieving a display apparatus having a higher aperture ratio than that formed using, for example, a shadow mask such as a metal mask.

FIG. 33A illustrates the conductor 123 functioning as a common electrode and the conductor 121CM functioning as a connection electrode. Here, the conductor 121CM is electrically connected to the conductor 123. The conductor 121CM is provided outside a display portion where the light-emitting devices 150 and the light-receiving devices 160 are arranged. In FIG. 33A, the conductor 123 including a region overlapping with the light-emitting devices 150, the light-receiving devices 160, and the conductor 121CM is shown by dashed lines.

The conductor 121CM can be provided along the outer periphery of the display portion. For example, the conductor 121CM may be provided along one side of the outer periphery of the display portion or two or more sides of the outer periphery of the display portion. That is, the top surface shape of the conductor 121CM can be a band shape, an L shape, a square bracket shape, or a quadrangle in the case where the top surface shape of the display portion is a rectangle.

Figure 33B:
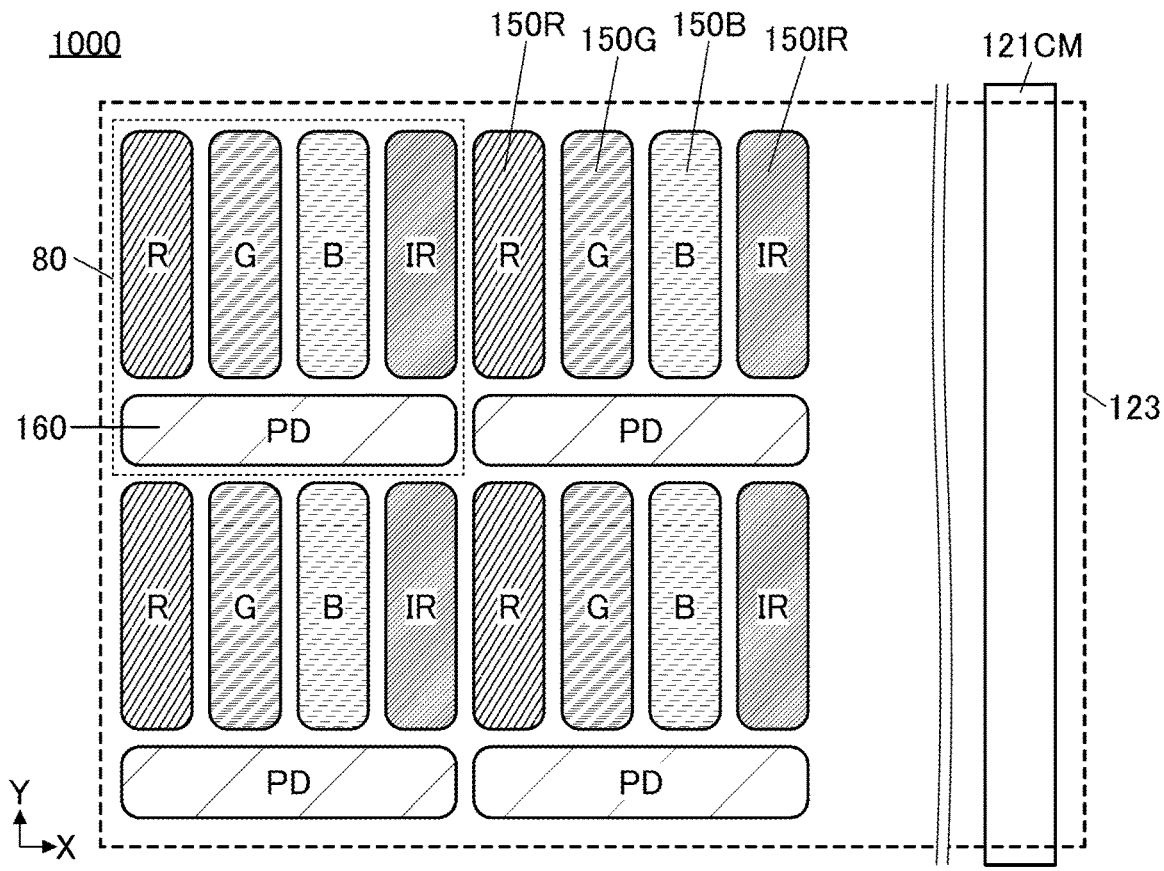

FIG. 33B is a schematic plan view illustrating a structure example of the display apparatus 1000 and is a modification example of the display apparatus 1000 illustrated in FIG. 33A. The display apparatus 1000 illustrated in FIG. 33B differs from the display apparatus 1000 illustrated in FIG. 33A in that light-emitting devices 150IR that emit infrared light are included. The light-emitting devices 150IR can emit near-infrared light (light with a wavelength greater than or equal to 750 nm and less than or equal to 1300 nm), for example.

In the example illustrated in FIG. 33B, the light-emitting devices 150IR as well as the light-emitting devices 150R, the light-emitting devices 150G, and the light-emitting devices 150B are arranged in the X direction, and the light-receiving devices 160 are arranged thereunder. The light-receiving device 160 has a function of detecting infrared light.

Figure 34A:
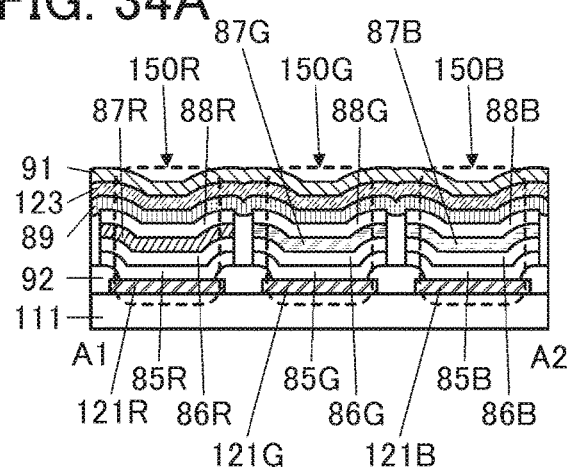
FIG. 34A to FIG. 34D are schematic cross-sectional views illustrating structure examples of light-emitting devices, light-receiving devices, and a connection electrode included in a display apparatus.
Figure 34B:
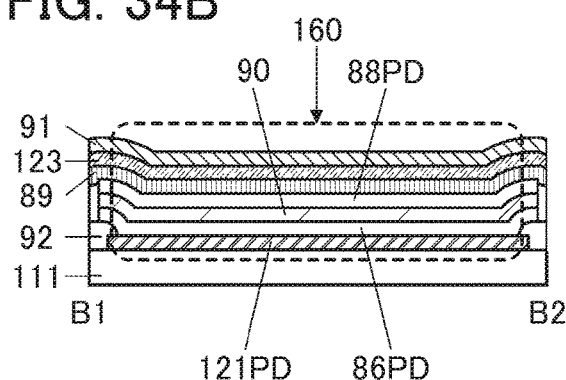
Figure 34C:
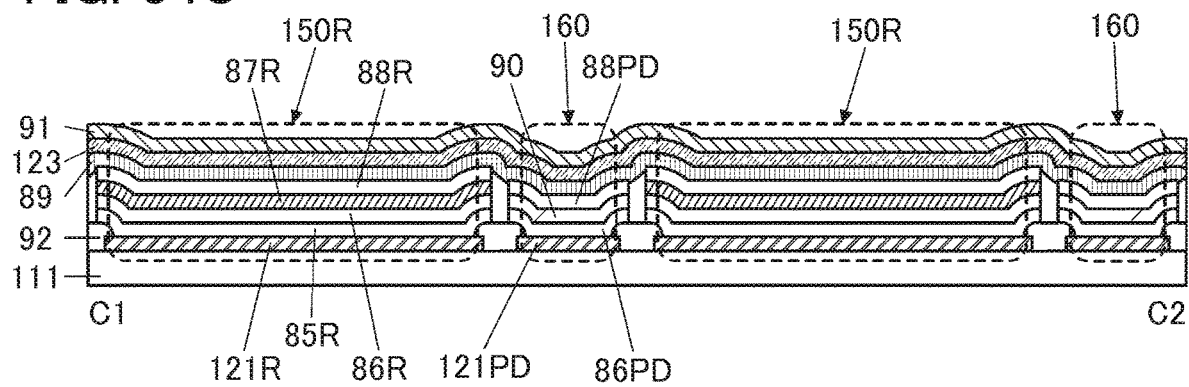
Figure 34D:
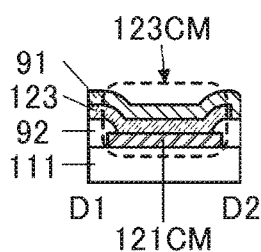

FIG. 34A is a cross-sectional view taken along the dashed-dotted line A1-A2 in FIG. 33A, and FIG. 34B is a cross-sectional view taken along the dashed-dotted line B1-B2 in FIG. 33A. FIG. 34C is a cross-sectional view taken along the dashed-dotted line C1-C2 in FIG. 33A, and FIG. 34D is a cross-sectional view taken along the dashed-dotted line D1-D2 in FIG. 33A. The light-emitting devices 150R, the light-emitting devices 150G, the light-emitting devices 150B, and the light-receiving devices 160 are provided over the insulator 111. In the case where the display apparatus 1000 includes the light-emitting devices 150IR, the light-emitting devices 150IR are provided over the insulator 111.

In the case where the expression "B over A" or "B under A" is used in this specification and the like, for example, A and B do not always need to include a region where they are in contact with each other.

FIG. 34A illustrates a cross-sectional structure example of the light-emitting device 150R, the light-emitting device 150G, and the light-emitting device 150B in FIG. 33A. FIG. 34B illustrates a cross-sectional structure example of the light-receiving device 160 in FIG. 33A.

The light-emitting device 150R includes a conductor 121R functioning as a pixel electrode, a hole-injection layer 85R, a hole-transport layer 86R, a light-emitting layer 87R, an electron-transport layer 88R, a common layer 89, and the conductor 123. The light-emitting device 150G includes a conductor 121G functioning as a pixel electrode, a hole-injection layer 85G, a hole-transport layer 86G, a light-emitting layer 87G, an electron-transport layer 88G, the common layer 89, and the conductor 123. The light-emitting device 150B includes a conductor 121B functioning as a pixel electrode, a hole-injection layer 85B, a hole-transport layer 86B, a light-emitting layer 87B, an electron-transport layer 88B, the common layer 89, and the conductor 123. The light-receiving device 160 includes a conductor 121PD functioning as a pixel electrode, a hole-transport layer 86PD, a light-receiving layer 90, an electron-transport layer 88PD, the common layer 89, and the conductor 123.

As the conductor 121R, the conductor 121G, and the conductor 121B, for example, the conductor 121a, the conductor 121b, and the conductor 121c illustrated in FIG. 27A to FIG. 28B can be used.

The common layer 89 has a function of an electron-injection layer in the light-emitting device 150. Meanwhile, the common layer 89 has a function of an electron-transport layer in the light-receiving device 160. Therefore, the light-receiving device 160 does not necessarily include the electron-transport layer 88PD.

The hole-injection layer 85, the hole-transport layer 86, the electron-transport layer 88, and the common layer 89 can also be referred to as functional layers.

The conductor 121, the hole-injection layer 85, the hole-transport layer 86, the light-emitting layer 87, and the electron-transport layer 88 can each be separately provided for each element. The common layer 89 and the conductor 123 are provided to be shared by the light-emitting device 150R, the light-emitting device 150G, the light-emitting device 150B, and the light-receiving device 160.

The light-emitting device 150 and the light-receiving device 160 may each include a hole-blocking layer and an electron-blocking layer other than the layers illustrated in FIG. 34A.

The light-emitting device 150 and the light-receiving device 160 may each include a layer containing, for example, a substance with a bipolar property (a substance with a high electron-transport property and a high hole-transport property).

An insulating layer 92 is provided to cover an end portion of the conductor 121R, an end portion of the conductor 121G, an end portion of the conductor 121B, and an end portion of the conductor 121PD. An end portion of the insulating layer 92 is preferably tapered. The insulating layer 92 is not necessarily provided when not needed.

Note that the insulating layer 92 may be provided to prevent adjacent pixels (e.g., the light-emitting device 150R and the light-emitting device 150G, or the light-emitting device 150G and the light-emitting device 150B) from being electrically short-circuited and emitting light unintentionally, for example. In the case where the light-emitting devices are formed using a metal mask, the insulating layer 92 may be provided to cover end portions of the conductor 121R, the conductor 121G, the conductor 121B, and the conductor 121PD so as to prevent the metal mask from being in contact with the conductor 121R, the conductor 121G, the conductor 121B, and the conductor 121PD. With this structure, the surface of the insulating layer 92 is higher in level than the surfaces of the conductor 121R, the conductor 121G, the conductor 121B, and the conductor 121PD; thus, the metal mask is not in contact with the conductor 121R, the conductor 121G, the conductor 121B, and the conductor 121PD, whereby damage on the surfaces of the conductor 121R, the conductor 121G, the conductor 121B, and the conductor 121PD can be prevented.

For example, the hole-injection layer 85R, the hole-injection layer 85G, the hole-injection layer 85B, and the hole-transport layer 86PD each include a region in contact with the top surface of the conductor 121 and a region in contact with the surface of the insulating layer 92. In addition, an end portion of the hole-injection layer 85R, an end portion of the hole-injection layer 85G, an end portion of the hole-injection layer 85B, and an end portion of the hole-transport layer 86PD are positioned over the insulating layer 92.

A gap is provided between the common layer 89 and the insulating layer 92. This can inhibit contact between the common layer 89 and each of the side surface of the light-emitting layer 87, the side surface of the light-receiving layer 90, the side surface of the hole-transport layer 86, and the side surface of the hole-injection layer 85. Thus, short-circuit in the light-emitting device 150 and short-circuit in the light-receiving device 160 can be inhibited.

The shorter the distance between the adjacent light-emitting layers 87 is, for example, the more easily the gap is formed. For example, when the distance is less than or equal to 1 m, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm, the gap can be suitably formed.

A protective layer 91 is provided over the conductor 123. The protective layer 91 has a function of preventing diffusion of impurities such as water into each light-emitting device from above.

The protective layer 91 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as an indium gallium oxide or an indium gallium zinc oxide may be used for the protective layer 91.

A stacked-layer film of an inorganic insulating film and an organic insulating film can be used as the protective layer 91. For example, a structure in which an organic insulating film is interposed between a pair of inorganic insulating films is preferable. Furthermore, the organic insulating film preferably functions as a planarization film. With this, the top surface of the organic insulating film can be flat, and accordingly, coverage with the inorganic insulating film thereover is improved, leading to an improvement in barrier property. The top surface of the protective layer 91 is flat, which is preferable because the influence of an uneven shape due to a component below the protective layer 91 can be reduced in the case where a component (e.g., a color filter, an electrode of a touch sensor, or a lens array) is provided above the protective layer 91.

FIG. 34C illustrates a cross-sectional structure example of the display apparatus 1000 in the Y direction, specifically, a cross-sectional structure example of the light-emitting device 150R and the light-receiving device 160. Note that the light-emitting device 150G and the light-emitting device 150B can also be arranged in the Y direction like the light-emitting device 150R.

FIG. 34D illustrates a structure in which the conductor 123 functioning as a connection electrode and the conductor 121CM functioning as a common electrode are electrically connected to each other in the region 123CM. Thus, in the region 123CM in FIG. 34D, the conductor 122 is provided over and in contact with the conductor 123, and the protective layer 91 is provided to cover the conductor 122. The insulating layer 92 is provided to cover the end portion of the conductor 123.

FIG. 34A illustrates the light-emitting device 150 in which the conductor 121, the hole-injection layer 85, the hole-transport layer 86, the light-emitting layer 87, the electron-transport layer 88, the common layer 89 (electron-injection layer), and the conductor 123 are provided in this order from the bottom, and the light-receiving device 160 in which the conductor 121PD, the hole-transport layer 86PD, the light-receiving layer 90, the electron-transport layer 88PD, the common layer 89, and the conductor 123 are provided in this order from the bottom; however, the structure of the light-emitting device or the light-receiving device of an electronic device of one embodiment of the present invention is not limited to this example. For example, the light-emitting device 150 may include a conductor functioning as a pixel electrode, an electron-injection layer, an electron-transport layer, a light-emitting layer, a hole-transport layer, a hole-injection layer, and a conductor functioning as a common electrode in this order from the bottom, and the light-receiving device 160 may include a conductor functioning as a pixel electrode, an electron-transport layer, a light-receiving layer, a hole-transport layer, and a conductor functioning as a common electrode in this order from the bottom. In that case, the hole-injection layer included in the light-emitting device 150 can be a common layer, and the common layer can be provided between the hole-transport layer included in the light-receiving device 160 and the common electrode. In addition, the electron-injection layers can be separated between the light-emitting devices 150.

<Pixel Layout>

Here, a pixel layout that is different from those illustrated in FIG. 33A and FIG. 33B will be described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a quadrangle (including a rectangle and a square), and a pentagon; polygons with rounded corners; an ellipse; and a circle. Here, the top surface shape of the subpixel corresponds to the top surface shape of a light-emitting region of the light-emitting device.

Figure 35A:
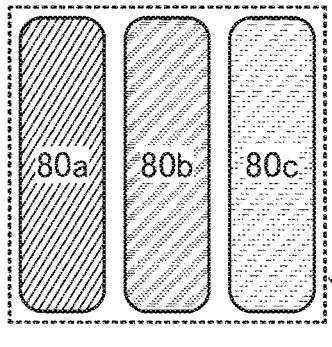
FIG. 35A to FIG. 35G are plan views illustrating examples of pixels.
Figure 36A:
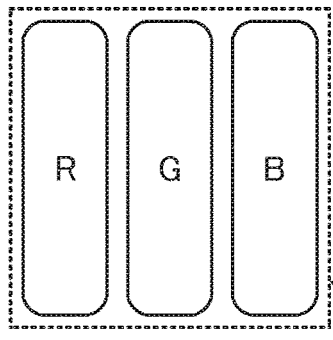
FIG. 36A to FIG. 36F are plan views illustrating examples of pixels.

The pixel 80 illustrated in FIG. 35A employs stripe arrangement. The pixel 80 illustrated in FIG. 35A is composed of three subpixels: a subpixel 80*a*, a subpixel 80*b*, and a subpixel 80*c*. For example, as illustrated in FIG. 36A, the subpixel 80*a* may be a red subpixel R, the subpixel 80*b* may be a green subpixel G, and the subpixel 80*c* may be a blue subpixel B.

Figure 35B:
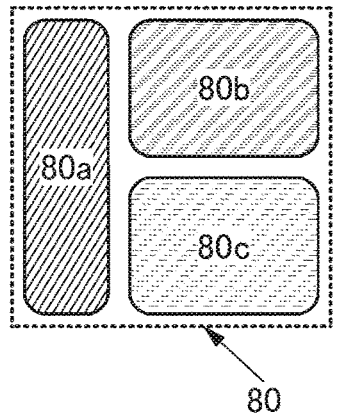
Figure 36B:
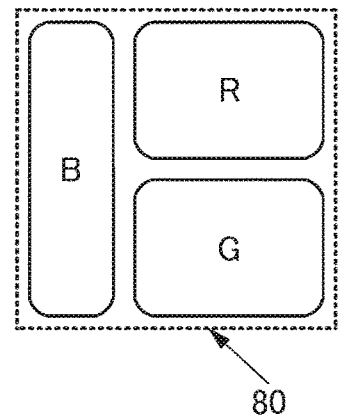

The pixel 80 illustrated in FIG. 35B employs S-stripe arrangement. The pixel 80 illustrated in FIG. 35B is composed of three subpixels: the subpixel 80*a*, the subpixel 80*b*, and the subpixel 80*c*. For example, as illustrated in FIG. 36B, the subpixel 80*a* may be the blue subpixel B, the subpixel 80*b* may be the red subpixel R, and the subpixel 80*c* may be the green subpixel G.

Figure 35C:
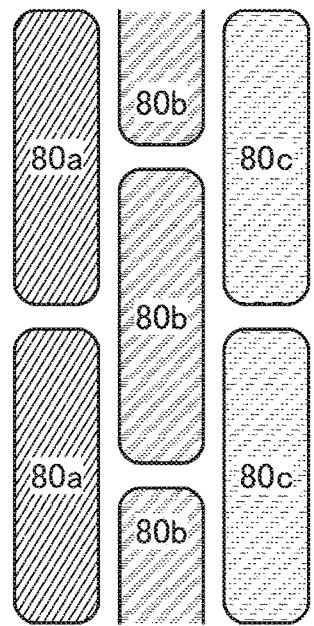
Figure 36C:
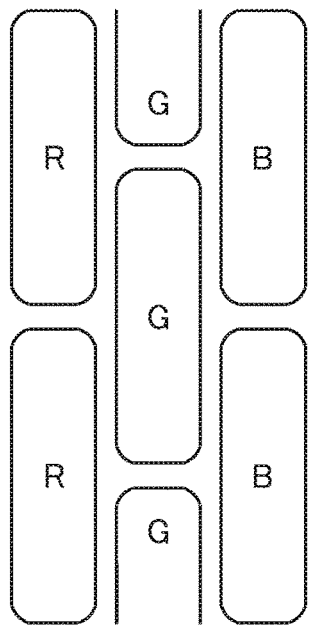

FIG. 35C illustrates an example in which subpixels of different colors are arranged in a zigzag manner. Specifically, the positions of the top sides of two subpixels arranged in the column direction (e.g., the subpixel 80*a* and the subpixel 80*b* or the subpixel 80*b* and the subpixel 80*c*) are not aligned in the plan view. For example, as illustrated in FIG. 36C, the subpixel 80*a* may be the red subpixel R, the subpixel 80*b* may be the green subpixel G, and the subpixel 80*c* may be the blue subpixel B.

Figure 35D:
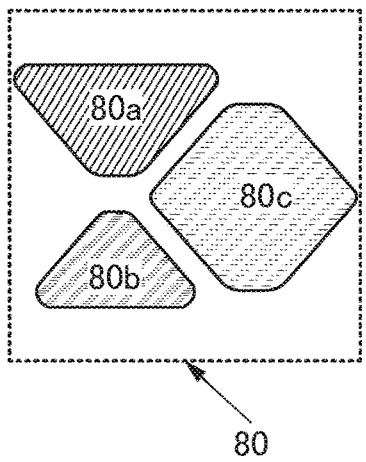
Figure 36D:
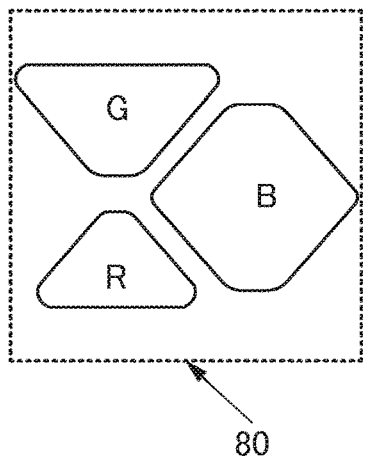

The pixel 80 illustrated in FIG. 35D includes the subpixel 80*a* whose top surface has a rough trapezoidal shape with rounded corners, the subpixel 80*b* whose top surface has a rough triangle shape with rounded corners, and the subpixel 80*c* whose top surface has a rough tetragonal or rough hexagonal shape with rounded corners. The subpixel 80*a* has a larger light-emitting area than the subpixel 80*b*. In this manner, the shapes and sizes of the subpixels can be determined independently. For example, the size of a subpixel including a light-emitting device with higher reliability can be smaller. For example, as illustrated in FIG. 36D, the subpixel 80*a* may be the green subpixel G, the subpixel 80*b* may be the red subpixel R, and the subpixel 80*c* may be the blue subpixel B.

Figure 35E:
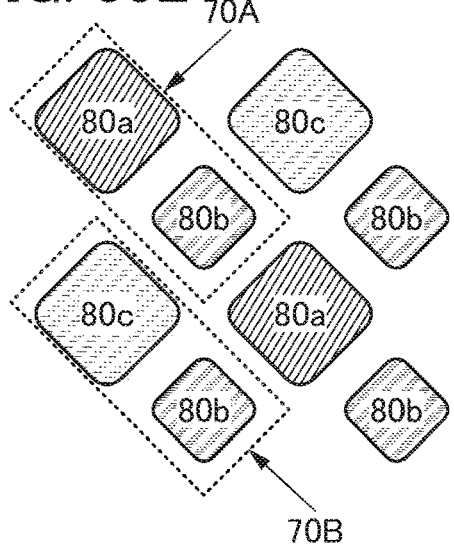
Figure 36E:
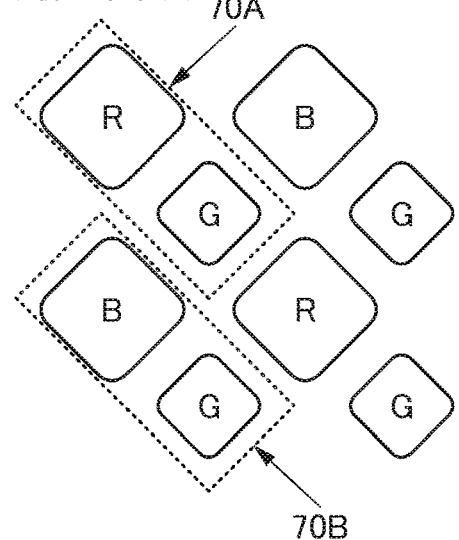

A pixel 70A and a pixel 70B illustrated in FIG. 35E employ pentile arrangement. FIG. 35E illustrates an example in which the pixels 70A including the subpixel 80*a* and the subpixel 80*b* and the pixels 70B including the subpixel 80*b* and the subpixel 80*c* are alternately arranged. For example, as illustrated in FIG. 36E, the subpixel 80*a* may be the red subpixel R, the subpixel 80*b* may be the green subpixel G, and the subpixel 80*c* may be the blue subpixel B.

Figure 35F:
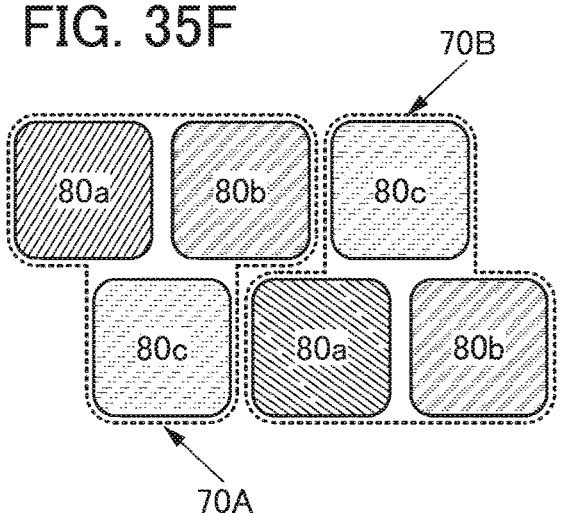
Figure 35G:
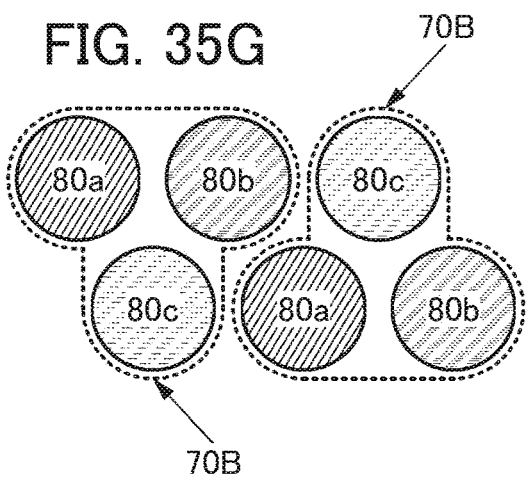
Figure 36F:
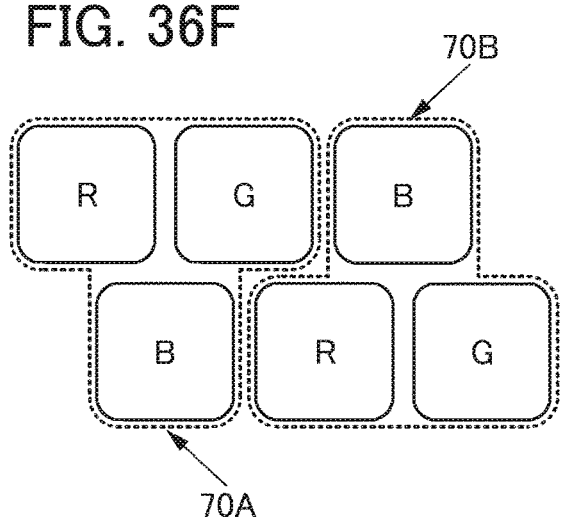

The pixel 70A and the pixel 70B illustrated in FIG. 35F and FIG. 35G employ delta arrangement. The pixel 70A includes two subpixels (the subpixel 80*a* and the subpixel 80*b*) in the upper row (first row) and one subpixel (the subpixel 80*c*) in the lower row (second row). The pixel 70B includes one subpixel (the subpixel 80*c*) in the upper row (first row) and two subpixels (the subpixel 80*a* and the subpixel 80*b*) in the lower row (second row). For example, as illustrated in FIG. 36F, the subpixel 80*a* may be the red subpixel R, the subpixel 80*b* may be the green subpixel G, and the subpixel 80*c* may be the blue subpixel B.

FIG. 35F illustrates an example in which the top surface of each subpixel has a rough quadrangular shape with rounded corners, and FIG. 35G illustrates an example in which the top surface of each subpixel has a circular shape.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel can have a polygonal shape with rounded corners, an elliptical shape, or a circular shape in some cases.

Furthermore, in the method for fabricating the display apparatus of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, or a circular shape. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance such that a transferred pattern agrees with a design pattern (OPC (Optical Proximity Correction) technique) may be used. Specifically, with the OPC technique, a pattern for correction is added to a corner portion or the like of a figure on a mask pattern.

Figure 37A:
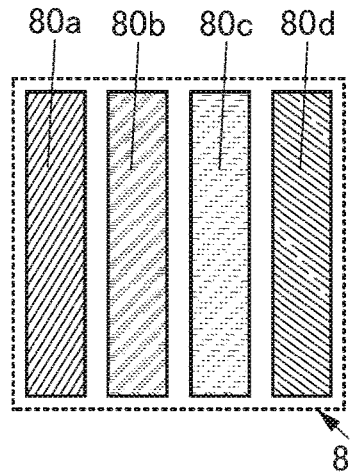
FIG. 37A to FIG. 37H are plan views illustrating examples of pixels.
Figure 37B:
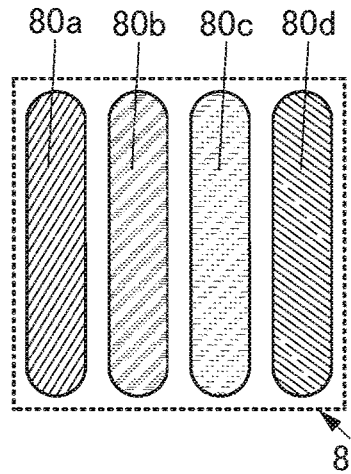
Figure 37C:
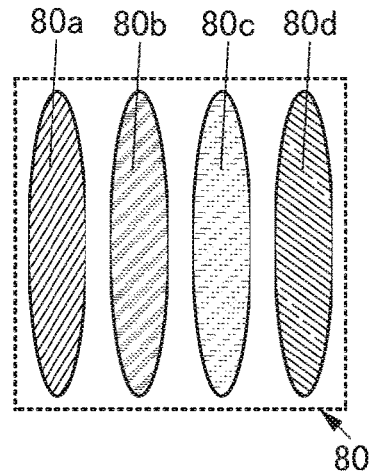

The pixels 80 illustrated in FIG. 37A to FIG. 37C employ stripe arrangement.

FIG. 37A illustrates an example in which each subpixel has a rectangular top surface shape, FIG. 37B illustrates an example in which each subpixel has a top surface shape formed by combining two half circles and a rectangle, and FIG. 37C illustrates an example in which each subpixel has an elliptical top surface shape.

Figure 37D:
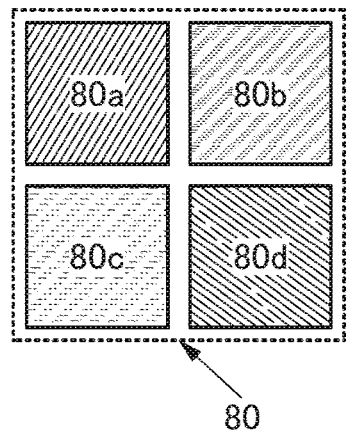
Figure 37E:
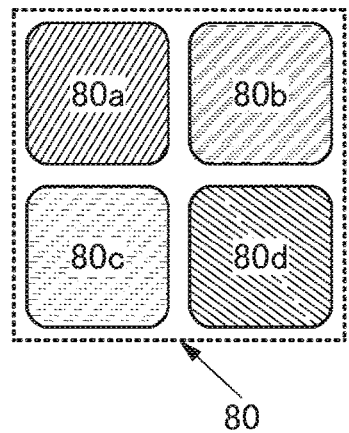
Figure 37F:
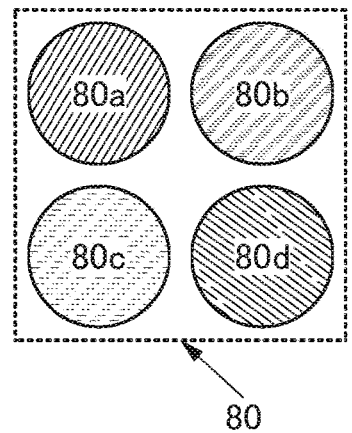

The pixels 80 illustrated in FIG. 37D to FIG. 37F employ matrix arrangement.

FIG. 37D illustrates an example in which each subpixel has a square top surface shape, FIG. 37E illustrates an example in which each subpixel has a rough square top surface shape with rounded corners, and FIG. 37F illustrates an example in which each subpixel has a circular top surface shape.

Figure 38A:
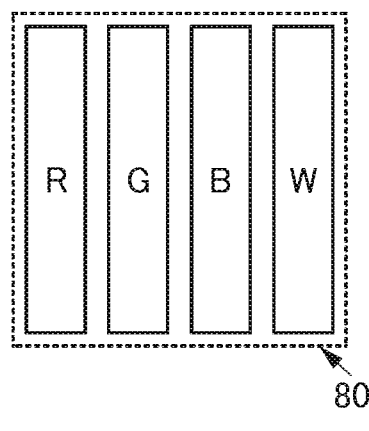
FIG. 38A to FIG. 38D are plan views illustrating examples of pixels.
Figure 38B:
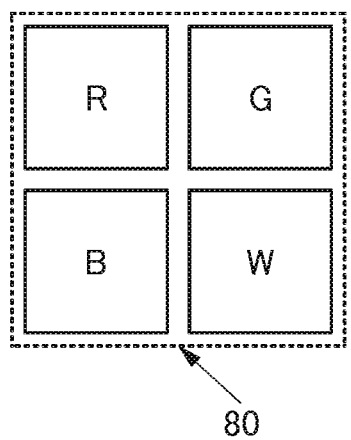

The pixels 80 illustrated in FIG. 37A to FIG. 37F are each composed of four subpixels: the subpixel 80*a*, the subpixel 80*b*, the subpixel 80*c*, and a subpixel 80*d*. The subpixel 80*a*, the subpixel 80*b*, the subpixel 80*c*, and the subpixel 80*d* emit light of different colors. For example, the subpixel 80*a*, the subpixel 80*b*, the subpixel 80*c*, and the subpixel 80*d* can be red, green, blue, and white subpixels, respectively, as illustrated in FIG. 38A and FIG. 38B. Alternatively, the subpixel 80*a*, the subpixel 80*b*, the subpixel 80*c*, and the subpixel 80*d* can be red, green, blue, and infrared-light subpixels, respectively.

The subpixel 80*d* includes a light-emitting device. The light-emitting device includes, for example, a pixel electrode, an EL layer, and the conductor 121CM functioning as a common electrode. For the pixel electrode, a material similar to those for the conductor 121*a*, the conductor 121*b*, the conductor 121*c*, the conductor 122*a*, the conductor 122*b*, and the conductor 122*c* can be used. For the EL layer, a material similar to that for the EL layer 141*a*, the EL layer 141*b*, or the EL layer 141*c* can be used, for example.

Figure 37G:
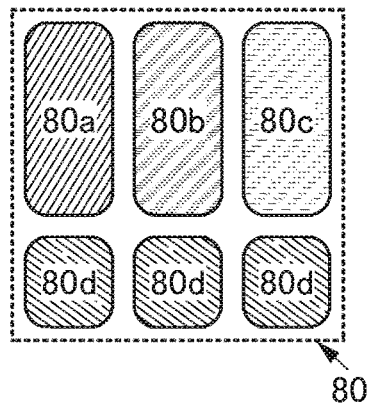

FIG. 37G illustrates an example in which one pixel 80 is composed of two rows and three columns. The pixel 80 includes three subpixels (the subpixel 80*a*, the subpixel 80*b*, and the subpixel 80*c*) in the upper row (first row) and three subpixels 80*d* in the lower row (second row). In other words, the pixel 80 includes the subpixel 80*a* and the subpixel 80*d* in the left column (first column), the subpixel 80*b* and another subpixel 80*d* in the center column (second column), and the subpixel 80*c* and another subpixel 80*d* in the right column (third column). Matching the positions of the subpixels in the upper row and the lower row as illustrated in FIG. 37G enables dust and the like that would be produced in the manufacturing process to be removed efficiently. Thus, a display apparatus with high display quality can be provided.

Figure 37H:
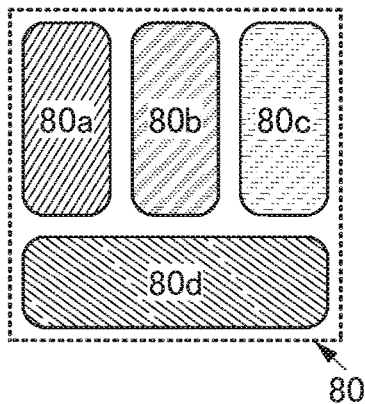

FIG. 37H illustrates an example in which one pixel 80 is composed of two rows and three columns. The pixel 80 includes three subpixels (the subpixel 80*a*, the subpixel 80*b*, and the subpixel 80*c*) in the upper row (first row) and one subpixel (the subpixel 80*d*) in the lower row (second row). In other words, the pixel 80 includes the subpixel 80*a* in the left column (first column), the subpixel 80*b* in the center column (second column), the subpixel 80c in the right column (third column), and the subpixel 80d across these three columns.

Figure 38C:
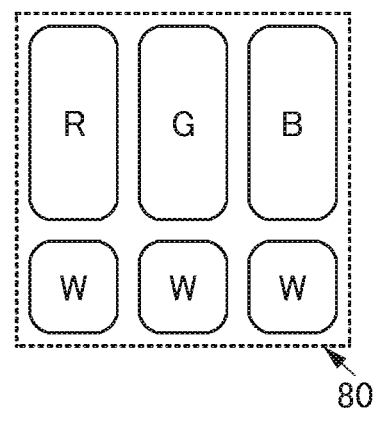
Figure 38D:
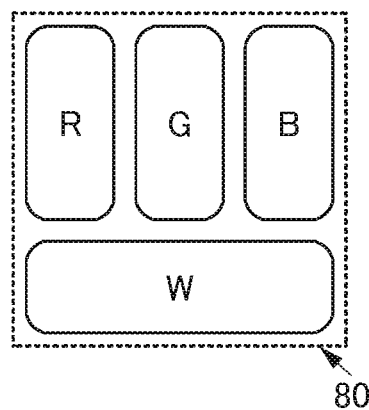

In the pixel 80 illustrated in each of FIG. 37G and FIG. 37H, for example, the subpixel 80a can be the red subpixel R, the subpixel 80b can be the green subpixel G, the subpixel 80c can be the blue subpixel B, and the subpixel 80d can be a white subpixel W, as illustrated in FIG. 38C and FIG. 38D.

The display apparatus of one embodiment of the present invention may include a light-receiving device in the pixel.

Three of the four subpixels included in the pixel 80 illustrated in FIG. 37G may each include a light-emitting device and the other one may include a light-receiving device.

For example, a pn-type or pin-type light-receiving device can be used as the light-receiving device. The light-receiving device functions as a photoelectric conversion device (also referred to as a photoelectric conversion element) that detects light entering the light-receiving device and generates charge. The amount of charge generated from the light-receiving device depends on the amount of light entering the light-receiving device.

It is particularly preferable to use, as the light-receiving device, an organic light-receiving device including a layer containing an organic compound. An organic light-receiving device, which is easily made thin, lightweight, and large in area and has a high degree of freedom for shape and design, can be used in a variety of display apparatuses.

In one embodiment of the present invention, an organic EL device is used as the light-emitting device, and an organic light-receiving device is used as the light-receiving device. The organic EL device and the organic light-receiving device can be formed over the same substrate. Thus, the organic light-receiving device can be incorporated in the display apparatus including the organic EL device.

The light-receiving device includes at least an active layer that functions as a photoelectric conversion layer between a pair of electrodes. In this specification and the like, one of the pair of electrodes may be referred to as a pixel electrode and the other may be referred to as a common electrode.

For example, the subpixel 80a, the subpixel 80b, and the subpixel 80c may be subpixels for three colors of R, G, and B, and the subpixel 80d may be a subpixel including the light-receiving device. In that case, a fourth layer includes at least an active layer.

One of the pair of electrodes of the light-receiving device functions as an anode, and the other electrode functions as a cathode. Hereinafter, the case where the pixel electrode functions as an anode and the common electrode functions as a cathode is described as an example. When the light-receiving device is driven by application of reverse bias between the pixel electrode and the common electrode, light entering the light-receiving device can be detected and charge can be generated and extracted as current. Alternatively, the pixel electrode may function as a cathode and the common electrode may function as an anode.

A fabrication method similar to that of the light-emitting device can be employed for the light-receiving device. An island-shaped active layer (also referred to as a photoelectric conversion layer) included in the light-receiving device is formed by processing a film that is to be the active layer and formed on the entire surface, not by using a pattern of a metal mask; thus, the island-shaped active layer with a uniform thickness can be formed. In addition, a sacrificial layer provided over the active layer can reduce damage to the active layer in the fabrication process of the display apparatus, increasing the reliability of the light-receiving device.

Here, a layer shared by the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device might have the same function in both the light-emitting device and the light-receiving device. A hole-transport layer functions as a hole-transport layer in both the light-emitting device and the light-receiving device, and an electron-transport layer functions as an electron-transport layer in both the light-emitting device and the light-receiving device.

The active layer included in the light-receiving device includes a semiconductor. Examples of the semiconductor include an inorganic semiconductor such as silicon and an organic semiconductor including an organic compound. This embodiment describes an example in which an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material contained in the active layer include electron-accepting organic semiconductor materials such as fullerene (e.g., $C_{60}$ and $C_{70}$) and fullerene derivatives. Fullerene has a soccer ball-like shape, which is energetically stable. Both the HOMO level (highest occupied molecular orbital level) and the LUMO level (lowest unoccupied molecular orbital) of fullerene are deep (low). Having a deep LUMO level, fullerene has an extremely high electron-accepting property (acceptor property). In general, when π-electron conjugation (resonance) spreads in a plane as in benzene, an electron-donating property (donor property) becomes high; however, since fullerene has a spherical shape, fullerene has a high electron-accepting property even when π-electron conjugation widely spreads therein. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-Phenyl-C71-butyric acid methyl ester (abbreviation: PC70BM), [6,6]-Phenyl-C61-butyric acid methyl ester (abbreviation: PC60BM), and 1',1'',4',4''-Tetrahydro-di[1,4]methanonaphthaleno[1,2:2',3',56,60:2'',3''][5,6] fullerene-$C_{60}$ (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Other examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance with a high hole-transport property, a substance with a high electron-transport property, a substance with a bipolar property (a substance with a high electron-transport property and a high hole-transport property), and the like. Without limitation to the above, a layer containing one or more selected from a substance with a high hole-injection property, a hole-blocking material, a material with a high electron-injection property, and an electron-blocking material may be further included.

Either a low molecular compound or a high molecular compound can be used in the light-receiving device, and an inorganic compound may also be included. Each layer included in the light-receiving device can be formed by a method such as an evaporation method (including a vacuum evaporation method), a transfer method, a printing method, an inkjet method, or a coating method.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer, a high molecular compound such as Poly[[4,8-bis[5-(2-ethylhexyl)-2-thienyl]benzo[1,2-b:4,5-b'] dithiophene-2,6-diyl]-2,5-thiophenediyl[5,7-bis(2-ethylhexyl)-4,8-dioxo-4H,8H-benzo[1,2-c:4,5-c'] dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. In that case, the third material may be a low molecular compound or a high molecular compound.

In the display apparatus including the light-emitting device and the light-receiving device in the pixel, the pixel has a light-receiving function, which enables detection of a touch or approach of an object while an image is displayed. For example, all the subpixels included in the display apparatus can display an image; alternatively, some of the subpixels can emit light as a light source and the other subpixels can display an image.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or an approach or touch of an object (e.g., a finger, a hand, or a pen) can be detected. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can detect reflected light (or scattered light); thus, image capturing or touch detection is possible even in a dark place.

In the case where the light-receiving devices are used as the image sensor, the display apparatus can capture an image with the use of the light-receiving devices. For example, the display apparatus of this embodiment can be used as a scanner.

For example, data on biological information such as a fingerprint or a palm print can be obtained with the use of the image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

In the case where the light-receiving devices are used as the touch sensor, the display apparatus can detect an approach or touch of an object with the use of the light-receiving devices.

Pixels illustrated in FIG. 39A to FIG. 39D each include the subpixel G, the subpixel B, the subpixel R, and the subpixel PS.

Figure 39A:
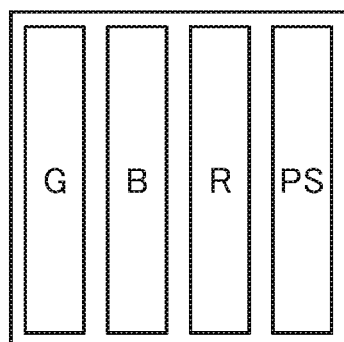
FIG. 39A to FIG. 39D are plan views illustrating examples of pixels.
Figure 39B:
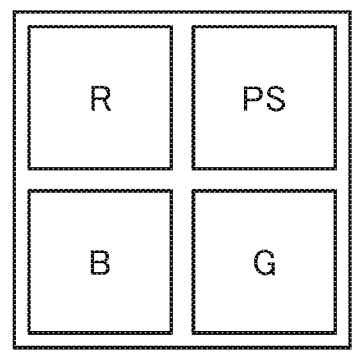

The pixel illustrated in FIG. 39A employs stripe arrangement. The pixel illustrated in FIG. 39B employs matrix arrangement.

Figure 39C:
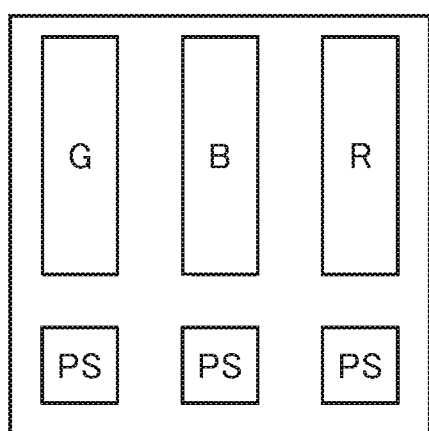
Figure 39D:
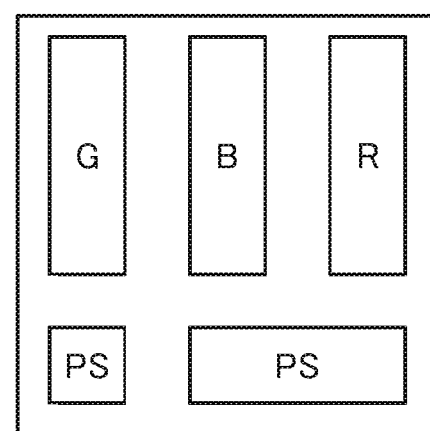

FIG. 39C and FIG. 39D illustrate an example in which one pixel is provided in two rows and three columns. Three subpixels (the subpixel G, the subpixel B, and the subpixel R) are provided in the upper row (first row). In FIG. 39C, three subpixels PS are provided in the lower row (second row). In FIG. 39D, two subpixels PS are provided in the lower row (second row). Aligning the positions of the subpixels in the upper row and the lower row as illustrated in FIG. 39C enables dust and the like that would be produced in the manufacturing process to be removed efficiently. Thus, a display apparatus with high display quality can be provided. Note that the layout of the subpixels is not limited to the structures illustrated in FIG. 39A to FIG. 39D.

Each of the subpixel R, the subpixel G, and the subpixel B includes a light-emitting device that emits white light. In each of the subpixel R, the subpixel G, and the subpixel B, the corresponding coloring layer is provided to overlap with the light-emitting device.

The subpixel PS includes a light-receiving device. There is no particular limitation on the wavelength of light detected by the subpixel PS.

The light-receiving device included in the subpixel PS preferably detects visible light, and preferably detects one or more selected from blue light, violet light, bluish violet light, green light, yellowish green light, yellow light, orange light, and red light. The light-receiving device included in the subpixel PS may detect infrared light.

Figure 39E:
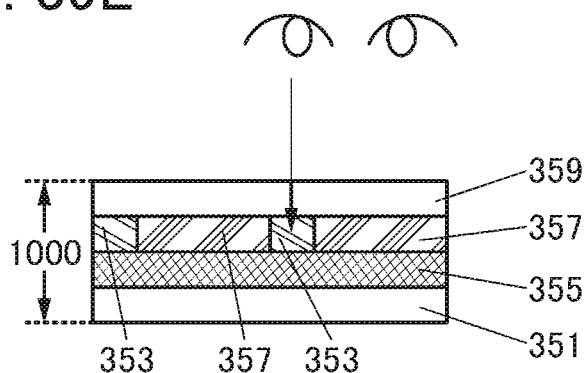
FIG. 39E is a cross-sectional view illustrating an example of a display apparatus.

The display apparatus 1000 illustrated in FIG. 39E includes, between a substrate 351 and a substrate 359, a layer 353 including a light-receiving device, a functional layer 355, and a layer 357 including a light-emitting device.

The functional layer 355 includes a circuit for driving a light-receiving device and a circuit for driving a light-emitting device. For example, one or more selected from a switch, a transistor, a capacitor, a resistor, a wiring, and a terminal can be provided in the functional layer 355. Note that in the case where the light-emitting device and the light-receiving device are driven by a passive-matrix method, a structure not provided with a switch and a transistor may be employed.

For example, after light emitted from the light-emitting device in the layer 357 including the light-emitting device is reflected by a human eye and its surroundings as illustrated in FIG. 39E, the light-receiving device in the layer 353 including the light-receiving device detects the reflected light. Accordingly, information of the surroundings, surface, or inside of the human eye (the number of blinks, the movement of an eyeball, the movement of an eyelid, and the like) can be detected.

Note that the insulators, the conductors, the semiconductors, and the like disclosed in this specification and the like can be formed by a PVD (Physical Vapor Deposition) method or a CVD method. Examples of a PVD method include a sputtering method, a resistance heating evaporation method, an electron beam evaporation method, and a PLD method. Examples of the CVD method include a plasma CVD method and a thermal CVD method. In particular, examples of a thermal CVD method include an MOCVD (Metal Organic Chemical Vapor Deposition) method and an ALD method.

A thermal CVD method, which is a deposition method not using plasma, has an advantage that a defect due to plasma damage is not generated.

Deposition by a thermal CVD method may be performed in the following manner: a source gas and an oxidizer are supplied into a chamber at a time, the pressure in the chamber is set to an atmospheric pressure or a reduced pressure, and they are made to react with each other in the vicinity of the substrate or over the substrate to be deposited over the substrate.

Deposition by an ALD method may be performed in the following manner: pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (e.g., argon or nitrogen) or the like is introduced at the same time as or after introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to deposit a first thin layer, and then the second source gas is introduced to react with the first thin layer; as a result, a second thin layer is stacked over the first thin layer, so that a thin film is formed. The sequence of the gas introduction is controlled and repeated a plurality of times until a desired thickness is obtained, so that a thin film with excellent step coverage can be formed. The thickness of the thin film can be adjusted by the number of repetition times of the sequence of the gas introduction; therefore, an ALD method makes it possible to accurately adjust the thickness and is thus suitable for fabricating a minute FET.

A variety of films such as the metal film, the semiconductor film, and the inorganic insulating film disclosed in the above-described embodiments can be formed by a thermal CVD method such as an MOCVD method and an ALD method; for example, in the case of depositing an In—Ga—Zn—O film, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can also be used instead of trimethylgallium, and diethylzinc ($Zn(C_2H_5)_2$) can also be used instead of dimethylzinc.

For example, in the case where a hafnium oxide film is formed with a deposition apparatus utilizing an ALD method, two kinds of gases, ozone ($O_3$) as an oxidizer and a source gas which is obtained by vaporizing liquid containing a solvent and a hafnium precursor compound (e.g., hafnium alkoxide or hafnium amide such as tetrakis(dimethylamide)hafnium (TDMAH, $Hf[N(CH_3)_2]_4$)), are used. Examples of another material include tetrakis(ethylmethylamide)hafnium.

For example, in the case where an aluminum oxide film is formed with a deposition apparatus utilizing an ALD method, two kinds of gases, $H_2O$ as an oxidizer and a source gas which is obtained by vaporizing liquid containing a solvent and an aluminum precursor compound (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus utilizing an ALD method, hexachlorodisilane is adsorbed on a surface on which a film is to be formed, and radicals of an oxidizing gas (e.g., $O_2$ or dinitrogen monoxide) are supplied to react with the adsorbate.

For example, in the case where a tungsten film is deposited by a deposition apparatus utilizing an ALD method, a $WF_6$ gas and a $B_2H_6$ gas are sequentially and repeatedly introduced to form an initial tungsten film, and then a $WF_6$ gas and an $H_2$ gas are sequentially and repeatedly introduced to form a tungsten film. Note that a $SiH_4$ gas may be used instead of a $B_2H_6$ gas.

In the case where an In—Ga—Zn—O film is deposited as an oxide semiconductor film with a deposition apparatus utilizing an ALD method, for example, a precursor (generally referred to as a metal precursor or the like in some cases) and an oxidizer (generally referred to as a reactant, a non-metal precursor, or the like in some cases) are sequentially and repeatedly introduced. Specifically, for example, an $In(CH_3)_3$ gas as a precursor and an $O_3$ gas) as an oxidizer are introduced to form an In—O layer; a $Ga(CH_3)_3$ gas as a precursor and an $O_3$ gas) as an oxidizer are introduced to form a GaO layer; and then, a $Zn(CH_3)_2$ gas as a precursor and an $O_3$ gas) as an oxidizer are introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an $H_2O$ gas which is obtained by bubbling water with an inert gas such as Ar may be used instead of an $O_3$ gas), it is preferable to use an $O_3$ gas) which does not contain H. Furthermore, instead of an $In(CH_3)_3$ gas, an $In(C_2H_5)_3$ gas may be used. Furthermore, instead of a $Ga(CH_3)_3$ gas, a $Ga(C_2H_5)_3$ gas may be used. Furthermore, a $Zn(CH_3)_2$ gas may be used.

There is no particular limitation on the screen ratio (aspect ratio) of the display portion of the electronic device of one embodiment of the present invention. For example, the display portion is compatible with a variety of screen ratios such as 1:1 (a square), 4:3, 16:9, and 16:10.

There is no particular limitation on the shape of the display portion of the electronic device of one embodiment of the present invention. The display portion can have any of various shapes such as a rectangular shape, a polygonal shape (e.g., octagon), a circular shape, and an elliptical shape.

Note that this embodiment can be combined with any of the other embodiments described in this specification as appropriate.

Embodiment 5

In this embodiment, a display module that can be used for the electronic device of one embodiment of the present invention will be described.

Structure Example of Display Module

First, a display module including the display apparatus that can be used for the electronic device of one embodiment of the present invention will be described.

Figure 40A:
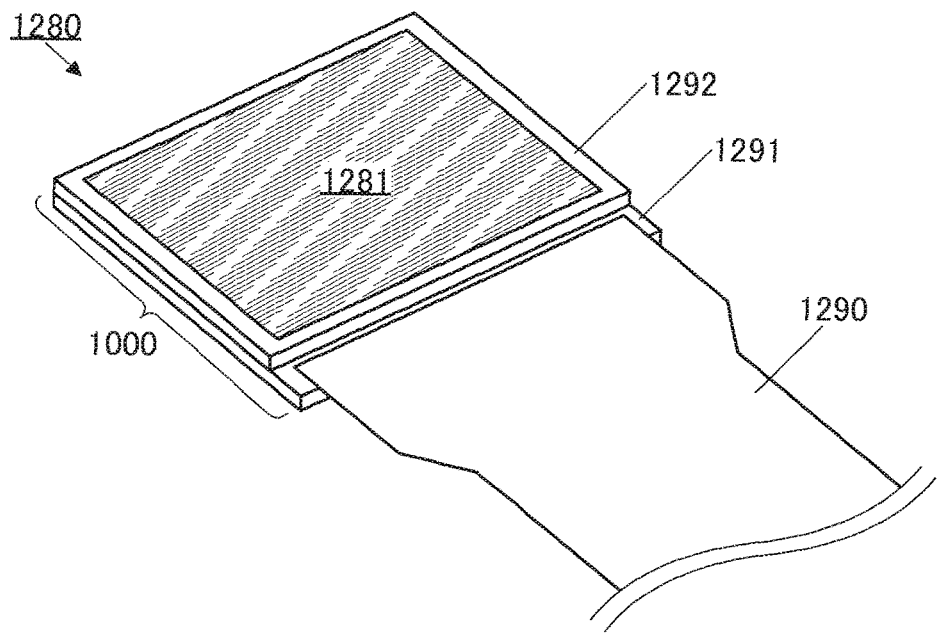
FIG. 40A and FIG. 40B are diagrams illustrating a structure example of a display module.

FIG. 40A is a perspective view of a display module 1280. The display module 1280 includes the display apparatus 1000 and an FPC 1290.

The display module 1280 includes a substrate 1291 and a substrate 1292. The display module 1280 includes a display portion 1281. The display portion 1281 is a region of the display module 1280 where an image is displayed, and is a region where light emitted from pixels provided in a pixel portion 1284 described later can be seen.

Figure 40B:
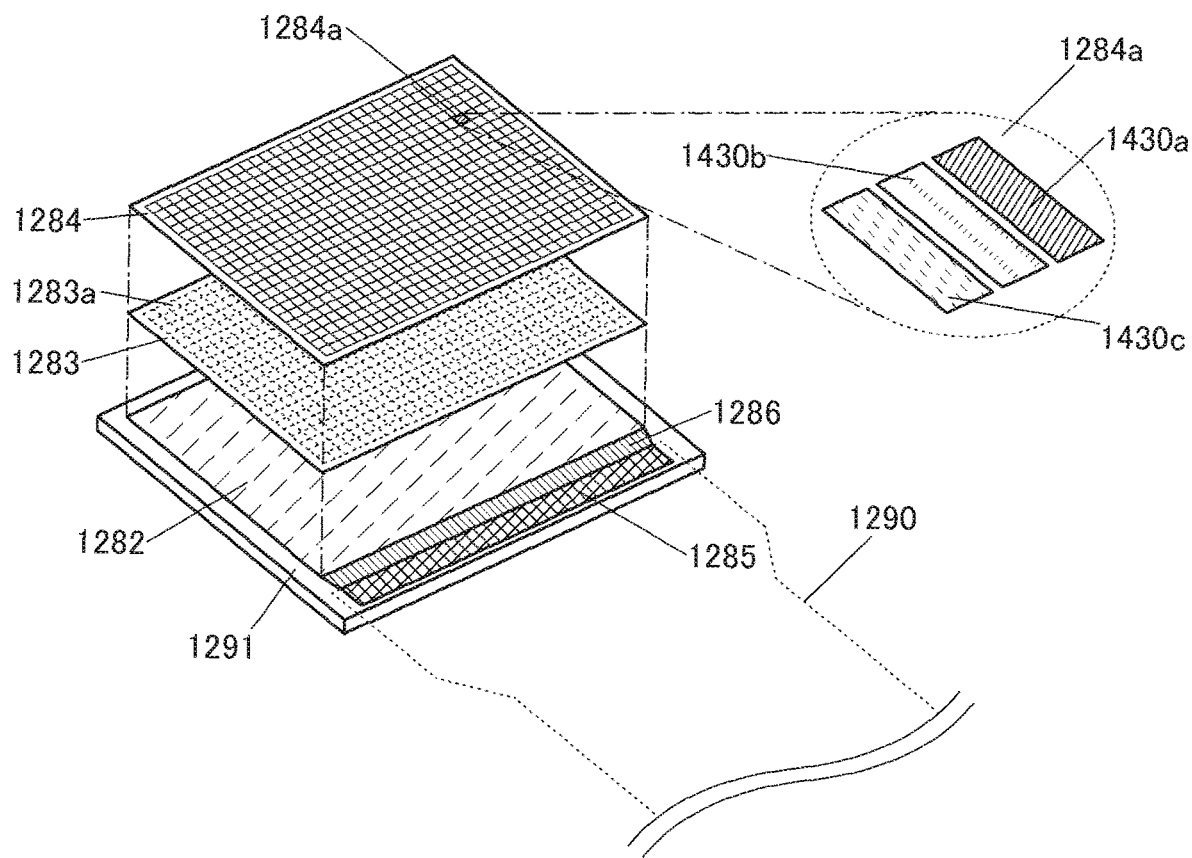

FIG. 40B is a perspective view schematically illustrating a structure on the substrate 1291 side. A circuit portion 1282, a pixel circuit portion 1283 over the circuit portion 1282, and the pixel portion 1284 over the pixel circuit portion 1283 are stacked over the substrate 1291. In addition, a terminal portion 1285 for connection to the FPC 1290 is provided in a portion not overlapping with the pixel portion 1284 over the substrate 1291. The terminal portion 1285 and the circuit portion 1282 are electrically connected to each other through a wiring portion 1286 formed of a plurality of wirings.

Note that the pixel portion 1284 and the pixel circuit portion 1283 correspond to the pixel layer PXAL described above, for example. The circuit portion 1282 corresponds to the circuit layer SICL described above, for example.

The pixel portion 1284 includes a plurality of pixels 1284*a* arranged periodically. An enlarged view of one pixel 1284*a* is illustrated on the right side in FIG. 40B. The pixel 1284*a* includes a light-emitting device 1430*a*, a light-emitting device 1430*b*, and a light-emitting device 1430*c* that emit light of different colors. Note that the light-emitting device 1430*a*, the light-emitting device 1430*b*, and the light-emitting device 1430*c* correspond to the light-emitting device 150*a*, the light-emitting device 150*b*, and the light-emitting device 150*c* described above, for example. The above-described light-emitting devices may be arranged in a stripe pattern as illustrated in FIG. 40B. Alternatively, a variety of arrangement methods, such as delta arrangement and pentile arrangement, can be employed.

The pixel circuit portion 1283 includes a plurality of pixel circuits 1283*a* arranged periodically.

One pixel circuit 1283*a* is a circuit that controls light emission from three light-emitting devices included in one pixel 1284*a*. One pixel circuit 1283*a* may be provided with three circuits each of which controls light emission from one light-emitting device. For example, the pixel circuit 1283*a* can include one or more selected from one selection transistor, one current control transistor (driving transistor), and a capacitor for one light-emitting device. In that case, a gate signal is input to a gate of the selection transistor, and a source signal is input to one of a source and a drain of the selection transistor. Thus, an active-matrix display apparatus is achieved. The circuit portion 1282 includes a circuit for driving the pixel circuits 1283*a* in the pixel circuit portion 1283. For example, one or both of agate line driver circuit and a source line driver circuit are preferably included. In addition, one or more selected from an arithmetic circuit, a memory circuit, and a power supply circuit may be included.

The FPC 1290 functions as a wiring for supplying a video signal or a power supply potential to the circuit portion 1282 from the outside. In addition, an IC may be mounted on the FPC 1290.

The display module 1280 can have a structure in which one or both of the pixel circuit portion 1283 and the circuit portion 1282 are stacked below the pixel portion 1284; thus, the aperture ratio (the effective display area ratio) of the display portion 1281 can be significantly high. For example, the aperture ratio of the display portion 1281 can be higher than or equal to 40% and lower than 100%, preferably higher than or equal to 50% and lower than or equal to 95%, further preferably higher than or equal to 60% and lower than or equal to 95%. Furthermore, the pixels 1284*a* can be arranged extremely densely and thus the display portion 1281 can have an extremely high resolution. For example, the pixels 1284*a* are preferably arranged in the display portion 1281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 1280 has an extremely high resolution and thus can be suitably used for a VR device such as a head-mounted display or a glasses-type AR device. For example, even with a structure in which the display portion of the display module 1280 is seen through a lens, pixels of the extremely-high-resolution display portion 1281 included in the display module 1280 are prevented from being perceived when the display portion is enlarged by the lens, so that display providing a strong sense of immersion can be performed. Without being limited thereto, the display module 1280 can be suitably used for electronic devices including relatively small display portions. For example, the display module 1280 can be suitably used for a display portion of a wearable electronic device such as a wristwatch.

Note that this embodiment can be combined with any of the other embodiments described in this specification as appropriate.

Embodiment 6

In this embodiment, electronic devices each including a display apparatus will be described as examples of an electronic device of one embodiment of the present invention.

Figure 41A:
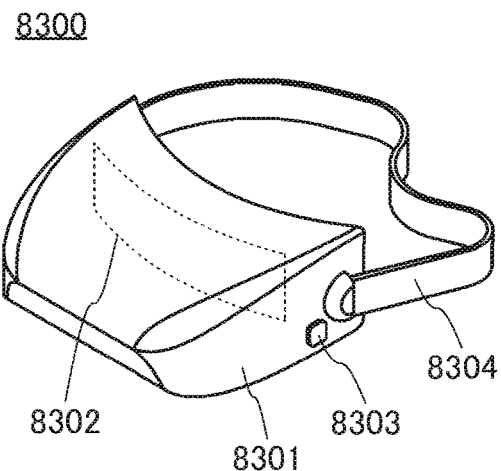
FIG. 41A to FIG. 41F are diagrams illustrating a structure example of an electronic device.
Figure 41B:
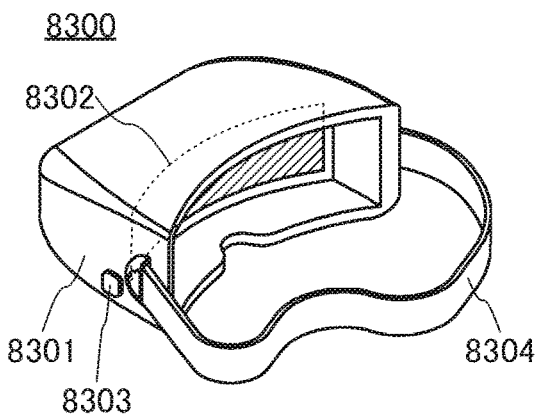

FIG. 41A and FIG. 41B each illustrate an appearance of an electronic device 8300 that is a head-mounted display.

The electronic device 8300 includes a housing 8301, a display portion 8302, an operation button 8303, and a band-shaped fixing unit 8304.

The operation button 8303 has a function of a power button or the like. The electronic device 8300 may include a button other than the operation button 8303.

Figure 41C:
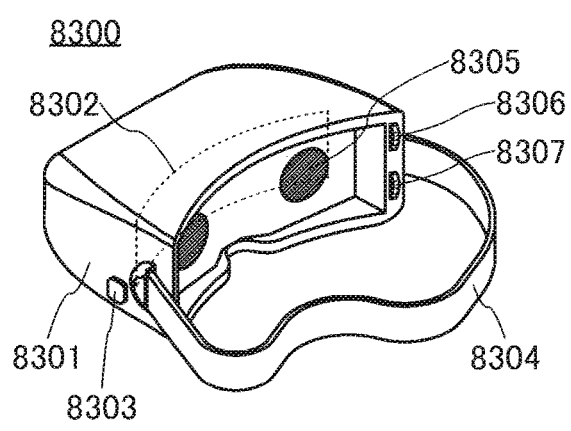

As illustrated in FIG. 41C, lenses 8305 may be included between the display portion 8302 and the positions of the user's eyes. The user can see magnified images on the display portion 8302 through the lenses 8305, leading to a higher realistic sensation. In that case, as illustrated in FIG. 41C, a dial 8306 for changing the positions of the lenses and adjusting visibility may be included.

For the display portion 8302, a display apparatus with an extremely high resolution is preferably used, for example. When a high-resolution display apparatus is used for the display portion 8302, it is possible to display a more realistic video that does not allow the user to perceive pixels even when the image is magnified using the lenses 8305 as illustrated in FIG. 41C.

FIG. 41A to FIG. 41C illustrate an example in which one display portion 8302 is provided. Such a structure can reduce the number of components.

The display portion 8302 can display an image for the right eye and an image for the left eye side by side on a right region and a left region, respectively. Thus, a three-dimensional video using binocular disparity can be displayed.

One image that can be seen by both eyes may be displayed on the entire display portion 8302. A panorama video can thus be displayed from end to end of the field of view, which can provide a stronger sense of reality.

Here, the electronic device 8300 preferably has, for example, a mechanism for changing the curvature of the display portion 8302 to an optimal value in accordance with one or both of the size of the user's head and the positions of the user's eyes. For example, the user himself or herself may adjust the curvature of the display portion 8302 by operating a dial 8307 for adjusting the curvature of the display portion 8302. Alternatively, a sensor for detecting the size of the user's head or the positions of the user's eyes (e.g., a camera, a contact sensor, and a noncontact sensor) may be provided on the housing 8301, and a mechanism for adjusting the curvature of the display portion 8302 on the basis of detection data obtained by the sensor may be provided.

In the case where the lenses 8305 are used, a mechanism for adjusting the positions and angle of the lenses 8305 in synchronization with the curvature of the display portion 8302 is preferably provided. Alternatively, the dial 8306 may have a function of adjusting the angle of the lenses.

Figure 41D:
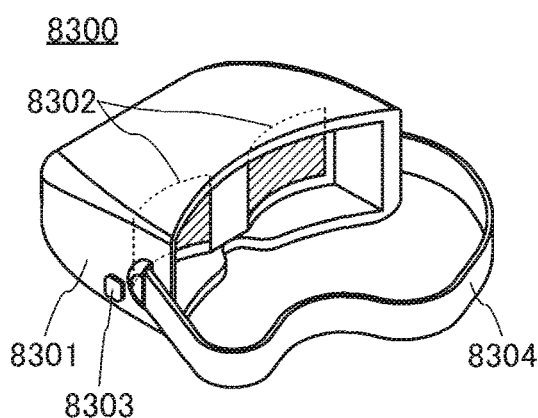
Figure 41E:
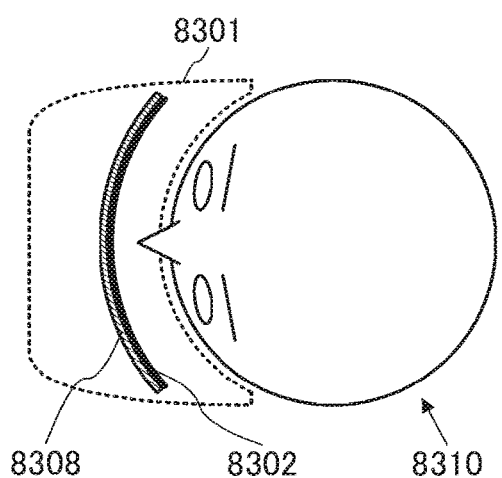
Figure 41F:
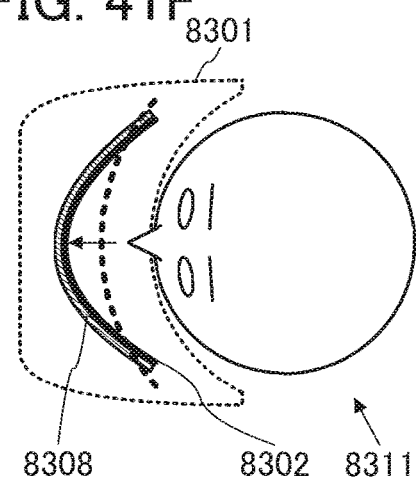

FIG. 41E and FIG. 41F illustrate an example in which a driver portion 8308 controlling the curvature of the display portion 8302 is provided. The driver portion 8308 is fixed to at least part of the display portion 8302. The driver portion 8308 has a function of changing the shape of the display portion 8302 when the part that is fixed to the display portion 8302 changes in shape or moves.

FIG. 41E is a schematic view illustrating the case where a user 8310 having a relatively large head wears the housing 8301. In that case, the driver portion 8308 adjusts the shape of the display portion 8302 such that the curvature is relatively small (the radius of curvature is large).

By contrast, FIG. 41F illustrates the case where a user 8311 having a smaller head than the user 8310 wears the housing 8301. The user 8311 has a shorter distance between the eyes than the user 8310. In that case, the driver portion 8308 adjusts the shape of the display portion 8302 such that the curvature of the display portion 8302 is large (the radius of curvature is small). In FIG. 41F, the position and shape of the display portion 8302 in FIG. 41E are denoted by a dashed line.

When the electronic device 8300 has such a mechanism for adjusting the curvature of the display portion 8302, an optimal display can be offered to a variety of users of all ages and genders.

When the curvature of the display portion 8302 is changed in accordance with contents displayed on the display portion 8302, the user can have a more realistic sensation. For example, shaking can be expressed by fluctuating the curvature of the display portion 8302. In this way, it is possible to produce various effects depending on the scene in contents, and provide the user with new experiences. A further realistic display can be provided when the display portion 8302 operates in conjunction with a vibration module provided in the housing 8301.

Note that the electronic device 8300 may include two display portions 8302 as illustrated in FIG. 41D.

Since the two display portions 8302 are included, the user's eyes can see their respective display portions. This allows a high-definition video to be displayed even when three-dimensional display using parallax is performed. In addition, the display portion 8302 is curved around an arc with the user's eye as an approximate center. This allows a uniform distance between the user's eye and the display surface of the display portion; thus, the user can see a more natural video. Even when the luminance or chromaticity of light from the display portion is changed depending on the angle at which the user sees it, since the user's eye is positioned in a normal direction of the display surface of the display portion, the influence of the change can be substantially ignorable and thus a more realistic video can be displayed.

Figure 42A:
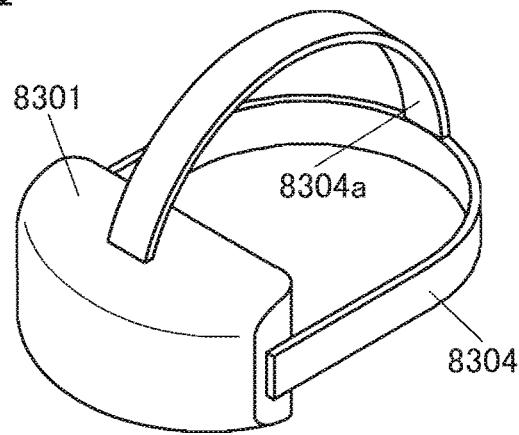
FIG. 42A to FIG. 42D are diagrams illustrating structure examples of electronic devices.
Figure 42B:
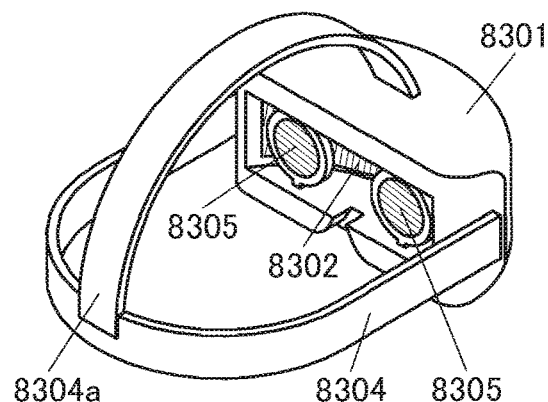
Figure 42C:
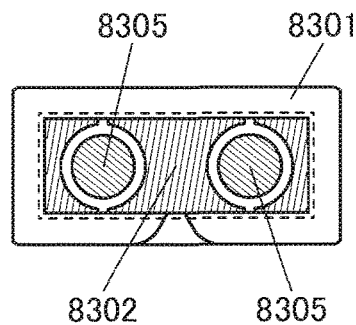

FIG. 42A to FIG. 42C are diagrams illustrating an appearance of another electronic device 8300, which is different from the electronic devices 8300 illustrated in FIG. 41A to FIG. 41D. Specifically, FIG. 42A to FIG. 42C are different from FIG. 41A to FIG. 41D in including a fixing unit 8304*a* worn on a head and a pair of lenses 8305, for example.

A user can see display on the display portion 8302 through the lenses 8305. The display portion 8302 is preferably curved so that the user can feel high realistic sensation. Another image displayed on another region of the display portion 8302 is seen through the lenses 8305, so that three-dimensional display using parallax can be performed. Note that the structure is not limited to the structure in which one display portion 8302 is provided; two display portions 8302 may be provided and one display portion may be provided per eye of the user.

For the display portion 8302, a display apparatus with an extremely high resolution is preferably used, for example. When a high-resolution display apparatus is used for the display portion 8302, it is possible to display a more realistic video that does not allow the user to perceive pixels even when the video is magnified using the lenses 8305 as illustrated in FIG. 42C.

Figure 42D:
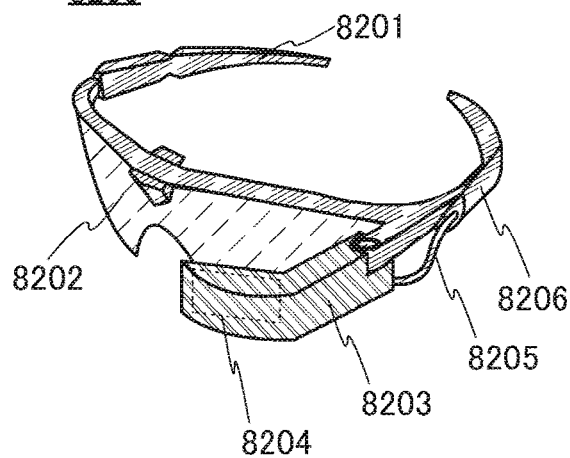

The head-mounted display, which is an electronic device of one embodiment of the present invention, may be an electronic device 8200 illustrated in FIG. 42D, which is a glasses-type head-mounted display.

The electronic device 8200 includes a mounting portion 8201, a lens 8202, a main body 8203, a display portion 8204, and a cable 8205. A battery 8206 is incorporated in the mounting portion 8201.

The cable 8205 supplies power from the battery 8206 to the main body 8203. The main body 8203 includes a wireless receiver or the like and can display received video information on the display portion 8204. The main body 8203 includes a camera, and information on the movement of the eyeballs or the eyelids of the user can be used as an input means.

The mounting portion 8201 may include a plurality of electrodes capable of sensing current flowing accompanying with the movement of the user's eyeballs at a position in contact with the user to recognize the user's sight line. The mounting portion 8201 may also have a function of monitoring the user's pulse with use of current flowing through the electrodes. The mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, and the like.

Figure 43A:
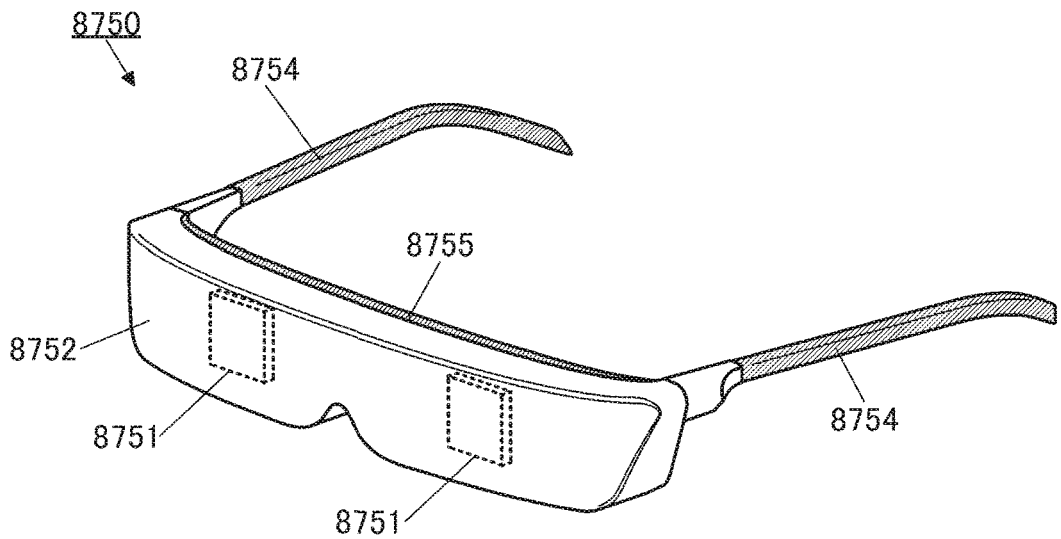
FIG. 43A to FIG. 43C are diagrams illustrating a structure example of an electronic device.
Figure 43B:
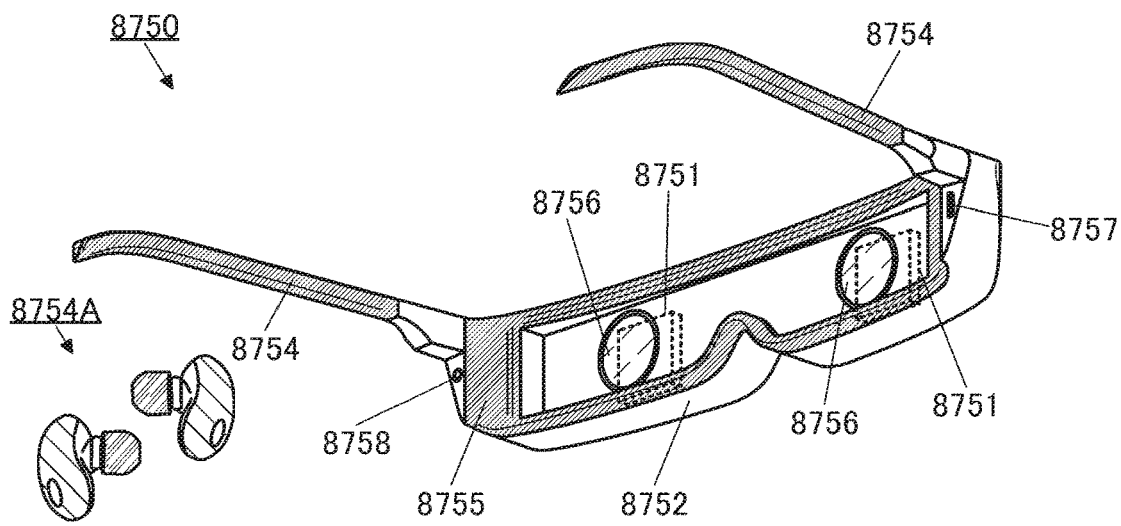
Figure 43C:
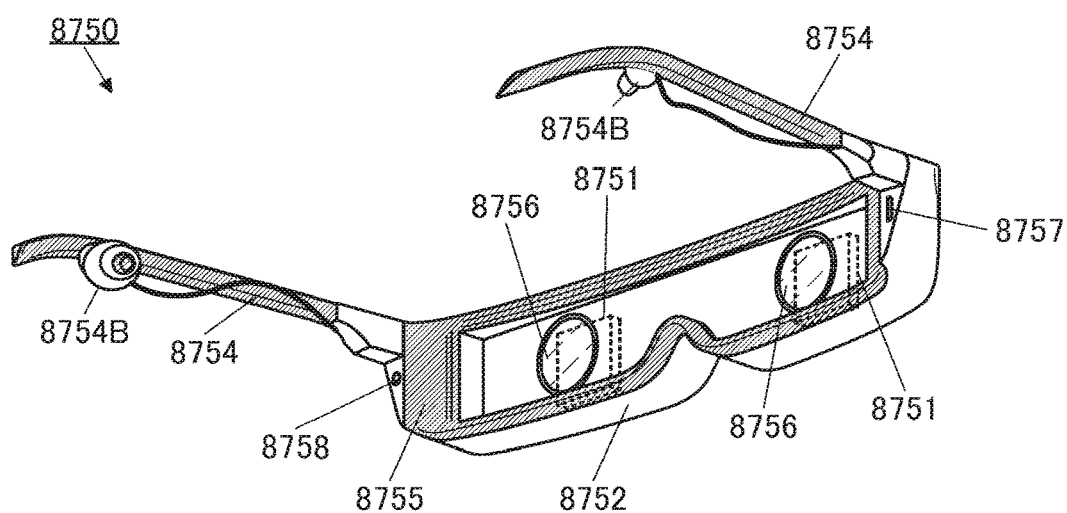

FIG. 43A to FIG. 43C are diagrams illustrating an appearance of an electronic device 8750, which is different from the electronic devices 8300 illustrated in FIG. 41A to FIG. 41D and FIG. 42A to FIG. 42C and the electronic device 8200 illustrated in FIG. 42D.

FIG. 43A is a perspective view illustrating the front surface, the top surface, and the left side surface of the electronic device 8750, and FIG. 43B and FIG. 43C are each a perspective view illustrating the back surface, the bottom surface, and the right side surface of the electronic device 8750.

The electronic device 8750 includes a pair of display apparatuses 8751, a housing 8752, a pair of mounting portions 8754, a cushion 8755, a pair of lenses 8756, and the like. The pair of display apparatuses 8751 is positioned to be seen through the lenses 8756 inside the housing 8752.

Here, one of the pair of display apparatuses 8751 corresponds to the display apparatus 10 illustrated in FIG. 19, for example. Although not illustrated, the electronic device 8750 illustrated in FIG. 43A to FIG. 43C includes an electronic component including the processing unit described in the above embodiment (e.g., the circuits included in the functional circuit region MFNC and the driver circuit region DRV illustrated in FIG. 19). Although not illustrated, the electronic device 8750 illustrated in FIG. 43A to FIG. 43C includes a camera (e.g., the sensor PDA illustrated in FIG. 19). The camera can take an image of the user's eye and its periphery. Although not illustrated, in the housing 8752 of the electronic device 8750 illustrated in FIG. 43A to FIG. 43C, a motion detection portion, an audio, a control portion, a communication portion, and a battery are provided.

The electronic device 8750 is an electronic device for VR. A user wearing the electronic device 8750 can see an image displayed on the display apparatus 8751 through the lens 8756. Furthermore, the pair of display apparatuses 8751 may display different images, whereby three-dimensional display using parallax can be performed.

An input terminal 8757 and an output terminal 8758 are provided on the back side of the housing 8752. To the input terminal 8757, a cable for supplying a video signal from a video output device or power for charging a battery provided in the housing 8752 can be connected.

The output terminal 8758 can function as, for example, an audio output terminal to which earphones or headphones can be connected.

The housing 8752 preferably includes a mechanism by which the left and right positions of the lens 8756 and the display apparatus 8751 can be adjusted to the optimal positions in accordance with the position of the user's eye. In addition, the housing 8752 preferably includes a mechanism for adjusting focus by changing the distance between the lens 8756 and the display apparatus 8751.

With use of the camera, the display apparatus 8751, and the electronic component, the electronic device 8750 can estimate the state of a user of the electronic device 8750 and can display information on the estimated user's state on the display apparatus 8751. Alternatively, information on a state of a user of an electronic device connected to the electronic device 8750 through a network can be displayed on the display apparatus 8751.

The cushion 8755 is a portion in contact with the user's face (e.g., forehead and cheek). The cushion 8755 is in close contact with the user's face, so that light leakage can be prevented, which increases the sense of immersion. A soft material is preferably used for the cushion 8755 so that the cushion 8755 is in close contact with the face of the user wearing the electronic device 8750. For example, any of a variety of materials such as rubber, silicone rubber, urethane, and sponge can be used. Furthermore, when a sponge whose surface is covered with cloth or leather (natural leather or synthetic leather) is used, a gap is unlikely to be generated between the user's face and the cushion 8755, whereby light leakage can be suitably prevented. Furthermore, using such a material is preferable because it has a soft texture and the user does not feel cold when wearing the device in a cold season, for example. The member in contact with user's skin, such as the cushion 8755 or the mounting portion 8754, is preferably detachable because cleaning or replacement can be easily performed.

The electronic device in this embodiment may further include earphones 8754A. The earphones 8754A include a communication portion (not illustrated) and have a wireless communication function. The earphones 8754A can output audio data with the wireless communication function. Note that the earphones 8754A may include a vibration mechanism to function as bone-conduction earphones.

Like earphones 8754B illustrated in FIG. 43C, the earphones 8754A can be connected to the mounting portion 8754 directly or by wiring. The earphones 8754B and the mounting portion 8754 may each have a magnet. This is preferable because the earphones 8754B can be fixed to the mounting portion 8754 with magnetic force and thus can be easily housed.

The earphones 8754A may include a sensor portion. With use of the sensor portion, the state of the user of the electronic device can be estimated.

The electronic device of one embodiment of the present invention may include one or more selected from an antenna, a battery, a camera, a speaker, a microphone, a touch sensor, and an operation button, in addition to any one of the above components.

The electronic device of one embodiment of the present invention may include a secondary battery, and it is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display a video, information, or the like on a display portion. When the electronic device includes an antenna and a secondary battery, the antenna may be used for contactless power transmission.

A display portion in an electronic device of one embodiment of the present invention can display a video with a definition of, for example, full high definition, 4K2K, 8K4K, 16K8K, or higher.

Note that this embodiment can be combined with any of the other embodiments described in this specification as appropriate.

Embodiment 7

In this embodiment, electronic devices each including a display apparatus fabricated using one embodiment of the present invention will be described.

Electronic devices described below as examples each include the display apparatus of one embodiment of the present invention in a display portion. Thus, the electronic devices achieve high definition. In addition, the electronic devices can each achieve both high definition and a large screen.

One embodiment of the present invention includes the display apparatus and one or more selected from an antenna, a battery, a housing, a camera, a speaker, a microphone, a touch sensor, and an operation button.

The electronic device of one embodiment of the present invention may include a secondary battery, and it is preferable that the secondary battery be capable of being charged by contactless power transmission.

Examples of the secondary battery include a lithium ion secondary battery (e.g., a lithium polymer battery using a gel electrolyte (lithium ion polymer battery)), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display a video, information, or the like on a display portion. When the electronic device includes an antenna and a secondary battery, the antenna may be used for contactless power transmission.

A display portion in an electronic device of one embodiment of the present invention can display a video with a definition of, for example, full high definition, 4K2K, 8K4K, 16K8K, or higher.

Examples of the electronic devices include a digital camera, a digital video camera, a digital photo frame, a mobile phone, a portable game machine, a portable information terminal, and an audio reproducing device, in addition to electronic devices with relatively large screens, such as a television device, a laptop personal computer, a monitor device, digital signage, a pachinko machine, and a game machine.

An electronic device using one embodiment of the present invention can be incorporated along a flat surface or a curved surface of an inside wall or an outside wall of a building such as a house or a building, an interior or an exterior of a car, or the like.

[Mobile Phone]

Figure 44A:
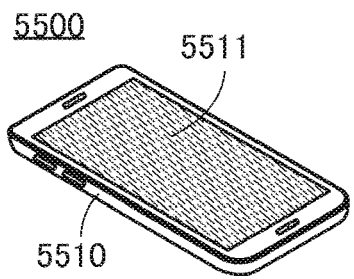
FIG. 44A to FIG. 44H are diagrams illustrating structure examples of electronic devices.

An information terminal 5500 illustrated in FIG. 44A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

The information terminal 5500 can display an image with high display quality on the display portion 5511 by including the display apparatus described in the above embodiment.

[Wearable Terminal]

Figure 44B:
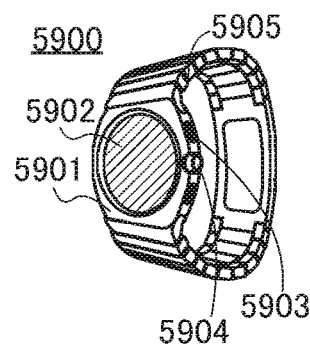

FIG. 44B is an external view of an information terminal 5900 that is an example of a wearable terminal. The information terminal 5900 includes a housing 5901, a display portion 5902, an operation button 5903, a crown 5904, and a band 5905.

The wearable terminal can display an image with high display quality on the display portion 5902 by including the display apparatus described in the above embodiment.

[Information Terminal]

Figure 44C:
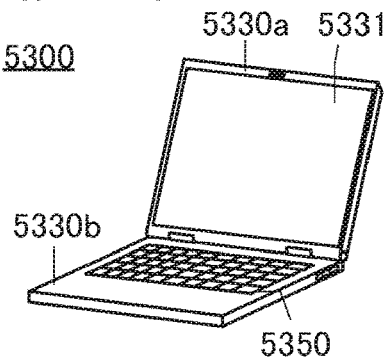

FIG. 44C illustrates a laptop information terminal 5300. The laptop information terminal 5300 illustrated in FIG. 44C includes, for example, a display portion 5331 in a housing 5330a and a keyboard portion 5350 in a housing 5330b.

Like the information terminal 5500 described above, the laptop information terminal 5300 can display an image with high display quality on the display portion 5331 by including the display apparatus described in the above embodiment.

Although the smartphone, the wearable terminal, and the laptop information terminal are respectively illustrated in FIG. 44A to FIG. 44C as examples of the electronic devices, one embodiment of the present invention can be used for information terminals other than a smartphone, a wearable terminal, and a laptop information terminal. Examples of information terminals other than a smartphone, a wearable terminal, and a laptop information terminal include a PDA (Personal Digital Assistant), a desktop information terminal, and a workstation.

[Camera]

Figure 44D:
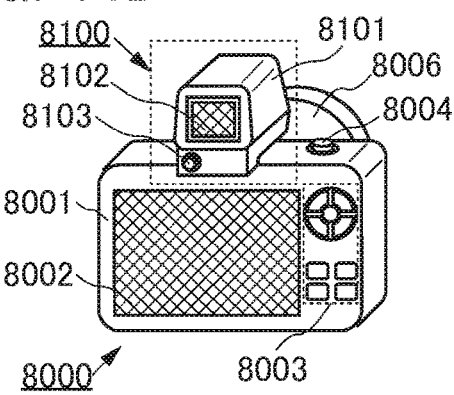

FIG. 44D is an external view of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Note that the lens 8006 and the housing may be integrated with each other in the camera 8000.

The camera 8000 can take images by the press of the shutter button 8004 or touch on the display portion 8002 functioning as a touch panel.

The housing 8001 includes a mount including an electrode, so that, in addition to the finder 8100, a stroboscope or the like can be connected to the housing.

The finder 8100 includes a housing 8101, a display portion 8102, and a button 8103.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or an operation button, for example.

The display apparatus of one embodiment of the present invention can be used for the display portion 8002 of the camera 8000 and the display portion 8102 of the finder 8100. Note that a finder may be incorporated in the camera 8000.

[Game Machine]

Figure 44E:
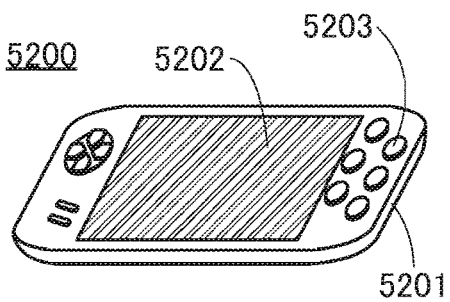

FIG. 44E is an external view of a portable game machine 5200 which is an example of a game machine. The portable game machine 5200 includes a housing 5201, a display portion 5202, and a button 5203.

Videos displayed on the portable game machine 5200 can be output with a display apparatus such as a television device, a personal computer display, a game display, or a head-mounted display.

The portable game machine 5200 can display an image with high display quality on the display portion 5202 by including the display apparatus described in the above embodiment. In addition, the portable game machine 5200 with low power consumption can be provided. Moreover, heat generation from a circuit can be reduced owing to low power consumption; thus, the influence of heat generation on the circuit itself, a peripheral circuit, and a module can be reduced.

Although FIG. 44E illustrates the portable game machine as an example of a game machine, the electronic device of one embodiment of the present invention is not limited thereto. Examples of the electronic device of one embodiment of the present invention include a stationary game machine, an arcade game machine installed in entertainment facilities (e.g., a game center and an amusement park), and a throwing machine for batting practice installed in sports facilities.

[Television Device]

Figure 44F:
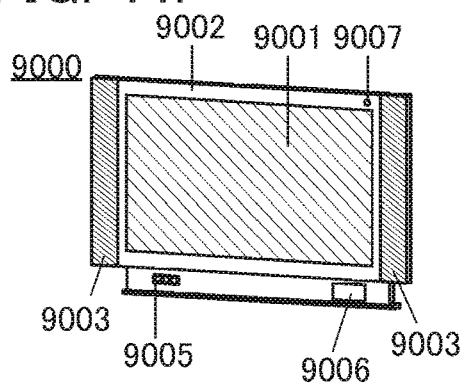

FIG. 44F is a perspective view illustrating a television device. A television device 9000 includes a housing 9002, a display portion 9001, speakers 9003, an operation key 9005 (including a power switch or an operation switch), a connection terminal 9006, and a sensor 9007 (e.g., a sensor having a function of measuring force, displacement, a position, speed, acceleration, angular velocity, rotational frequency, distance, light, liquid, magnetism, temperature, a chemical substance, sound, time, hardness, an electric field, current, voltage, power, radiation, a flow rate, humidity, gradient, oscillation, an odor, or infrared rays). The display apparatus of one embodiment of the present invention can be provided in the television device. The television device can include the display portion 9001 of, for example, 50 inches or more or 100 inches or more.

The television device 9000 can display an image with high display quality on the display portion 9001 by including the display apparatus described in the above embodiment. In addition, the television device 9000 with low power consumption can be provided. Moreover, heat generation from a circuit can be reduced owing to low power consumption; thus, the influence of heat generation on the circuit itself, a peripheral circuit, and a module can be reduced.

[Moving Vehicle]

The display apparatus of one embodiment of the present invention can be used around a driver's seat in a car, which is a moving vehicle.

Figure 44G:
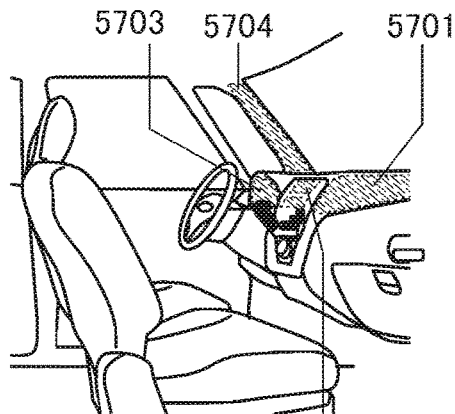

FIG. 44G is a diagram illustrating an area around a windshield inside a car. FIG. 44G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying navigation information, a speedometer, a tachometer, a mileage, a fuel meter, a gearshift indicator, and air-condition settings. The content and layout of the display on the display panels can be changed appropriately to suit the user's preferences, so that the design can be improved. The display panel 5701 to the display panel 5703 can also be used as lighting devices.

The display panel 5704 can compensate for the view obstructed by the pillar (blind areas) by showing a video taken by an imaging unit provided for the car body. That is, showing an image taken by an imaging unit provided on the outside of the car body leads to elimination of blind areas and enhancement of safety. Display of a video that complements for a portion that cannot be seen makes it possible to confirm safety more naturally and comfortably. The display panel 5704 can also be used as a lighting device.

The display apparatus of one embodiment of the present invention can be used for the display panel 5701 to the display panel 5704, for example.

Although a car is described above as an example of a moving vehicle, the moving vehicle is not limited to a car. Examples of moving vehicles include a train, a monorail train, a ship, and a flying object (a helicopter, an unmanned aircraft (a drone), an airplane, and a rocket), and these moving vehicles can include the display apparatus of one embodiment of the present invention.

[Digital Signage]

Figure 44H:
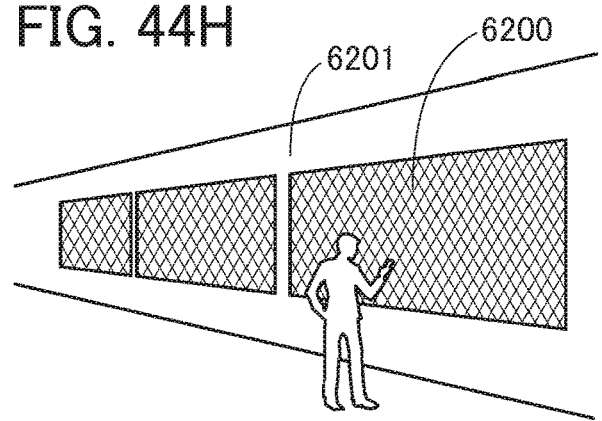

FIG. 44H illustrates an example of digital signage that can be attached to a wall. FIG. 44H illustrates a state where digital signage 6200 is attached to a wall 6201. The display apparatus of one embodiment of the present invention can be used in a display portion of the digital signage 6200, for example. An interface such as a touch panel may be provided in the digital signage 6200, for example.

Although the electronic device attachable to a wall is described above as an example of digital signage, the kind of digital signage is not limited thereto. Examples of the digital signage include digital signage attached to a pillar, freestanding digital signage placed on the ground, and digital signage mounted on a rooftop or a side wall of a building.

Note that this embodiment can be combined with any of the other embodiments described in this specification as appropriate.

REFERENCE NUMERALS

AP: circuit, PX: circuit, PX_R: circuit, PX_G: circuit, PX_B: circuit, PV: circuit, PV1: circuit, PV2: circuit, PV3: circuit, PV4: circuit, PV_R: circuit, PV_G: circuit, PV_B: circuit, PV_Y: circuit, SL: wiring, SLR: wiring, SL_G: wiring, SL_B: wiring, SE: wiring, RS: wiring, RS1: wiring, RS2: wiring, TX: wiring, TX1: wiring, TX2: wiring, GL: wiring, GL1: wiring, GL2: wiring, GL3: wiring, GL4: wiring, OL: wiring, CT: wiring, VR1: wiring, VR2: wiring, VDE: wiring, VA: wiring, VB: wiring, VC: wiring, M1: transistor, M2: transistor, M3: transistor, M4: transistor, M5: transistor, M6: transistor, M7: transistor, M8: transistor, Tr1: transistor, Tr2: transistor, Tr3: transistor, Tr4: transistor, Tr5: transistor, Tr6: transistor, CV1: capacitor, CX1: capacitor, CX2: capacitor, CX3: capacitor, CX4: capacitor, PD: light-receiving device, ED: light-emitting device, SW: switch, DM_R: region, DM_G: region, DM_B: region, DM_V: region, BS: substrate, DRV: driver circuit region, MFNC: functional circuit region, PXAL: pixel layer, LINL: wiring layer, SICL: circuit layer, DIS: display portion, SIC: circuit portion, PDA: sensor, BSL: bus wiring, SNCL: wiring, OSL: layer, EML: layer, ANO: wiring, VCOM: wiring, V0: wiring, OUT: output terminal, 10: display apparatus, 11: source driver circuit, 12: digital-analog converter circuit, 13: gate driver circuit, 14: level shifter, 21: memory device, 22: GPU, 22a: correction circuit, 22b: converter, 23: EL correction circuit, 24: timing controller, 25: CPU, 26: sensor controller, 27: power supply circuit, 30: driver circuit, 31: imaging portion, 32: imaging pixel circuit, 33: first driver circuit portion, 34: second driver circuit portion, 35: reading circuit portion, 36: control circuit portion, 41: wiring, 42: wiring, 43: wiring, 44: wiring, 70A: pixel, 70B: pixel, 80: pixel, 80a: subpixel, 80b: subpixel, 80c: subpixel, 80d: subpixel, 85R: hole-injection layer, 85G: hole-injection layer, 85B: hole-injection layer, 86R: hole-transport layer, 86G: hole-transport layer, 86B: hole-transport layer, 86PD: hole-transport layer, 87R: light-emitting layer, 87G: light-emitting layer, 87B: light-emitting layer, 88R: electron-transport layer, 88G: electron-transport layer, 88B: electron-transport layer, 88PD: electron-transport layer, 89: common layer, 90: light-receiving layer, 91: protective layer, 92: insulating layer, 102: substrate, 111: insulator, 111a: insulator, 111b: insulator, 112: insulator, 113: insulator, 113a: insulator, 113b: insulator, 113c: insulator, 118: sacrificial layer, 119: sacrificial layer, 121a: conductor, 121b: conductor, 121c: conductor, 121CM: conductor, 121B: conductor, 121G: conductor, 121R: conductor, 121PD: conductor, 122a: conductor, 122b: conductor, 122c: conductor, 123: conductor, 123CM: region, 141a: EL layer, 141b: EL layer, 141c: EL layer, 142: EL layer, 150a: light-emitting device, 150b: light-emitting device, 150c: light-emitting device, 150B: light-emitting device, 150G: light-emitting device, 150R: light-emitting device, 150IR: light-emitting device, 160: light-receiving device, 162: insulator, 163: resin layer, 164: adhesive layer, 165: adhesive layer, 166a: coloring layer, 166b: coloring layer, 166c: coloring layer, 200: transistor, 202: insulator, 210: substrate, 214: insulator, 216: conductor, 220: insulator, 222: insulator, 224: insulator, 226: insulator, 228: conductor, 230: conductor, 250: insulator, 300: transistor, 310: substrate, 312: element isolation layer, 313: semiconductor region, 314a: low-resistance region, 314b: low-resistance region, 315: insulator, 316: conductor, 317: insulator, 320: insulator, 322: insulator, 324: insulator, 326: insulator, 328: conductor, 330: conductor, 350: insulator, 351: substrate, 352: insulator, 353: layer, 354: insulator, 355: functional layer, 356: conductor, 357: layer, 359: substrate, 360: insulator, 362: insulator, 364: insulator, 366: conductor, 370: insulator, 372: insulator, 376: conductor, 380: insulator, 400: pixel circuit, 400A: pixel circuit, 400B: pixel circuit, 400C: pixel circuit, 400D: pixel circuit, 400E: pixel circuit, 400F: pixel circuit, 400G: pixel circuit, 400H: pixel circuit, 500: transistor, 500A: transistor, 500B: transistor, 500C: transistor, 500D: transistor, 501: substrate, 512: insulator, 514: insulator, 576: insulator, 581: insulator, 600: capacitor, 600A: capacitor, 1000: display apparatus, 1280: display module, 1281: display portion, 1290: FPC, 1282: circuit portion, 1283: pixel circuit portion, 1283a: pixel circuit, 1284: pixel portion, 1284a: pixel, 1285: terminal portion, 1286: wiring portion, 1291: substrate, 1292: substrate, 1430a: light-emitting device, 1430b: light-emitting device, 1430c: light-emitting device, 4400a: light-emitting unit, 4400b: light-emitting unit, 4411: light-emitting layer, 4412: light-emitting layer, 4413: light-emitting layer, 4420: layer, 4420-1: layer, 4420-2: layer, 4430: layer, 4430-1: layer, 4430-2: layer, 4440: intermediate layer, 5200: portable game machine, 5201: housing, 5202: display portion, 5203: button, 5300: laptop information terminal, 5330a: housing, 5330b: housing, 5331: display portion, 5350: keyboard portion, 5500: information terminal, 5510: housing, 5511: display portion, 5701: display panel, 5702: display panel, 5703: display panel, 5704: display panel, 5900: information terminal, 5901: housing, 5902: display portion, 5903: operation button, 5904: crown, 5905: band, 6200: digital signage, 6201: wall, 8000: camera, 8001: housing, 8002: display portion, 8003: operation button, 8004: shutter button, 8006: lens, 8100: finder, 8101: housing, 8102: display portion, 8103: button, 8200: electronic device, 8201: mounting portion, 8202: lens, 8203: main body, 8204: display portion, 8205: cable, 8206: battery, 8300: electronic device, 8301: housing, 8302: display portion, 8303: operation button, 8304: fixing unit, 8304a: fixing unit, 8305: lens, 8306: dial, 8307: dial, 8308: driver portion, 8310: user, 8311: user, 8750: electronic device, 8751: display apparatus, 8752: housing, 8754: mounting portion, 8754A: earphone, 8754B: earphone, 8756: lens, 8757: input terminal, 8758: output terminal, 9000: television device, 9001: display portion, 9002: housing, 9003: speaker, 9005: operation key, 9006: connection terminal, 9007: sensor

The invention claimed is:

1. A semiconductor device comprising:
a first circuit; and
a second circuit,
wherein the first circuit comprises a light-emitting device,
wherein the second circuit comprises a light-receiving device, a first transistor, a second transistor, a third transistor, a fourth transistor, a fifth transistor, and a first capacitor,
wherein the light-receiving device comprises a first terminal and a second terminal, wherein the light-emitting device comprises a third terminal and a fourth terminal, wherein one of a source and a drain of the first transistor is electrically connected to one of a source and a drain of the second transistor, wherein a gate of the second transistor is electrically connected to one of a source and a drain of the third transistor and one terminal of the first capacitor, wherein the other terminal of the first capacitor is electrically connected to one of a source and a drain of the fourth transistor and one of a source and a drain of the fifth transistor, wherein the other of the source and the drain of the fifth transistor is electrically connected to the first terminal of the light-receiving device, wherein the second terminal of the light-receiving device is electrically connected to the third terminal of the light-emitting device, wherein the fourth terminal of the light-emitting device is electrically connected to a first wiring, and wherein the first wiring is configured to supply a potential to the fourth terminal of the light-emitting device.

2. The semiconductor device according to claim 1, wherein a gate of the third transistor is electrically connected to a gate of the fourth transistor.

3. The semiconductor device according to claim 1,
wherein the first circuit comprises a sixth transistor and a seventh transistor,
wherein one of a source and a drain of the seventh transistor is directly electrically connected to the fourth terminal of the light-emitting device,
wherein the other of the source and the drain of the seventh transistor is directly electrically connected to the first wiring, and
wherein one of a source and a drain of the sixth transistor is electrically connected to a gate of the seventh transistor.

4. A display apparatus comprising:
the semiconductor device according to claim 3;
a first driver circuit;
a second driver circuit;
a second wiring; and
a third wiring,
wherein the first driver circuit is electrically connected to a gate of the sixth transistor through the second wiring,
wherein the second driver circuit is electrically connected to the other of the source and the drain of the seventh transistor through the third wiring,
wherein the first driver circuit is configured to transmit a selection signal to the second wiring, and
wherein the second driver circuit is configured to transmit an image data signal to the third wiring.

5. An electronic device comprising:
the display apparatus according to claim 4; and
a housing.

6. A semiconductor device comprising:
a first circuit; and
a second circuit,
wherein the first circuit comprises a first light-receiving device, a first transistor, a second transistor, a third transistor, a fourth transistor, a fifth transistor, a sixth transistor and a first capacitor,
wherein the second circuit comprises a second light-receiving device, a seventh transistor, an eighth transistor, a ninth transistor, a tenth transistor, an eleventh transistor, twelfth transistor and a second capacitor, wherein the first light-receiving device comprises a first terminal and a second terminal, wherein the second light-receiving device comprises a third terminal and a fourth terminal, wherein one of a source and a drain of the first transistor is electrically connected to one of a source and a drain of the second transistor, wherein a gate of the second transistor is electrically connected to one of a source and a drain of the third transistor and one terminal of the first capacitor, wherein the other terminal of the first capacitor is electrically connected to one of a source and a drain of the fourth transistor, one of a source and a drain of the fifth transistor, one of a source and a drain of the sixth transistor, and one of a source and a drain of the twelfth transistor, wherein the other of the source and the drain of the fifth transistor is electrically connected to the other of the source and the drain of the sixth transistor and the first terminal of the first light-receiving device, wherein one of a source and a drain of the seventh transistor is electrically connected to one of a source and a drain of the eighth transistor, wherein a gate of the eighth transistor is electrically connected to one of a source and a drain of the ninth transistor and one terminal of the second capacitor, wherein the other terminal of the second capacitor is electrically connected to one of a source and a drain of the tenth transistor and one of a source and a drain of the eleventh transistor, wherein the other of the source and the drain of the eleventh transistor is electrically connected to the other of the source and the drain of the twelfth transistor and the third terminal of the second light-receiving device, and wherein the second terminal of the first light-receiving device is electrically connected to the fourth terminal of the second light-receiving device.

7. The semiconductor device according to claim 6,
wherein a gate of the third transistor is electrically connected to a gate of the ninth transistor,
wherein a gate of the fourth transistor is electrically connected to a gate of the tenth transistor,
wherein a gate of the fifth transistor is electrically connected to a gate of the eleventh transistor, and
wherein a gate of the sixth transistor is electrically connected to a gate of the twelfth transistor.

8. The semiconductor device according to claim 7, wherein the other of the source and the drain of the first transistor is electrically connected to the other of the source and the drain of the seventh transistor.

9. The semiconductor device according to claim 8, further comprising a third circuit,
wherein the third circuit comprises a light-emitting device,
wherein the light-emitting device comprises a fifth terminal and a fourth sixth terminal,
wherein the fifth terminal of the light-emitting device is electrically connected to the second terminal of the first light-receiving device and the fourth terminal of the second light-receiving device,
wherein the sixth terminal of the light-emitting device is electrically connected to a first wiring, and
wherein the first wiring is configured to supply a potential to the sixth terminal of the light-emitting device.

10. The semiconductor device according to claim 8, further comprising a third circuit,
- wherein the third circuit comprises a light-emitting device, a thirteenth transistor and a fourteenth transistor,
- wherein the light-emitting device comprises a fifth terminal and a sixth terminal,
- wherein the fifth terminal of the light-emitting device is electrically connected to the second terminal of the first light-receiving device and the fourth terminal of the second light-receiving device,
- wherein one of a source and a drain of the fourteenth transistor is electrically connected to the sixth terminal of the light-emitting device,
- wherein the other of the source and the drain of the fourteenth transistor is electrically connected to a first wiring,
- wherein one of a source and a drain of the thirteenth transistor is electrically connected to a gate of the fourteenth transistor, and
- wherein the first wiring is configured to supply a potential to the other of the source and the drain of the seventh fourteenth transistor.

11. A semiconductor device comprising:
a first circuit; and
a second circuit,
- wherein the first circuit comprises a first light-receiving device, a first transistor, a second transistor, a third transistor, a fourth transistor, a fifth transistor, a sixth transistor and a first capacitor,
- wherein the second circuit comprises a second light-receiving device, a seventh transistor, an eighth transistor, a ninth transistor, a tenth transistor, an eleventh transistor, a twelfth transistor and a second capacitor,
- wherein the first circuit further comprises a thirteenth transistor,
- wherein the first light-receiving device comprises a first terminal and a second terminal,
- wherein the second light-receiving device comprises a third terminal and a fourth terminal,
- wherein one of a source and a drain of the first transistor is electrically connected to one of a source and a drain of the second transistor,
- wherein a gate of the second transistor is electrically connected to one of a source and a drain of the third transistor and one terminal of the first capacitor,
- wherein the other terminal of the first capacitor is electrically connected to one of a source and a drain of the fourth transistor, one of a source and a drain of the fifth transistor, one of a source and a drain of the sixth transistor, and one of a source and a drain of the thirteenth transistor,
- wherein the other of the source and the drain of the thirteenth transistor is electrically connected to one of a source and a drain of the twelfth transistor,
- wherein a gate of the thirteenth transistor is electrically connected to a gate of the sixth transistor,
- wherein the other of the source and the drain of the fifth transistor is electrically connected to the other of the source and the drain of the sixth transistor and the first terminal of the first light-receiving device,
- wherein one of a source and a drain of the seventh transistor is electrically connected to one of a source and a drain of the eighth transistor,
- wherein a gate of the eighth transistor is electrically connected to one of a source and a drain of the ninth transistor and one terminal of the second capacitor,
- wherein the other terminal of the second capacitor is electrically connected to one of a source and a drain of the tenth transistor and one of a source and a drain of the eleventh transistor,
- wherein the other of the source and the drain of the eleventh transistor is electrically connected to the other of the source and the drain of the twelfth transistor and the third terminal of the second light-receiving device, and
- wherein the second terminal of the first light-receiving device is electrically connected to the fourth terminal of the second light-receiving device.

12. The semiconductor device according to claim 11,
- wherein a gate of the third transistor is electrically connected to a gate of the ninth transistor,
- wherein a gate of the fourth transistor is electrically connected to a gate of the tenth transistor,
- wherein a gate of the fifth transistor is electrically connected to a gate of the eleventh transistor, and
- wherein the gate of the sixth transistor is electrically connected to a gate of the twelfth transistor.

13. The semiconductor device according to claim 12, wherein the other of the source and the drain of the first transistor is electrically connected to the other of the source and the drain of the seventh transistor.

14. The semiconductor device according to claim 13, further comprising a third circuit,
- wherein the third circuit comprises a light-emitting device,
- wherein the light-emitting device comprises a fifth terminal and a sixth terminal,
- wherein the fifth terminal of the light-emitting device is electrically connected to the second terminal of the first light-receiving device and the fourth terminal of the second light-receiving device,
- wherein the sixth terminal of the light-emitting device is electrically connected to a first wiring, and
- wherein the first wiring is configured to supply a potential to the sixth terminal of the light-emitting device.

15. The semiconductor device according to claim 13, further comprising a third circuit,
- wherein the third circuit comprises a light-emitting device, a fourteenth transistor and a fifteenth transistor,
- wherein the light-emitting device comprises a fifth terminal and a sixth terminal,
- wherein the fifth terminal of the light-emitting device is electrically connected to the second terminal of the first light-receiving device and the fourth terminal of the second light-receiving device,
- wherein one of a source and a drain of the fifteenth transistor is electrically connected to the sixth terminal of the light-emitting device,
- wherein the other of the source and the drain of the fifteenth transistor is electrically connected to a first wiring,
- wherein one of a source and a drain of the fourteenth transistor is electrically connected to a gate of the fifteenth transistor, and
- wherein the first wiring is configured to supply a potential to the other of the source and the drain of the fifteenth transistor.

16. A display apparatus comprising:
the semiconductor device according to claim 10;
a first driver circuit;
a second driver circuit;
a second wiring; and
a third wiring, wherein the first driver circuit is electrically connected to a gate of the thirteenth transistor through the second wiring, wherein the second driver circuit is electrically connected to the other of the source and the drain of the thirteenth transistor through the third wiring, wherein the first driver circuit is configured to transmit a selection signal to the second wiring, and wherein the second driver circuit is configured to transmit an image data signal to the third wiring.

17. An electronic device comprising:

the display apparatus according to claim 16; and a housing.

* * * * *